(12) United States Patent
Szigethy et al.

(10) Patent No.: US 11,744,142 B2
(45) Date of Patent: Aug. 29, 2023

(54) ORGANIC ELECTROLUMINESCENT MATERIALS AND DEVICES

(71) Applicant: UNIVERSAL DISPLAY CORPORATION, Ewing, NJ (US)

(72) Inventors: Geza Szigethy, Newtown, PA (US); Joseph A. Macor, Ewing, NJ (US); Charles Stanton, New Castle, DE (US); Galyna Dubinina, New Castle, DE (US); Douglas Williams, New Castle, DE (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 834 days.

(21) Appl. No.: 16/044,620

(22) Filed: Jul. 25, 2018

(65) Prior Publication Data

US 2019/0051845 A1 Feb. 14, 2019

Related U.S. Application Data

(60) Provisional application No. 62/543,694, filed on Aug. 10, 2017.

(51) Int. Cl.
| | |
|---|---|
| H10K 85/30 | (2023.01) |
| C07F 15/00 | (2006.01) |
| C09K 11/06 | (2006.01) |
| H05B 33/14 | (2006.01) |
| H10K 85/40 | (2023.01) |
| H10K 85/60 | (2023.01) |
| H10K 50/11 | (2023.01) |
| H10K 101/10 | (2023.01) |

(52) U.S. Cl.
CPC ....... *H10K 85/342* (2023.02); *C07F 15/0033* (2013.01); *C09K 11/06* (2013.01); *H05B 33/14* (2013.01); *H10K 85/40* (2023.02); *H10K 85/6572* (2023.02); *C09K 2211/1044* (2013.01); *C09K 2211/1055* (2013.01); *C09K 2211/1096* (2013.01); *C09K 2211/185* (2013.01); *H10K 50/11* (2023.02); *H10K 2101/10* (2023.02)

(58) Field of Classification Search
CPC ............. H01L 51/0085; H01L 51/5016; C07F 15/0033; C09K 11/06; C09K 2211/185; H10K 85/342; H10K 50/11; H10K 2101/10
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 10,256,419 B2 * | 4/2019 | Brooks | H01L 51/0073 |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Dylan C Kershner
(74) *Attorney, Agent, or Firm* — Duane Morris LLP

(57) ABSTRACT

A compound having a structure of the formula $Ir(L_A)(L_B)$, in which $L_A$ is a bidentate, tridentate, tetradentate, pentadentate, or hexadentate ligand and $L_B$ is a monodentate, bidentate, tridentate, or tetradentate ligand, or not present, and where the total denticity of $L_A$ plus $L_B$ is 6, and $L_A$ includes at least one structure of Formula I:

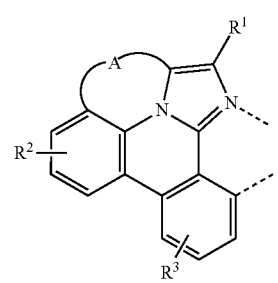

is disclosed as a useful phosphorescent emitter compound.

10 Claims, 2 Drawing Sheets

(56) References Cited

U.S. PATENT DOCUMENTS

| | | | |
|---|---|---|---|
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0152802 A1 | 8/2003 | Tsuboyama et al. | |
| 2003/0162053 A1 | 8/2003 | Marks et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0112407 A1 | 5/2005 | Ogasawara et al. | |
| 2005/0170206 A1* | 8/2005 | Ma | C07F 15/0073 428/690 |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Prakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2015/0179958 A1 | 6/2015 | Otsu et al. | |
| 2015/0221877 A1 | 8/2015 | De Cola et al. | |
| 2015/0380666 A1 | 12/2015 | Szigethy et al. | |
| 2016/0072082 A1* | 3/2016 | Brooks | H01L 51/005 257/40 |

FOREIGN PATENT DOCUMENTS

| | | |
|---|---|---|
| EP | 2034538 | 3/2009 |
| EP | 3091024 | 11/2016 |
| JP | 200511610 | 1/2005 |
| JP | 2007123392 | 5/2007 |
| JP | 2007254297 | 10/2007 |
| JP | 2008074939 | 4/2008 |
| JP | 2013-149812 | 8/2013 |
| JP | 2013187211 | 9/2013 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |
| WO | 2013/088959 | 6/2013 |
| WO | 2017/119200 | 7/2019 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electro phosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20(2000).

Hamada, Yuji et al., "High Luminance in Organic Electroluminescent Devices with Bis(10-hydroxybenzo[h]quinolinato)beryllium as an Emitter," Chem. Lett., 905-906 (1993).

Holmes, R.J. et al., "Blue Organic Electrophosphorescence Using Exothermic Host-Guest Energy Transfer," Appl. Phys. Lett., 82(15):2422-2424 (2003).

Hu, Nan-Xing et al., "Novel High Tg Hole-Transport Molecules Based on Indolo[3,2-b]carbazoles for Organic Light-Emitting Devices," Synthetic Metals, 111-112:421-424 (2000).

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).

Huang, Wei-Sheng et al., "Highly Phosphorescent Bis-Cyclometalated Iridium Complexes Containing Benzoimidazole-Based Ligands," Chem. Mater., 16(12):2480-2488 (2004).

Hung, L.S. et al., "Anode Modification in Organic Light-Emitting Diodes by Low-Frequency Plasma Polymerization of CHF3," Appl. Phys. Lett., 78(5):673-675 (2001).

Ikai, Masamichi et al., "Highly Efficient Phosphorescence From Organic Light-Emitting Devices with an Exciton-Block Layer," Appl. Phys. Lett., 79(2):156-158 (2001).

(56) References Cited

OTHER PUBLICATIONS

Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1):162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5'-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91: 209-215 (1997).
Shirota, Yasuhiko et al., "Starburst Molecules Based on pi-Electron Systems as Materials for Organic Electroluminescent Devices," Journal of Luminescence, 72-74:985-991 (1997).
*****Sotoyama, Wataru et al., "Efficient Organic Light-Emitting Diodes with Phosphorescent Platinum Complexes Containing NCN-Coordinating Tridentate Ligand," Appl. Phys. Lett., 86:153505-1 - 153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Extended European Search Report dated Jan. 22, 2021 for corresponding European Application No. 20183075.9.
Notice of Reasons for Rejection dated Nov. 2, 2021 for corresponding Japanese Patent Application No. 2018-146383.

* cited by examiner

ORGANIC ELECTROLUMINESCENT MATERIALS AND DEVICES

CROSS-REFERENCE TO RELATED APPLICATIONS

This application claims priority under 35 U.S.C. § 119(e) to U.S. Provisional Application No. 62/543,694, filed Aug. 10, 2017, the entire contents of which are incorporated herein by reference.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

One example of a green emissive molecule is tris(2-phenylpyridine) iridium, denoted Ir(ppy)$_3$, which has the following structure:

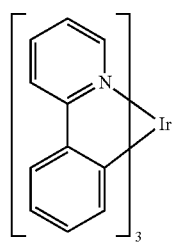

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

One common strategy to generating stable metal complexes is to tether the coordinating moieties to each other, increasing their thermal, electrochemical and photochemical stability. Such tethers can have other beneficial properties beyond stability, such as enhancing or modifying phosphorescent properties and efficiencies as well as assisting in their purification. This disclosure details using such tethered bis- and tris-bidentate ligands to improve the stability and luminescent properties of organometallic phosphorescent emitters incorporating an internally-strapped phenanthridineimidazole ligand.

A compound is disclosed having a structure of the formula Ir($L_A$)($L_B$), in which $L_A$ is a bidentate, tridentate, tetradentate, pentadentate, or hexadentate ligand and $L_B$ is a monodentate, bidentate, tridentate, or tetradentate ligand, or not present. The total denticity of $L_A$ plus $L_B$ is 6, where $L_A$ comprises at least one structure of Formula I:

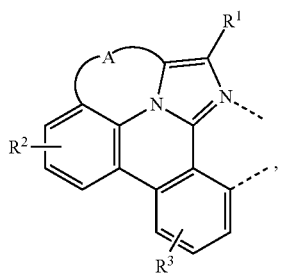

where A is a linking group having two to three linking atoms, where the linking atoms are each independently selected from the group consisting of C, Si, O, S, N, B; where $R^2$ and $R^3$ each independently represents mono to a maximum allowable number of substitutions, or no substitution; where each of $R^1$, $R^2$, and $R^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any two substituents may be joined or fused together to form a ring; and where $R^1$ or $R^3$ can join to another ligand via a linking group to form a ligand with higher denticity than bidentate.

An OLED comprising an anode, a cathode, and an organic layer disposed between the anode and the cathode is also disclosed, where the organic layer comprises a compound having the formula Ir($L_A$)($L_B$); where $L_A$ is a bidentate, tridentate, tetradentate, pentadentate, or hexadentate ligand; where $L_B$ is a monodentate, bidentate, tridentate, or tetradentate ligand, or not present; where the total denticity of $L_A$ plus $L_B$ is 6; where $L_A$ comprises at least one structure of Formula I:

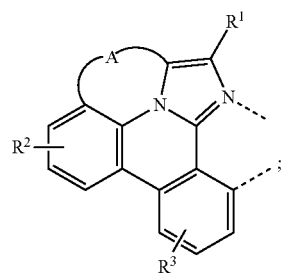

where A is a linking group having two to three linking atoms, wherein the linking atoms are each independently selected from the group consisting of C, Si, O, S, N, B; where $R^2$ and $R^3$ each independently represents mono to a maximum allowable number of substitutions, or no substitution; where each of $R^1$, $R^2$, and $R^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any two substituents may be joined or fused together to form a ring; and where $R^1$ or $R^3$ can join to another ligand via a linking group to form a higher denticity ligand.

A consumer product comprising the OLED is also disclosed.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
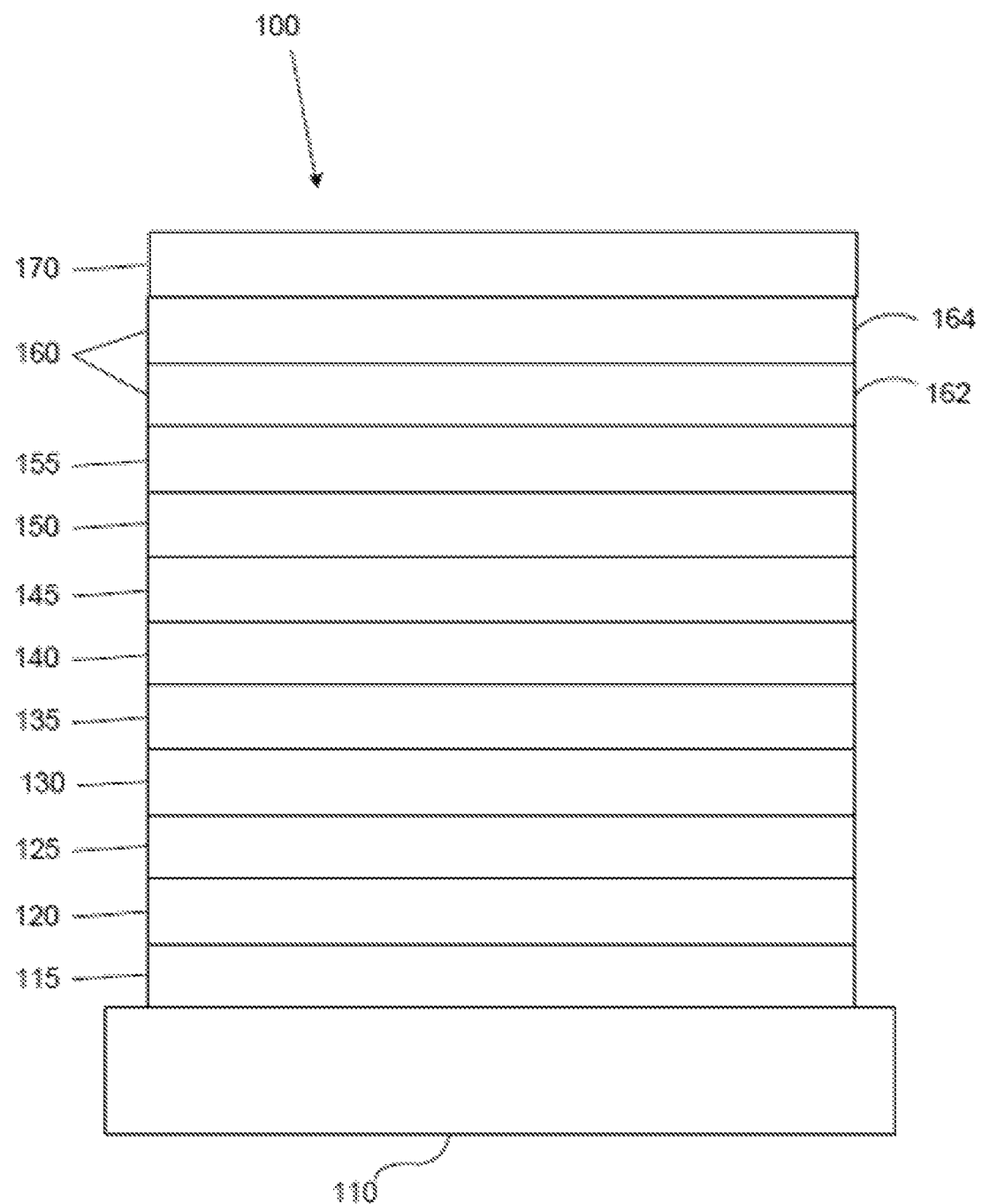
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
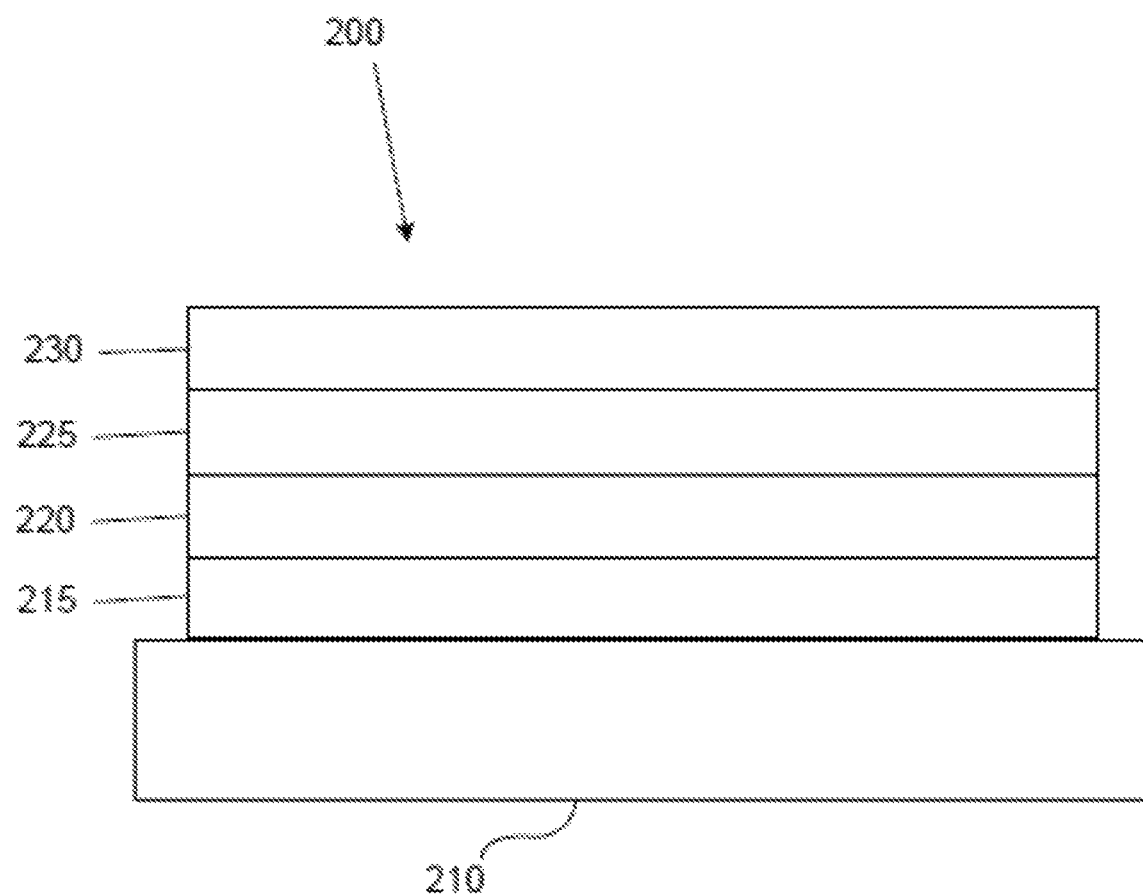
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —P($R_s$)$_3$ radical, wherein each R can be same or different.

The term "silyl" refers to a —Si($R_s$)$_3$ radical, wherein each $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group is optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group is optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group is optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group is optionally substituted.

The term "alkynyl" refers to and includes both straight and branched chain alkyne radicals. Preferred alkynyl groups are those containing two to fifteen carbon atoms. Additionally, the alkynyl group is optionally substituted.

The terms "aralkyl" or "arylalkyl" are used interchangeably and refer to an alkyl group that is substituted with an aryl group. Additionally, the aralkyl group is optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group is optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group is optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some instances, the preferred general substituents are selected from the group consisting of deuterium, fluorine, alkyl, cycloalkyl, alkoxy, aryloxy, amino, silyl, aryl, heteroaryl, sulfanyl, and combinations thereof.

In yet other instances, the more preferred general substituents are selected from the group consisting of deuterium, fluorine, alkyl, cycloalkyl, aryl, heteroaryl, and combinations thereof.

The term "substituted" refers to a substituent other than H that is bonded to the relevant position, e.g., a carbon. For example, where $R^1$ represents mono-substituted, then one $R^1$ must be other than H. Similarly, where $R^1$ represents di-substituted, then two of $R^1$ must be other than H. Similarly, where $R^1$ is unsubstituted, $R^1$ is hydrogen for all available positions. The maximum number of substitutions possible in a structure (for example, a particular ring or fused ring system) will depend on the number of atoms with available valencies.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C—H groups in the respective fragment can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed.* (*Reviews*) 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

A compound having the formula $Ir(L_A)(L_B)$ is disclosed. In the formula $Ir(L_A)(L_B)$, $L_A$ is a bidentate, tridentate, tetradentate, pentadentate, or hexadentate ligand. $L_B$ is a monodentate, bidentate, tridentate, or tetradentate ligand, or it is not present. The total denticity of $L_A$ plus $L_B$ is 6, where $L_A$ comprises at least one structure of Formula I:

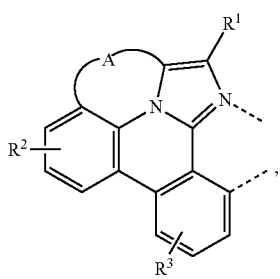

where A is a linking group having two to three linking atoms, where the linking atoms are each independently selected from the group consisting of C, Si, O, S, N, B; where $R^2$ and $R^3$ each independently represents mono to a maximum allowable number of substitutions, or no substitution; where each of $R^1$, $R^2$, and $R^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any two substituents may be joined or fused together to form a ring; and where $R^1$ or $R^3$ can join to another ligand via a linking group to form a ligand with higher denticity than bidentate. When the ligand is joined to another ligand to form a higher denticity ligand.

In some embodiments of the compound, each of $R^1$, $R^2$, and $R^3$ is independently selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof.

In some embodiments, the linking group A is independently selected from the group consisting of —$CR^AR^B$—$CR^CR^D$—, —$CR^AR^B$—$CR^CR^D$—$CR^ER^F$—, —$CR^AR^B$—$NR^C$—, —$CR^A$=$CR^B$—$CR^CR^D$—, —O—$SiR^AR^B$—, —$CR^AR^B$—S—, —$CR^AR^B$—O—, —C—$SiR^AR^B$—, and —$SiR^AR^B$—$SiR^CR^D$—, wherein each $R^A$ to $R^F$ can be same or different, and are independently selected from the group consisting of hydrogen, deuterium, alkyl, cycloalkyl, aryl, heteroaryl, and combinations thereof; and any adjacent $R^A$ to $R^F$ are optionally joined or fused into a 5-membered or 6-membered ring.

In some embodiments, the linking group A in Formula I is selected from the group consisting of:

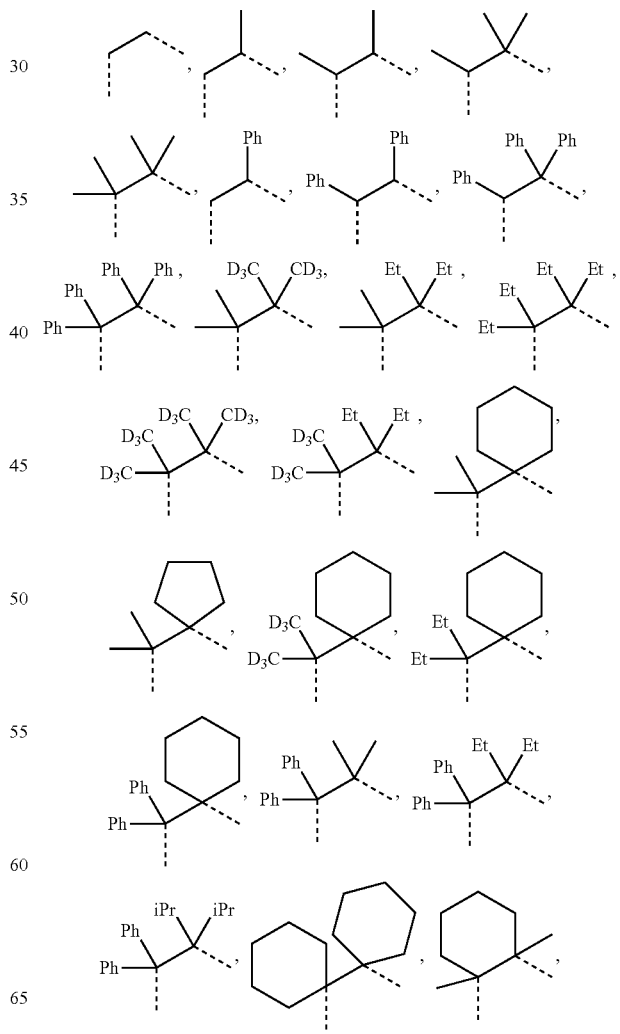

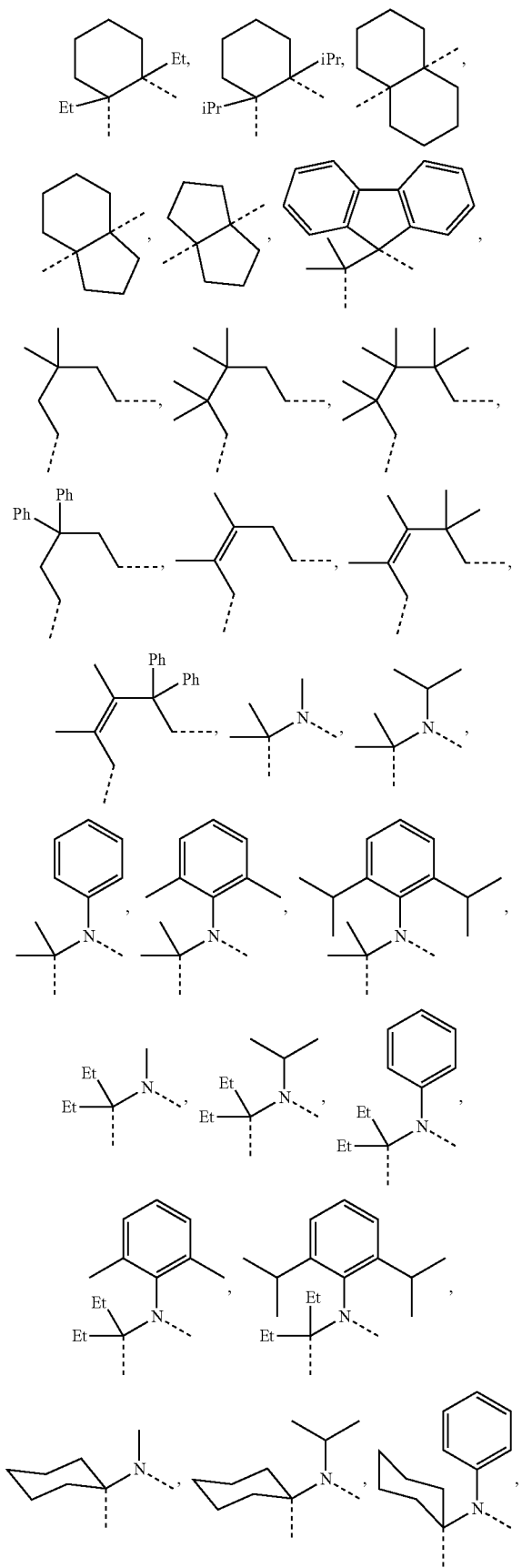
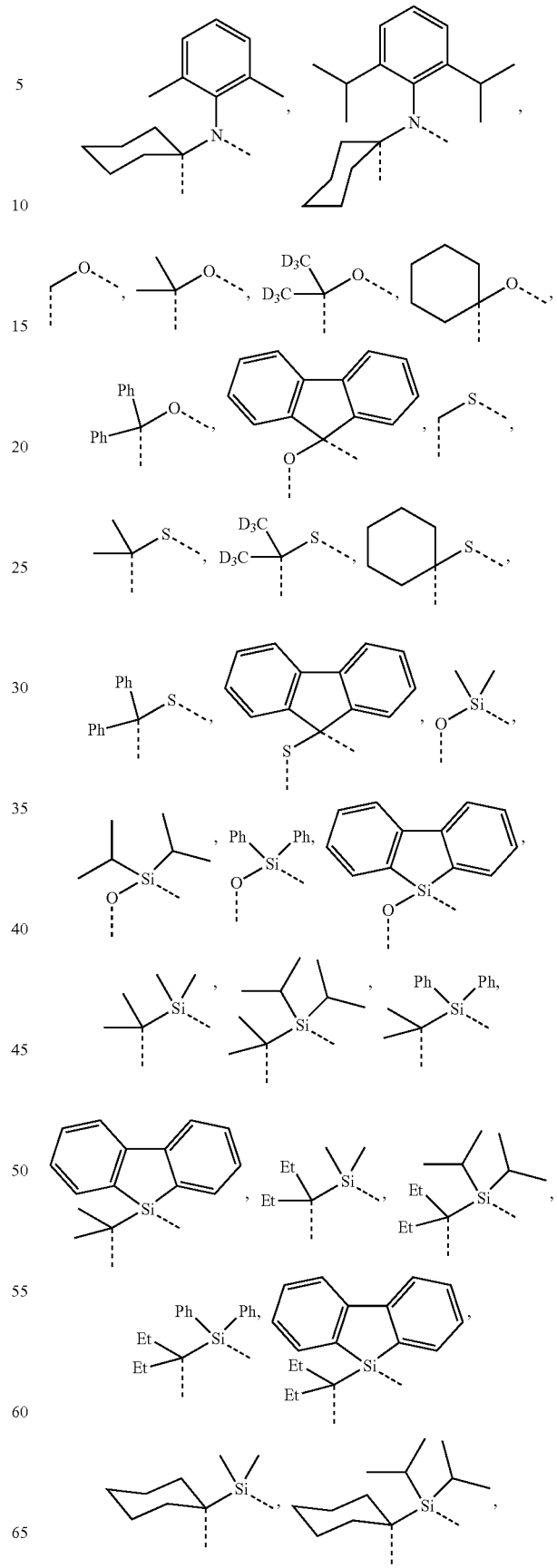

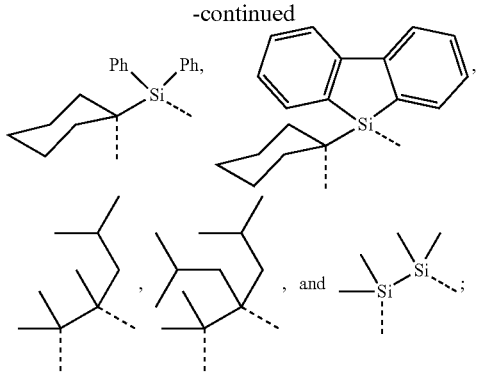

and the dashed lines represent the connecting bonds.

In some embodiments of the compound, the ligand $L_A$ comprises one structure of Formula I. In some embodiments, $L_A$ is a tetradentate ligand comprising two identical or two different structures of Formula I. In some embodiments, $L_A$ is a hexadentate ligand comprising three identical or three different structures of Formula I. In some embodiments of the compound, the ligand $L_B$ comprises one structure of Formula I. In some embodiments, $L_A$ is a tetradentate ligand comprising only one structure of Formula I. In some embodiments, $L_A$ is a hexadentate ligand comprising only one or two structures of Formula I.

In some embodiments, $L_A$ is a bidentate ligand, and $L_B$ is a tetradentate ligand. In some embodiments, $L_A$ is a tridentate ligand, and $L_B$ is a tridentate ligand. In some embodiments, $L_A$ is a tetradentate ligand, and $L_B$ is a bidentate ligand. In some embodiments, $L_A$ is a pentadentate ligand, and $L_B$ is a monodentate ligand. In some embodiments, $L_A$ is a hexadentate ligand, and $L_B$ is not present.

In some embodiments, the compound is a compound according to formula $Ir(L_A)_n(L_B)_m(Link)$; where each $L_A$ and $L_B$ represents a bidentate, monoanionic cyclometalating ligand that may or may not comprise one structure of Formula I may optionally be bound to other bidentate moieties; where at least one of $L_A$ contains a fragment described by Formula I; where n=1, 2, or 3; where m=0, 1, or 2; where n+m=3; and where Link is an organic linker further designated as $L_1$ or $L_2$ used to connect one or more of $L_A$ and/or $L_B$ to form tetradentate or hexadentate ligands. In some embodiments, $L_1$ and $L_2$ each can independently comprise 6-20 carbon atoms. In some embodiments, $L_1$ and $L_2$ each can independently comprise a 6-membered aromatic ring. In some embodiments, $L_1$ and $L_2$ each can independently comprise a cycloalkyl ring. In some embodiments, $L_1$ and $L_2$ can independently be partially or fully deuterated.

In some embodiments of the compound having the formula $Ir(L_A)_n(L_B)_m(Link)$, the compound is selected from the following structures $G_{nk}=Ir(Ligand\ 1)(Ligand\ 2)(Ligand\ 3)$ defined in the following table, wherein k is an integer from 1 to 16:

| $G_{nk}$ | Ligand 1 | Ligand 2 | Ligand 3 |
|---|---|---|---|
| $G_{n1}$ | $L_{Ai}$, wherein i = an integer from 1 to 6 | $L_{Ai}$, wherein i = an integer from 7 to 12 | $L_{Ai}$, wherein i = an integer from 7 to 12 |
| $G_{n2}$ | $L_{Ai}$, wherein i = an integer from 7 to 12 | $L_{Ai}$, wherein i = an integer from 7 to 12 | $L_{Ai}$, wherein i = an integer from 7 to 12 |
| $G_{n3}$ | $L_{Ai}$, wherein i = an integer from 1 to 6 | $L_{Ai}$, wherein i = an integer from 13 to 18 | $L_{Ai}$, wherein i = an integer from 13 to 18 |
| $G_{n4}$ | $L_{Ai}$, wherein i = an integer from 13 to 18 | $L_{Ai}$, wherein i = an integer from 13 to 18 | $L_{Ai}$, wherein i = an integer from 13 to 18 |
| $G_{n5}$ | $L_{Ai}$, wherein i = an integer from 1 to 6 | $L_{Bp}$, wherein p = an integer from 16 to 26 | $L_{Bp}$, wherein p = an integer from 16 to 26 |
| $G_{n6}$ | $L_{Ai}$, wherein i = an integer from 7 to 12 | $L_{Bp}$, wherein p = an integer from 16 to 26 | $L_{Bp}$, wherein p = an integer from 16 to 26 |
| $G_{n7}$ | $L_{Ai}$, wherein i = an integer from 1 to 6 | $L_{Bp}$, wherein p = an integer from 27 to 41 | $L_{Bp}$, wherein p = an integer from 27 to 41 |
| $G_{n8}$ | $L_{Ai}$, wherein i = an integer from 13 to 18 | $L_{Bp}$, wherein p = an integer from 27 to 41 | $L_{Bp}$, wherein p = an integer from 27 to 41 |
| $G_{n9}$ | $L_{Ai}$, wherein i = an integer from 7 to 12 | $L_{Ai}$, wherein i = an integer from 7 to 12 | $L_{Bp}$, wherein p = an integer from 16 to 26 |
| $G_{n10}$ | $L_{Ai}$, wherein i = an integer from 13 to 18 | $L_{Ai}$, wherein i = an integer from 13 to 18 | $L_{Bp}$, wherein p = an integer from 27 to 41 |
| $G_{n11}$ | $L_{Ai}$, wherein i = an integer from 1 to 6 | $L_{Ai}$, wherein i = an integer from 7 to 12 | $L_{Bp}$, wherein p = an integer from 16 to 26 |
| $G_{n12}$ | $L_{Ai}$, wherein i = an integer from 1 to 6 | $L_{Ai}$, wherein i = an integer from 13 to 18 | $L_{Bp}$, wherein p = an integer from 27 to 41 |
| $G_{n13}$ | $L_{Bp}$, wherein p = an integer from 1 to 15 | $L_{Ai}$, wherein i = an integer from 7 to 12 | $L_{Bp}$, wherein p = an integer from 16 to 26 |
| $G_{n14}$ | $L_{Bp}$, wherein p = an integer from 1 to 15 | $L_{Ai}$, wherein i = an integer from 13 to 18 | $L_{Bp}$, wherein p = an integer from 27 to 41 |
| $G_{n15}$ | $L_{Bp}$, wherein p = an integer from 1 to 15 | $L_{Ai}$, wherein i = an integer from 7 to 12 | $L_{Ai}$, wherein i = an integer from 7 to 12 |
| $G_{n16}$ | $L_{Bp}$, wherein p = an integer from 1 to 15 | $L_{Ai}$, wherein i = an integer from 13 to 18 | $L_{Ai}$, wherein i = an integer from 13 to 18 | where the ligands $L_{Ai}$ comprises the following structure:

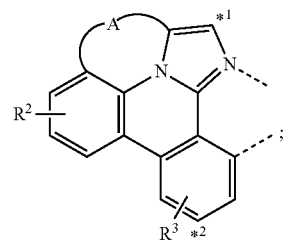

where the dashed lines represent bonds to the iridium atom;

where A is a linking group selected from the group consisting of:

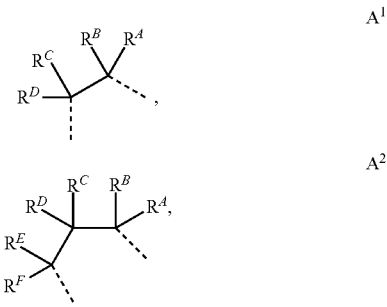

-continued $A^3$

<br>

$A^4$

<br>

$A^5$, and

<br>

$A^6$;

where the dashed lines in $A^1$ to $A^6$ indicate the connecting bonds;

wherein each $R^A$ to $R^F$ can be same or different, and are independently selected from the group consisting of hydrogen, deuterium, alkyl, cycloalkyl, aryl, hereroaryl, and combinations thereof; wherein any adjacent $R^A$ to $R^F$ are optionally joined or fused into a 5-membered or 6-membered ring;

where $L_{Bp}$ is selected from the group consisting of:

M1

<br>

M2

<br>

M3

<br>

M4

<br>

M5

<br>

M6

<br>

M7 wherein C is an organic linker selected from the group consisting of:

not present,

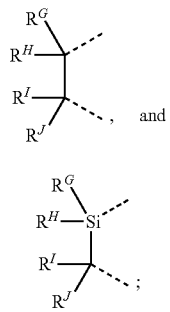

wherein the dashed lines indicate the connecting bonds;
wherein the carbon marked by *¹ connects to $L_1$ or $R^1$;
wherein the carbon marked by *² connects to $L_2$ or $R^3$
wherein the carbon marked by *³ connects to $L_1$ or $R^4$
wherein the carbon marked by *⁴ connects to $L_2$ or $R^5$;
wherein each of $R^4$ and $R^5$ independently represents mono to a maximum possible number of substitutions, or no substitution;
wherein each of $R^4$, $R^5$, $R^G$, $R^H$, $R^I$, and $R^J$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;
wherein R is selected from the group consisting of methyl, deuterated methyl, isopropyl, substituted phenyl, and substituted dibenzofuran;
wherein the ligands $L_{Ai}$, wherein i is an integer from 1 to 18, are defined as follows:

| $L_{Ai}$ | A | *¹ | *² |
|---|---|---|---|
| $L_{A1}$ | $A^1$ | $R^1$ | $R^3$ |
| $L_{A2}$ | $A^2$ | $R^1$ | $R^3$ |
| $L_{A3}$ | $A^3$ | $R^1$ | $R^3$ |
| $L_{A4}$ | $A^4$ | $R^1$ | $R^3$ |
| $L_{A5}$ | $A^5$ | $R^1$ | $R^3$ |
| $L_{A6}$ | $A^6$ | $R^1$ | $R^3$ |
| $L_{A7}$ | $A^1$ | $L_1$ | $R^3$ |
| $L_{A8}$ | $A^2$ | $L_1$ | $R^3$ |
| $L_{A9}$ | $A^3$ | $L_1$ | $R^3$ |
| $L_{A10}$ | $A^4$ | $L_1$ | $R^3$ |
| $L_{A11}$ | $A^5$ | $L_1$ | $R^3$ |
| $L_{A12}$ | $A^6$ | $L_1$ | $R^3$ |
| $L_{A13}$ | $A^1$ | $R^1$ | $L_2$ |
| $L_{A14}$ | $A^2$ | $R^1$ | $L_2$ |
| $L_{A15}$ | $A^3$ | $R^1$ | $L_2$ |
| $L_{A16}$ | $A^4$ | $R^1$ | $L_2$ |
| $L_{A17}$ | $A^5$ | $R^1$ | $L_2$ |
| $L_{A18}$ | $A^6$ | $R^1$ | $L_2$; | wherein the ligands $L_{Bp}$, wherein p is an integer from 1 to 41, are defined as follows:

| $L_{Bp}$ | having a structure | C | *³ | *⁴ |
|---|---|---|---|---|
| $L_{B1}$ | M1 | $C_1$ | $R^4$ | $R^5$ |
| $L_{B2}$ | M1 | $C_2$ | $R^4$ | $R^5$ |
| $L_{B3}$ | M1 | $C_3$ | $R^4$ | $R^5$ |
| $L_{B4}$ | M2 | — | $R^4$ | $R^5$ |
| $L_{B5}$ | M3 | — | $R^4$ | $R^5$ |
| $L_{B6}$ | M4 | $C_1$ | $R^4$ | $R^5$ |
| $L_{B7}$ | M4 | $C_2$ | $R^4$ | $R^5$ |
| $L_{B8}$ | M4 | $C_3$ | $R^4$ | $R^5$ |
| $L_{B9}$ | M5 | $C_1$ | $R^4$ | $R^5$ |
| $L_{B10}$ | M5 | $C_2$ | $R^4$ | $R^5$ |
| $L_{B11}$ | M5 | $C_3$ | $R^4$ | $R^5$ |
| $L_{B12}$ | M6 | $C_1$ | — | $R^5$ |
| $L_{B13}$ | M6 | $C_2$ | — | $R^5$ |
| $L_{B14}$ | M6 | $C_3$ | — | $R^5$ |
| $L_{B15}$ | M7 | — | — | $R^5$ |
| $L_{B16}$ | M1 | $C_1$ | $L_1$ | $R^5$ |
| $L_{B17}$ | M1 | $C_2$ | $L_1$ | $R^5$ |
| $L_{B18}$ | M1 | $C_3$ | $L_1$ | $R^5$ |
| $L_{B19}$ | M2 | — | $L_1$ | $R^5$ |
| $L_{B20}$ | M3 | — | $L_1$ | $R^5$ |
| $L_{B21}$ | M4 | $C_1$ | $L_1$ | $R^5$ |
| $L_{B22}$ | M4 | $C_2$ | $L_1$ | $R^5$ |
| $L_{B23}$ | M4 | $C_3$ | $L_1$ | $R^5$ |
| $L_{B24}$ | M5 | $C_1$ | $L_1$ | $R^5$ |
| $L_{B25}$ | M5 | $C_2$ | $L_1$ | $R^5$ |
| $L_{B26}$ | M5 | $C_3$ | $L_1$ | $R^5$ |
| $L_{B27}$ | M1 | $C_1$ | $R^4$ | $L_2$ |
| $L_{B28}$ | M1 | $C_2$ | $R^4$ | $L_2$ |
| $L_{B29}$ | M1 | $C_3$ | $R^4$ | $L_2$ |
| $L_{B30}$ | M2 | — | $R^4$ | $L_2$ |
| $L_{B31}$ | M3 | — | $R^4$ | $L_2$ |
| $L_{B32}$ | M4 | $C_1$ | $R^4$ | $L_2$ |
| $L_{B33}$ | M4 | $C_2$ | $R^4$ | $L_2$ |
| $L_{B34}$ | M4 | $C_3$ | $R^4$ | $L_2$ |
| $L_{B35}$ | M5 | $C_1$ | $R^4$ | $L_2$ |
| $L_{B36}$ | M5 | $C_2$ | $R^4$ | $L_2$ |
| $L_{B37}$ | M5 | $C_3$ | $R^4$ | $L_2$ |
| $L_{B38}$ | M6 | $C_1$ | — | $L_2$ |
| $L_{B39}$ | M6 | $C_2$ | — | $L_2$ |
| $L_{B40}$ | M6 | $C_3$ | — | $L_2$ |
| $L_{B41}$ | M7 | — | — | $L_2$. |

In some embodiments of the compound having the formula $Ir(L_A)_n(L_B)_m(Link)$, the compound is a compound V having the formula $Ir(L_x)(L_y\text{-}L_z\text{-}Link_q)$ or a compound W having the formula $Ir(L_x\text{-}L_y\text{-}L_z\text{-}Link_q)$.

In compound V, $L_x$ is a bidentate ligand and $(L_y\text{-}L_z\text{-}Link_q)$ is a tetradentate ligand formed by linking bindentate ligands $L_y$ and $L_z$ with $Link_q$;

wherein V is an integer defined by $V=371((478((478(q-1)+z)-1)+y)-1)+x$;

wherein one of the following conditions (a)-(d) are true:
(a) wherein x is an integer from 1 to 132, y and z are each independently an integer from 1 to 371, and q is an integer from 1 to 8;
(b) wherein x is an integer from 1 to 132, y and z are each independently an integer from 372 to 478, and q is an integer from 9 to 21;
(c) wherein x is an integer from 133 to 371, y is an integer from 1 to 132, z is an integer from 1 to 371, and q is an integer from 1 to 8; and
(d) wherein x is an integer from 133 to 371, y is an integer from 440 to 478, z is an integer from 372 to 478, and q is an integer from 9 to 21.

In compound W, $(L_x\text{-}L_y\text{-}L_z\text{-}Link_q)$ is a hexadentate ligand formed by connecting bidentate $L_x$, $L_y$, and $L_z$ with a linker $Link_q$;

wherein W is an integer defined by $W=478((478((478(q-1)+z)-1)+y)-1)+x$,
wherein x is an integer from 1 and 132, and y and z are each independently an integer from 1 to 371, and q is an integer from 22 to 39; or
wherein x is an integer from 440 to 478, and y and z are each independently an integer from 372 to 478, and q is an integer from 40 to 53.

In both the compound V and the compound W, each of $L_x$, $L_y$, and $L_z$ is one of the following structures L1 to L478:

L1, L2, L3, L4, L5, L6, L7, L8, L9, L10, L11, L12, L13, L14, L15, L16, L17, L18, L19, L20, and L21 having the structure

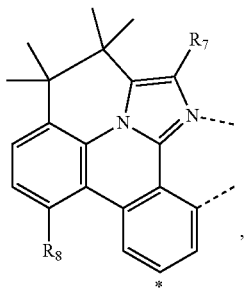
, wherein in L1, $R_7$=H, and $R_8$=H, in L2, $R_7$=D, and $R_8$=H,
in L3, $R_7$=H, and $R_8$=Me, in L4, $R_7$=D, and $R_8$=Me,
in L5, $R_7$=H, and $R_8$=CD$_3$, in L6, $R_7$=D, and $R_8$=CD$_3$,
in L7, $R_7$=Ph, and $R_8$=H, in L8, $R_7$=Ph, and $R_8$=Me,
in L9, $R_7$=Ph, and $R_8$=CD$_3$, in L10, $R_7$=m-tol, and $R_8$=H,
in L11, $R_7$=m-tol, and $R_8$=Me, in L12, $R_7$=m-tol, and $R_8$=CD$_3$,
in L13, $R_7$=m-CD$_3$C$_6$H$_4$, and $R_8$=H, in L14, $R_7$=m-CD$_3$C$_6$H$_4$, and $R_8$=Me,
in L15, $R_7$=m-CD$_3$C$_6$H$_4$, and $R_8$=CD$_3$, in L16, $R_7$=p-tol, and $R_8$=H,
in L17, $R_7$=p-tol, and $R_8$=Me, in L18, $R_7$=p-tol, and $R_8$=CD$_3$,
in L19, $R_7$=p-CD$_3$C$_6$H$_4$, and $R_8$=H, in L20, $R_7$=p-CD$_3$C$_6$H$_4$, and $R_8$=Me,
and in L21, $R^7$=p-CD$_3$C$_6$H$_4$, and $R_8$=CD$_3$, L22, L23, L24, L25, L26, L27, L28, L29, L30, L31, L32, L33, L34, L35, L36, L37, L38, L39, L40, L41, and L42 having the structure

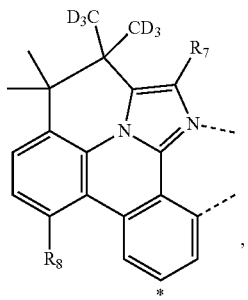
, wherein in L22, $R_7$=H, and $R_8$=H, in L23, $R_7$=D, and $R_8$=H,
in L24, $R_7$=H, and $R_8$=Me, in L25, $R_7$=D, and $R_8$=Me,
in L26, $R_7$=H, and $R_8$=CD$_3$, in L27, $R_7$=D, and $R_8$=CD$_3$,
in L28, $R_7$=Ph, and $R_8$=H, in L29, $R_7$=Ph, and $R_8$=Me,
in L30, $R_7$=Ph, and $R_8$=CD$_3$, in L31, $R_y$=m-tol, and $R_8$=H,
in L32, $R_7$=m-tol, and $R_8$=Me, in L33, $R_7$=m-tol, and $R_8$=CD$_3$,
in L34, $R_7$=m-CD$_3$C$_6$H$_4$, and $R_8$=H, in L35, $R_7$=m-CD$_3$C$_6$H$_4$, and $R_8$=Me,
in L36, $R_7$=m-CD$_3$C$_6$H$_4$, and $R_8$=CD$_3$, in L37, $R_7$=p-tol, and $R_8$=H,
in L38, $R_7$=p-tol, and $R_8$=Me, in L39, $R_7$=p-tol, and $R_8$=CD$_3$,
in L40, $R_7$=p-CD$_3$C$_6$H$_4$, and $R_8$=H, in L41, $R_7$=p-CD$_3$C$_6$H$_4$, and $R_8$=Me,
and in L42, $R_7$=p-CD$_3$C$_6$H$_4$, and $R_8$=CD$_3$, L43, L44, L45, L46, L47, L48, L49, L50, L51, L52, L53, L54, L55, L56, L57, L58, L59, L60, L61, L62, and L63 having the structure

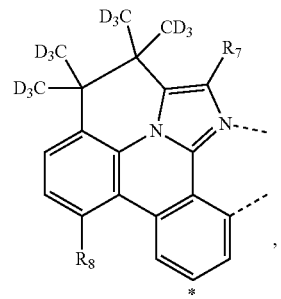
, wherein in L43, $R_7$=H, and $R_8$=H, in L44, $R_7$=D, and $R_8$=H,
in L45, $R_7$=H, and $R_8$=Me, in L46, $R_7$=D, and $R_8$=Me,
in L47, $R_7$=H, and $R_8$=CD$_3$, in L48, $R_7$=D, and $R_8$=CD$_3$,
in L49, $R_7$=Ph, and $R_8$=H, in L50, $R_7$=Ph, and $R_8$=Me,
in L51, $R_7$=Ph, and $R_8$=CD$_3$, in L52, $R_7$=m-tol, and $R_8$=H,
in L53, $R_7$=m-tol, and $R_8$=Me, in L54, $R_7$=m-tol, and $R_8$=CD$_3$,
in L55, $R_7$=m-CD$_3$C$_6$H$_4$, and $R_8$=H, in L56, $R_7$=m-CD$_3$C$_6$H$_4$, and $R_8$=Me,
in L57, $R_7$=m-CD$_3$C$_6$H$_4$, and $R_8$=CD$_3$, in L58, $R_7$=p-tol, and $R_8$=H,
in L59, $R_7$=p-tol, and $R_8$=Me, in L60, $R_7$=p-tol, and $R_8$=CD$_3$,
in L61, $R_7$=p-CD$_3$C$_6$H$_4$, and $R_8$=H, in L62, $R_7$=p-CD$_3$C$_6$H$_4$, and $R_8$=Me,
and in L63, $R_7$=p-CD$_3$C$_6$H$_4$, and $R_8$=CD$_3$, L64, L65, L66, L67, L68, L69, L70, L71, L72, L73, L74, L75, L76, L77, L78, L79, L80, L81, L82, L83, and L84 having the structure

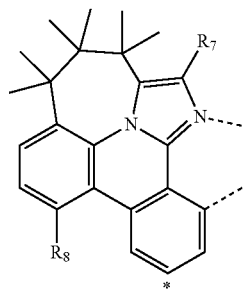
, wherein in L64, $R_7$=H, and $R_8$=H, in L65, $R_7$=D, and $R_8$=H,
in L66, $R_7$=H, and $R_8$=Me, in L67, $R_7$=D, and $R_8$=Me,
in L68, $R_7$=H, and $R_8$=CD$_3$, in L69, $R_7$=D, and $R_8$=CD$_3$,
in L70, $R_7$=Ph, and $R_8$=H, in L71, $R_7$=Ph, and $R_8$=Me, in L72, R$_7$=Ph, and R$_8$=CD$_3$, in L73, R$_7$=m-tol, and R$_8$=H, in L74, R$_7$=m-tol, and R$_8$=Me, in L75, R$_7$=m-tol, and R$_8$=CD$_3$, in L76, R$_7$=m-CD$_3$C$_6$H$_4$, and R$_8$=H, in L77, R$_7$=m-CD$_3$C$_6$H$_4$, and R$_8$=Me, in L78, R$_7$=m-CD$_3$C$_6$H$_4$, and R$_8$=CD$_3$, in L79, R$_7$=p-tol, and R$_8$=H, in L80, R$_7$=p-tol, and R$_8$=Me, in L81, R$_7$=p-tol, and R$_8$=CD$_3$, in L82, R$_7$=p-CD$_3$C$_6$H$_4$, and R$_8$=H, in L83, R$_7$=p-CD$_3$C$_6$H$_4$, and R$_8$=Me, and in L84, R$_7$=p-CD$_3$C$_6$H$_4$, and R$_8$=CD$_3$, L85, L86, L87, L88, L89, L90, L91, L92, L93, L94, L95, L96, L97, L98, L99, L100, L101, and L102 having the structure

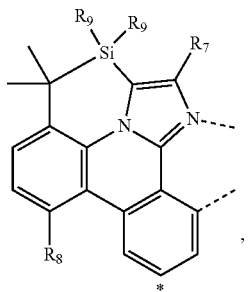

wherein in L85, R$_7$=H, R$_8$=H, and R$_9$=Me, in L86, R$_7$=H, R$_8$=Me, and R$_9$=Me, in L87, R$_7$=H, R$_8$=CD$_3$, and R$_9$=Me, in L88, R$_7$=Ph, R$_8$=H, and R$_9$=Me, in L89, R$_7$=Ph, R$_8$=Me, and R$_9$=Me, in L90, R$_7$=Ph, R$_8$=CD$_3$, and R$_9$=Me, in L91, R$_7$=H, R$_8$=H, and R$_9$=$^i$Pr, in L92, R$_7$=H, R$_8$=Me, and R$_9$=$^i$Pr, in L93, R$_7$=H, R$_8$=CD$_3$, and R$_9$=$^i$Pr, in L94, R$_7$=Ph, R$_8$=H, and R$_9$=$^i$Pr, in L95, R$_7$=Ph, R$_8$=Me, and R$_9$=$^i$Pr, in L96, R$_7$=Ph, R$_8$=CD$_3$, and R$_9$=$^i$Pr, in L97, R$_7$=H, R$_8$=H, and R$_9$=Ph, in L98, R$_7$=H, R$_8$=Me, and R$_9$=Ph, in L99, R$_7$=H, R$_8$=CD$_3$, and R$_9$=Ph, in L100, R$_7$=Ph, R$_8$=H, and R$_9$=Ph, in L101, R$_7$=Ph, R$_8$=Me, and R$_9$=Ph, and in L102, R$_7$=Ph, R$_8$=CD$_3$, and R$_9$=Ph, L103, L104, L105, L106, L107, and L108 having the structure

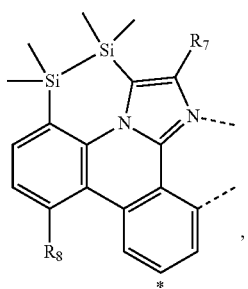

wherein in L103, R$_7$=H, and R$_8$=H, in L104, R$_7$=H, and R$_8$=Me, in L105, R$_7$=H, and R$_8$=CD$_3$, in L106, R$_7$=Ph, and R$_8$=H, in L107, R$_7$=Ph, and R$_8$=Me, and in L108, R$_7$=Ph, and R$_8$=CD$_3$, L109, L110, L111, L112, L113, L114, L115, L116, L117, L118, L119, L120, L121, L122, L123, L124, L125, and L126 having the structure

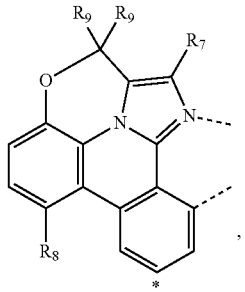

wherein in L109, R$_7$=H, R$_8$=H, and R$_9$=Me, in L110, R$_7$=H, R$_8$=Me, and R$_9$=Me, in L111, R$^7$=H, R$_8$=CD$_3$, and R$_9$=Me, in L112, R$_7$=Ph, R$_8$=H, and R$_9$=Me, in L113, R$_7$=Ph, R$_8$=Me, and R$_9$=Me, in L114, R$_7$=Ph, R$_8$=CD$_3$, and R$_9$=Me, in L115, R$_7$=H, R$_8$=H, and R$_9$=CD$_3$, in L116, R$_7$=H, R$_8$=Me, and R$_9$=CD$_3$, in L117, R$_7$=H, R$_8$=CD$_3$, and R$_9$=CD$_3$, in L118, R$_7$=Ph, R$_8$=H, and R$_9$=CD$_3$, in L119, R$_7$=Ph, R$_8$=Me, and R$_9$=CD$_3$, in L120, R$_7$=Ph, R$_8$=CD$_3$, and R$_9$=CD$_3$, in L121, R$_7$=H, R$_8$=H, and R$_9$=Ph, in L122, R$_7$=H, R$_8$=Me, and R$_9$=Ph, in L123, R$_7$=H, R$_8$=CD$_3$, and R$_9$=Ph, in L124, R$_7$=Ph, R$_8$=H, and R$_9$=Ph, in L125, R$_7$=Ph, R$_8$=Me, and R$_9$=Ph, and in L126, R$_7$=Ph, R$_8$=CD$_3$, and R$_9$=Ph, L127, L128, L129, L130, L131, and L132 having the structure

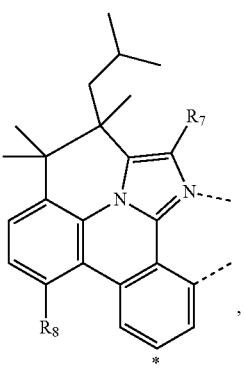

wherein in L127, R$_7$=H, and R$_8$=H, in L128, R$_7$=H, and R$_8$=Me, in L129, R$_7$=H, and R$_8$=CD$_3$, in L130, R$_7$=Ph, and R$_8$=H, in L131, R$_7$=Ph, and R$_8$=Me, and in L132, R$_7$=Ph, and R$_8$=CD$_3$, L133, L134, L135, L136, L137, L138, L139, L140, L141, L142, L143, and L144 having the structure

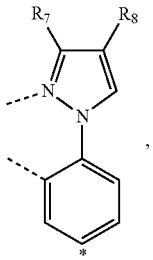

wherein in L133, R$_7$=H, and R$_8$=H, in L134, R$_7$=H, and R$_8$=Ph,
in L135, R$_7$=H, and R$_8$=2,6-Me$_2$-C$_6$H$_3$, in L136, R$_7$=H, and R$_8$=2,6-(CD$_3$)$_2$-C$_6$H$_3$,
in L137, R$_7$=H, and R$_8$=2,6-($^t$Bu)$_2$-C$_6$H$_3$, in L138, R$_7$=Ph, and R$_8$=H,
in L139, R$_7$=3,5-Me$_2$-C$_6$H$_3$, and R$_8$=H, and in L140, R$_7$=3,5-(CD$_3$)$_2$-C$_6$H$_3$, and R$_8$=H,
in L141, R$_7$=3,5-Me$_2$-C$_6$H$_3$, and R$_8$=Ph, and in L142, R$_7$=3,5-(CD$_3$)$_2$-C$_6$H$_3$, and R$_8$=Ph,
in L143, R$_7$=3,5-Me$_2$-C$_6$H$_3$, and R$_8$=2,6-Me$_2$-C$_6$H$_3$,
and in L144, R$_7$=3,5-(CD$_3$)$_2$-C$_6$H$_3$, and R$_8$=2,6-(CD$_3$)$_2$-C$_6$H$_3$,
L145, L146, L147, L148, L149, L150, L151, L152, and L153 having the structure

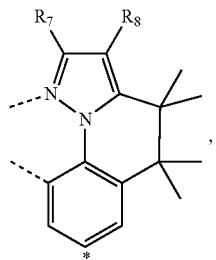

wherein in L145, R$_7$=H, and R$_8$=H, in L146, R$_7$=H, and R$_8$=Ph,
in L147, R$_7$=H, and R$_6$=2,6-Me$_2$-C$_6$H$_3$, in L148, R$_7$=H, and R$_8$=2,6-(CD$_3$)$_2$-C$_6$H$_3$,
in L149, R$_7$=Ph, and R$_8$=H, in L150, R$_7$=3,5-Me$_2$-C$_6$H$_3$, and R$_8$=H,
in L151, R$_7$=3,5-(CD$_3$)$_2$-C$_6$H$_3$, and R$_8$=H, and in L152, R$_7$=3,5-Me$_2$-C$_6$H$_3$, and R$_8$=Ph,
and in L153, R$_7$=3,5-(CD$_3$)$_2$-C$_6$H$_3$, and R$_6$=Ph,
L154, L155, L156, L157, L158, L159, L160, L161, and L162 having the structure

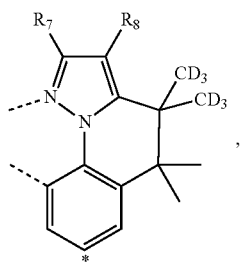

wherein in L154, R$_7$=H, and R$_8$=H, in L155, R$_7$=H, and R$_8$=Ph,
in L156, R$_7$=H, and R$_8$=2,6-Me$_2$-C$_6$H$_3$, in L157, R$_7$=H, and R$_8$=2,6-(CD$_3$)$_2$-C$_6$H$_3$,
in L158, R$_7$=Ph, and R$_8$=H, in L159, R$_7$=3,5-Me$_2$-C$_6$H$_3$, and R$_8$=H,
in L160, R$_7$=3,5-(CD$_3$)$_2$-C$_6$H$_3$, and R$_8$=H, and in L161, R$_7$=3,5-Me$_2$-C$_6$H$_3$, and R$_8$=Ph,
and in L162, R$_7$=3,5-(CD$_3$)$_2$-C$_6$H$_3$, and R$_6$=Ph,
L163, L164, L165, L166, L167, L168, L169, L170, and L171 having the structure

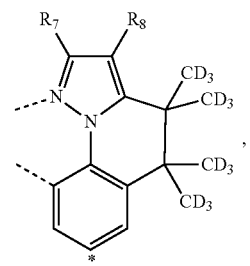

wherein in L163, R$_7$=H, and R$_8$=H, in L164, R$_7$=H, and R$_8$=Ph,
in L165, R$_7$=H, and R$_8$=2,6-Me$_2$-C$_6$H$_3$, in L166, R$_7$=H, and R$_8$=2,6-(CD$_3$)$_2$-C$_6$H$_3$,
in L167, R$_7$=Ph, and R$_8$=H, in L168, R$_7$=3,5-Me$_2$-C$_6$H$_3$, and R$_8$=H,
in L169, R$_7$=3,5-(CD$_3$)$_2$-C$_6$H$_3$, and R$_8$=H, and in L170, R$_7$=3,5-Me$_2$-C$_6$H$_3$, and R$_8$=Ph,
and in L171, R$_7$=3,5-(CD$_3$)$_2$-C$_6$H$_3$, and R$_6$=Ph,
L172, L173, L174, L175, L176, L177, L178, L179, and L180 having the structure

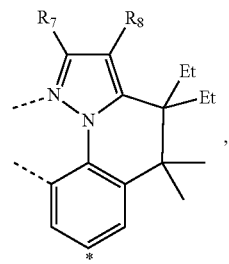

wherein in L172, R$_7$=H, and R$_8$=H, in L173, R$_7$=H, and R$_8$=Ph,
in L174, R$_7$=H, and R$_8$=2,6-Me$_2$-C$_6$H$_3$, in L175, R$_7$=H, and R$_8$=2,6-(CD$_3$)$_2$-C$_6$H$_3$,
in L176, R$_7$=Ph, and R$_8$=H, in L177, R$_7$=3,5-Me$_2$-C$_6$H$_3$, and R$_8$=H,
in L178, R$_7$=3,5-(CD$_3$)$_2$-C$_6$H$_3$, and R$_8$=H, and in L179, R$_7$=3,5-Me$_2$-C$_6$H$_3$, and R$_8$=Ph,
and in L180, R$_7$=3,5-(CD$_3$)$_2$-C$_6$H$_3$, and R$_8$=Ph, L181, L182, L183, L184, L185, L186, L187, L188, and L189 having the structure

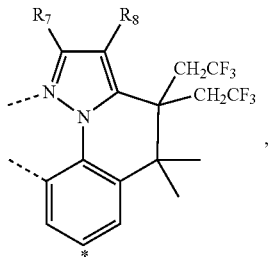

wherein in L181, R$_7$=H, and R$_8$=H, in L182, R$_7$=H, and R$_8$=Ph, in L183, R$_7$=H, and R$_8$=2,6-Me$_2$-C$_6$H$_3$, in L184, R$_7$=H, and R$_8$=2,6-(CD$_3$)$_2$-C$_6$H$_3$, in L185, R$_7$=Ph, and R$_8$=H, in L186, R$_7$=3,5-Me$_2$-C$_6$H$_3$, and R$_8$=H, in L187, R$_7$=3,5-(CD$_3$)$_2$-C$_6$H$_3$, and R$_8$=H, and in L188, R$_7$=3,5-Me$_2$-C$_6$H$_3$, and R$_8$=Ph, and in L189, R$_7$=3,5-(CD$_3$)$_2$-C$_6$H$_3$, and R$_8$=Ph, L190, L191, L192, L193, L194, and L195 having the structure

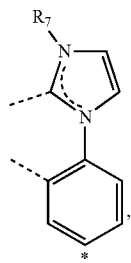

wherein in L190, R$_7$=Me, in L191, R$_7$=CD$_3$, in L192, R$_7$=$^i$Pr, in L193, R$_7$=Ph, in L194, R$_7$=2,6-Me$_2$-C$_6$H$_3$, and in L195, R$_7$=3,5-Me$_2$-C$_6$H$_3$, L196, L197, L198, L199, L200, and L201 having the structure

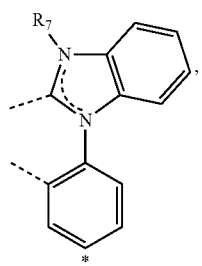

wherein in L196, R$_7$=Me, in L197, R$_7$=CD$_3$, in L198, R$_7$=$^i$Pr, in L199, R$_7$=Ph, in L200, R$_7$=2,6-Me$_2$-C$_6$H$_3$, and in L201, R$_7$=3,5-Me$_2$-C$_6$H$_3$, L202, L203, L204, L205, L206, and L207 having the structure

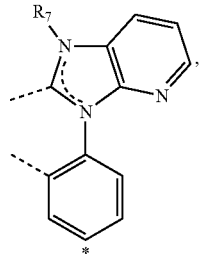

wherein in L202, R$_7$=Me, in L203, R$_7$=CD$_3$, in L204, R$_7$=$^i$Pr, in L205, R$_7$=Ph, in L206, R$_7$=2,6-Me$_2$-C$_6$H$_3$, and in L207, R$_7$=3,5-Me$_2$-C$_6$H$_3$, L208, L209, L210, L211, L212, and L213 having the structure

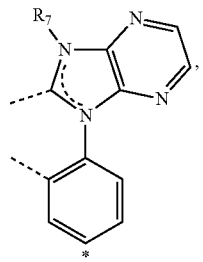

wherein in L208, R$_7$=Me, in L209, R$_7$=CD$_3$, in L210, R$_7$=$^i$Pr, in L211, R$_7$=Ph, in L212, R$_7$=2,6-Me$_2$-C$_6$H$_3$, and in L213, R$_7$=3,5-Me$_2$-C$_6$H$_3$, L214, L215, L216, L217, L218, and L219 having the structure

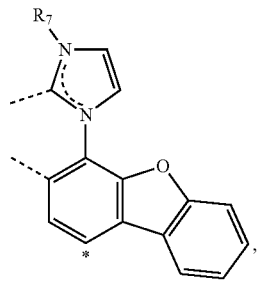

wherein in L214, R$_7$=Me, in L215, R$_7$=CD$_3$, in L216, R$_7$=$^i$Pr, in L217, R$_7$=Ph, in L218, R$_7$=2,6-Me$_2$-C$_6$H$_3$, and in L219, R$_7$=3,5-Me$_2$-C$_6$H$_3$, L220, L221, L222, L223, L224, and L225 having the structure

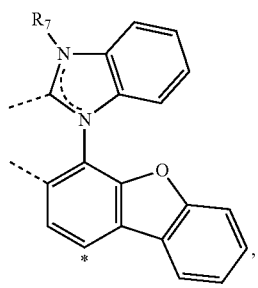

wherein in L220, $R_7$=Me, in L221, $R_7$=$CD_3$, in L222, $R_7$=$^i$Pr, in L223, $R_7$=Ph, in L224, $R_7$=2,6-$Me_2$-$C_6H_3$, and in L225, $R_7$=3,5-$Me_2$-$C_6H_3$, L226, L227, L228, L229, L230, and L231 having the structure

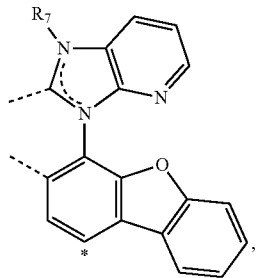

wherein in L226, $R_7$=Me, in L227, $R_7$=$CD_3$, in L228, $R_7$=$^i$Pr, in L229, $R_7$=Ph, in L230, $R_7$=2,6-$Me_2$-$C_6H_3$, and in L231, $R_7$=3,5-$Me_2$-$C_6H_3$, L232, L233, L234, L235, L236, and L237 having the structure

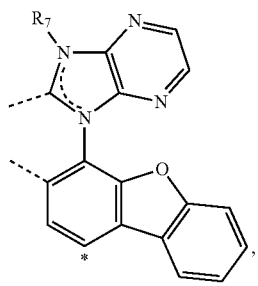

wherein in L232, $R_7$=Me, in L233, $R_7$=$CD_3$, in L234, $R_7$=$^i$Pr, in L235, $R_7$=Ph, in L236, $R_7$=2,6-$Me_2$-$C_6H_3$, and in L237, $R_7$=3,5-$Me_2$-$C_6H_3$, L238, L239, L240, and L241 having the structure

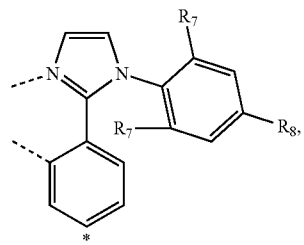

wherein in L238, $R_7$=Me, and $R_8$=H, in L239, $R_7$=$^i$Pr, and $R_8$=H, in L240, $R_7$=Me, and $R_8$=Ph, and in L241, $R_7$=$^i$Pr, and $R_8$=Ph, L242, and L243 having the structure

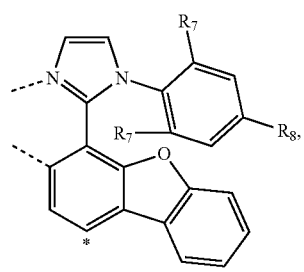

wherein in L242, $R_7$=Me, and $R_8$=H, and in L243, $R_7$=Me, and $R_8$=Ph,

L244, and L245 having the structure

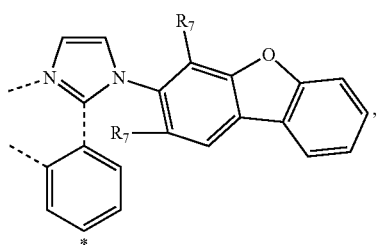

wherein in L244, $R_7$=Me, and in L245, $R_7$=$^i$Pr,

L246 having the structure

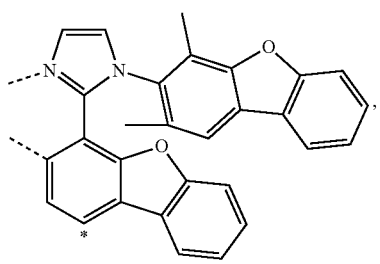

L247, L248, L249, and L250 having the structure

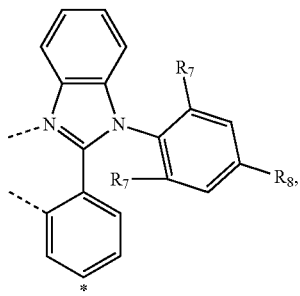

wherein in L247, R$_7$=Me, and R$_8$=H, in L248, R$_7$=$^i$Pr, and R$_8$=H,
in L249, R$_7$=Me, and R$_8$=Ph, and in L250, R$_7$=$^i$Pr, and R$_8$=Ph, L250, and L251 having the structure

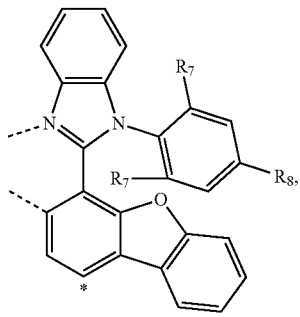

wherein in L250, R$_7$=Me, and R$_8$=H, and in L251, R$_7$=Me, and R$_8$=Ph,

L252, and L253 having the structure

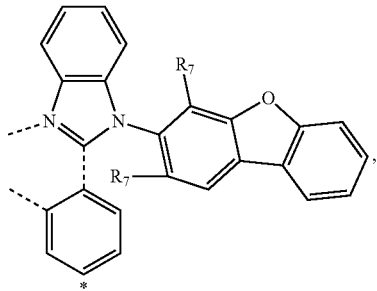

wherein in L252, R$_7$=Me, and in L253, R$_7$=$^i$Pr,

L255 having the structure

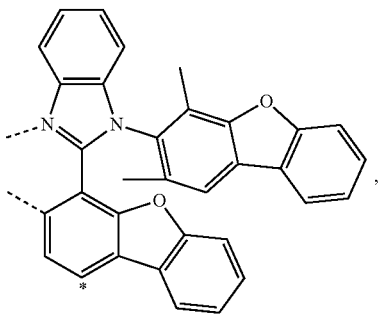

L256, L257, L258, L259, L260, L261, L262, L263, L264, L265, L266, L267, and L268 having the structure

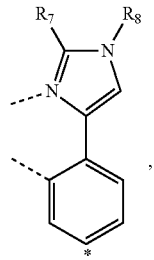

wherein in L256, R$_7$=H, and R$_8$=Me, in L257, R$_7$=H, and R$_8$=CD$_3$,
in L258, R$_7$=H, and R$_8$=$^i$Pr, in L259, R$_7$=H, and R$_8$=2,6-Me$_2$-C$_6$H$_3$,
in L260, R$_7$=H, and R$_s$=2,6-$^i$Pr$_2$-C$_6$H$_3$, in L261, R$_7$=Me, and R$_8$=2,6-Me$_2$-C$_6$H$_3$,
in L262, R$_7$=Me, and R$_8$=2,6-$^i$Pr$_2$-C$_6$H$_3$, in L263, R$_7$=CD$_3$, and R$_8$=2,6-Me$_2$-C$_6$H$_3$,
in L264, R$_7$=CD$_3$, and R$_8$=2,6-$^i$Pr$_2$-C$_6$H$_3$, in L265, R$_7$=Ph, and R$_8$=2,6-Me$_2$-C$_6$H$_3$,
in L266, R$_7$=Ph, and R$_s$=2,6-$^i$Pr$_2$-C$_6$H$_3$, in L267, R$_7$=3,5-Me$_2$-C$_6$H$_3$, and R$_s$=2,6-Me$_2$-C$_6$H$_3$,
and in L268, R$_7$=3,5-Me$_2$-C$_6$H$_3$, and R$_8$=2,6-$^i$Pr$_2$-C$_6$H$_3$, L269, L270, L271, L272, L273, L274, L275, L276, L277, L278, L279, L280, and L281 having the structure

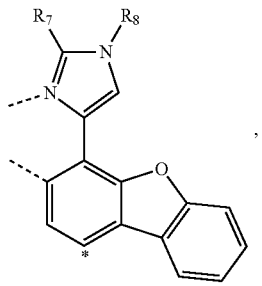

wherein in L269, R$_7$=H, and R$_8$=Me, in L270, R$_7$=H, and R$_8$=CD$_3$,
in L271, R$^7$=H, and R$_8$=$^i$Pr, in L272, R$_7$=H, and R$_8$=2,6-Me$_2$-C$_6$H$_3$,
in L273, R$_7$=H, and R$_8$=2,6-$^i$Pr$_2$-C$_6$H$_3$, in L274, R$_7$=Me, and R$_8$=2,6-Me$_2$-C$_6$H$_3$,
in L275, R$_7$=Me, and R$_8$=2,6-$^i$Pr$_2$-C$_6$H$_3$, in L276, R$_7$=CD$_3$, and R$_8$=2,6-Me$_2$-C$_6$H$_3$,
in L277, R$_7$=CD$_3$, and R$_8$=2,6-$^i$Pr$_2$-C$_6$H$_3$, in L278, R$_7$=Ph, and R$_8$=2,6-Me$_2$-C$_6$H$_3$,
in L279, R$_7$=Ph, and R$_8$=2,6-$^i$Pr$_2$-C$_6$H$_3$, in L280, R$_7$=3,5-Me$_2$-C$_6$H$_3$, and R$_8$=2,6-Me$_2$-C$_6$H$_3$,
and in L281, R$^{7=3,5}$-Me$_2$-C$_6$H$_3$, and R$_8$=2,6-$^i$Pr$_2$-C$_6$H$_3$, L282, L283, L284, and L285 having the structure

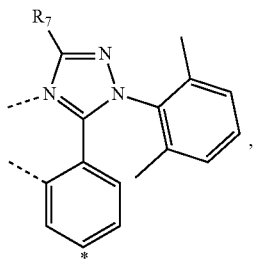

wherein in L282, R$_7$=H, in L283, R$_7$=Me,
in L284, R$_7$=CD$_3$, and in L285, R$_7$=3,5-Me$_2$-C$_6$H$_3$,
L286, L287, L288, and L289 having the structure

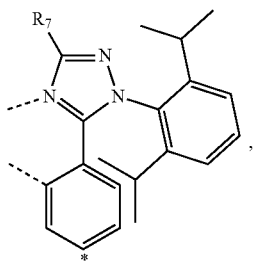

wherein in L286, R$_7$=H, in L287, R$_7$=Me,
in L288, R$_7$=CD$_3$, and in L289, R$_7$=3,5-Me$_2$-C$_6$H$_3$,
L290, L291, L292, and L293 having the structure

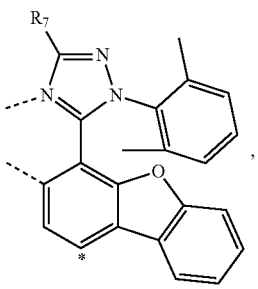

wherein in L290, R$_7$=H, in L291, R$^7$=Me,
in L292, R$_7$=CD$_3$, and in L293, R$_7$=3,5-Me$_2$-C$_6$H$_3$,
L294, L295, L296, and L297 having the structure

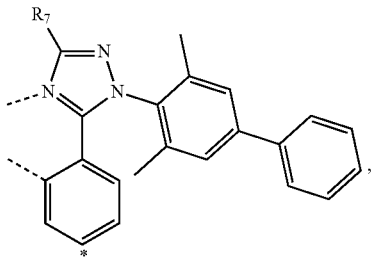

wherein in L294, R$_7$=H, in L295, R$_7$=Me,
in L296, R$_7$=CD$_3$, and in L297, R$_7$=3,5-Me$_2$-C$_6$H$_3$, L298, L299, L300, and L301 having the structure

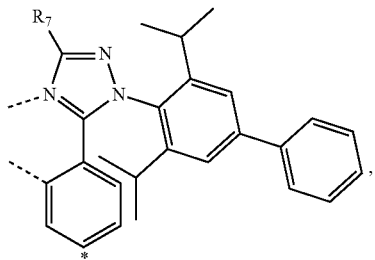

wherein in L298, R$_7$=H, in L299, R$_7$=Me,
in L300, R$_7$=CD$_3$, and in L301, R$^{7=3,5}$-Me$_2$-C$_6$H$_3$,
L302, L303, L304, and L305 having the structure

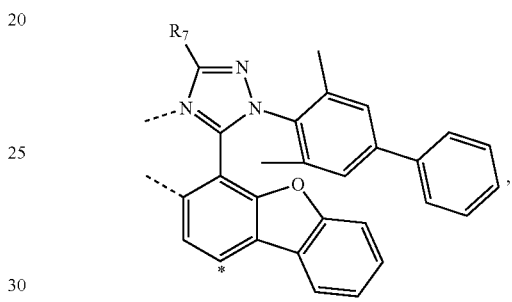

wherein in L302, R$_7$=H, in L303, R$_7$=Me,
in L304, R$_7$=CD$_3$, and in L305, R$_7$=3,5-Me$_2$-C$_6$H$_3$,
L306, L307, L308, and L309 having the structure

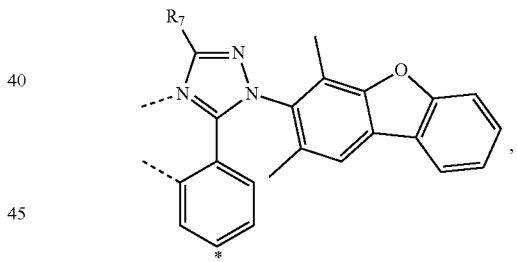

wherein in L306, R$_7$=H, in L307, R$_7$=Me,
in L308, R$_7$=CD$_3$, and in L309, R$_7$=3,5-Me$_2$-C$_6$H$_3$,
L310, L311, L312, and L313 having the structure

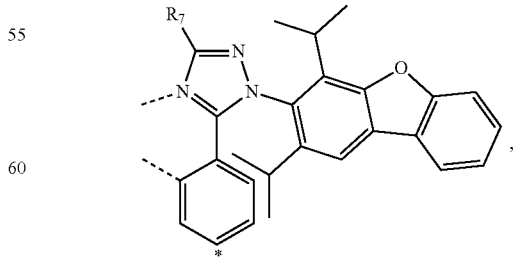

wherein in L310, R$_7$=H, in L311, R$^7$=Me,
in L312, R$_7$=CD$_3$, and in L313, R$_7$=3,5-Me$_2$-C$_6$H$_3$, L314, L315, L316, and L317 having the structure

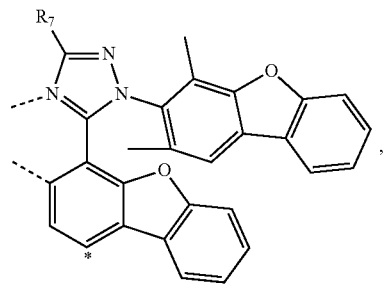

wherein in L314, R$_7$=H, in L315, R$_7$=Me,
in L316, R$_7$=CD$_3$, and in L317, R$_7$=3,5-Me$_2$-C$_6$H$_3$,
L318, L319, L320, and L321 having the structure

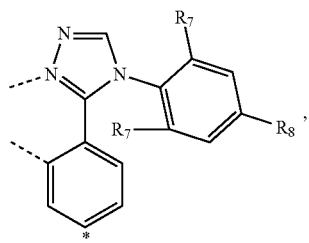

wherein in L318, R$_7$=Me, and R$_8$=H, in L319, R$_7$=$^i$Pr, and R$_8$=H,
in L320, R$_7$=Me, and R$_8$=Ph, and in L321, R$^7$=$^i$Pr, and R$_8$=Ph,
L322, and L323 having the structure

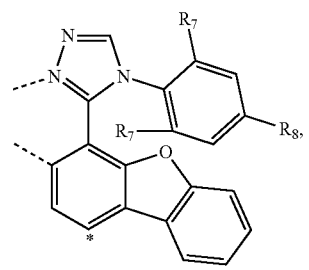

wherein in L322, R$_7$=Me, and R$_8$=H, and in L323, R$_7$=$^i$Pr, and R$_8$=H,
L324, and L325 having the structure

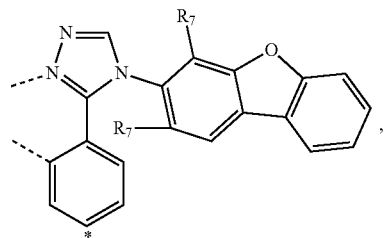

wherein in L324, R$_7$=Me, and in L325, R$_7$=$^i$Pr,

L326 having the structure

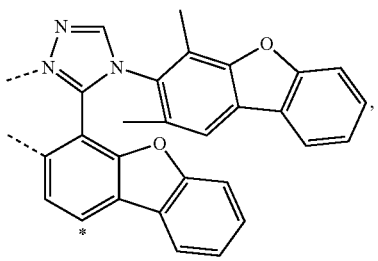

L327, L328, L329, and L330 having the structure

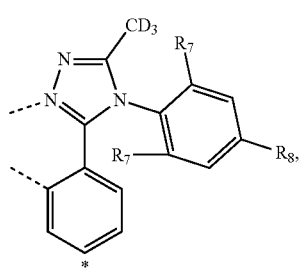

wherein in L327, R$_7$=Me, and R$_8$=H, in L328, R$_7$=$^i$Pr, and R$_8$=H,
in L329, R$_7$=Me, and R$_8$=Ph, and in L330, R$_7$=$^i$Pr, and R$_8$=Ph,
L331, and L332 having the structure

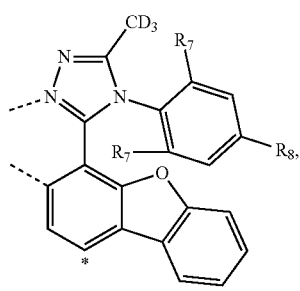

wherein in L331, R$_7$=Me, and R$_8$=H, and in L332, R$_7$=Me, and R$_8$=Ph,
L333, and L334 having the structure

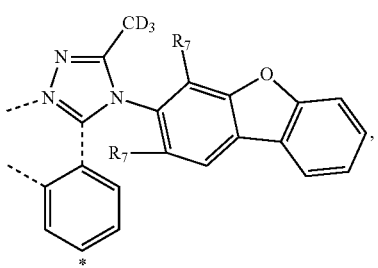

wherein in L333, R$_7$=Me, and in L334, R$_7$=$^i$Pr,

L335 having the structure

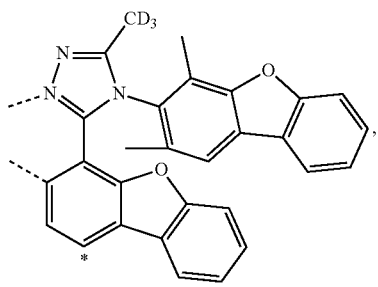

L336, L337, L338, L339, L340, and L341 having the structure

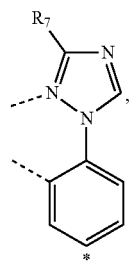

wherein in L336, R_7=H, in L337, R_7=Me,
in L338, R_7=CD_3, in L339, R_7=Ph,
in L340, R_7=3,5-Me_2-C_6H_3, and in L341, R_7=3,5-(CD_3)_2-C_6H_3

L342, L343, L344, L345, L346, and L347 having the structure

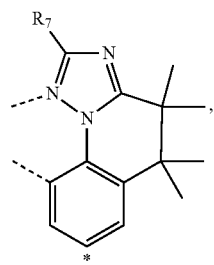

wherein in L342, R_7=H, in L343, R_7=Me,
in L344, R_7=CD_3, in L345, R_7=Ph,
in L346, R_7=3,5-Me_2-C_6H_3, and in L347, R_7=3,5-(CD_3)_2-C_6H_3

L348, L349, L350, L351, L352, and L353 having the structure

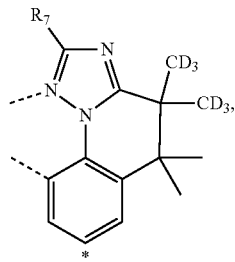

wherein in L348, R_7=H, in L349, R_7=Me,
in L350, R_7=CD_3, in L351, R_7=Ph,
in L352, R_7=3,5-Me_2-C_6H_3, and in L353, R_7=3,5-(CD_3)_2-C_6H_3

L354, L355, L356, L357, L358, and L359 having the structure

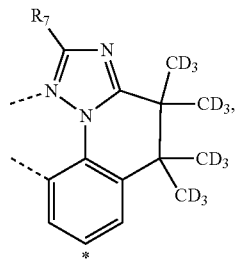

wherein in L354, R_7=H, in L355, R_7=Me,
in L356, R_7=CD_3, in L357, R_7=Ph,
in L358, R_7=3,5-Me_2-C_6H_3, and in L359, R_7=3,5-(CD_3)_2-C_6H_3

L360, L361, L362, L363, L364, and L365 having the structure

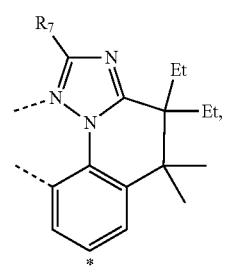

wherein in L360, R_7=H, in L361, R_7=Me,
in L362, R_7=CD_3, in L363, R_7=Ph,
in L364, R_7=3,5-Me_2-C_6H_3, and in L365, R_7=3,5-(CD_3)_2-C_6H_3

L366, L367, L368, L369, L370, and L371 having the structure

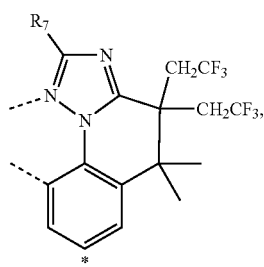

wherein in L366, R_7=H, in L367, R_7=Me,
in L368, R_7=CD_3, in L369, R_7=Ph,
in L370, R_7=3,5-Me_2-C_6H_3, and in L371, R_7=3,5-(CD_3)_2-C_6H_3

L372, L373, L374, L375, and L376 having the structure

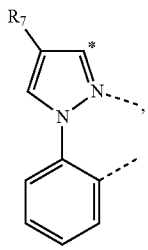

wherein in L372, R$_7$=H, in L373, R$_7$=Ph,
in L374, R$_7$=2,6-Me$_2$C$_6$H$_3$, in L375, R$_7$=2,6-(CD$_3$)$_2$C$_6$H$_3$,
and in L376, R$_7$=2,6-($^i$Bu)$_2$C$_6$H$_3$,
L377, L378, and L379 having the structure

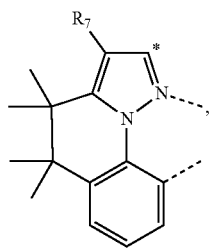

wherein in L377, R$_7$=H, in L378, R$_7$=Ph,
and in L379, R$_7$=2,6-Me$_2$C$_6$H$_3$,
L380, L381, L382, and L383 having the structure

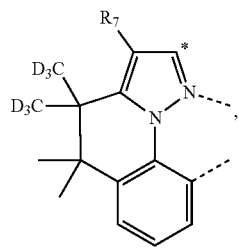

wherein in L380, R$_7$=H, in L381, R$^7$=Ph,
in L382, R$_7$=2,6-Me$_2$C$_6$H$_3$, and in L383, R$_7$=2,6-(CD$_3$)$_2$C$_6$H$_3$,
L384, L385, L386, and L387 having the structure

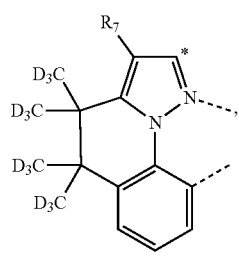

wherein in L384, R$_7$=H, in L385, R$_7$=Ph,
in L386, R$_7$=2,6-Me$_2$C$_6$H$_3$, and in L387, R$_7$=2,6-(CD$_3$)$_2$C$_6$H$_3$, L388, L389, L390, and L391 having the structure

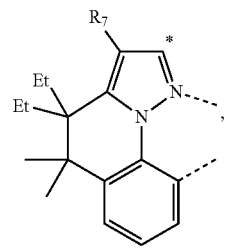

wherein in L388, R$_7$=H, in L389, R$_7$=Ph,
in L390, R$_7$=2,6-Me$_2$C$_6$H$_3$, and in L391, R$_7$=2,6-(CD$_3$)$_2$C$_6$H$_3$,
L392, L393, L394, and L395 having the structure

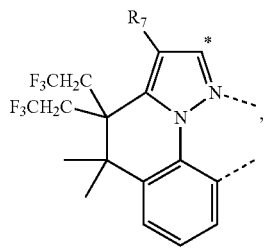

wherein in L392, R$_7$=H, in L393, R$_7$=Ph,
in L394, R$_7$=2,6-Me$_2$C$_6$H$_3$, and in L395, R$_7$=2,6-(CD$_3$)$_2$C$_6$H$_3$,
L396 having the structure

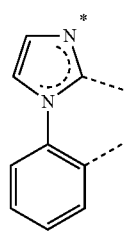

L397, L398, and L399 having the structure

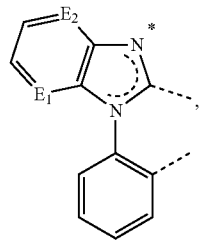

wherein in L397, E$_1$=CH, and E$_2$=CH,
in L398, E$_1$=N, and E$_2$=CH,
and in L399, E$_1$=N, and E$_2$=N, L400 having the structure

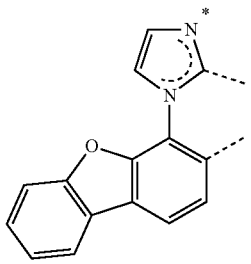

L401, L402, and L403 having the structure

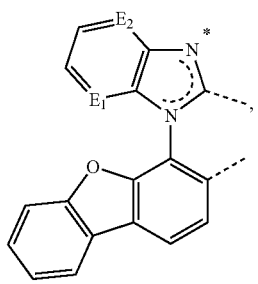

wherein in L401, $E_1$=CH, and $E_2$=CH,
in L402, $E_1$=N, and $E_2$=CH,
and in L403, $E_1$=N, and $E_2$=N,
L404, L405, L406, and L407 having the structure

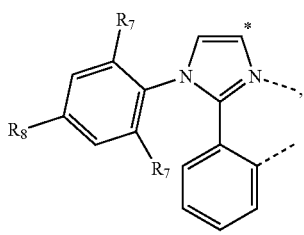

wherein in L404, $R_7$=Me, and $R_8$=H,
in L405, $R_7$=$^i$Pr, and $R_8$=H,
in L406, $R_7$=Me, and $R_8$=Ph,
and in L407, $R_7$=$^i$Pr, and $R_8$=Ph,
L408, L409, and L410 having the structure

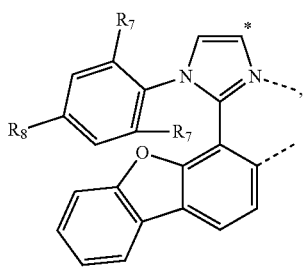

wherein in L408, $R_7$=Me, and $R_8$=H,
in L409, $R_7$=Me, and $R_8$=Ph,
and in L410, $R_7$=$^i$Pr, and $R_8$=Ph, L411, and L412 having the structure

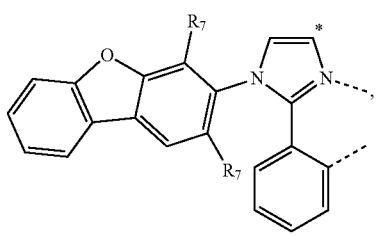

wherein in L411, $R_7$=Me, and in L412, $R_7$=$^i$Pr,
L413 having the structure

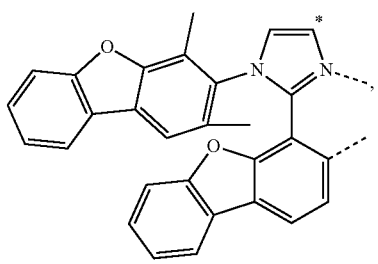

L414, L415, L416, L417, and L418 having the structure

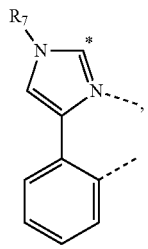

wherein in L414, $R_7$=Me, in L415, $R_7$=CD$_3$,
in L416, $R_7$=$^i$Pr, in L417, $R_7$=2,6-(CD$_3$)$_2$C$_6$H$_3$,
and in L418, $R_7$=2,6-($^i$Pr)$_2$C$_6$H$_3$,
L419, L420, L421, L422, and L423 having the structure

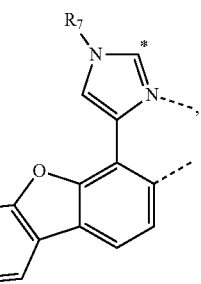

wherein in L419, $R_7$=Me, in L420, $R_7$=CD$_3$,
in L421, $R^7$=$^i$Pr, in L422, $R_7$=2,6-(CD$_3$)$_2$C$_6$H$_3$,
and in L423, $R_7$=2,6-($^i$Pr)$_2$C$_6$H$_3$, L424, L425, L426, and L427 having the structure

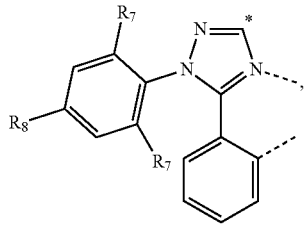

wherein in L424, R$_7$=Me, and R$_8$=H,
in L425, R$_7$=$^i$Pr, and R$_8$=H,
in L426, R$_7$=Me, and R$_8$=Ph,
and in L427, R$_7$=$^i$Pr, and R$_8$=Ph,
L428, L429, and L430 having the structure

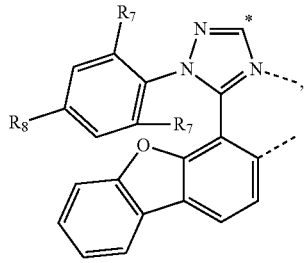

wherein in L428, R$_7$=Me, and R$_8$=H,
in L429, R$_7$=Me, and R$_8$=Ph,
and in L430, R$_7$=$^i$Pr, and R$_8$=Ph,
L431, and L432 having the structure

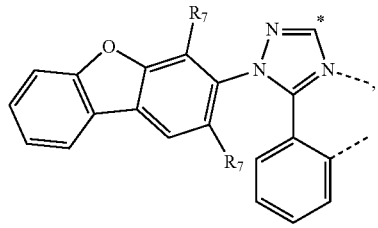

wherein in L431, R$^7$=Me, and in L432, R$_7$=Pr,
L433 having the structure

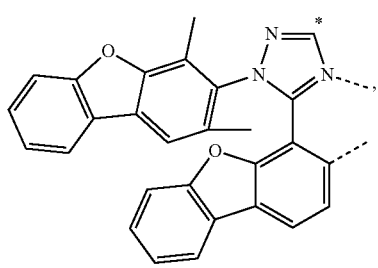

L434 having the structure

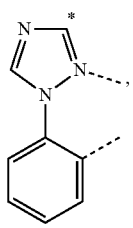

L435, L436, L437, L438, and L439 having the structure

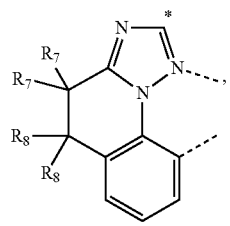

wherein in L435, R$_7$=Me, and R$_8$=Me,
in L436, R$_7$=CD$_3$, and R$_8$=Me,
in L437, R$_7$=CD$_3$, and R$_8$=CD$_3$,
in L438, R$_7$=Et, and R$_8$=Me,
and in L439, R$_7$=CH$_2$CF$_3$, and R$_8$=Me, L440, L441, L442, L443, L444, L445, L446, L447, L448, L449, L450, and L451 having the structure

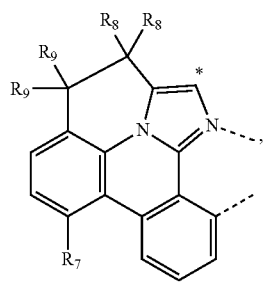

wherein in L440, R$_7$=H, R$_8$=Me, and R$_9$=Me, in L441, R$_7$=Me, R$_8$=Me, and R$_9$=Me,
in L442, R$_7$=CD$_3$, R$_8$=Me, and R$_9$=Me, in L443, R$_7$=H, R$_8$=CD$_3$, and R$_9$=Me,
in L444, R$_7$=Me, R$_8$=CD$_3$, and R$_9$=Me, in L445, R$_7$=CD$_3$, R$_8$=CD$_3$, and R$_9$=Me,
in L446, R$_7$=H, R$_8$=Me, and R$_9$=CD$_3$, in L447, R$_7$=Me, R$_8$=Me, and R$_9$=CD$_3$,
in L448, R$_7$=CD$_3$, R$_8$=Me, and R$_9$=CD$_3$, in L449, R$_7$=H, R$_8$=CD$_3$, and R$_9$=CD$_3$,
in L450, R$_7$=Me, R$_8$=CD$_3$, and R$_9$=CD$_3$, and in L451, R$_7$=CD$_3$, R$_8$=CD$_3$, and R$_9$=CD$_3$, L452, L453, and L454 having the structure

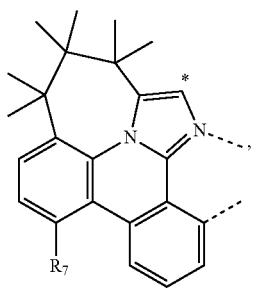

wherein in L452, R$_7$=H, in L453, R$_7$=Me, and in L454, R$_7$=CD$_3$,

L455, L456, L457, L458, L459, L460, L461, L462, and L463 having the structure

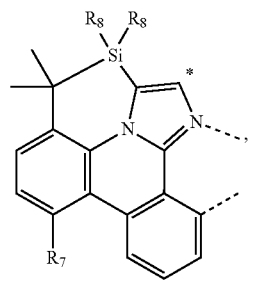

wherein in L455, R$_7$=H, and R$_8$=Me, in L456, R$_7$=Me, and R$_8$=Me, in L457, R$_7$=CD$_3$, and R$_8$=Me, in L458, R$_7$=H, and R$_8$=$^i$Pr, in L459, R$_7$=Me, and R$_8$=$^i$Pr, in L460, R$_7$=CD$_3$, and R$_8$=$^i$Pr, in L461, R$_7$=H, and R$_8$=Ph, in L462, R$_7$=Me, and R$_8$=Ph, and in L463, R$_7$=CD$_3$, and R$_8$=Ph, L464, L465, and L466 having the structure

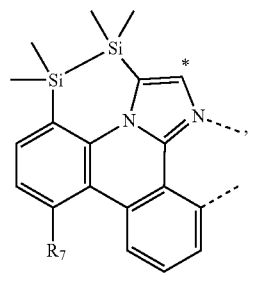

wherein in L464, R$_7$=H, in L465, R$_7$=Me, and in L466: R$_7$=CD$_3$,

L467, L468, L469, L470, L471, L472, L473, L474, and L475 having the structure

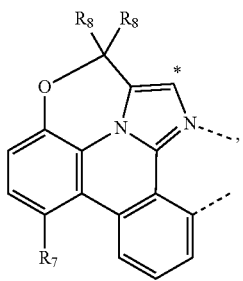

wherein in L467, R$_7$=H, and R$_8$=Me, in L468, R$_7$=Me, and R$_8$=Me, in L469, R$_7$=CD$_3$, and R$_8$=Me, in L470, R$_7$=H, and R$_8$=CD$_3$, in L471, R$_7$=Me, and R$_8$=CD$_3$, in L472, R$_7$=CD$_3$, and R$_8$=CD$_3$, in L473, R$_7$=H, and R$_8$=Ph, in L474, R$_7$=Me, and R$_8$=Ph, and in L475, R$_7$=CD$_3$, and R$_8$=Ph, L476, L477, and L478 having the structure

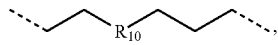

wherein in L476, R$_7$=H, in L477, R$_7$=Me, and in L478, R$_7$=CD$_3$, where the dashed lines indicate bonds to the iridium atom;

where the carbon marked with * connects to an H atom for all L$_x$ structures or connects to Link$_q$ in L$_y$ and L$_z$ structures; and where in compound V, Link$_q$ is one of the structures Link1 through Link21 defined below, and in compound W, Link$_q$ is one of the structures Link22 through Link53 defined below:

Link1 and Link 2 having the structure

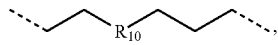

wherein in Link1, R$_{10}$=CH$_2$, and in Link 2, R$_{10}$=CH$_2$CH$_2$,

Link 3 and Link 4 having the structure

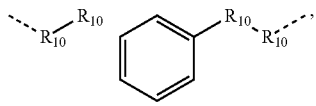

wherein in Link 3, $R_{10}=CH_2$, and in Link4, $R_{10}=CD_2$, Link 5 and Link6 having the structure

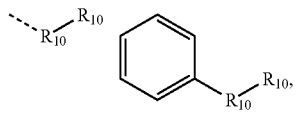

wherein in Link5, $R_{10}=CH_2$, and in Link6, $R_{10}=CD_2$,

Link7

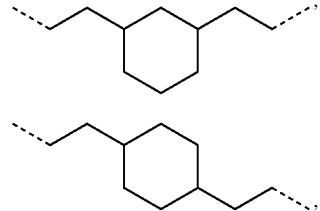

Link8

Link9, Link10, Link11, Link12, Link13, Link14, Link15, Link16, and Link17 having the structure

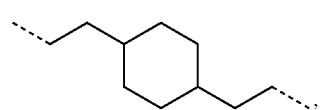

wherein in Link9, $R_{10}$=H, $R_{11}=CH_2$, and $R_{12}=CH_2$,
in Link10, $R_{10}$=Me, $R_{11}=CH_2$, and $R_{12}=CH_2$,
in Link11, $R_{10}=CD_3$, $R_{11}=CH_2$, and $R_{12}=CH_2$,
in Link12, $R_{10}$=H, $R_{11}=CD_2$, and $R_{12}=CH_2$,
in Link13, $R_{10}$=Me, $R_{11}=CD_2$, and $R_{12}=CH_2$,
in Link14, $R_{10}=CD_3$, $R_{11}=CD_2$, and $R_{12}=CH_2$,
in Link15, $R_{10}$=H, $R_{11}=CD_2$, and $R_{12}=CD_2$,
in Link16, $R_{10}$=Me, $R_{11}=CD_2$, and $R_{12}=CD_2$,
in Link17, $R_{10}=CD_3$, $R_{11}=CD_2$, and $R_{12}=CD_2$, Link18

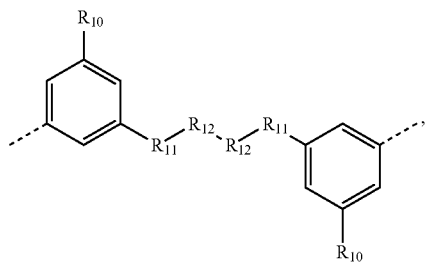

Link19

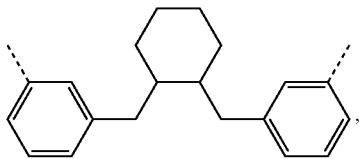

Link20 and Link21 having the structure

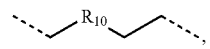

wherein in Link20, $R_{10}=CH_2$, and in Link21, $R_{10}=CH_2CH_2$, Link22, Link23, Link24, Link25, Link26, Link27, Link28, Link29, Link30, Link31, Link32, and Link33 having the structure

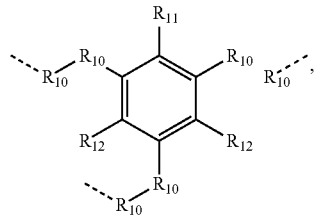

wherein, in Link22, $R_{10}=CH_2$, and $R_{11}=R^{12}=H$,
in Link23, $R_{10}=CD_2$, and $R_{11}=R^{12}=H$,
in Link24, $R_{10}=CH_2$, and $R_{11}=R^{12}$=Me,
in Link25, $R_{10}=CD_2$, and $R_{11}=R^{12}$=Me,
in Link26, $R_{10}=CH_2$, $R_{11}$=Me, and $R_{12}$=H,
in Link27, $R_{10}=CD_2$, $R_{11}$=Me, and $R_{12}$=H,
in Link28, $R_{10}=CH_2$, $R_{11}$=Et, and $R_{12}$=H,
in Link29, $R_{10}=CD_2$, $R_{11}$=Et, and $R_{12}$=H,
in Link30, $R_{10}=CH_2$, $R_{11}=CH_2CF_3$, and $R_{12}$=H,
in Link31, $R_{10}=CD_2$, $R_{11}=CH_2CF_3$, and $R_{12}$=H,
in Link32, $R_{10}=CH_2$, $R_{11}={}^iBu$, and $R_{12}$=H,
in Link33, $R_{10}=CD_2$, $R_{11}={}^iBu$, and $R_{12}$=H,
in Link34, $R_{10}=CH_2$, $R_{11}=CH_2(CH_3)_3$, and $R_{12}$=H,
in Link35, $R_{10}=CD_2$, $R_{11}=CH_2(CH_3)_3$, and $R_{12}$=H,
in Link36, $R_{10}=CH_2$, $R_{11}=CH_2CH(CH_3)(CF_3)$, and $R_{12}$=H,
in Link37, $R_{10}=CD_2$, $R_{11}=CH_2CH(CH_3)(CF_3)$, and $R_{12}$=H,

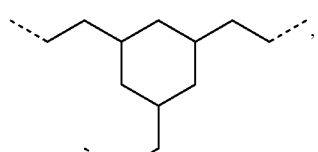

Link38

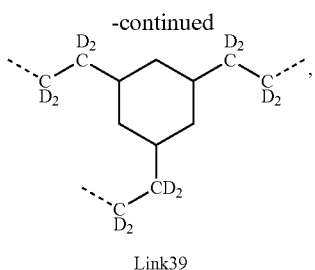

Link39

Link40 and Link41 having the structure

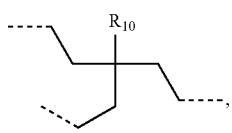

wherein, in Link40, $R_{10}$=Me, and in Link41, $R_{10}$=Ph, Link42 and Link43 having the structure

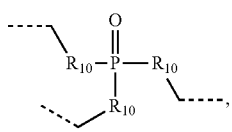

wherein, in Link42, $R_{10}$=CH$_2$, and
in Link43, $R_{10}$=O, Link 44, Link 45, Link 46, and Link47 having the structure

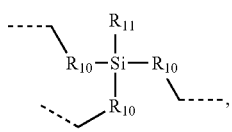

wherein, in Link44, $R_1$=CH$_2$, and $R_2$=Me,
in Link45, $R_1$=CH$_2$, and $R_2$=Ph,
in Link46, $R_1$=O, and $R_2$=Me, and
in Link47, $R_1$=O, and $R_2$=Ph,
Link48, Link49, Link50, Link51, Link52, and Link53 having the structure

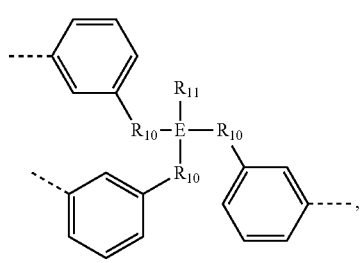

wherein, in Link48, E=C, $R_{10}$=CH$_2$, and $R_{11}$=Me,
in Link49, E=C, $R_{10}$=CH$_2$, and $R_{11}$=Ph,
in Link50, E=C, $R_{10}$=CD$_2$, and $R_{11}$=Me,
in Link51, E=C, $R_{10}$=CD$_2$, and $R_{11}$=Ph,
in Link52, E=Si, $R_{10}$=CH$_2$, and $R_{11}$=Me, and
in Link53, E=Si, $R_{10}$=COH$_2$, and $R_{11}$=Ph; where the dashed line represents the bonds connecting to the carbon marked by *on $L_x$, $L_y$, and $L_z$.

In one embodiment, the compound is selected from the group consisting of: Ir($L_{51}$-$L_{51}$-$L_{51}$-Link$_{22}$), Ir($L_{51}$-$L_{51}$-$L_{146}$-Link$_{22}$), Ir($L_{51}$-$L_{146}$-$L_{146}$-Link$_{22}$), Ir($L_{51}$-$L_{51}$-$L_{51}$-Link$_{23}$), Ir($L_{51}$-$L_{51}$-$L_{146}$-Link$_{23}$), Ir($L_{51}$-$L_{146}$-$L_{146}$-Link$_{23}$), Ir($L_9$-$L_9$-$L_9$-Link$_{22}$), Ir($L_9$-$L_9$-$L_{146}$-Link$_{22}$), Ir($L_9$-$L_{146}$-$L_{146}$-Link$_{22}$), Ir($L_9$-$L_9$-$L_9$-Link$_{23}$), Ir($L_9$-$L_9$-$L_{146}$-Link$_{23}$), Ir($L_9$-$L_{146}$-$L_{146}$-Link$_{23}$), Ir($L_{47}$-$L_{47}$-$L_{47}$-Link$_{22}$), Ir($L_{47}$-$L_{47}$-$L_{146}$-Link$_{22}$), Ir($L_{47}$-$L_{146}$-$L_{146}$-Link$_{22}$), Ir($L_{47}$-$L_{47}$-$L_{47}$-Link$_{23}$), Ir($L_{47}$-$L_{47}$-$L_{146}$-Link$_{23}$), Ir($L_{47}$-$L_{146}$-$L_{146}$-Link$_{23}$), Ir($L_5$-$L_5$-$L_5$-Link$_{22}$), Ir($L_5$-$L_5$-$L_{146}$-Link$_{22}$), Ir($L_5$-$L_{146}$-$L_{146}$-Link$_{22}$), Ir($L_5$-$L_5$-$L_5$-Link$_{23}$), Ir($L_5$-$L_5$-$L_{146}$-Link$_{23}$), Ir($L_5$-$L_{146}$-$L_{146}$-Link$_{23}$), Ir($L_1$-$L_1$-$L_1$-Link$_{22}$), Ir($L_1$-$L_1$-$L_{146}$-Link$_{22}$), Ir($L_1$-$L_{146}$-$L_{146}$-Link$_{22}$), Ir($L_1$-$L_1$-$L_1$-Link$_{23}$), Ir($L_1$-$L_1$-$L_{146}$-Link$_{23}$), Ir($L_1$-$L_{146}$-$L_{146}$-Link$_{23}$), Ir($L_{43}$-$L_{43}$-$L_{43}$-Link$_{22}$), Ir($L_{43}$-$L_{43}$-$L_{146}$-Link$_{22}$), Ir($L_{43}$-$L_{146}$-$L_{146}$-Link$_{22}$), Ir($L_{43}$-$L_{43}$-$L_{43}$-Link$_{23}$), Ir($L_{43}$-$L_{43}$-$L_{146}$-Link$_{23}$), Ir($L_{43}$-$L_{146}$-$L_{146}$-Link$_{23}$), Ir($L_{117}$-$L_{117}$-$L_{117}$-Link$_{22}$), Ir($L_{117}$-$L_{117}$-$L_{146}$-Link$_{22}$), Ir($L_{117}$-$L_{146}$-$L_{146}$-Link$_{22}$), Ir($L_{117}$-$L_{117}$-$L_{117}$-Link$_{23}$), Ir($L_{117}$-$L_{117}$-$L_{146}$-Link$_{23}$), Ir($L_{117}$-$L_{146}$-$L_{146}$-Link$_{23}$), Ir($L_{120}$-$L_{120}$-$L_{120}$-Link$_{22}$), Ir($L_{120}$-$L_{120}$-$L_{146}$-Link$_{22}$), Ir($L_{120}$-$L_{146}$-$L_{146}$-Link$_{22}$), Ir($L_{120}$-$L_{120}$-$L_{120}$-Link$_{23}$), Ir($L_{120}$-$L_{120}$-$L_{146}$-Link$_{23}$), Ir($L_{120}$-$L_{146}$-$L_{146}$-Link$_{23}$), Ir($L_9$)($L_{146}$-$L_{146}$-Link$_3$), Ir($L_9$)($L_{146}$-$L_{146}$-Link$_4$), Ir($L_{51}$)($L_{146}$-$L_{146}$-Link$_3$), Ir($L_{51}$)($L_{146}$-$L_{146}$-Link$_4$), Ir($L_{47}$)($L_{146}$-$L_{146}$-Link$_3$), Ir($L_{47}$)($L_{146}$-$L_{146}$-Link$_4$), Ir($L_5$)($L_{146}$-$L_{146}$-Link$_3$), Ir($L_5$)($L_{146}$-$L_{146}$-Link$_4$), Ir($L_1$)($L_{146}$-$L_{146}$-Link$_3$), Ir($L_1$)($L_{146}$-$L_{146}$-Link$_4$), Ir($L_{43}$)($L_{146}$-$L_{146}$-Link$_3$), Ir($L_{43}$)($L_{146}$-$L_{146}$-Link$_4$), Ir($L_{117}$)($L_{146}$-$L_{146}$-Link$_3$), Ir($L_{117}$)($L_{146}$-$L_{146}$-Link$_4$), Ir($L_{120}$)($L_{146}$-$L_{146}$-Link$_3$), Ir($L_{120}$)($L_{146}$-$L_{146}$-Link$_4$), Ir($L_9$)($L_9$-$L_{146}$-Link$_3$), Ir($L_9$)($L_9$-$L_{146}$-Link$_4$), Ir($L_{51}$)($L_{51}$-$L_{146}$-Link$_3$), Ir($L_{51}$)($L_{51}$-$L_{146}$-Link$_4$), Ir($L_{47}$)($L_{47}$-$L_{146}$-Link$_3$), Ir($L_{47}$)($L_{47}$-$L_{146}$-Link$_4$), Ir($L_5$)($L_5$-$L_{146}$-Link$_3$), Ir($L_5$)($L_5$-$L_{146}$-Link$_4$), Ir($L_1$)($L_1$-$L_{146}$-Link$_3$), Ir($L_1$)($L_1$-$L_{146}$-Link$_4$), Ir($L_{43}$)($L_{43}$-$L_{146}$-Link$_3$), Ir($L_{43}$)($L_{43}$-$L_{146}$-Link$_4$), Ir($L_{117}$)($L_{117}$-$L_{146}$-Link$_3$), Ir($L_{117}$)($L_{117}$-$L_{146}$-Link$_4$), Ir($L_{120}$)($L_{120}$-$L_{146}$-Link$_3$), Ir($L_{120}$)($L_{120}$-$L_{146}$-Link$_4$), Ir($L_{146}$)($L_9$-$L_{146}$-Link$_3$), Ir($L_{146}$)($L_9$-$L_{146}$-Link$_4$), Ir($L_{146}$)($L_{51}$-$L_{146}$-Link$_3$), Ir($L_{146}$)($L_{51}$-$L_{146}$-Link$_4$), Ir($L_{146}$)($L_{47}$-$L_{146}$-Link$_3$), Ir($L_{146}$)($L_{47}$-$L_{146}$-Link$_4$), Ir($L_{146}$)($L_5$-$L_{146}$-Link$_3$), Ir($L_{146}$)($L_5$-$L_{146}$-Link$_4$), Ir($L_{146}$)($L_1$-$L_{146}$-Link$_3$), Ir($L_{146}$)($L_1$-$L_{146}$-Link$_4$), Ir($L_{146}$)($L_{43}$-$L_{146}$-Link$_3$), Ir($L_{146}$)($L_{43}$-$L_{146}$-Link$_4$), Ir($L_{146}$)($L_{117}$-$L_{146}$-Link$_3$), Ir($L_{146}$)($L_{117}$-$L_{146}$-Link$_4$), Ir($L_{146}$)($L_{120}$-$L_{146}$-Link$_3$), Ir($L_{146}$)($L_{120}$-$L_{146}$-Link$_4$), Ir($L_{146}$)($L_9$-$L_{146}$-Link$_3$), Ir($L_{146}$)($L_9$-$L_{146}$-Link$_4$), Ir($L_{146}$)($L_9$-$L_9$-Link$_3$), Ir($L_{146}$)($L_9$-$L_9$-Link$_4$), Ir($L_{146}$)($L_{51}$-$L_{51}$-Link$_3$), Ir($L_{146}$)($L_{51}$-$L_{51}$-Link$_4$), Ir($L_{146}$)($L_{47}$-$L_{47}$-Link$_3$), Ir($L_{146}$)($L_{47}$-$L_{47}$-Link$_4$), Ir($L_{146}$)($L_5$-$L_5$-Link$_3$), Ir($L_{146}$)($L_5$-$L_5$-Link$_4$), Ir($L_{146}$)($L_1$-$L_1$-Link$_3$), Ir($L_{146}$)($L_1$-$L_1$-Link$_4$), Ir($L_{146}$)($L_{43}$-$L_{43}$-Link$_3$), Ir($L_{146}$)($L_{43}$-$L_{43}$-Link$_4$), Ir($L_{146}$)($L_{117}$-$L_{117}$-Link$_3$), Ir($L_{146}$)($L_{117}$-$L_{117}$-Link$_4$), Ir($L_{146}$)($L_{120}$-$L_{120}$-Link$_3$), and Ir($L_{146}$)($L_{120}$-$L_{120}$-Link$_4$).

In one embodiment, the compound is selected from the group consisting of: Ir($L_{51}$-$L_{51}$-$L_{51}$-Link$_{22}$), Ir($L_{51}$-$L_{51}$-$L_{146}$-Link$_{22}$), Ir($L_{51}$-$L_{146}$-$L_{146}$-Link$_{22}$), Ir($L_{51}$-$L_{51}$-$L_{51}$-Link$_{23}$), Ir($L_{51}$-$L_{51}$-$L_{146}$-Link$_{23}$), Ir($L_{51}$-$L_{146}$-$L_{146}$-Link$_{23}$), Ir($L_9$-$L_9$-$L_9$-Link$_{22}$), Ir($L_9$-$L_9$-$L_{146}$-Link$_{22}$), Ir($L_9$-$L_{146}$-$L_{14}$-Link$_{22}$), Ir($L_9$-$L_9$-$L_9$-Link$_{23}$), Ir($L_9$-$L_9$-$L_{146}$-Link$_{23}$), Ir($L_9$-$L_{146}$-$L_{146}$-Link$_{23}$), Ir($L_{47}$-$L_{47}$-$L_{47}$-Link$_{22}$), Ir($L_{47}$-$L_{47}$-$L_{146}$-Link$_{22}$), Ir($L_{47}$-$L_{146}$-$L_{146}$-Link$_{22}$), Ir($L_{47}$-$L_{47}$-$L_{471}$-Link$_{23}$), Ir($L_{47}$-$L_{47}$-$L_{146}$-Link$_{23}$), Ir($L_{47}$-$L_{146}$-$L_{146}$-Link$_{23}$), Ir($L_5$-$L_5$-$L_5$-Link$_{22}$), Ir($L_5$-$L_5$-$L_{146}$-Link$_{22}$), Ir($L_5$-$L_{146}$-$L_{146}$-Link$_{22}$), Ir($L_5$-$L_5$-$L_5$-Link$_{23}$), Ir($L_5$-$L_5$-$L_{146}$-Link$_{23}$), Ir($L_5$-$L_{146}$-$L_{146}$-Link$_{23}$), Ir($L_1$-$L_1$-$L_1$-Link$_{22}$), Ir($L_1$-$L_1$-$L_{146}$-

Link$_{22}$), Ir(L$_1$-L$_{146}$-L$_{146}$-Link$_{22}$), Ir(L$_1$-L$_1$-L$_1$-Link$_{23}$), Ir(L$_1$-L$_1$-L$_{146}$-Link$_{23}$), Ir(L$_1$-L$_{146}$-L$_{146}$-Link$_{23}$), Ir(L$_{43}$-L$_{43}$-L$_{43}$-Link$_{22}$), Ir(L$_{43}$-L$_{43}$-L$_{146}$-Link$_{22}$), Ir(L$_{43}$-L$_{146}$-L$_{146}$-Link$_{22}$), Ir(L$_{43}$-L$_{43}$-L$_{43}$-Link$_{23}$), Ir(L$_{43}$-L$_{43}$-L$_{146}$-Link$_{23}$), Ir(L$_{43}$-L$_{146}$-L$_{146}$-Link$_{23}$), Ir(L$_{117}$-L$_{117}$-L$_{117}$-Link$_{22}$), Ir(L$_{117}$-L$_{117}$-L$_{146}$-Link$_{22}$), Ir(L$_{117}$-L$_{146}$-L$_{146}$-Link$_{22}$), Ir(L$_{117}$-L$_{117}$-L$_{117}$-Link$_{23}$), Ir(L$_{117}$-L$_{117}$-L$_{146}$-Link$_{23}$), Ir(L$_{117}$-L$_{146}$-L$_{146}$-Link$_{23}$), Ir(L$_{120}$-L$_{120}$-L$_{120}$-Link$_{22}$), Ir(L$_{120}$-L$_{120}$-L$_{146}$-Link$_{22}$), Ir(L$_{120}$-L$_{146}$-L$_{146}$-Link$_{22}$), Ir(L$_{120}$-L$_{120}$-L$_{120}$-Link$_{23}$), Ir(L$_{120}$-L$_{120}$-L$_{146}$-Link$_{23}$), Ir(L$_{120}$-L$_{146}$-L$_{146}$-Link$_{23}$), Ir(L$_9$)(L$_{146}$-L$_{146}$-Link$_3$), Ir(L$_9$)(L$_{146}$-L$_{146}$-Link$_4$), Ir(L$_{51}$)(L$_{146}$-L$_{146}$-Link$_3$), Ir(L$_{51}$)(L$_{146}$-L$_{146}$-Link$_4$), Ir(L$_{47}$)(L$_{146}$-L$_{146}$-Link$_3$), Ir(L$_{47}$)(L$_{146}$-L$_{146}$-Link$_4$), Ir(L$_5$)(L$_{146}$-L$_{146}$-Link$_3$), Ir(L$_5$)(L$_{146}$-L$_{146}$-Link$_4$), Ir(L$_1$)(L$_{146}$-L$_{146}$-Link$_3$), Ir(L$_1$)(L$_{146}$-L$_{146}$-Link$_4$), Ir(L$_{43}$)(L$_{146}$-L$_{146}$-Link$_3$), Ir(L$_{43}$)(L$_{146}$-L$_{146}$-Link$_4$), Ir(L$_{117}$)(L$_{146}$-L$_{146}$-Link$_3$), Ir(L$_{117}$)(L$_{146}$-L$_{146}$-Link$_4$), Ir(L$_{120}$)(L$_{146}$-L$_{146}$-Link$_3$), Ir(L$_{120}$)(L$_{146}$-L$_{146}$-Link$_4$), Ir(L$_9$)(L$_9$-L$_{146}$-Link$_3$), Ir(L$_9$)(L$_9$-L$_{146}$-Link$_4$), Ir(L$_{51}$)(L$_{51}$-L$_{146}$-Link$_3$), Ir(L$_{51}$)(L$_{51}$-L$_{146}$-Link$_4$), Ir(L$_{47}$)(L$_{47}$-L$_{146}$-Link$_3$), Ir(L$_{47}$)(L$_{47}$-L$_{146}$-Link$_4$), Ir(L$_5$)(L$_5$-L$_{146}$-Link$_3$), Ir(L$_5$)(L$_5$-L$_{146}$-Link$_4$), Ir(L$_1$)(L$_1$-L$_{146}$-Link$_3$), Ir(L$_1$)(L$_1$-L$_{146}$-Link$_4$), Ir(L$_{43}$)(L$_{43}$-L$_{146}$-Link$_3$), Ir(L$_{43}$)(L$_{43}$-L$_{146}$-Link$_4$), Ir(L$_{117}$)(L$_{117}$-L$_{146}$-Link$_3$), Ir(L$_{117}$)(L$_{117}$-L$_{146}$-Link$_4$), Ir(L$_{120}$)(L$_{120}$-L$_{146}$-Link$_3$), Ir(L$_{120}$)(L$_{120}$-L$_{146}$-Link$_4$), Ir(L$_{146}$)(L$_9$-L$_{146}$-Link$_3$), Ir(L$_{146}$)(L$_9$-L$_{146}$-Link$_4$), Ir(L$_{146}$)(L$_{51}$-L$_{146}$-Link$_3$), Ir(L$_{146}$)(L$_{51}$-L$_{146}$-Link$_4$), Ir(L$_{146}$)(L$_{47}$-L$_{146}$-Link$_3$), Ir(L$_{146}$)(L$_{47}$-L$_{146}$-Link$_4$), Ir(L$_{146}$)(L$_5$-L$_{146}$-Link$_3$), Ir(L$_{146}$)(L$_5$-L$_{146}$-Link$_4$), Ir(L$_{146}$)(L$_1$-L$_{146}$-Link$_3$), Ir(L$_{146}$)(L$_1$-L$_{146}$-Link$_4$), Ir(L$_{146}$)(L$_{43}$-L$_{146}$-Link$_3$), Ir(L$_{146}$)(L$_{43}$-L$_{146}$-Link$_4$), Ir(L$_{146}$)(L$_{117}$-L$_{146}$-Link$_3$), Ir(L$_{146}$)(L$_{117}$-L$_{146}$-Link$_4$), Ir(L$_{146}$)(L$_{120}$-L$_{146}$-Link$_3$), Ir(L$_{146}$)(L$_{120}$-L$_{146}$-Link$_4$), Ir(L$_{146}$)(L$_9$-L$_{146}$-Link$_3$), Ir(L$_{146}$)(L$_9$-L$_{146}$-Link$_4$), Ir(L$_{146}$)(L$_9$-L$_9$-Link$_3$), Ir(L$_{146}$)(L$_9$-L$_9$-Link$_4$), Ir(L$_{146}$)(L$_{51}$-L$_{51}$-Link$_3$), Ir(L$_{146}$)(L$_{51}$-L$_{51}$-Link$_4$), Ir(L$_{146}$)(L$_{47}$-L$_{47}$-Link$_3$), Ir(L$_{146}$)(L$_{47}$-L$_{47}$-Link$_4$), Ir(L$_{146}$)(L$_5$-L$_5$-Link$_3$), Ir(L$_{146}$)(L$_5$-L$_5$-Link$_4$), Ir(L$_{146}$)(L$_1$-L$_1$-Link$_3$), Ir(L$_{146}$)(L$_1$-L$_1$-Link$_4$), Ir(L$_{146}$)(L$_{43}$-L$_{43}$-Link$_3$), Ir(L$_{146}$)(L$_{43}$-L$_{43}$-Link$_4$), Ir(L$_{146}$)(L$_{117}$-L$_{117}$-Link$_3$), Ir(L$_{146}$)(L$_{117}$-L$_{117}$-Link$_4$), Ir(L$_{146}$)(L$_{120}$-L$_{120}$-Link$_3$), and Ir(L$_{146}$)(L$_{120}$-L$_{120}$-Link$_4$).

An OLED comprising an anode, a cathode, and an organic layer disposed between the anode and the cathode is also disclosed. The organic layer comprises a compound having the formula Ir(L$_A$)(L$_B$); where L$_A$ is a bidentate, tridentate, tetradentate, pentadentate, or hexadentate ligand; where L$_B$ is a monodentate, bidentate, tridentate, or tetradentate ligand, or not present; where the total denticity of L$_A$ plus L$_B$ is 6; where L$_A$ comprises at least one structure of Formula I:

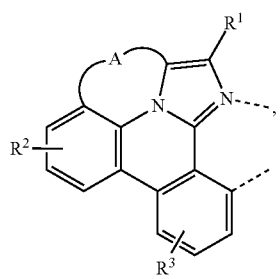

Formula I;

where A is a linking group having two to three linking atoms, wherein the linking atoms are each independently selected from the group consisting of C, Si, O, S, N, B; where R$^2$ and R$^3$ each independently represents mono to a maximum allowable number of substitutions, or no substitution; where each of R$^1$, R$^2$, and R$^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any two substituents may be joined or fused together to form a ring; and where R$^1$ or R$^3$ can join to another ligand via a linking group to form a higher denticity ligand.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

An emissive region in an OLED is also disclosed. The emissive region comprises a compound a compound having the formula Ir(L$_A$)(L$_B$); where L$_A$ is a bidentate, tridentate, tetradentate, pentadentate, or hexadentate ligand; where L$_B$ is a monodentate, bidentate, tridentate, or tetradentate ligand, or not present; where the total denticity of L$_A$ plus L$_B$ is 6; where L$_A$ comprises at least one structure of Formula I:

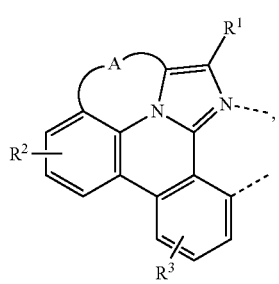

Formula I;

where A is a linking group having two to three linking atoms, wherein the linking atoms are each independently selected from the group consisting of C, Si, O, S, N, B; where R$^2$ and R$^3$ each independently represents mono to a maximum allowable number of substitutions, or no substitution; where each of R$^1$, R$^2$, and R$^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof; where any two substituents may be joined or fused together to form a ring; and where R$^1$ or R$^3$ can join to another ligand via a linking group to form a higher denticity ligand.

In some embodiments of the emissive region, the compound is an emissive dopant or a non-emissive dopant. In some embodiments, the emissive region further comprises a host, wherein the host comprises at least one selected from the group consisting of metal complex, triphenylene, carbazole, dibenzothiophene, dibenzofuran, dibenzoselenophene, aza-triphenylene, azacarbazole, aza-dibenzothiophene, aza-dibenzofuran, and aza-dibenzoselenophene.

In some embodiments of the emissive region, the emissive region further comprises a host, wherein the host is selected from the group consisting of:

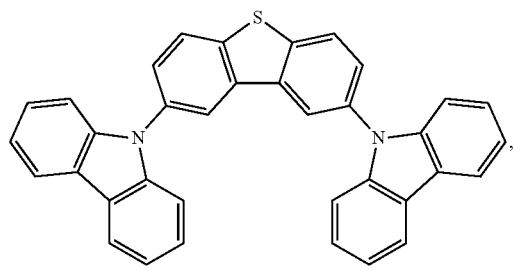

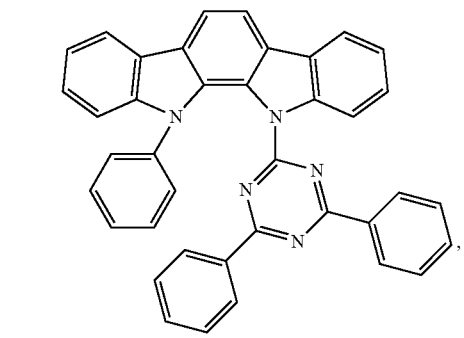

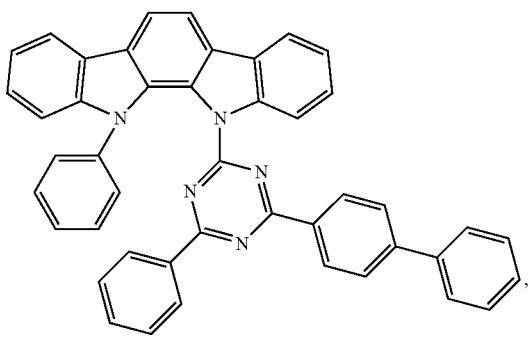

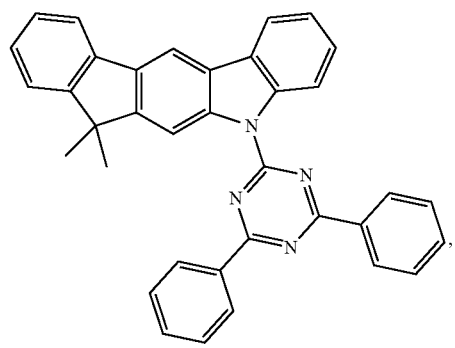

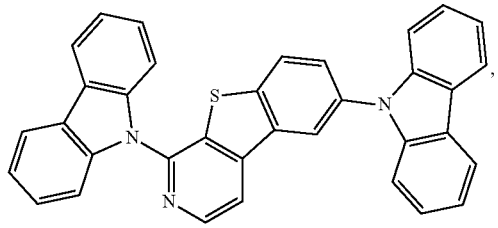

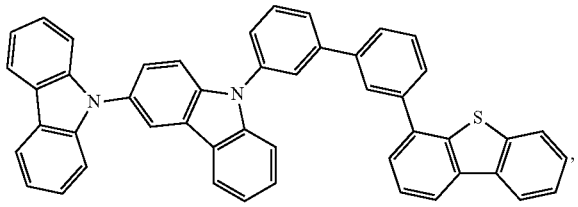

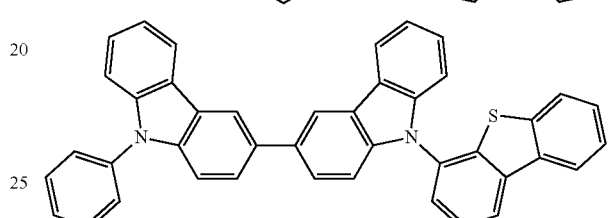

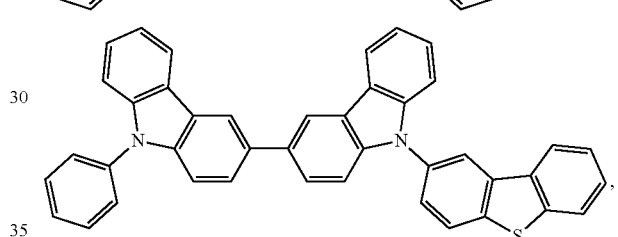

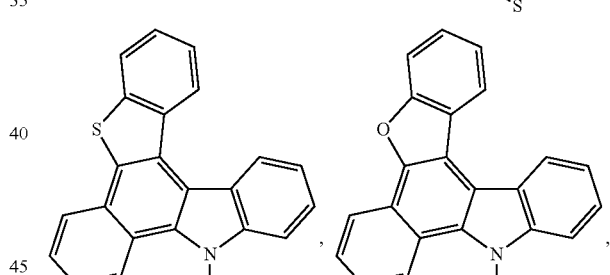

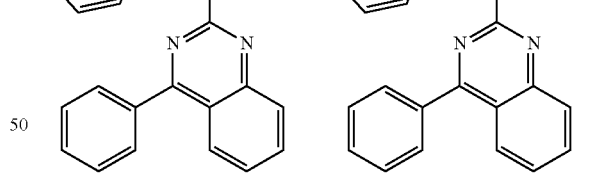

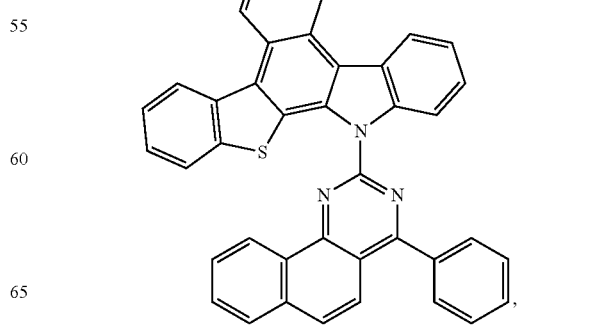

55
-continued
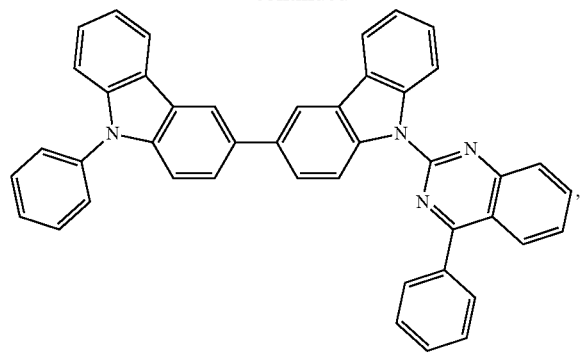
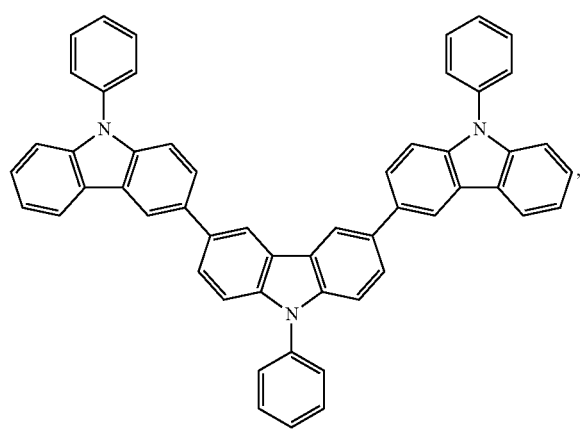
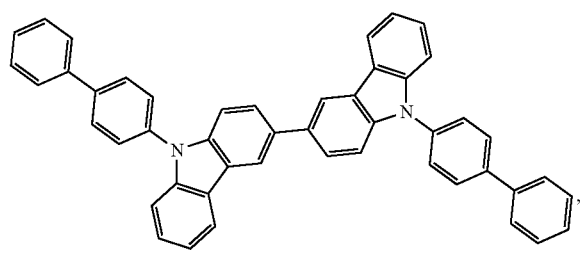
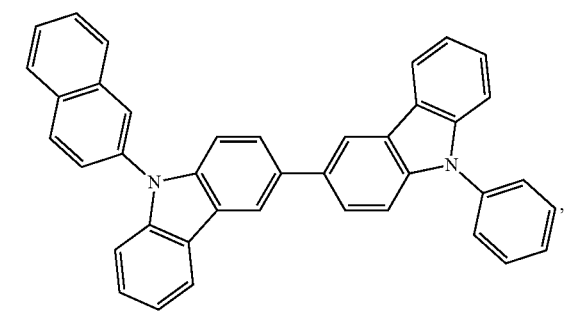
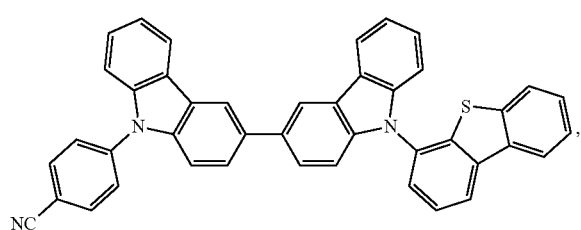
56
-continued
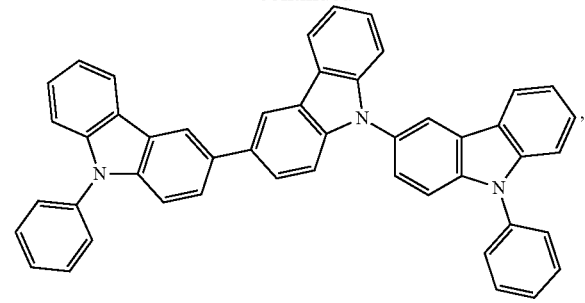
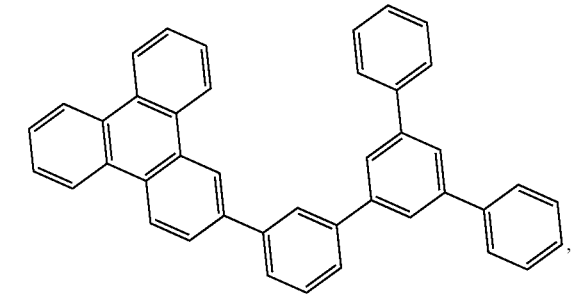
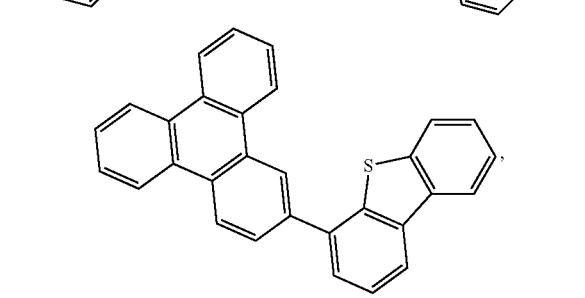
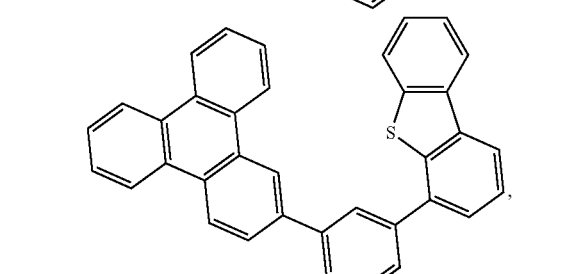
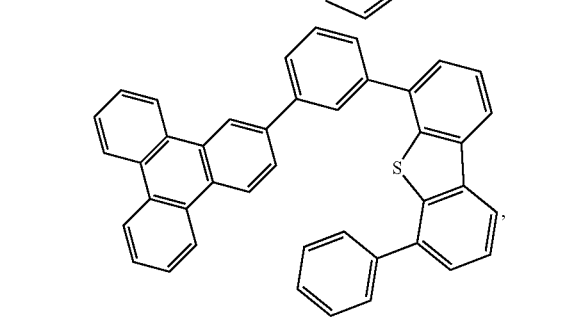

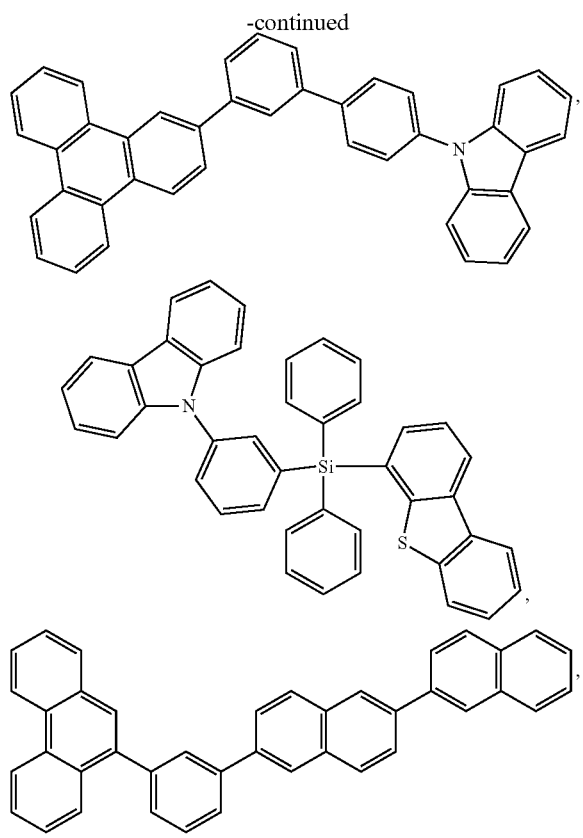

and combinations thereof.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

According to another aspect, a formulation comprising the compound described herein is also disclosed.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be a triphenylene containing benzo-fused thiophene or benzo-fused furan. Any substituent in the host can be an unfused substituent independently selected from the group consisting of $C_nH_{2n+1}$, $OC_nH_{2n+1}$, $OAr_1$, $N(C_nH_{2n+1})_2$, $N(Ar_1)(Ar_2)$, $CH=CH-CH_{2n+1}$, $C\equiv C-CH_{2n+1}$, $Ar_1$, $Ar_1-Ar_2$, and $C_nH_{2n}-Ar$, or the host has no substitutions. In the preceding substituents n can range from 1 to 10; and $Ar_1$ and $Ar_2$ can be independently selected from the group consisting of benzene, biphenyl, naphthalene, triphenylene, carbazole, and heteroaromatic analogs thereof. The host can be an inorganic compound. For example a Zn containing inorganic material e.g. ZnS.

The host can be a compound comprising at least one chemical group selected from the group consisting of triphenylene, carbazole, dibenzothiophene, dibenzofuran, dibenzoselenophene, azatriphenylene, azacarbazole, aza-dibenzothiophene, aza-dibenzofuran, and aza-dibenzoselenophene. The host can include a metal complex. The host can be, but is not limited to, a specific compound selected from the group consisting of:

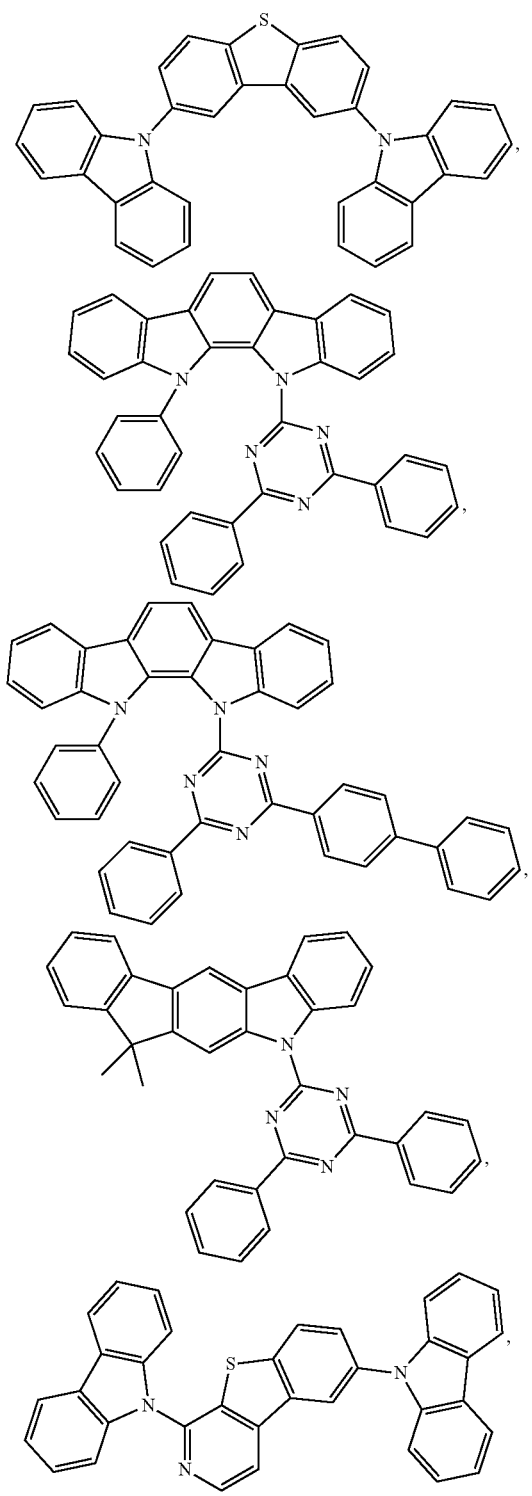

59
-continued
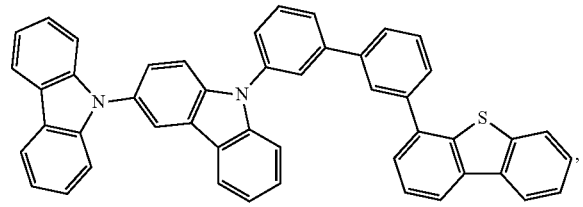
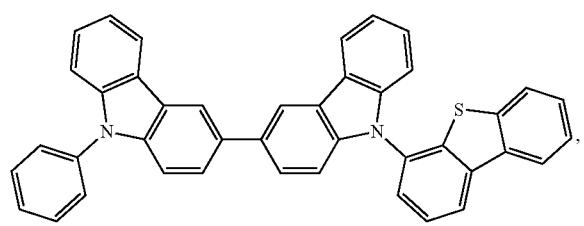
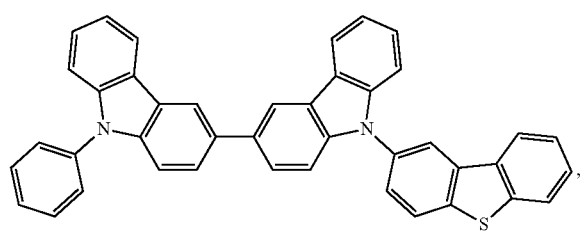
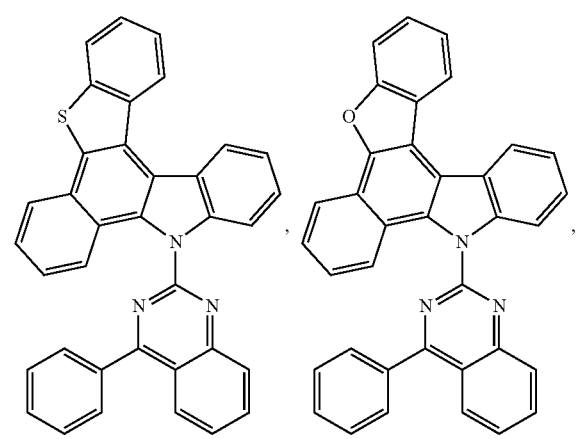
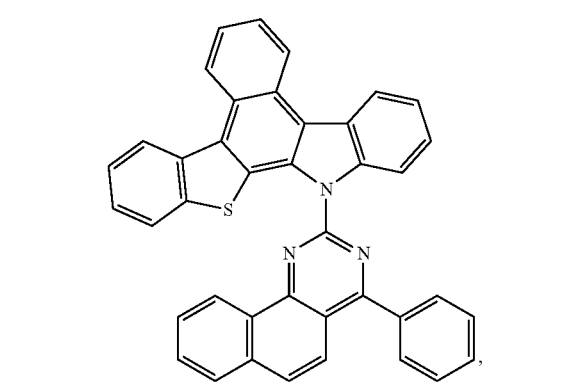
60
-continued
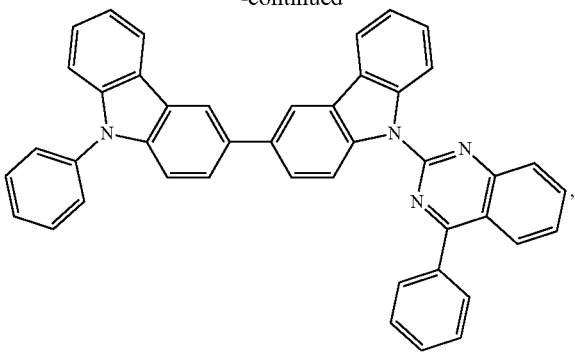
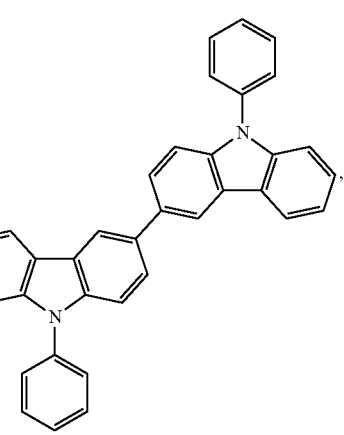
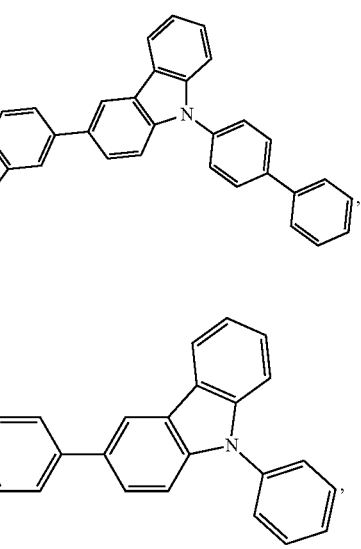
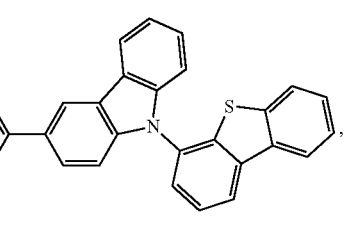

-continued

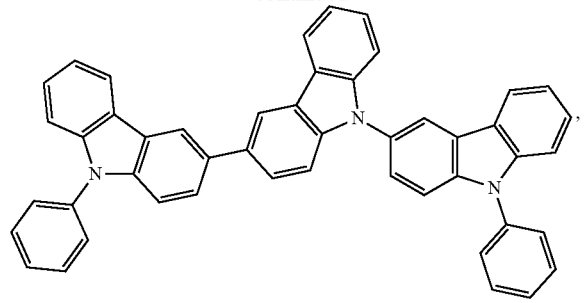

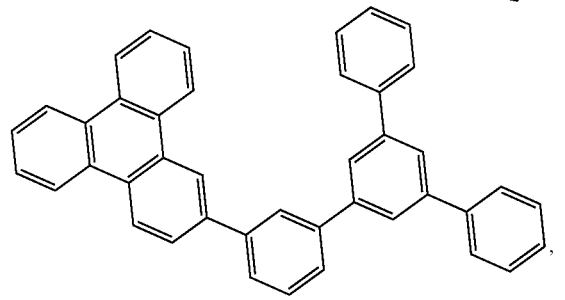

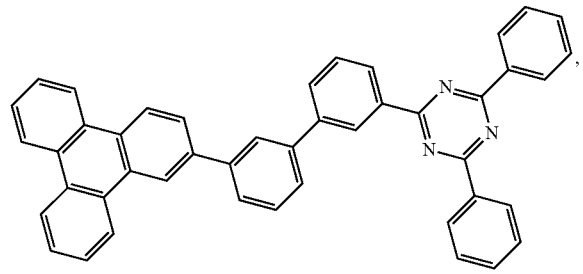

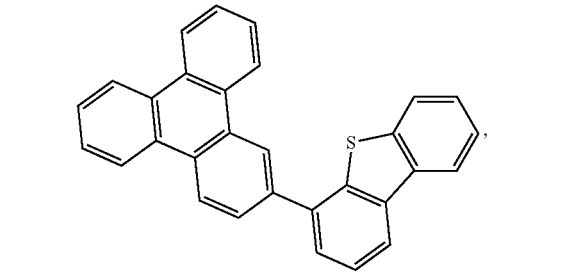

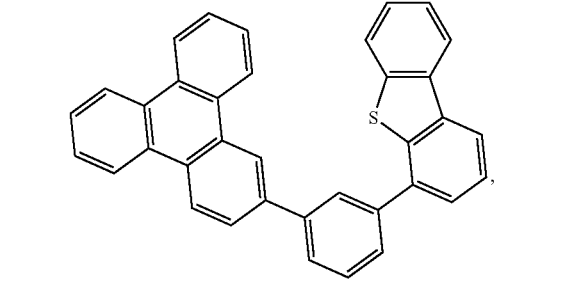

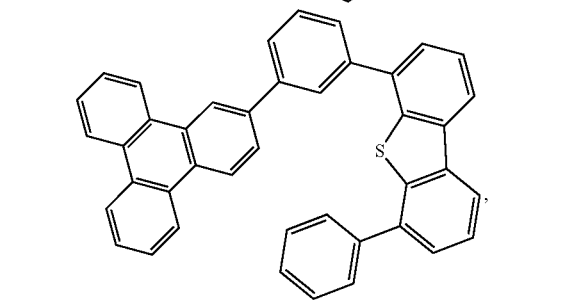

-continued

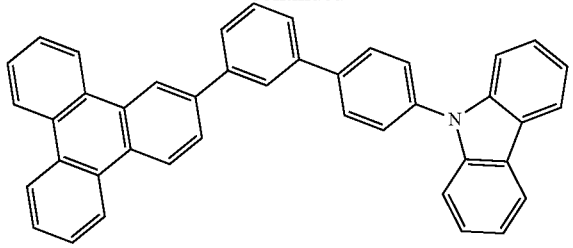

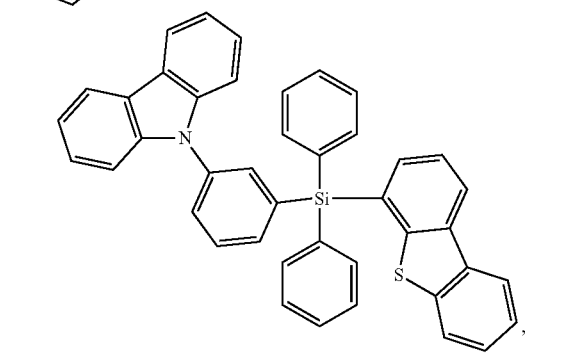

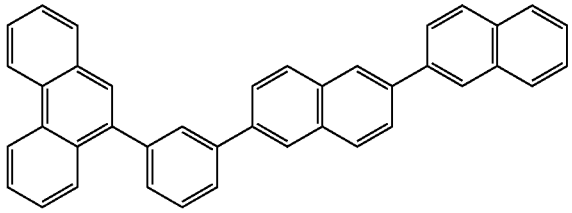

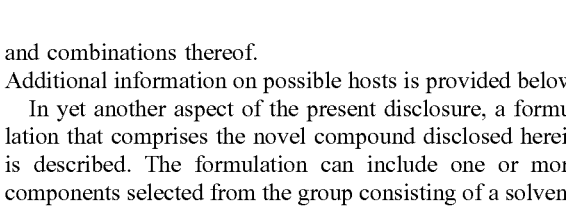

and combinations thereof.

Additional information on possible hosts is provided below.

In yet another aspect of the present disclosure, a formulation that comprises the novel compound disclosed herein is described. The formulation can include one or more components selected from the group consisting of a solvent, a host, a hole injection material, hole transport material, electron blocking material, hole blocking material, and an electron transport material, disclosed herein.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

Non-limiting examples of the conductivity dopants that may be used in an OLED in combination with materials disclosed herein are exemplified below together with references that disclose those materials: EP01617493, EP01968131, EP2020694, EP2684932, US20050139810, US20070160905, US20090167167, US2010288362, WO06081780, WO2009003455, WO2009008277, WO2009011327, WO2014009310, US2007252140, US2015060804, US20150123047, and US2012146012.
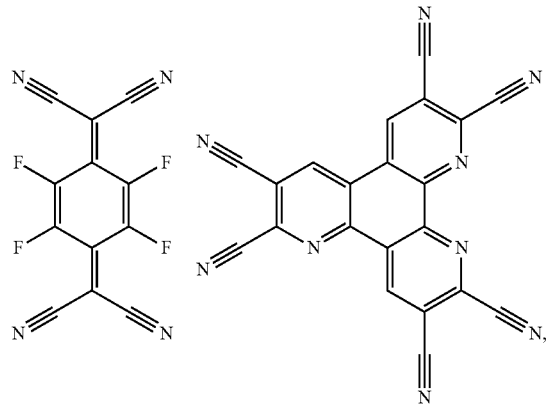
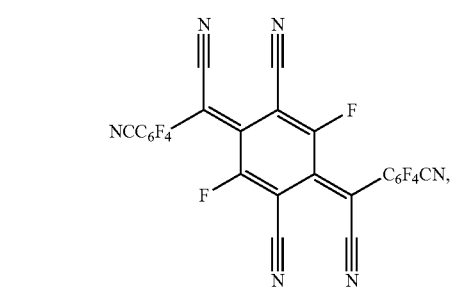
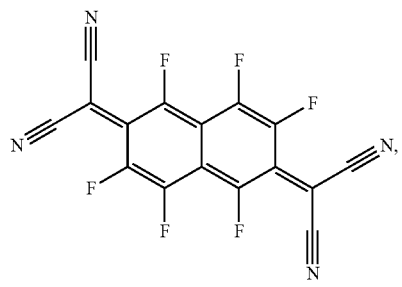
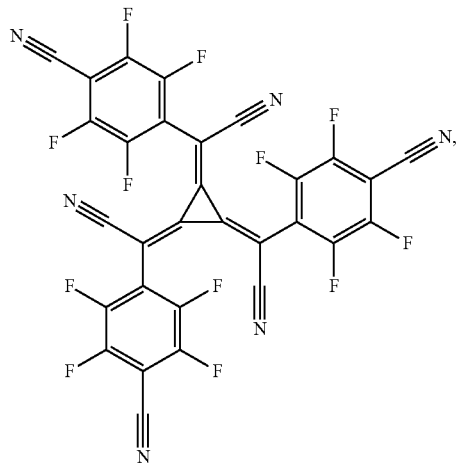
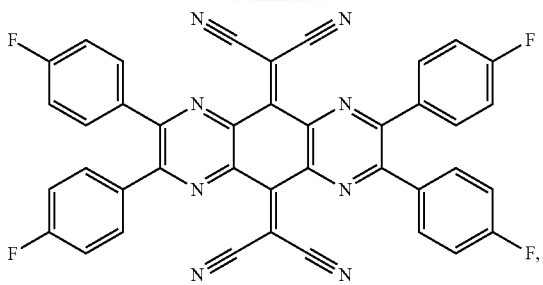
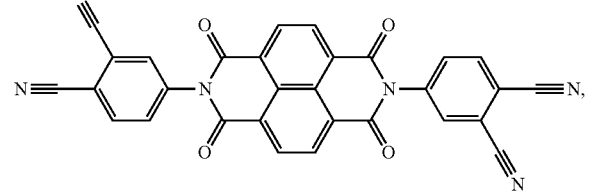
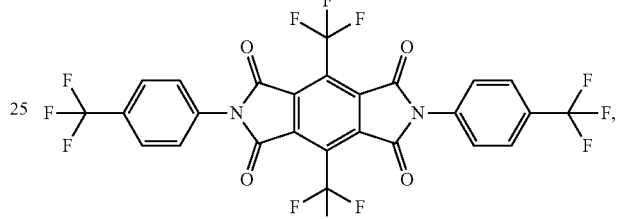
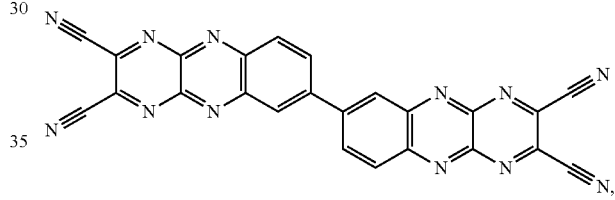
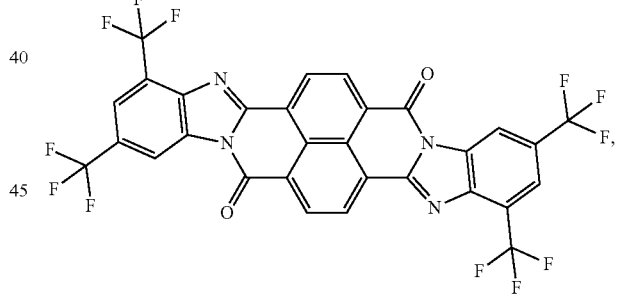
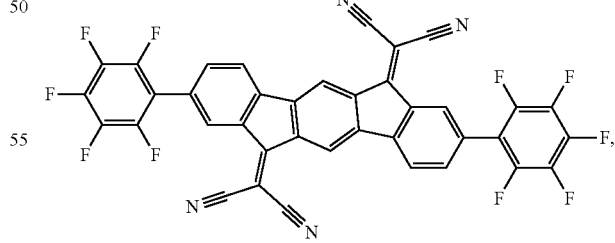
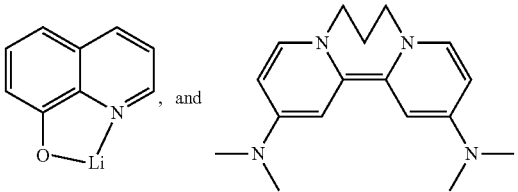

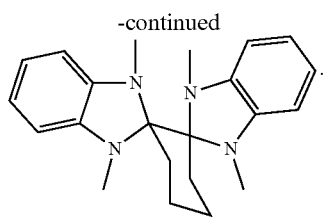

HIL/HTL:

A hole injecting/transporting material to be used in the present invention is not particularly limited, and any compound may be used as long as the compound is typically used as a hole injecting/transporting material. Examples of the material include, but are not limited to: a phthalocyanine or porphyrin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and silane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

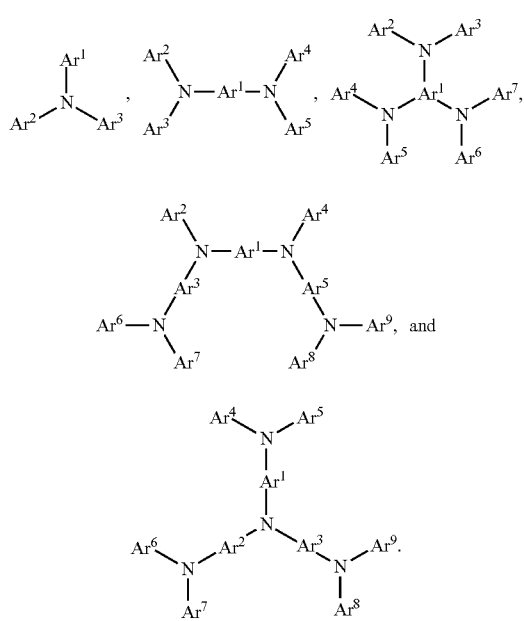

Each of $Ar^1$ to $Ar^9$ is selected from the group consisting of aromatic hydrocarbon cyclic compounds such as benzene, biphenyl, triphenyl, triphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each Ar may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, $Ar^1$ to $Ar^9$ is independently selected from the group consisting of:

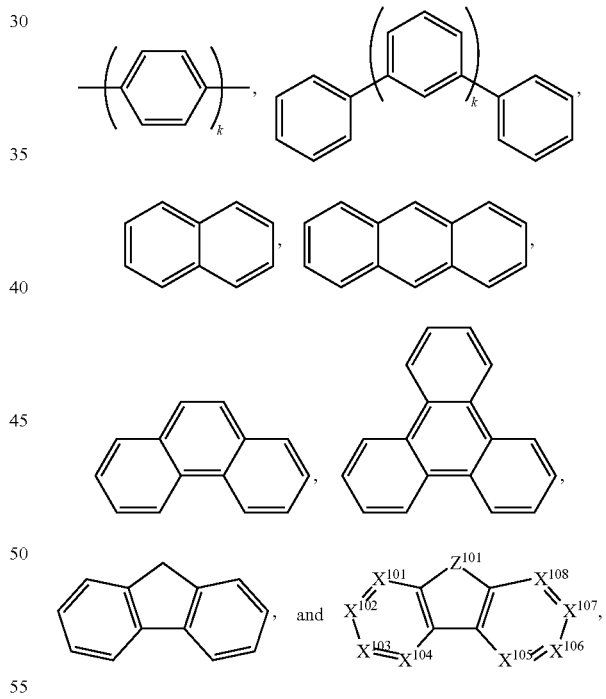

wherein k is an integer from 1 to 20; $X^{101}$ to $X^{108}$ is C (including CH) or N; $Z^{101}$ is $NAr^1$, O, or S; $Ar^1$ has the same group defined above.

Examples of metal complexes used in HIL or HTL include, but are not limited to the following general formula:

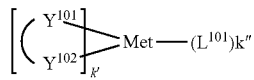

wherein Met is a metal, which can have an atomic weight greater than 40; ($Y^{101}$-$Y^{102}$) is a bidentate ligand, $Y^{101}$ and $Y^{102}$ are independently selected from C, N, O, P, and S; $L^{101}$ is an ancillary ligand; k' is an integer value from 1 to the maximum number of ligands that may be attached to the metal; and k'+k" is the maximum number of ligands that may be attached to the metal.

In one aspect, ($Y^{101}$-$Y^{102}$) is a 2-phenylpyridine derivative. In another aspect, ($Y^{101}$-$Y^{102}$) is a carbene ligand. In another aspect, Met is selected from Ir, Pt, Os, and Zn. In a further aspect, the metal complex has a smallest oxidation potential in solution vs. $Fc^+$/Fc couple less than about 0.6 V.

Non-limiting examples of the HIL and HTL materials that may be used in an OLED in combination with materials disclosed herein are exemplified below together with references that disclose those materials: CN102702075, DE102012005215, EP01624500, EP01698613, EP01806334, EP01930964, EP01972613, EP01997799, EP02011790, EP02055700, EP02055701, EP1725079, EP2085382, EP2660300, EP650955, JP07-073529, JP2005112765, JP2007091719, JP2008021687, JP2014-009196, KR20110088898, KR20130077473, TW201139402, U.S. Ser. No. 06/517,957, US20020158242, US20030162053, US20050123751, US20060182993, US20060240279, US20070145888, US20070181874, US20070278938, US20080014464, US20080091025, US20080106190, US20080124572, US20080145707, US20080220265, US20080233434, US20080303417, US2008107919, US20090115320, US20090167161, US2009066235, US2011007385, US20110163302, US2011240968, US2011278551, US2012205642, US2013241401, US20140117329, US2014183517, U.S. Pat. Nos. 5,061,569, 5,639,914, WO05075451, WO07125714, WO08023550, WO08023759, WO2009145016, WO2010061824, WO2011075644, WO2012177006, WO2013018530, WO2013039073, WO2013087142, WO2013118812, WO2013120577, WO2013157367, WO2013175747, WO2014002873, WO2014015935, WO2014015937, WO2014030872, WO2014030921, WO2014034791, WO2014104514, WO2014157018.

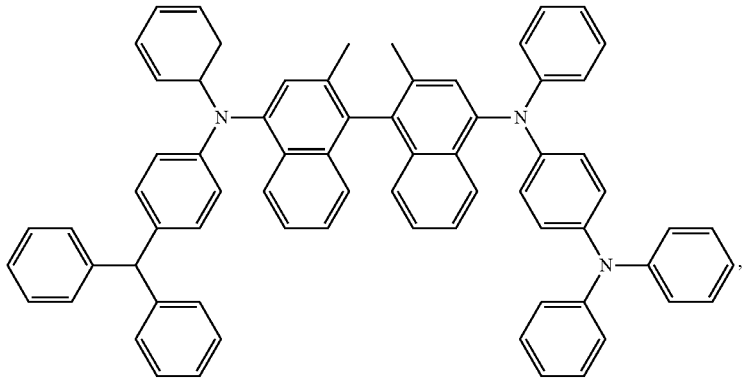

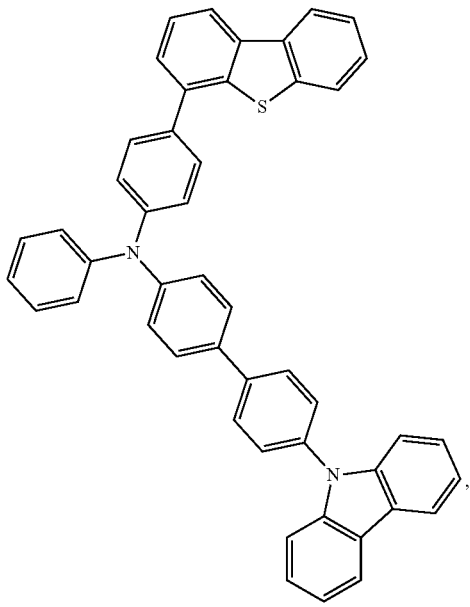

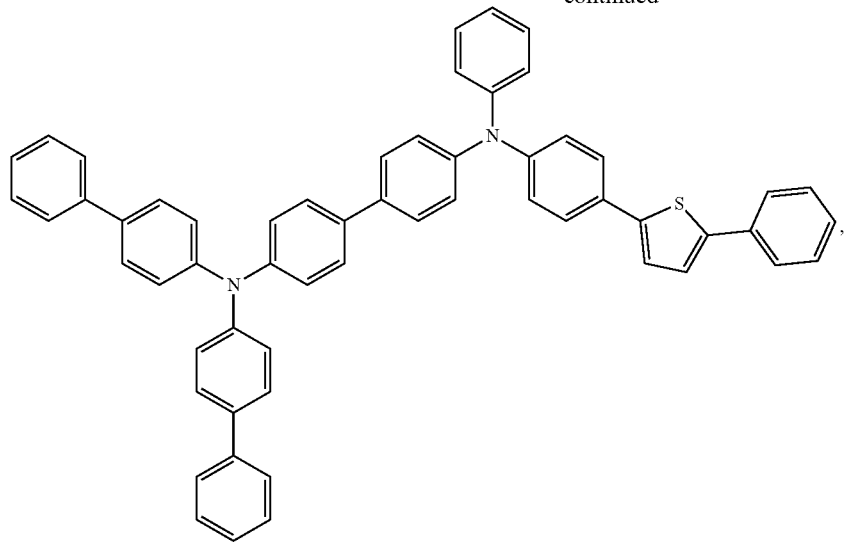
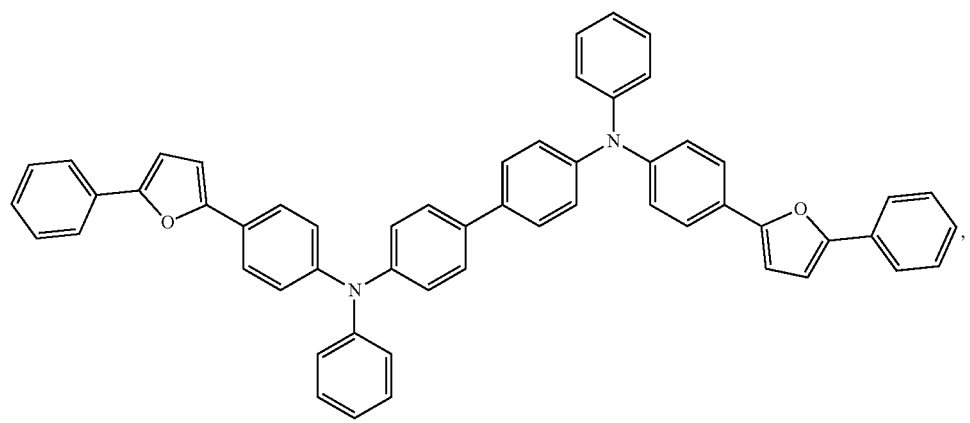
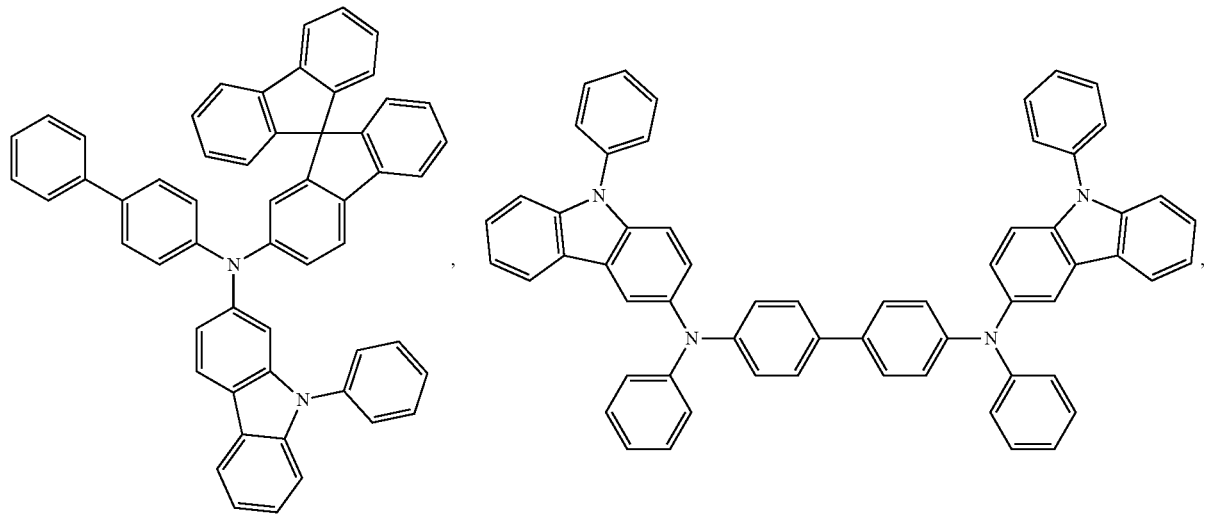

-continued
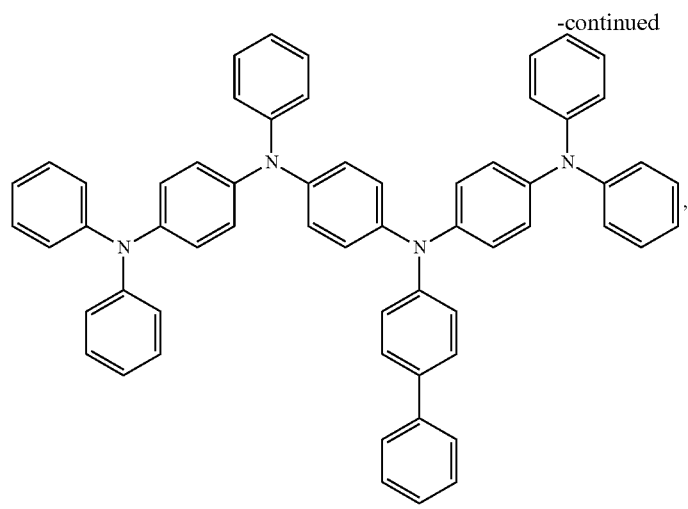
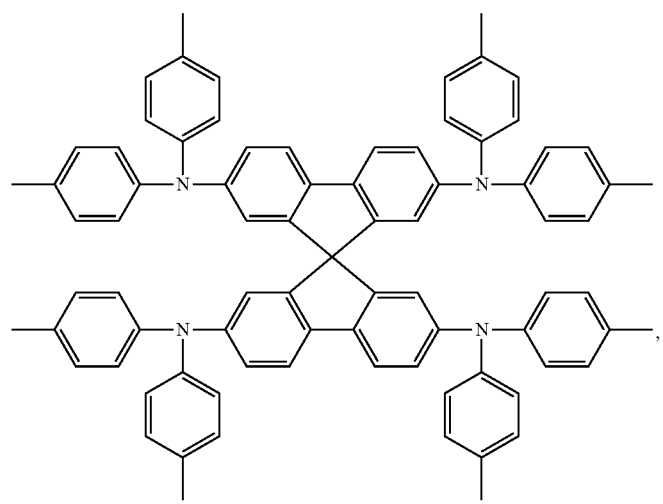
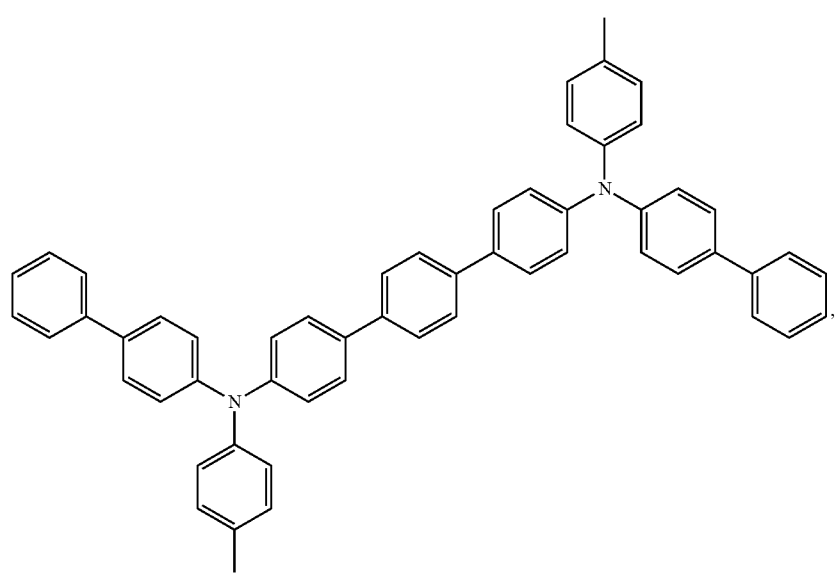

-continued
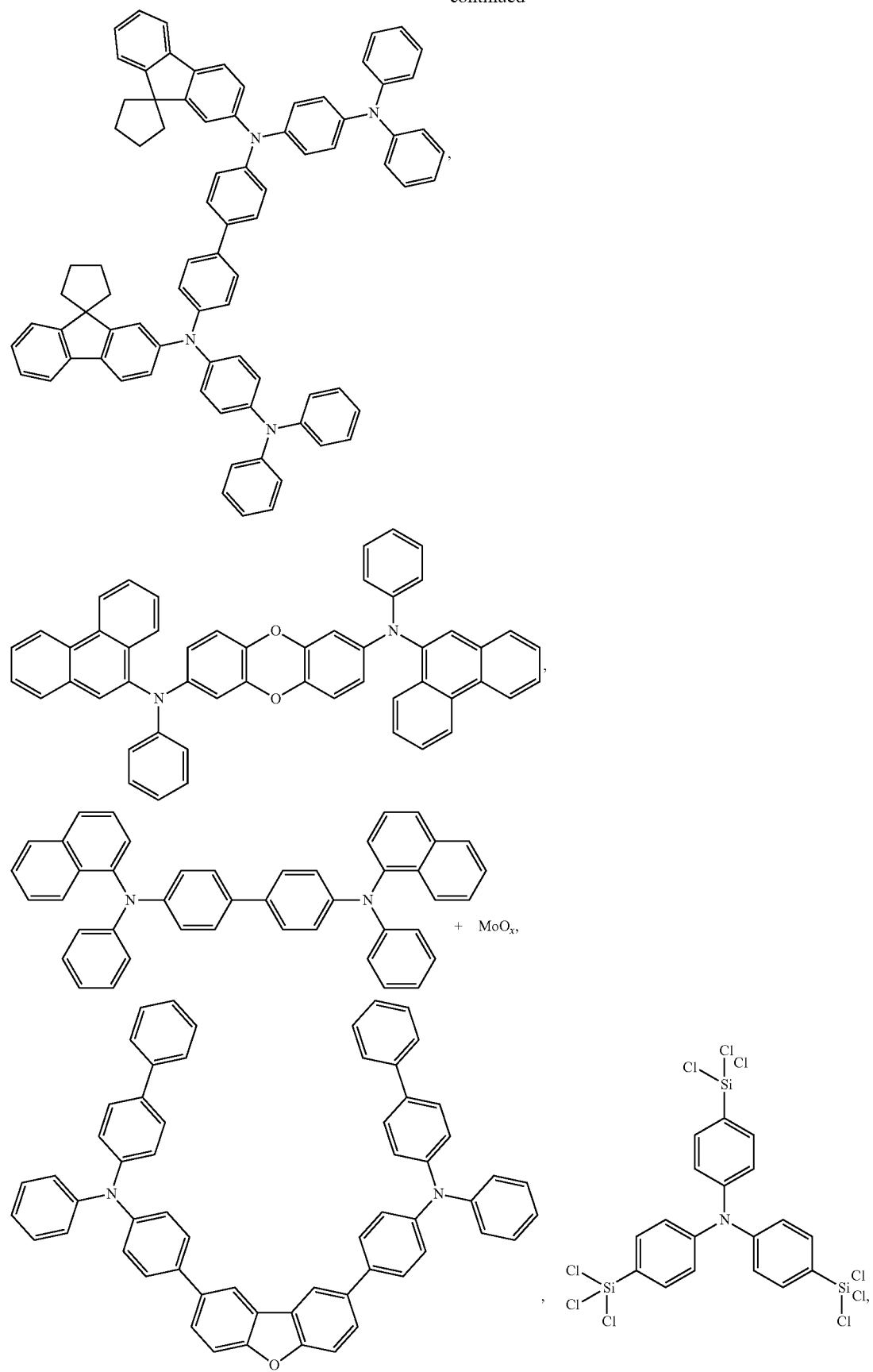

75 76
-continued
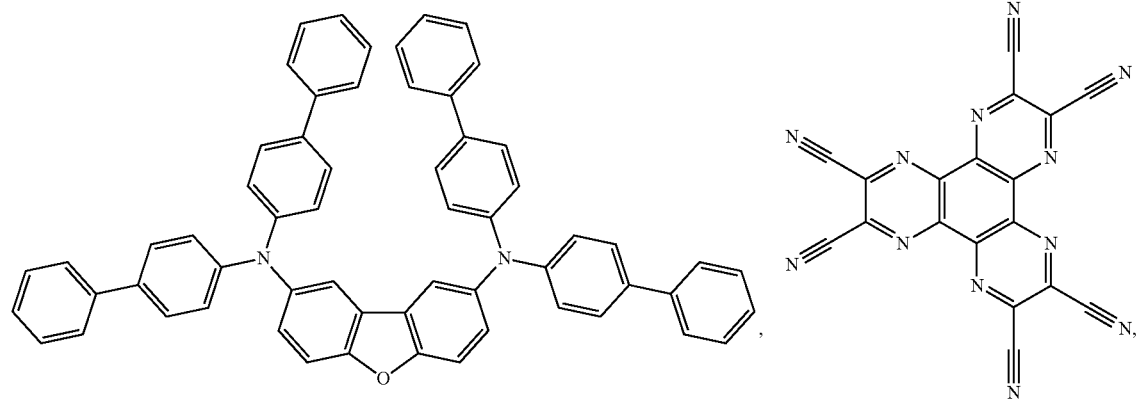
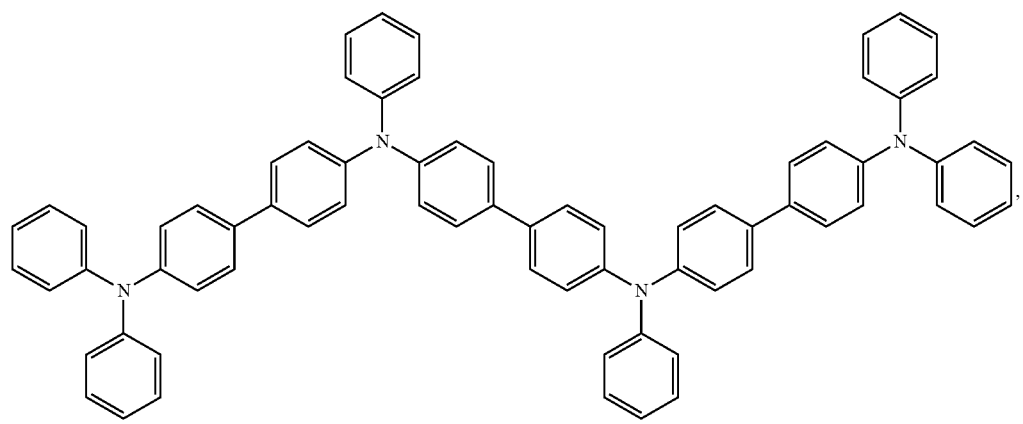
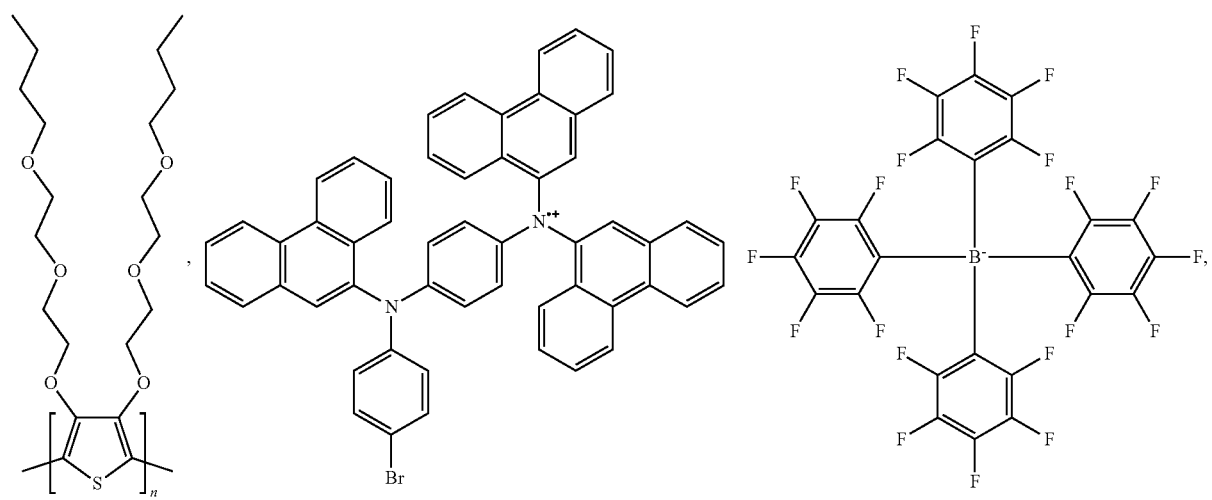

-continued
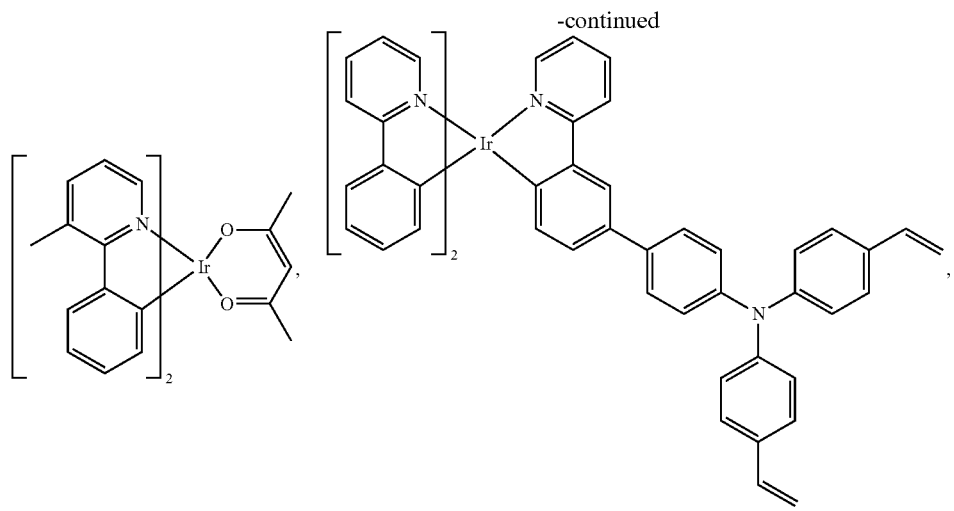
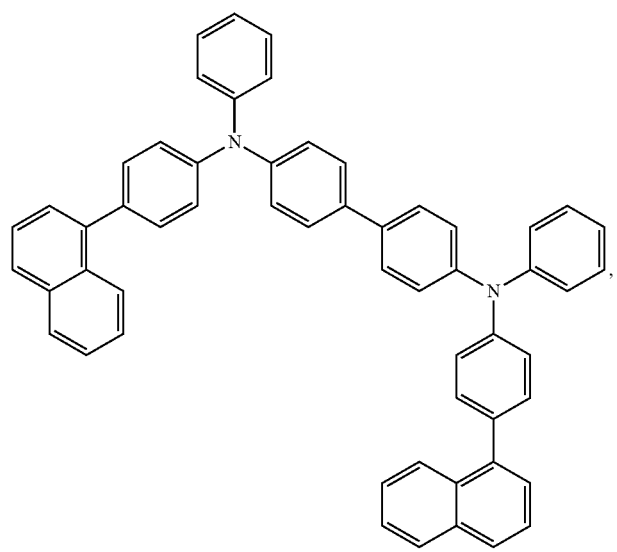
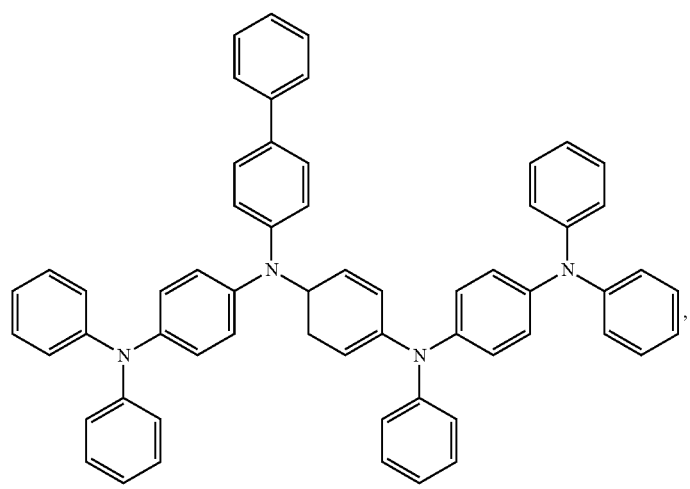

-continued
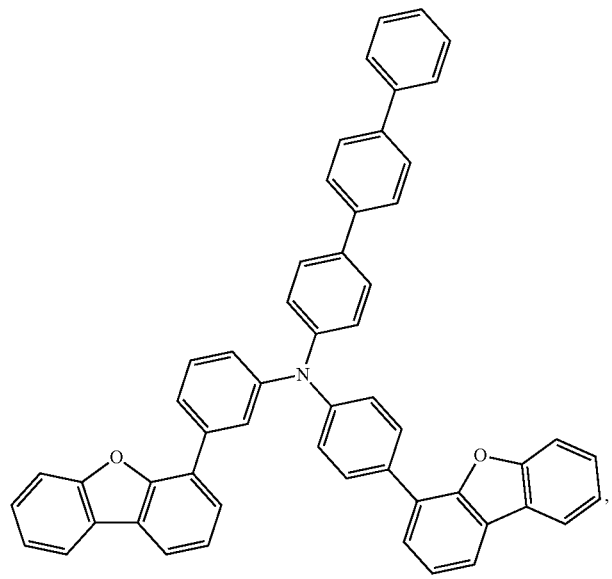
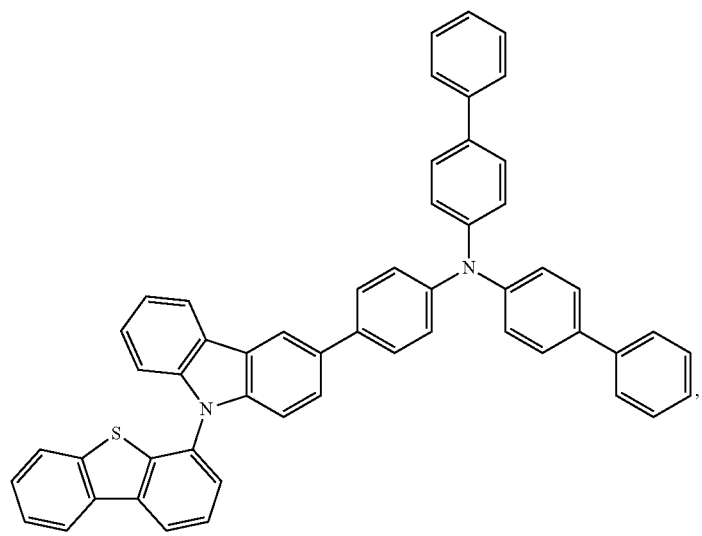
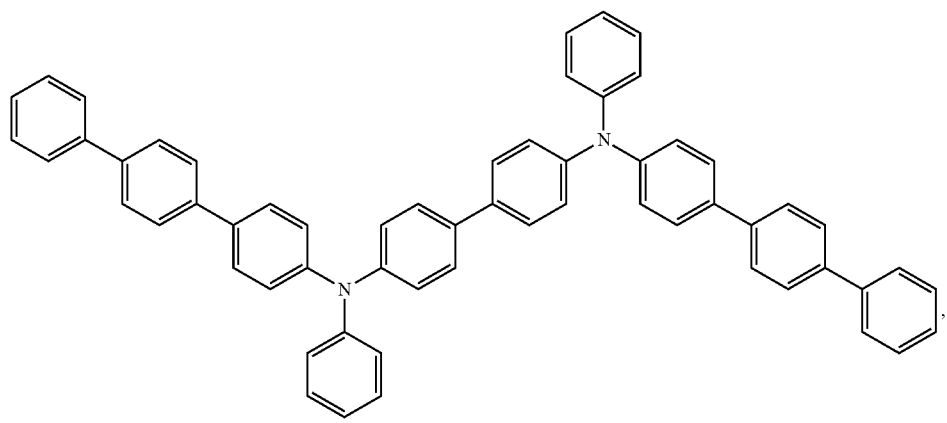

-continued
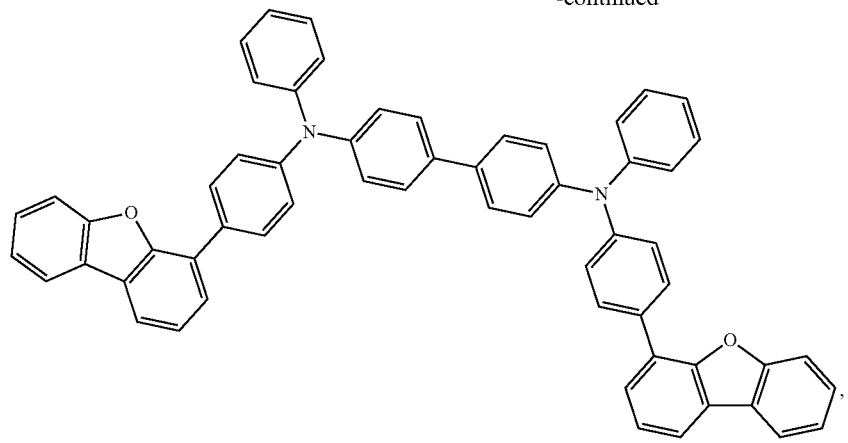
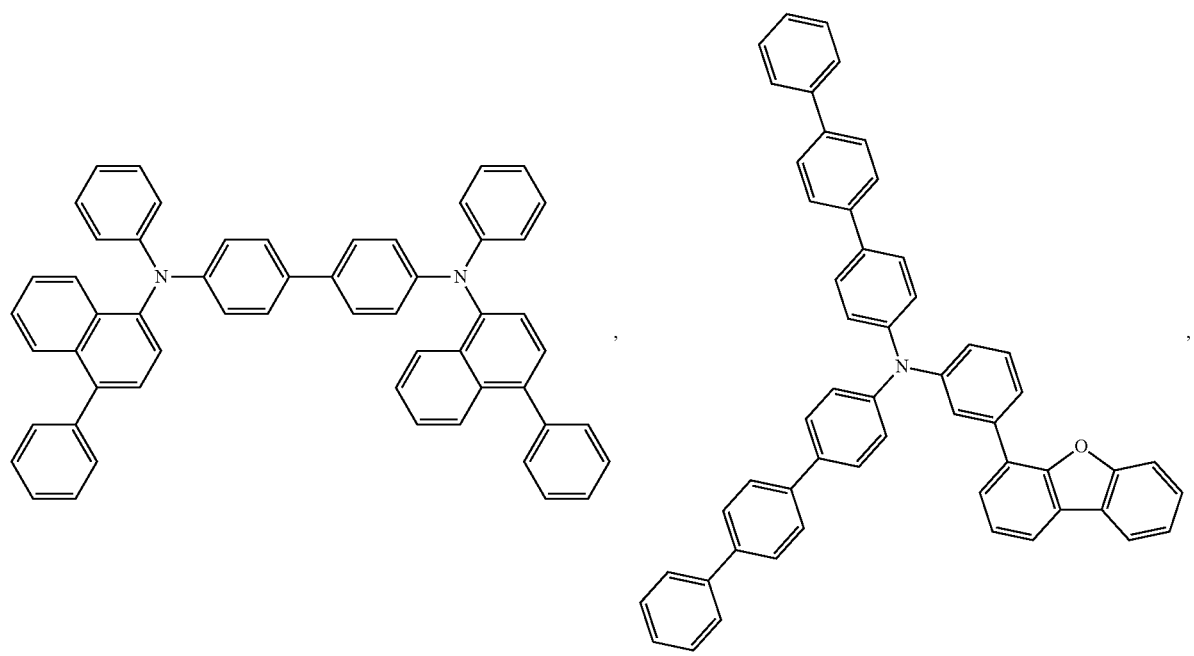
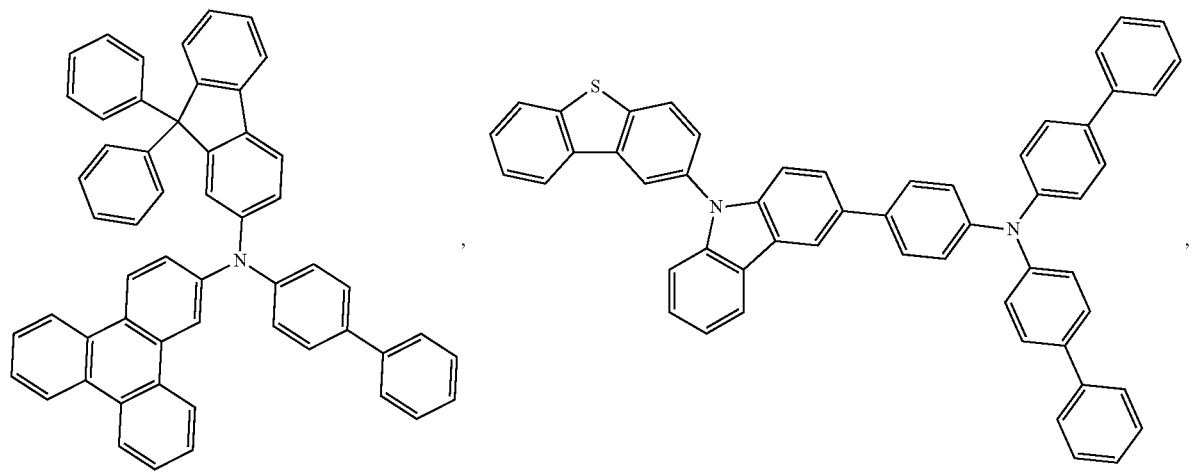

-continued
83
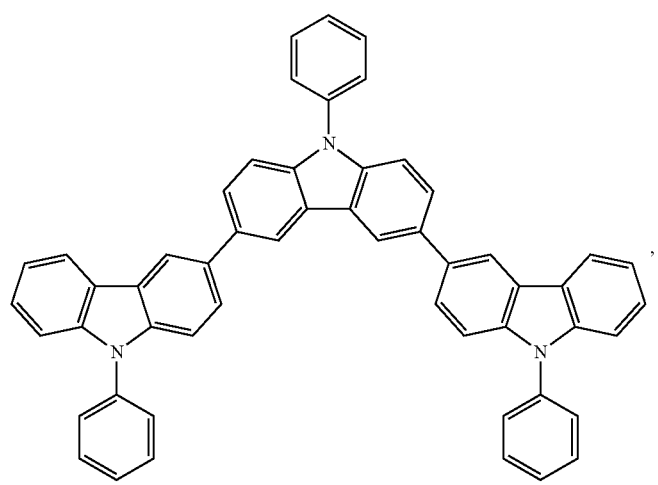
84
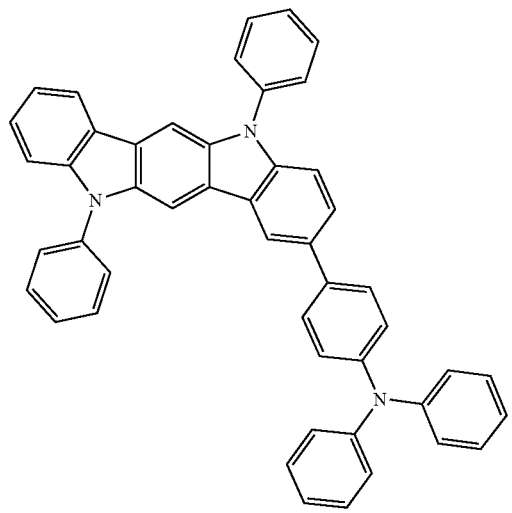
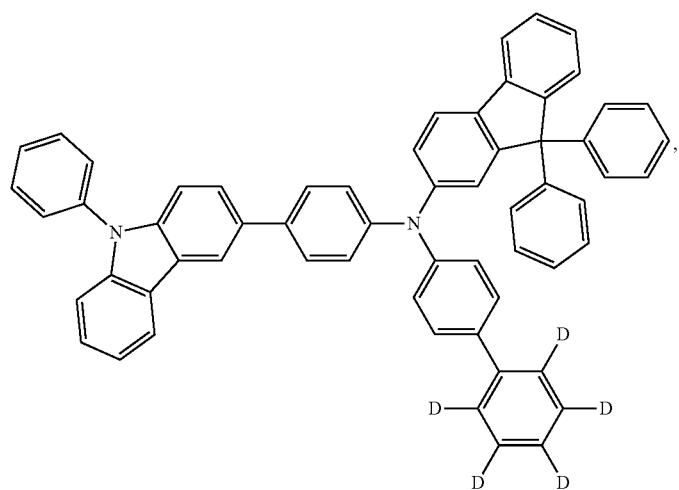
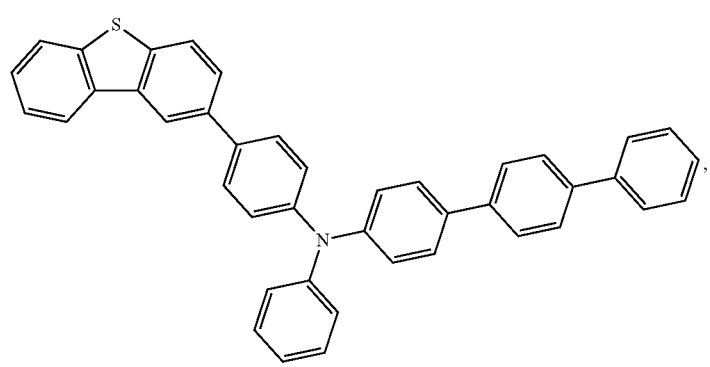

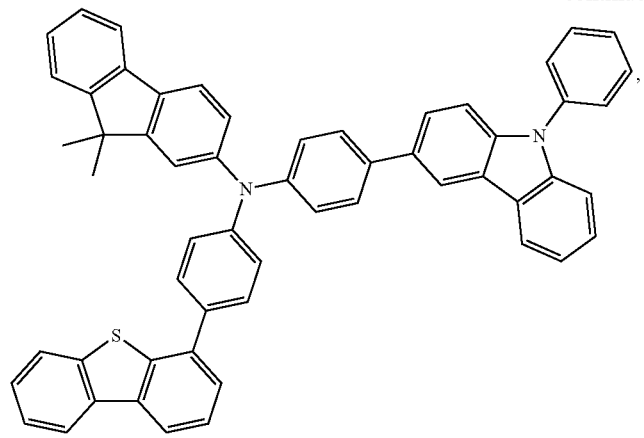
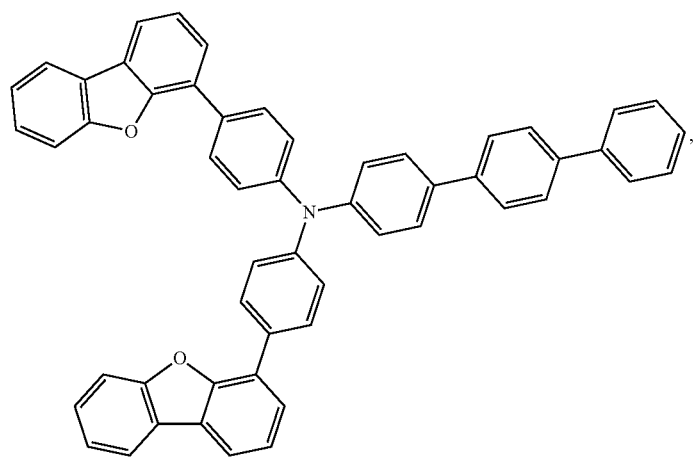
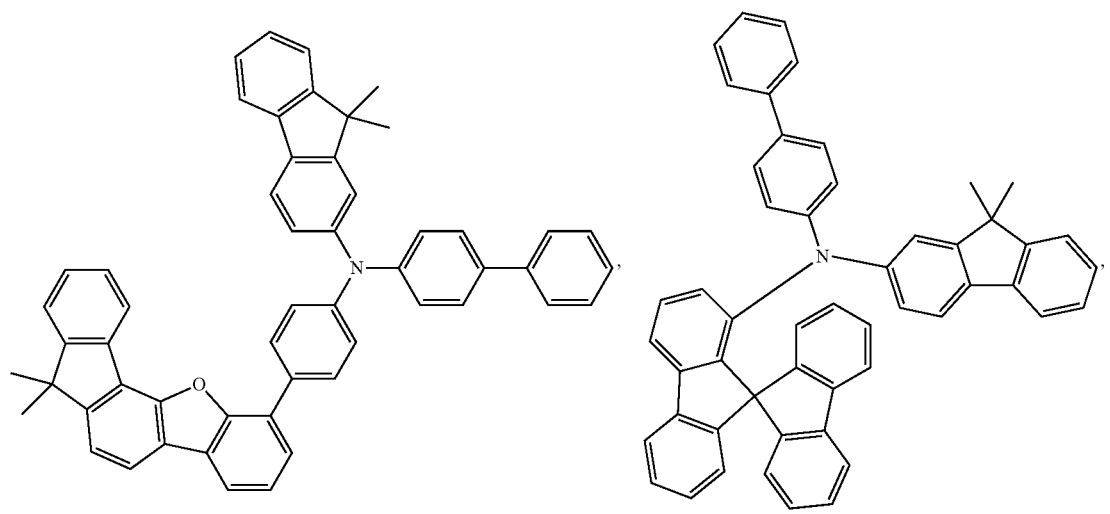

-continued
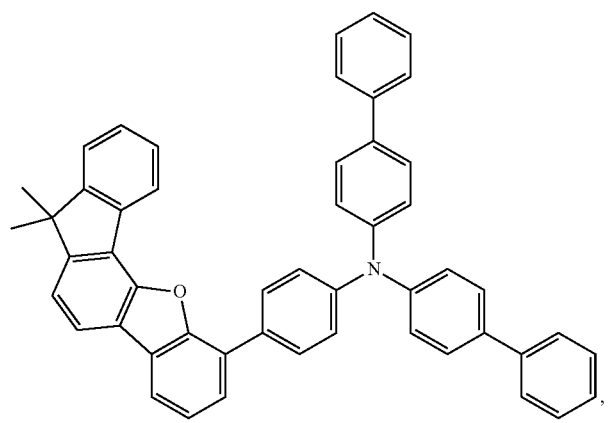
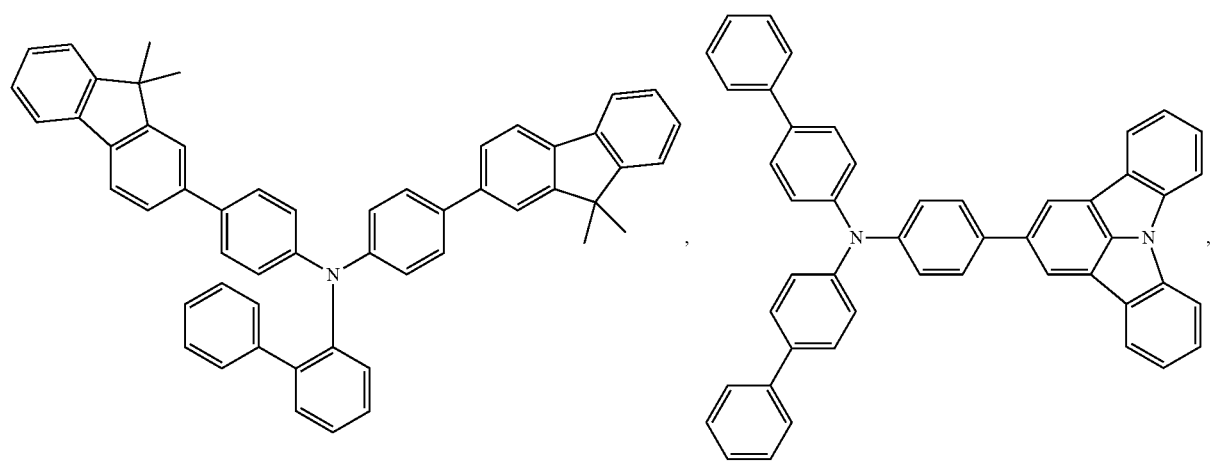
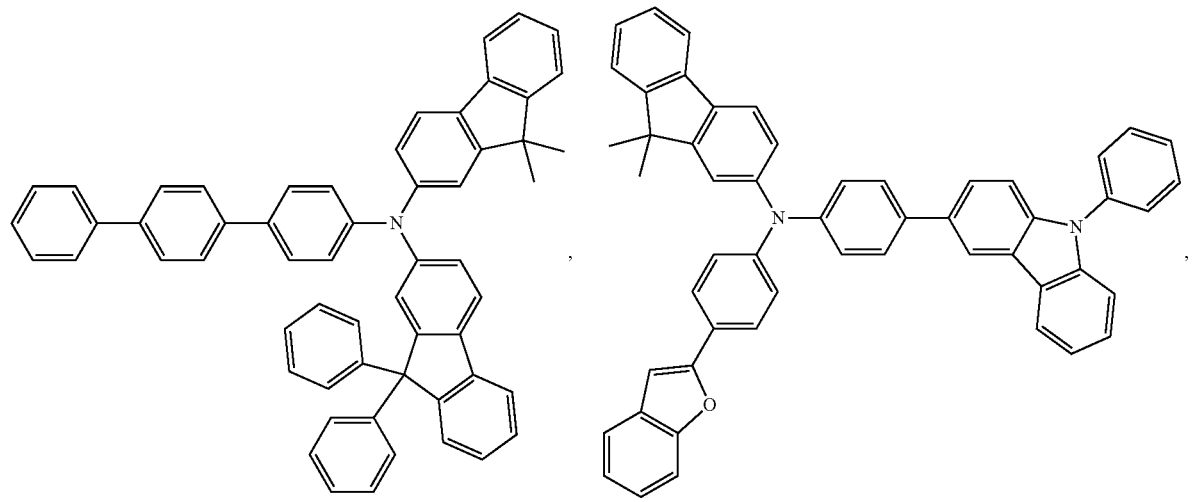

89
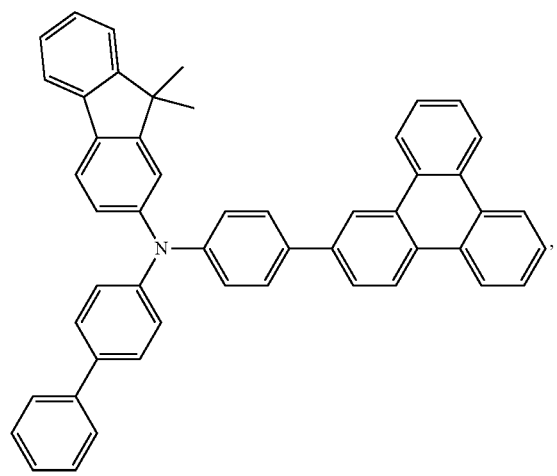
90
-continued
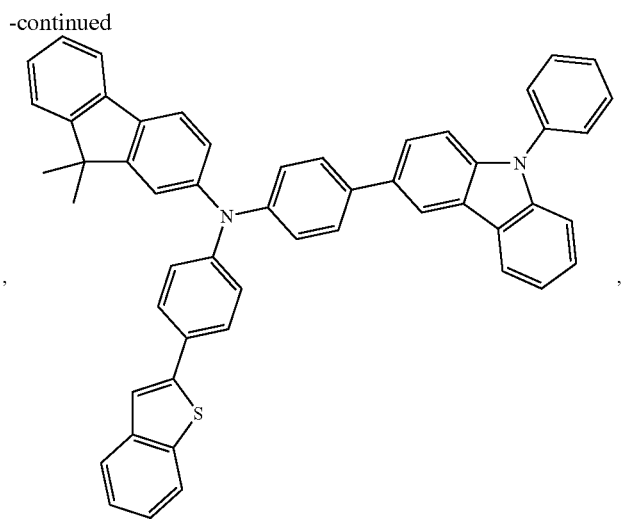
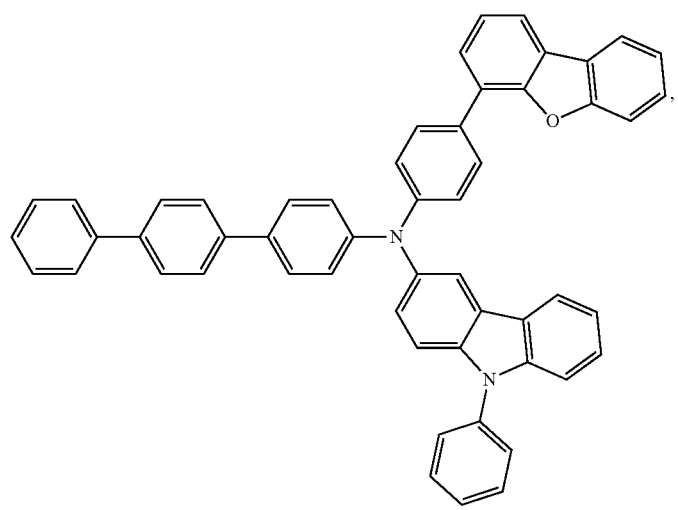
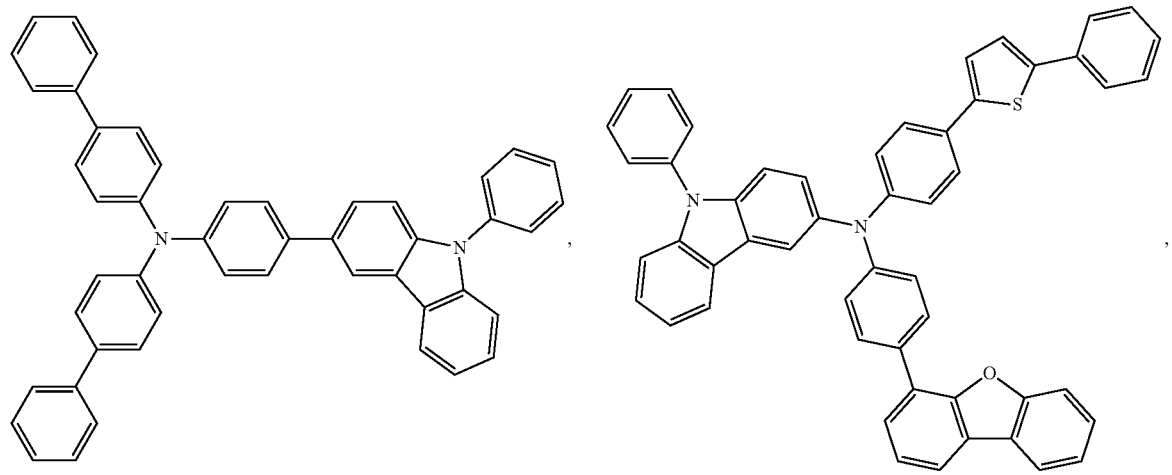

-continued
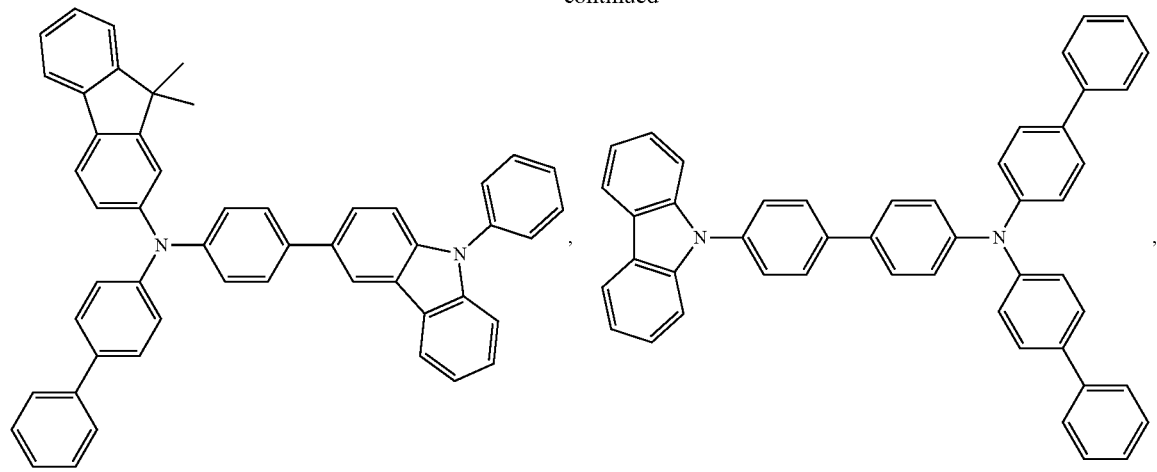
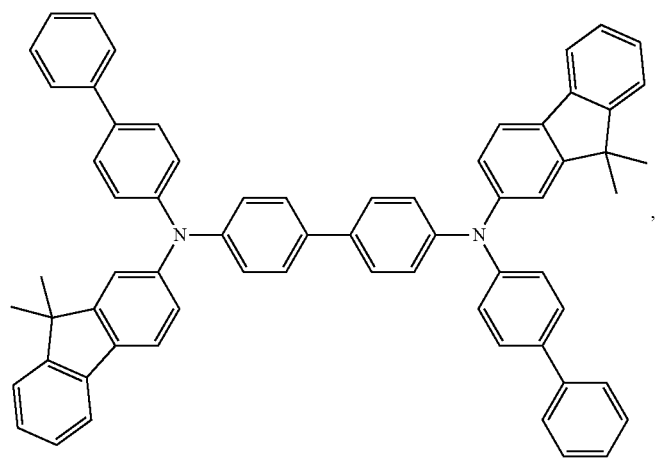
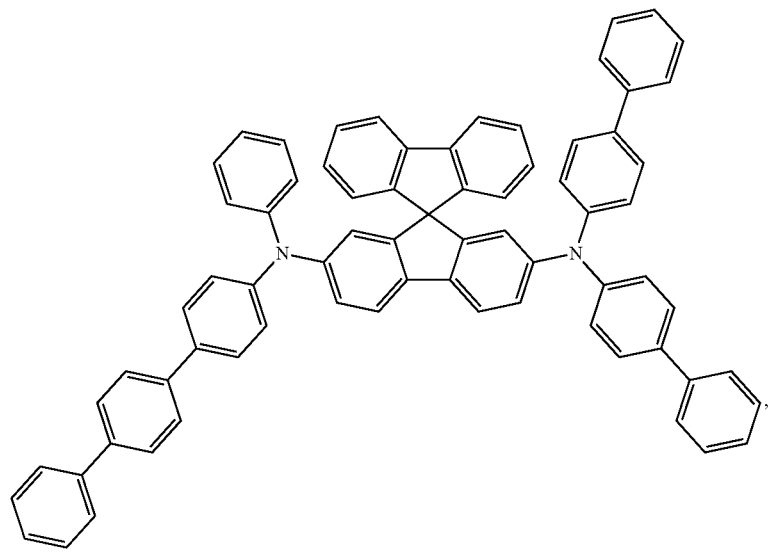

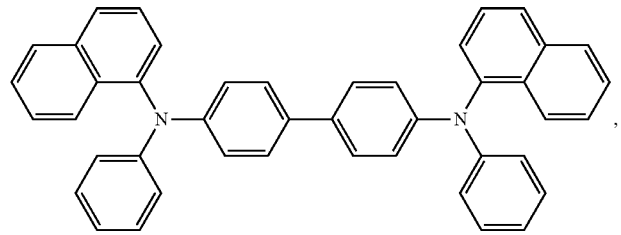
,
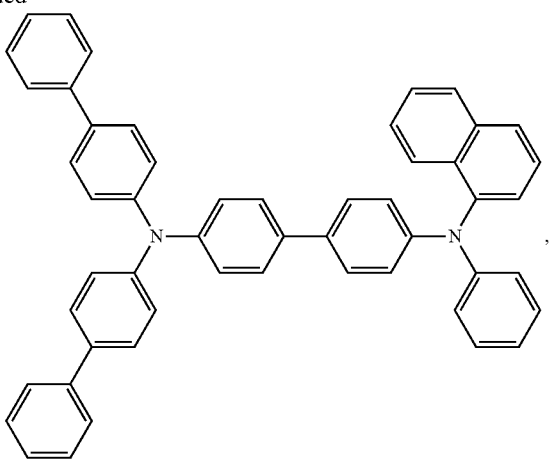
,
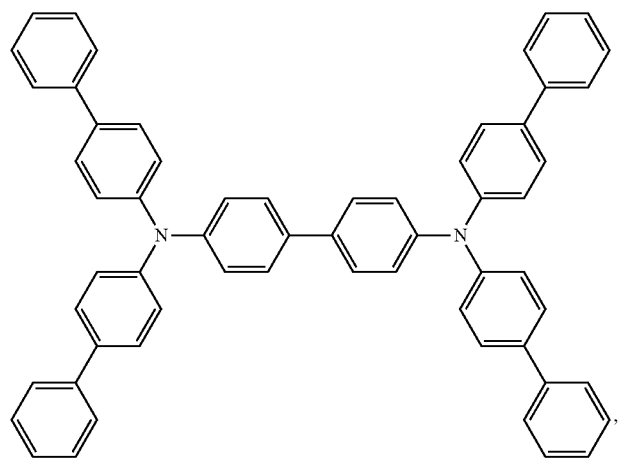
,
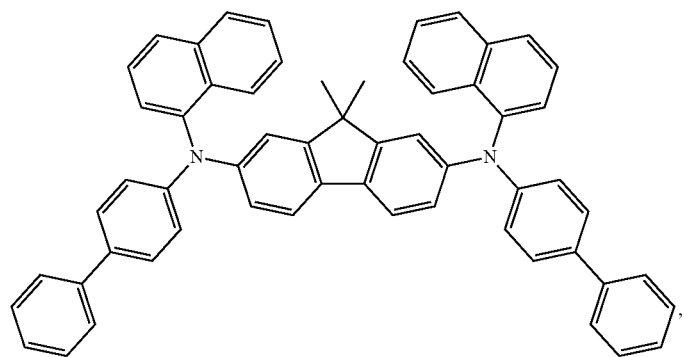
,

-continued
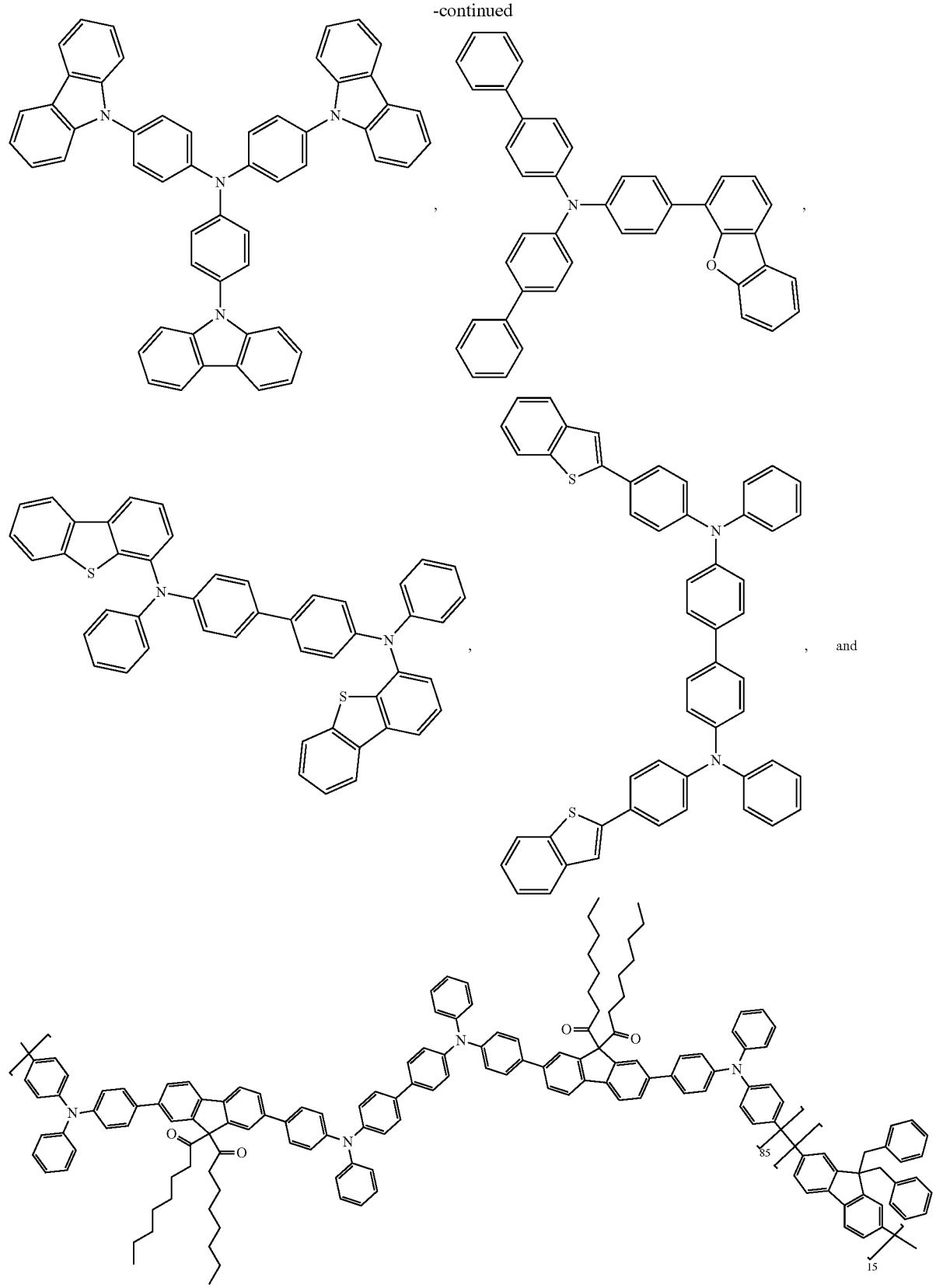
EBL:
An electron blocking layer (EBL) may be used to reduce the number of electrons and/or excitons that leave the emissive layer. The presence of such a blocking layer in a device may result in substantially higher efficiencies, and/or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and/or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

Examples of metal complexes used as host are preferred to have the following general formula:

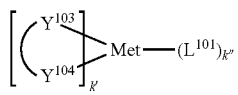

wherein Met is a metal; $(Y^{103}-Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

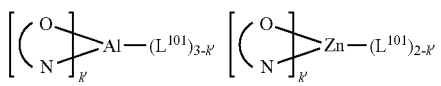

wherein (O—N) is a bidentate ligand, having metal coordinated to atoms O and N.

In another aspect, Met is selected from Ir and Pt. In a further aspect, $(Y^{103}-Y^{104})$ is a carbene ligand.

Examples of other organic compounds used as host are selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

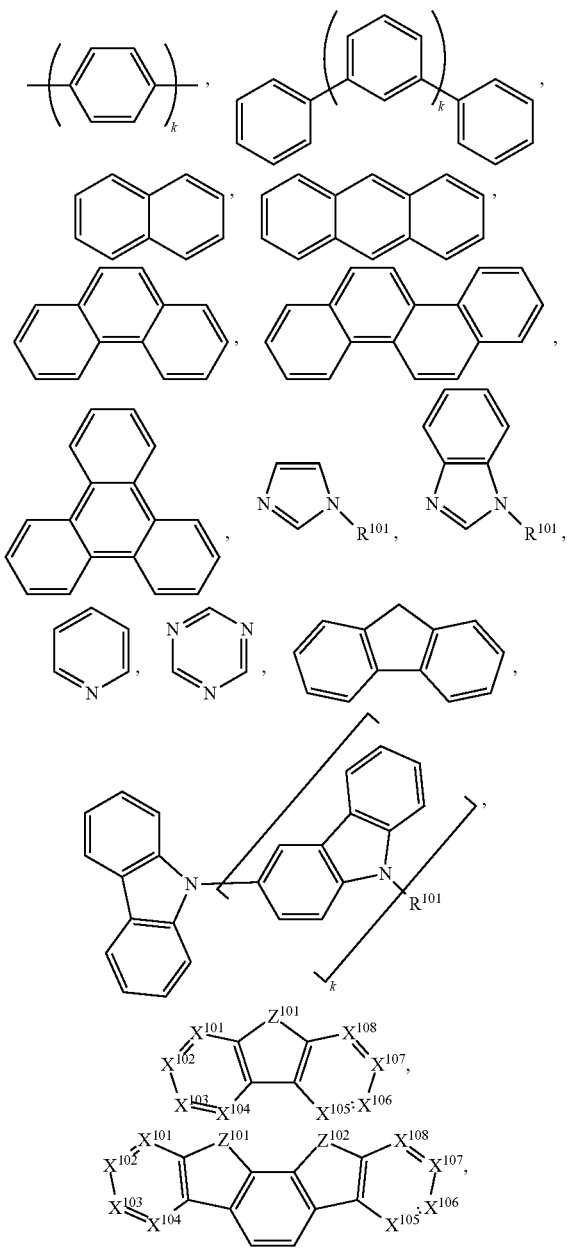

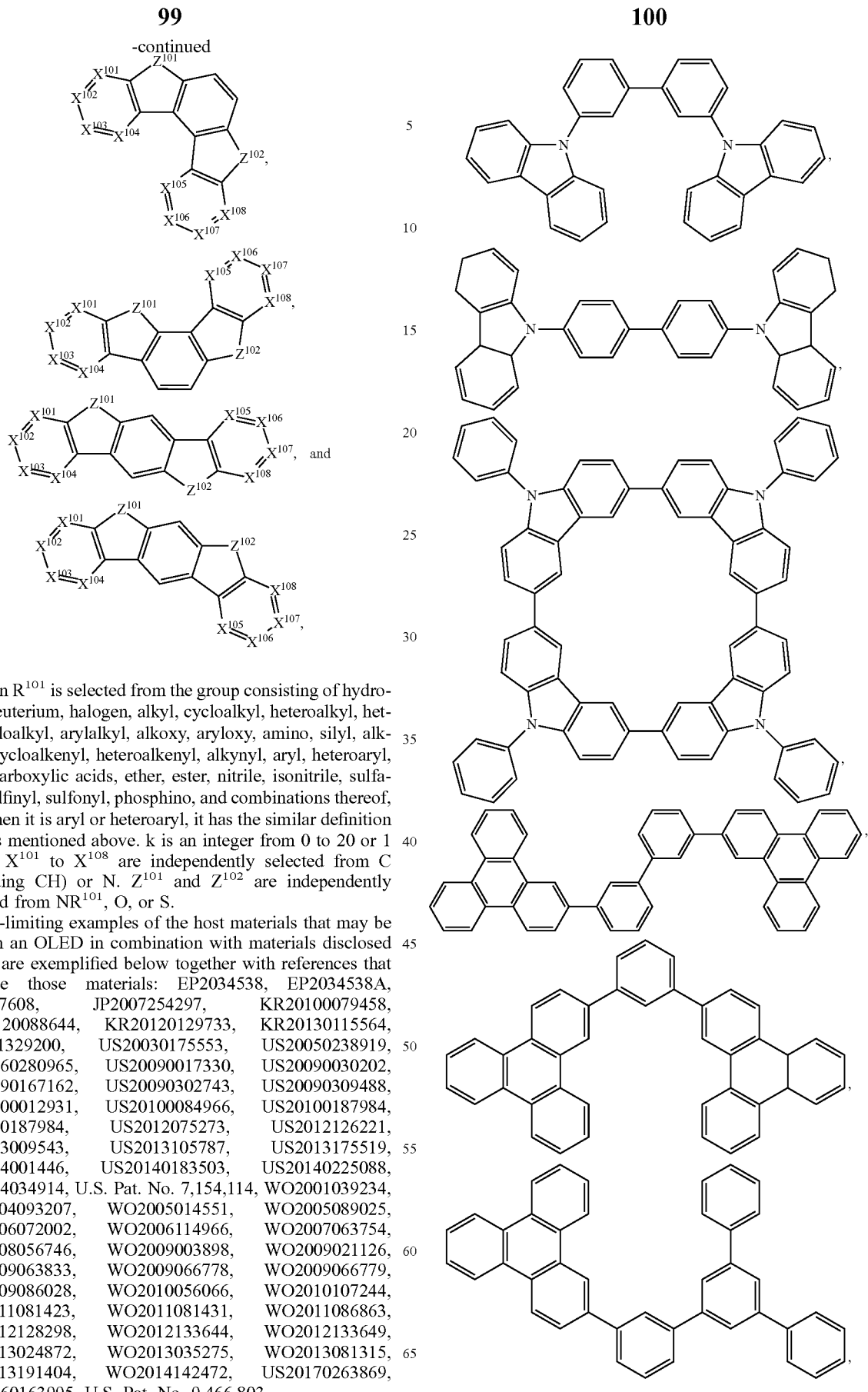

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803, 101
-continued
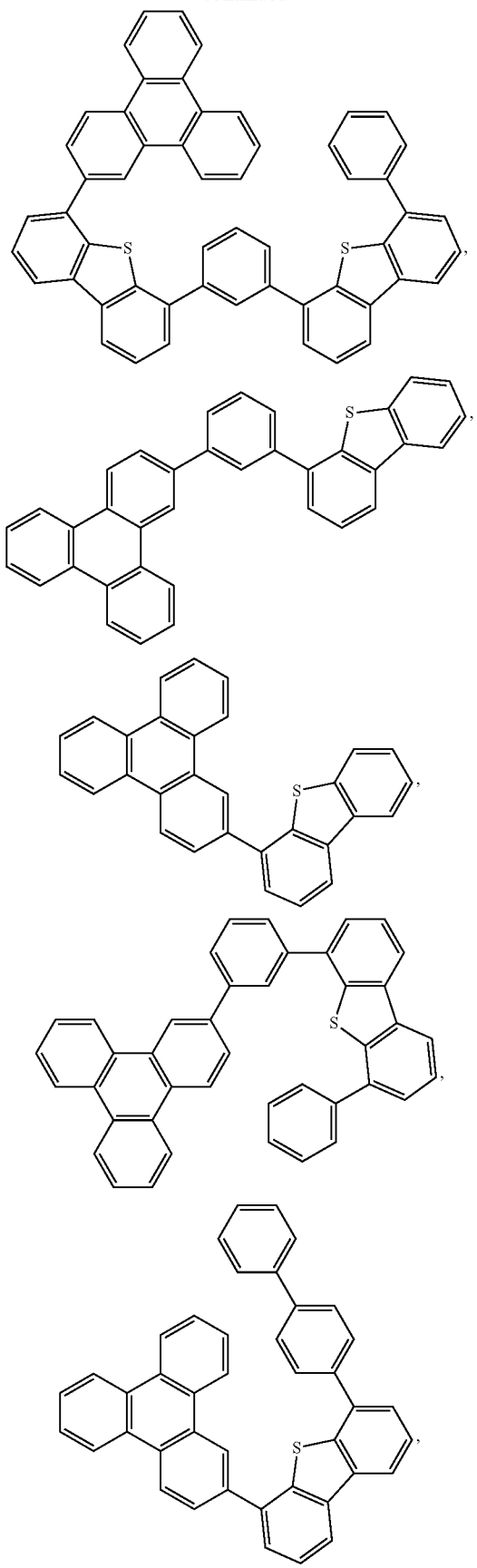
102
-continued
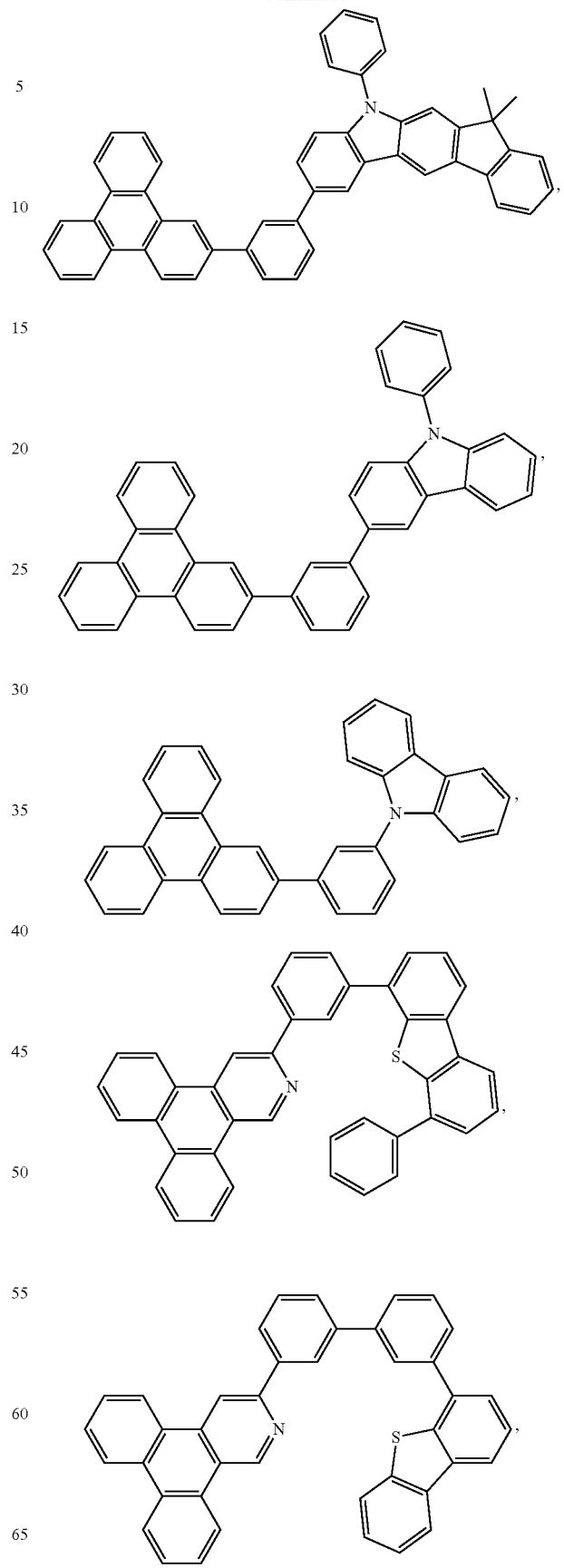

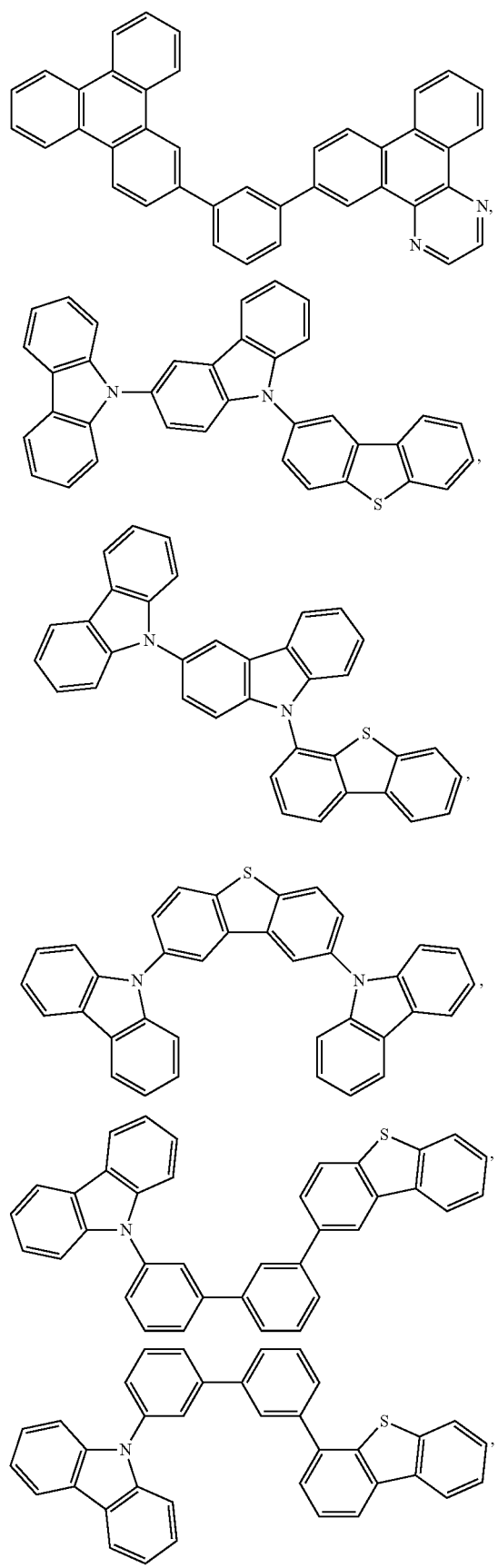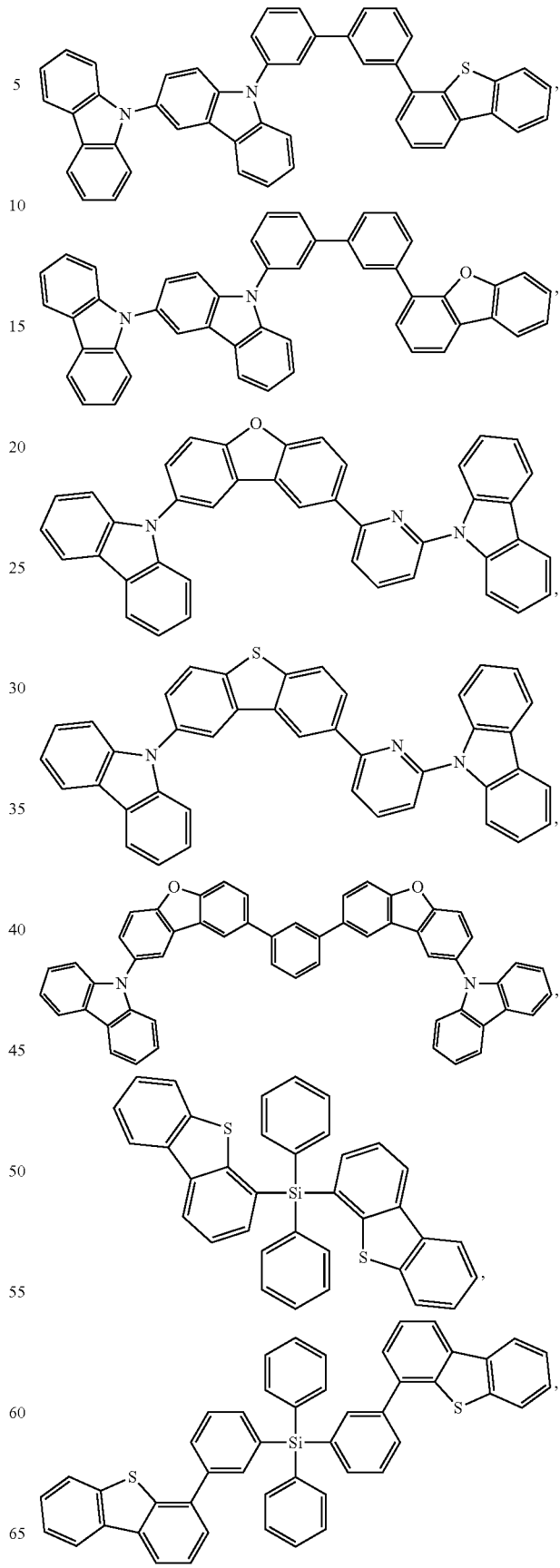

105
-continued
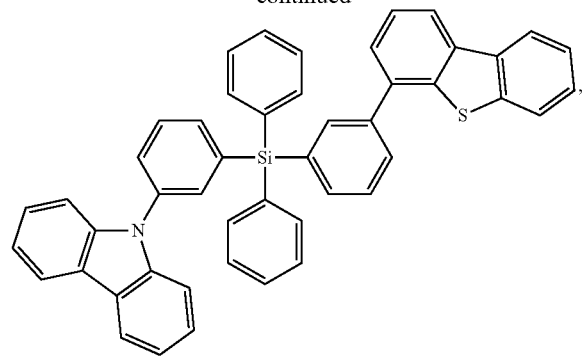
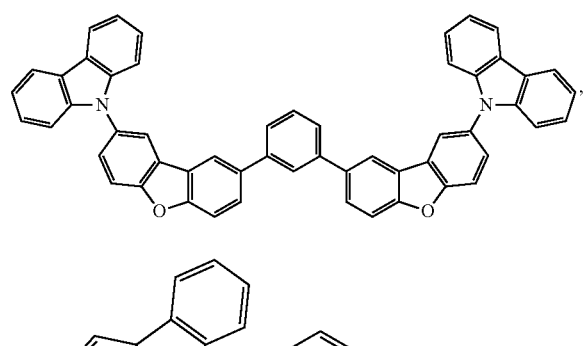
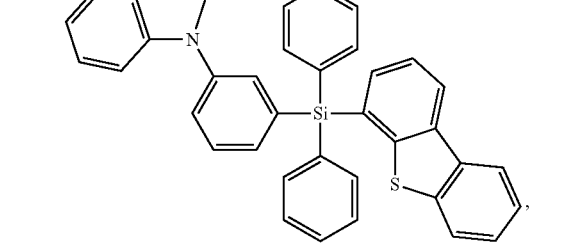
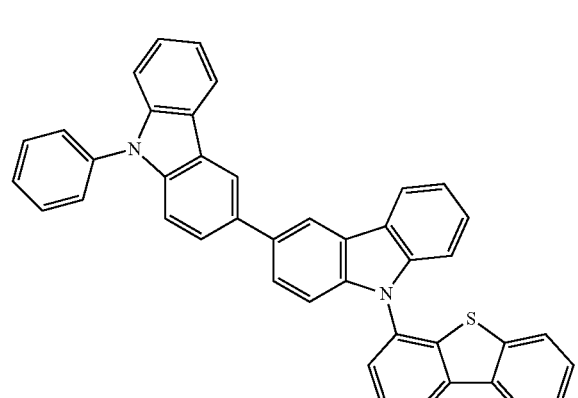
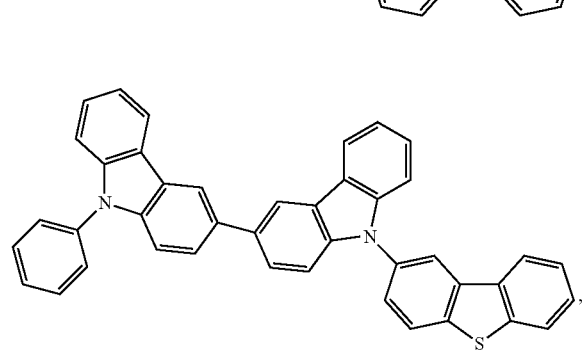
106
-continued
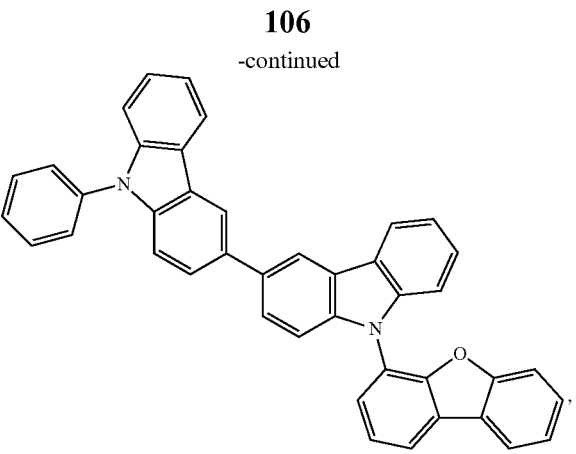
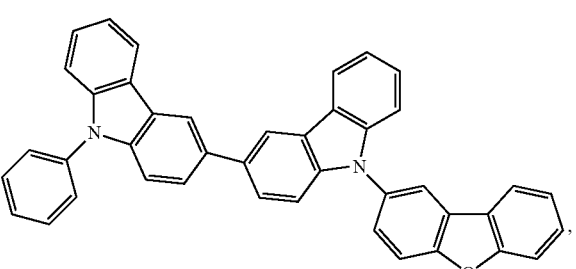
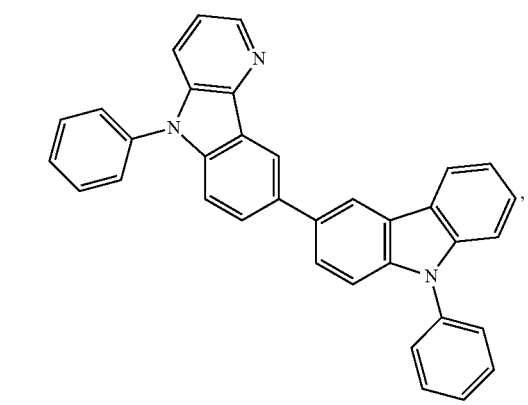
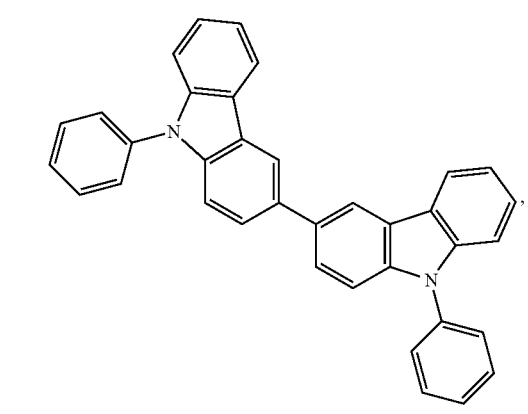

107
-continued
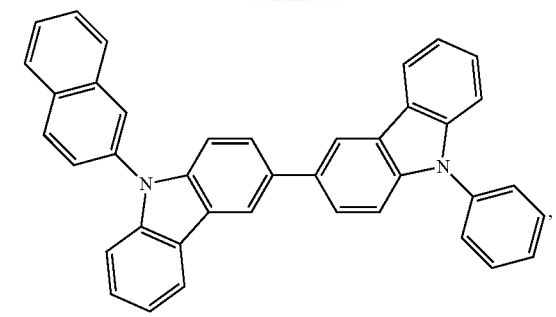
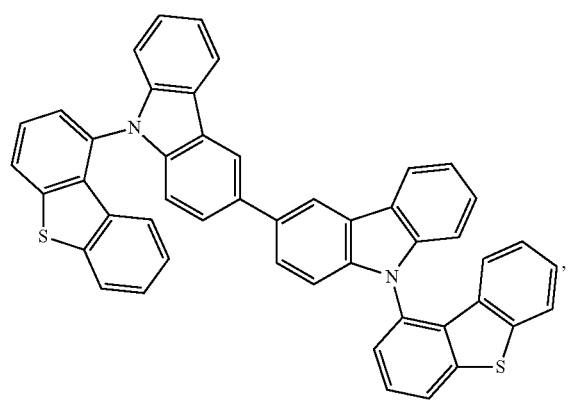
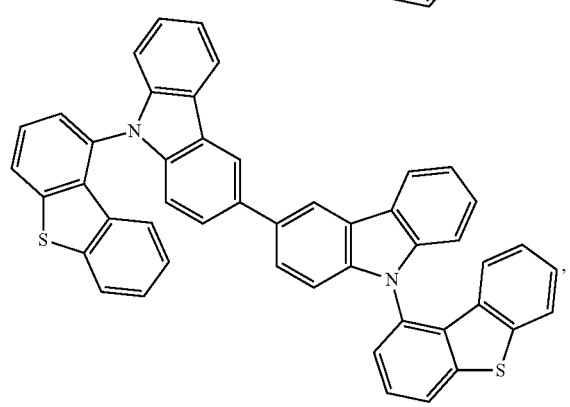
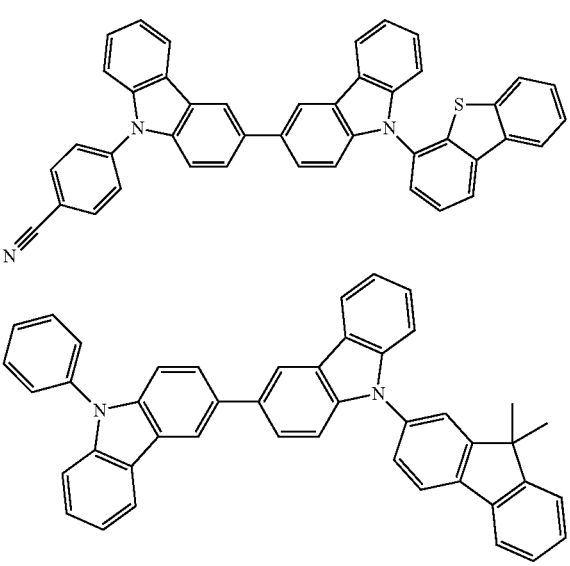
108
-continued
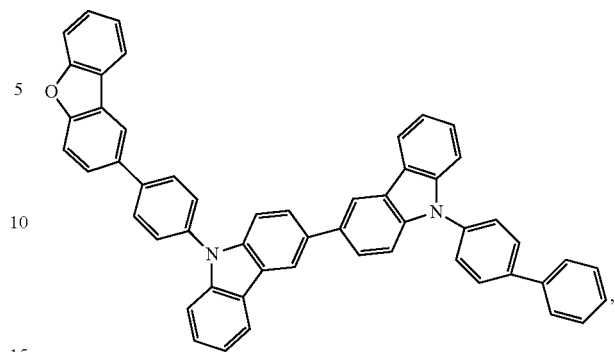
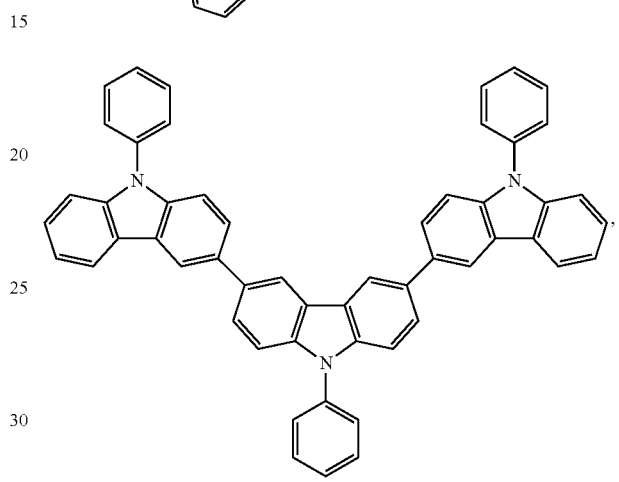
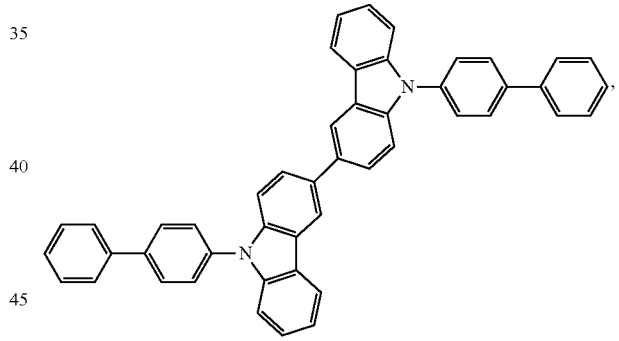
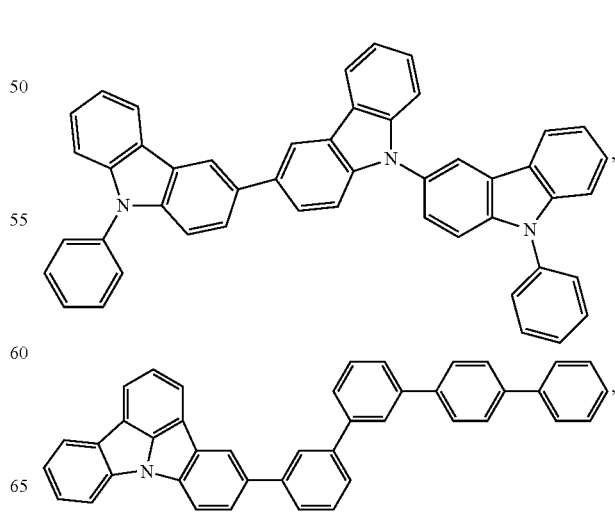

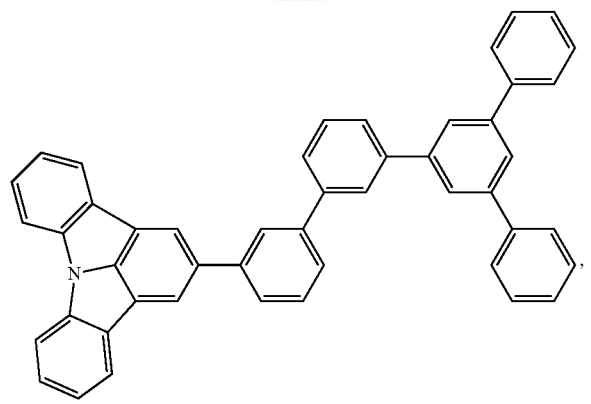
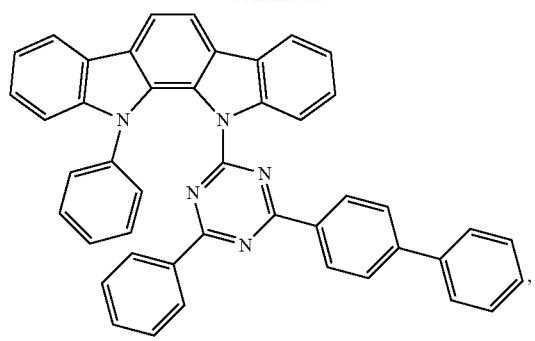
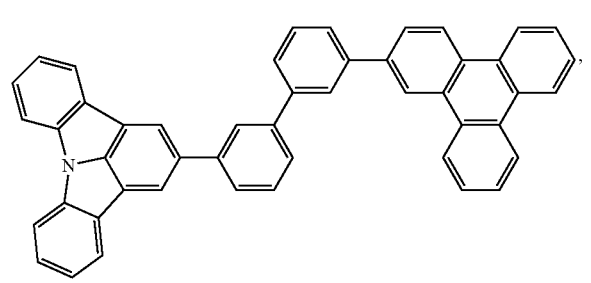
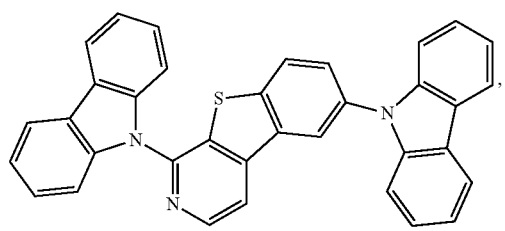
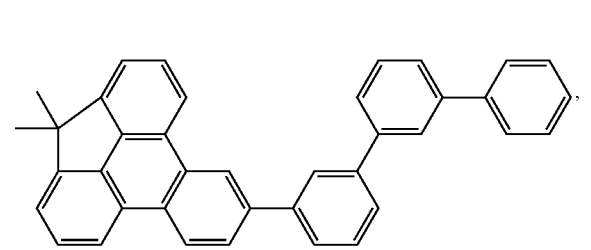
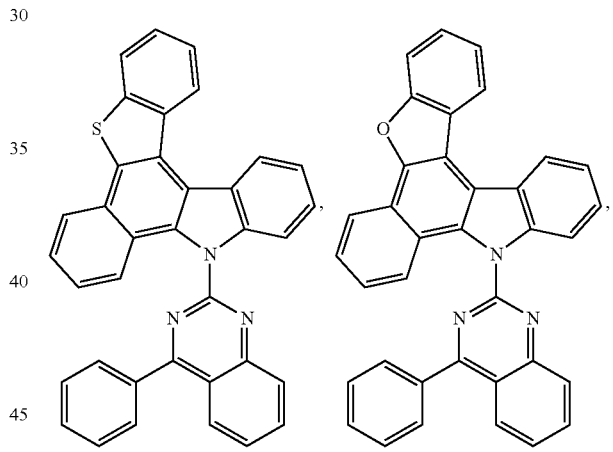
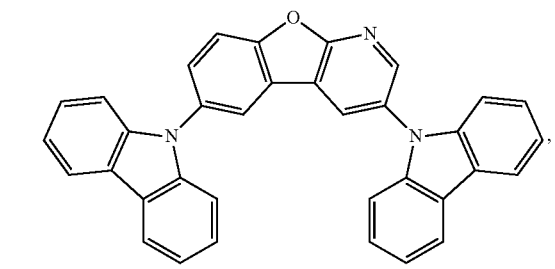
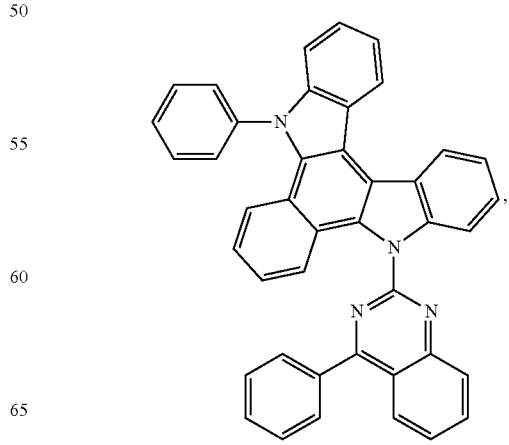

111
-continued
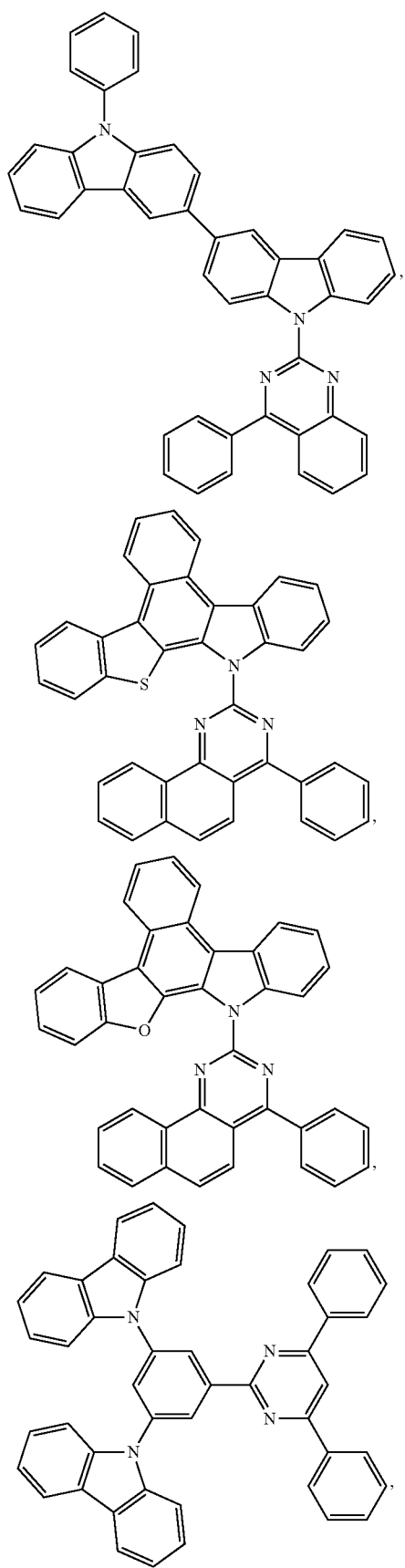
112
-continued
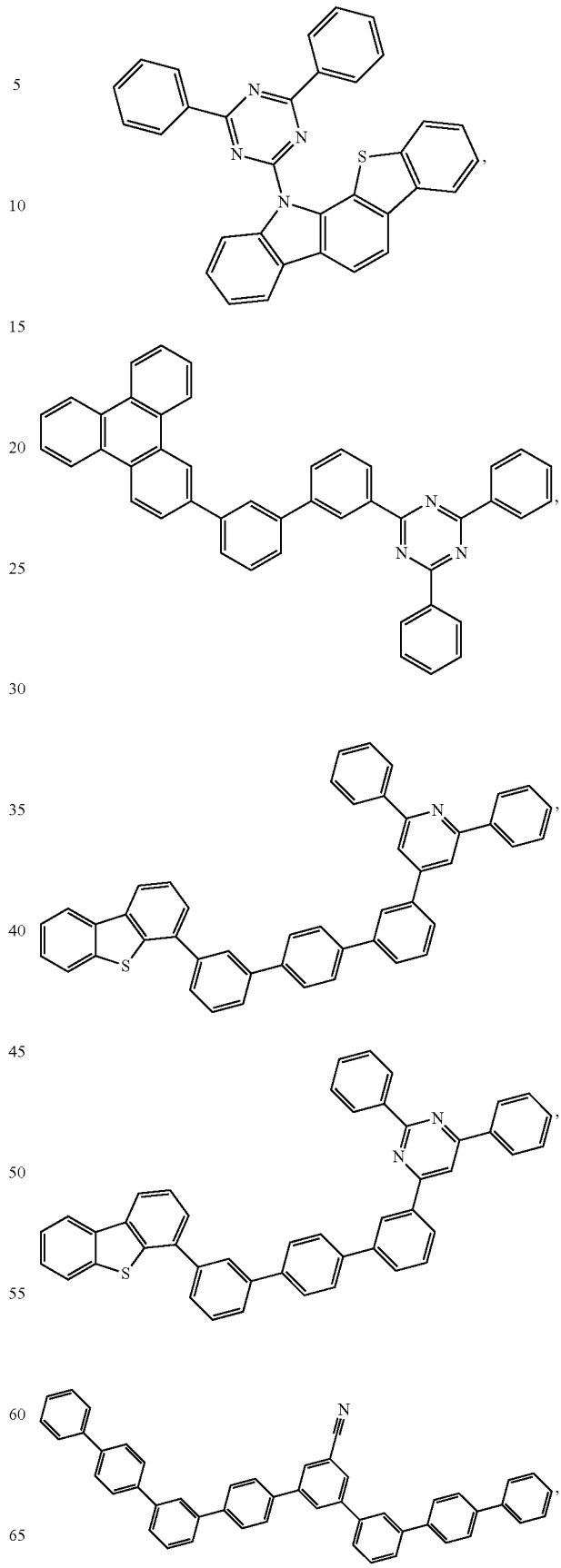

-continued

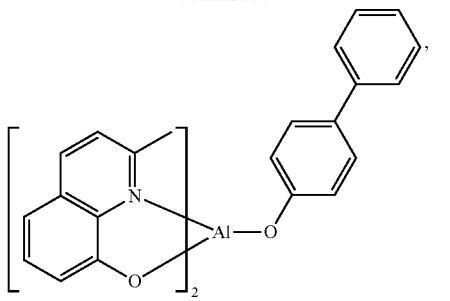

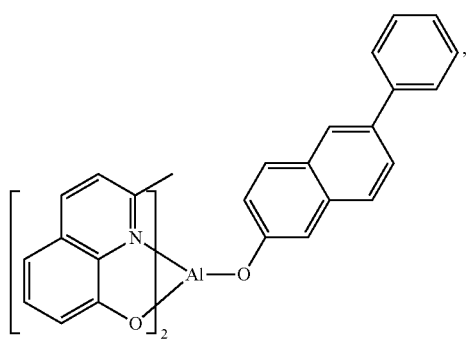

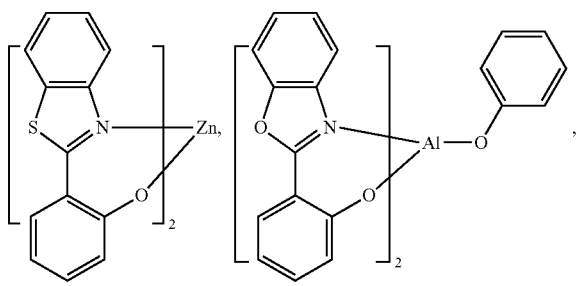

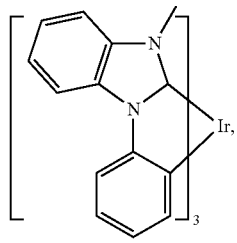

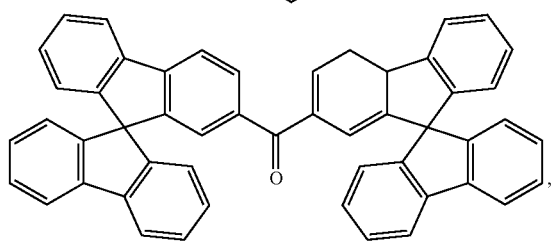

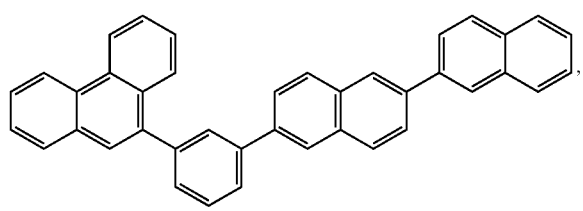

-continued

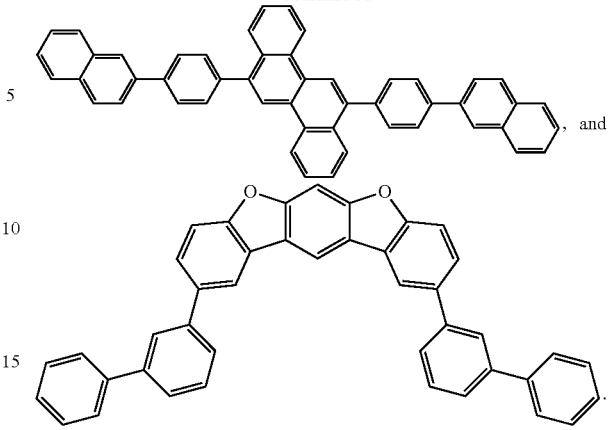

Additional Emitters:

One or more additional emitter dopants may be used in conjunction with the compound of the present disclosure. Examples of the additional emitter dopants are not particularly limited, and any compounds may be used as long as the compounds are typically used as emitter materials. Examples of suitable emitter materials include, but are not limited to, compounds which can produce emissions via phosphorescence, fluorescence, thermally activated delayed fluorescence, i.e., TADF (also referred to as E-type delayed fluorescence), triplet-triplet annihilation, or combinations of these processes.

Non-limiting examples of the emitter materials that may be used in an OLED in combination with materials disclosed herein are exemplified below together with references that disclose those materials: CN103694277, CN1696137, EB01238981, EP01239526, EP01961743, EP1239526, EP1244155, EP1642951, EP1647554, EP1841834, EP1841834B, EP2062907, EP2730583, JP2012074444, JP2013110263, JP4478555, KR1020090133652, KR20120032054, KR20130043460, TW201332980, U.S. Ser. No. 06/699,599, U.S. Ser. No. 06/916,554, US20010019782, US20020034656, US20030068526, US20030072964, US20030138657, US20050123788, US20050244673, US2005123791, US2005260449, US20060008670, US20060065890, US20060127696, US20060134459, US20060134462, US20060202194, US20060251923, US20070034863, US20070087321, US20070103060, US20070111026, US20070190359, US20070231600, US2007034863, US2007104979, US2007104980, US2007138437, US2007224450, US2007278936, US20080020237, US20080233410, US20080261076, US20080297033, US200805851, US2008161567, US2008210930, US20090039776, US20090108737, US20090115322, US20090179555, US2009085476, US2009104472, US20100090591, US20100148663, US20100244004, US20100295032, US2010102716, US2010105902, US2010244004, US2010270916, US20110057559, US20110108822, US20110204333, US2011215710, US2011227049, US2011285275, US2012292601, US20130146848, US2013033172, US2013165653, US2013181190, US2013334521, US20140246656, US2014103305, U.S. Pat. Nos. 6,303,238, 6,413,656, 6,653,654, 6,670,645, 6,687,266, 6,835,469, 6,921,915, 7,279,704, 7,332,232, 7,378,162, 7,534,505, 7,675,228, 7,728,137, 7,740,957, 7,759,489, 7,951,947, 8,067,099, 8,592,586, 8,871,361, WO06081973, WO06121811, WO07018067, WO07108362, WO07115970, WO07115981,
WO08035571, WO2002015645, WO2003040257,
WO2005019373, WO2006056418, WO2008054584,
WO2008078800, WO2008096609, WO2008101842,
WO2009000673, WO2009050281, WO2009100991,
WO2010028151, WO2010054731, WO2010086089,
WO2010118029, WO2011044988, WO2011051404,
WO2011107491, WO2012020327, WO2012163471,
WO2013094620, WO2013107487, WO2013174471,
WO2014007565, WO2014008982, WO2014023377,
WO2014024131, WO2014031977, WO2014038456,
WO2014112450.
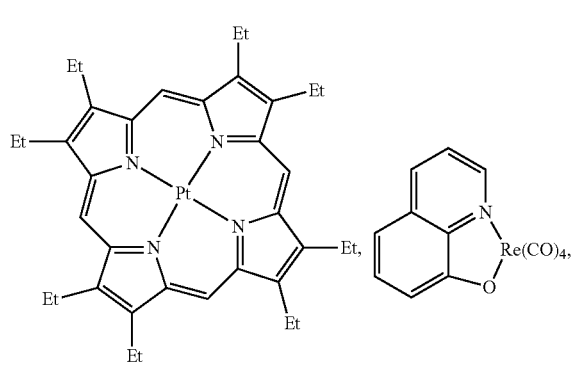
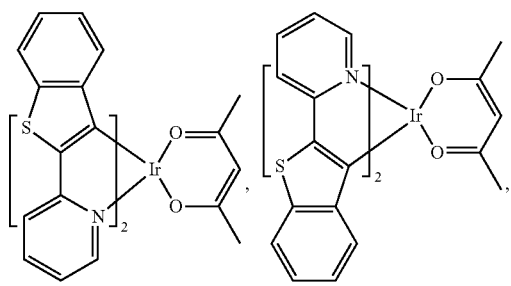
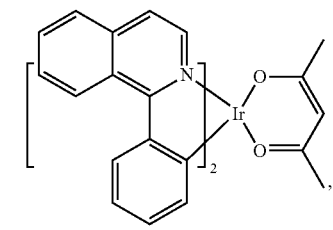
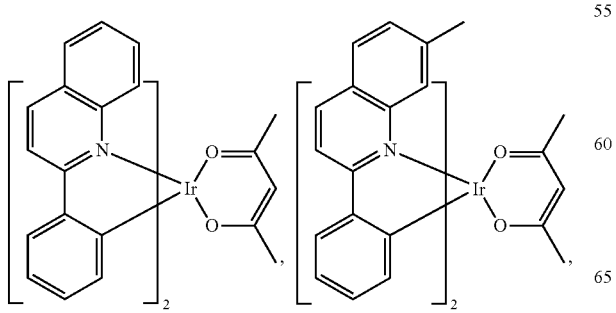
-continued
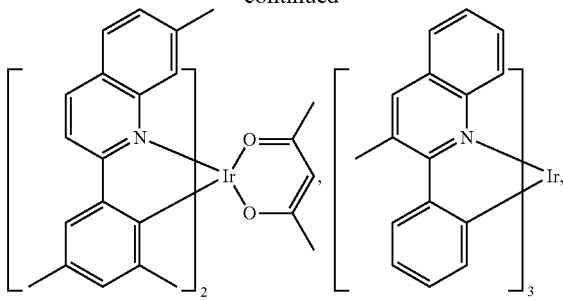
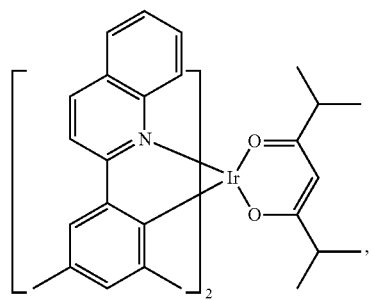
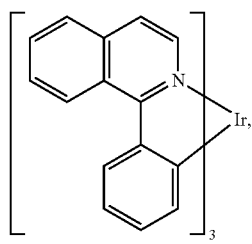
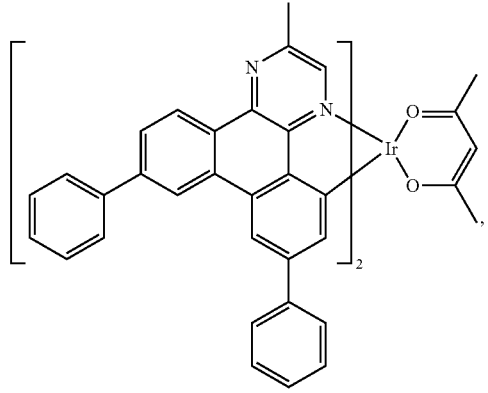
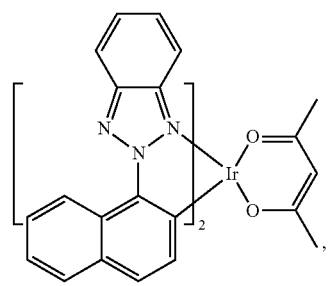

117
-continued
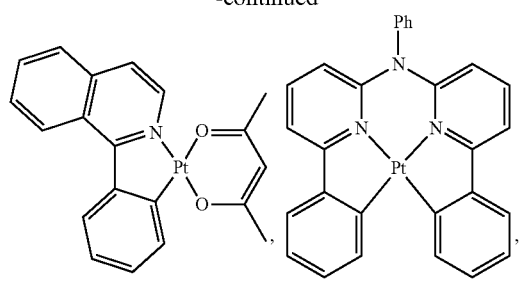
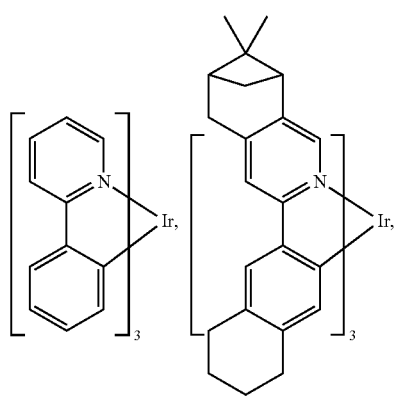
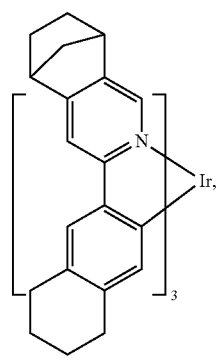
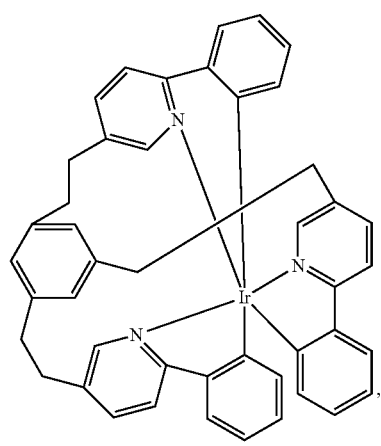
118
-continued
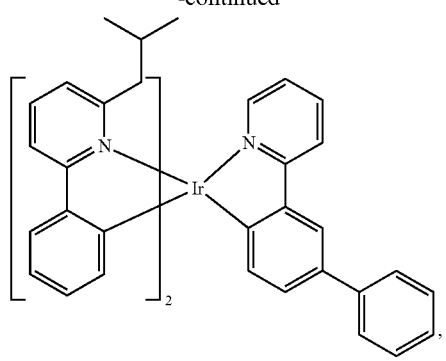
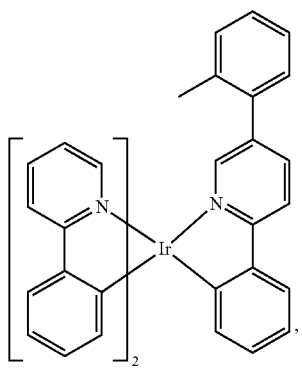
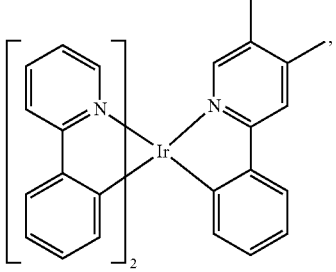
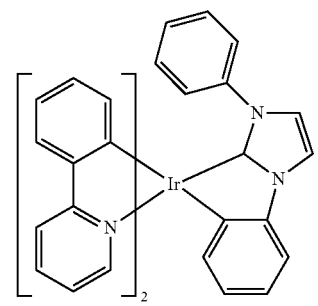
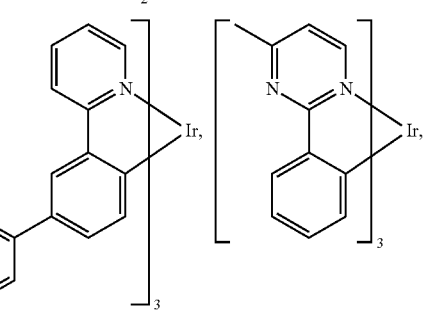

119
-continued
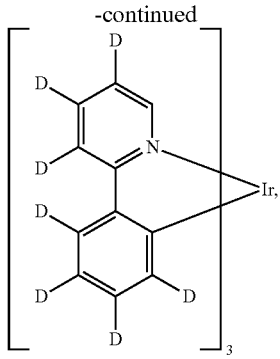
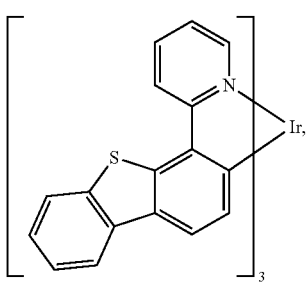
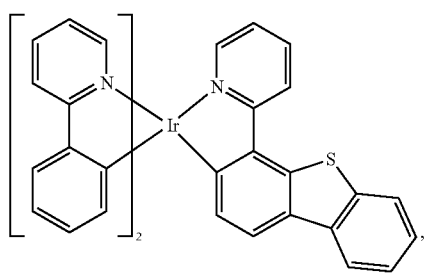
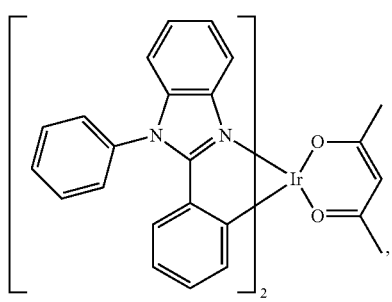
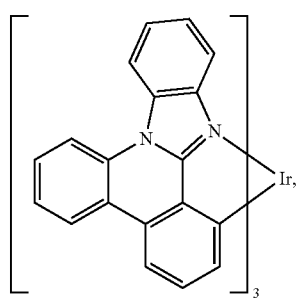
120
-continued
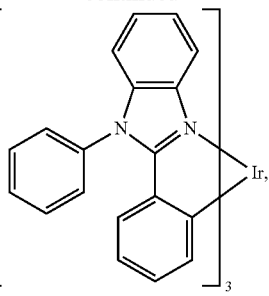
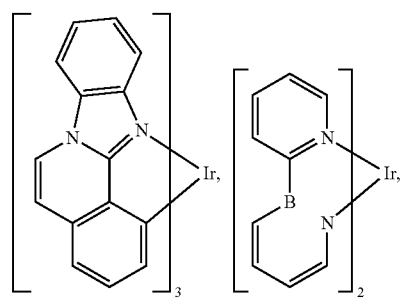
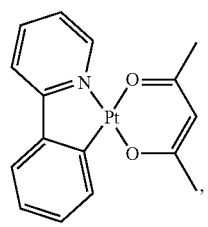
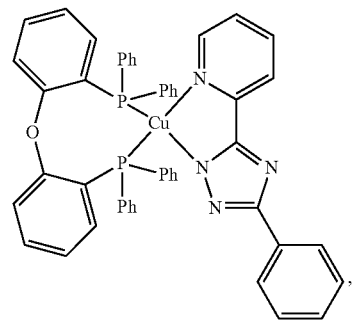
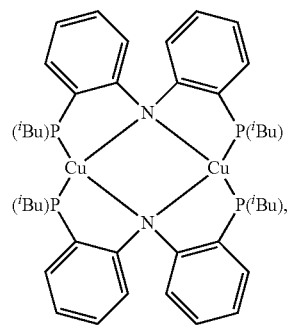

121
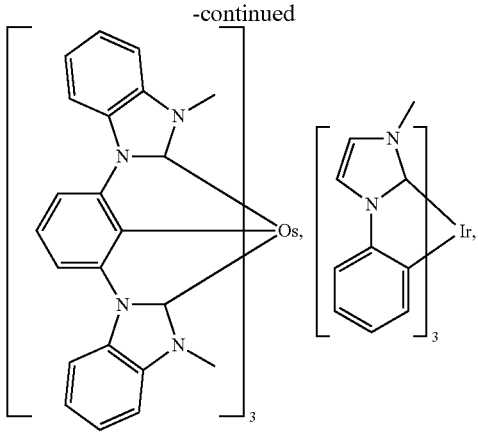
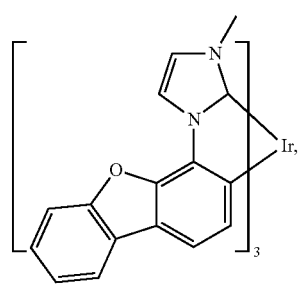
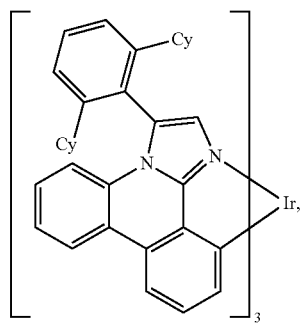
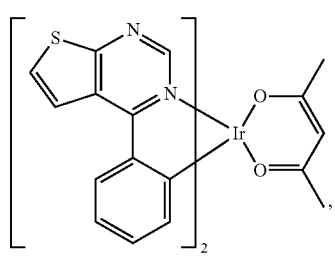
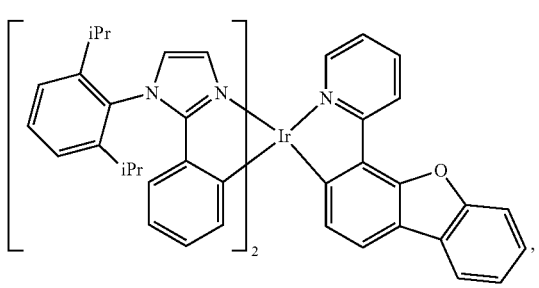
122
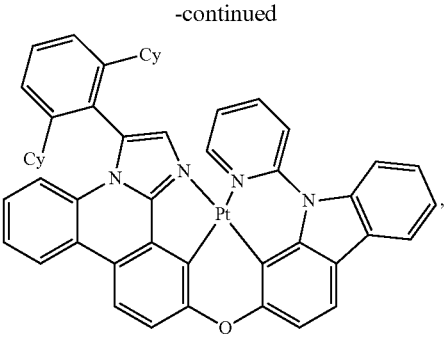
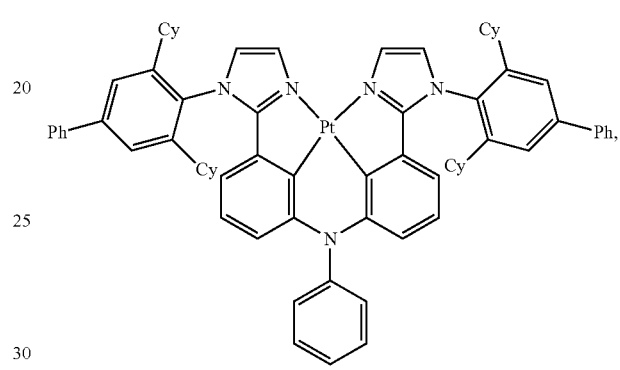
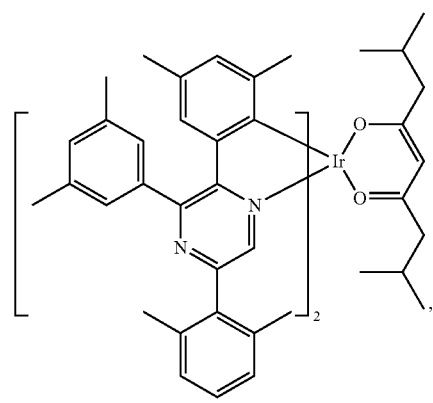
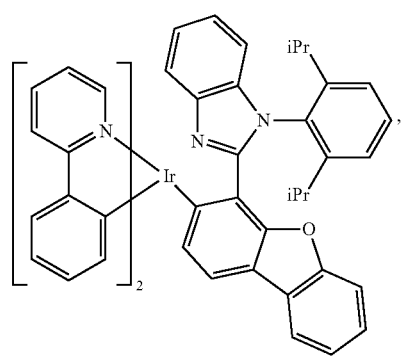

123
-continued
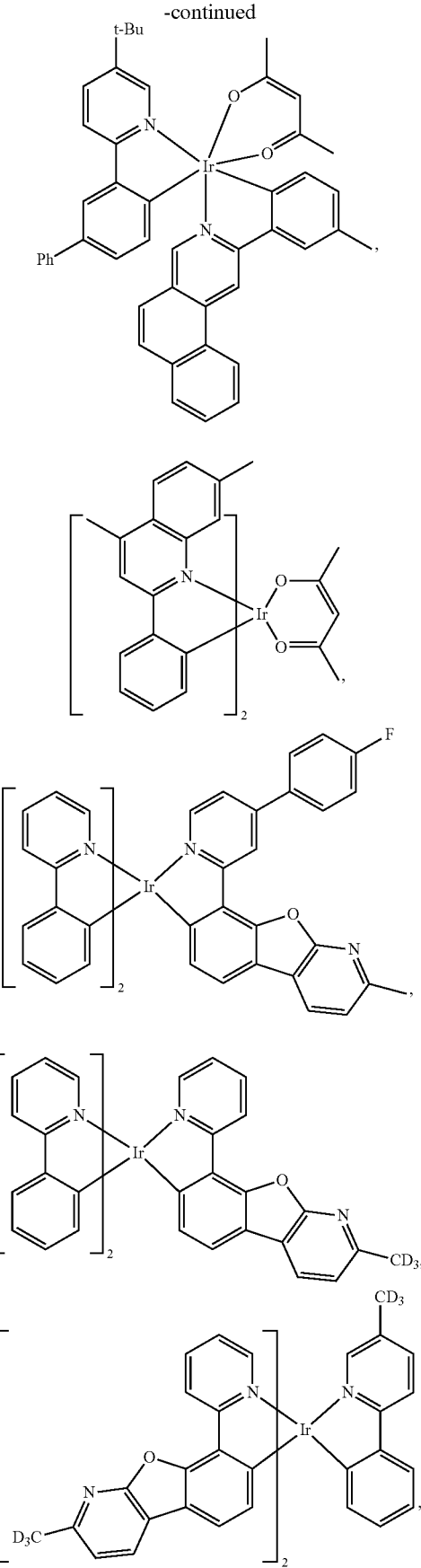
124
-continued
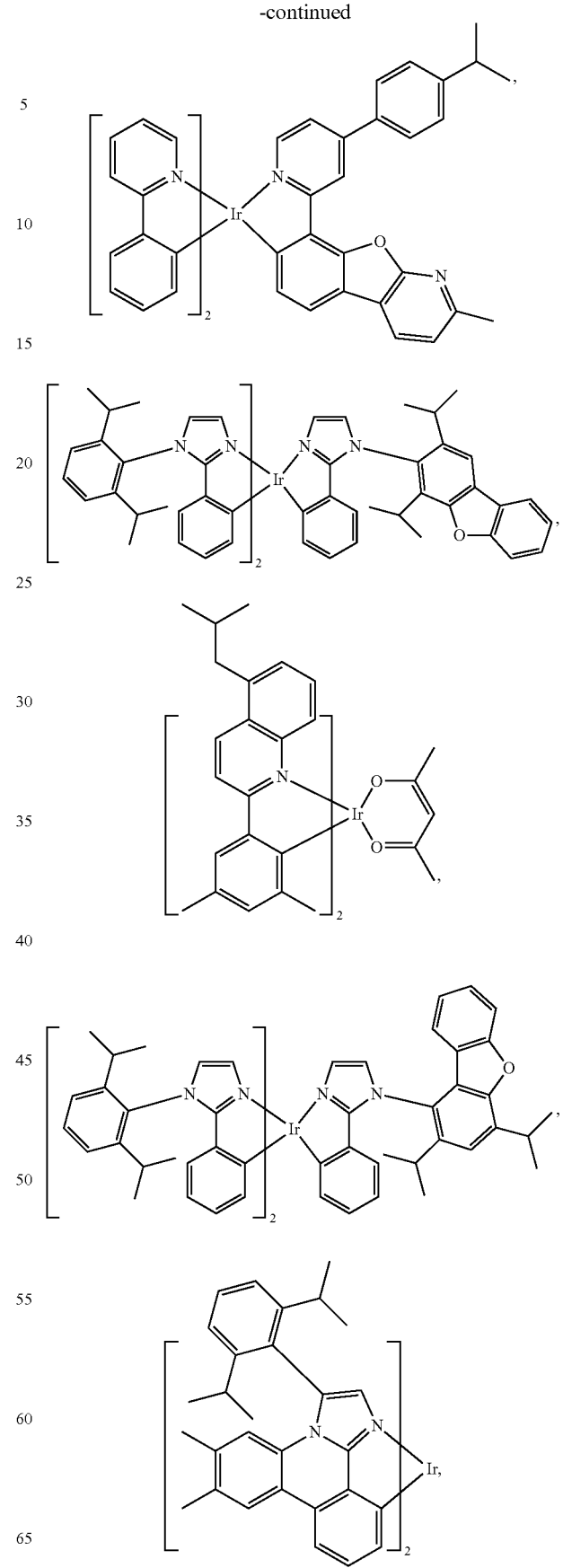

125
-continued
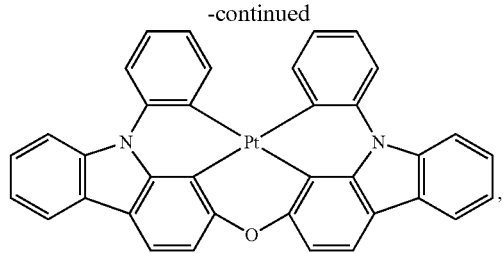
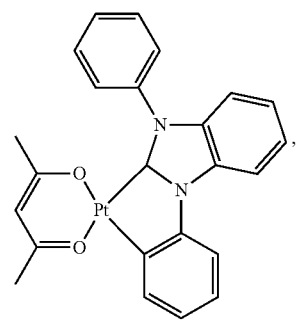
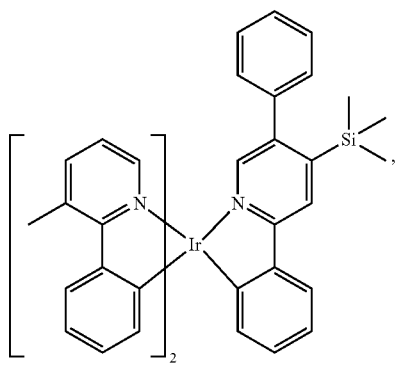
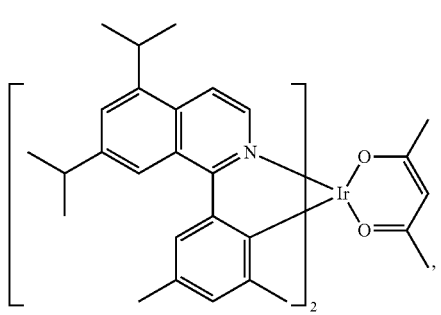
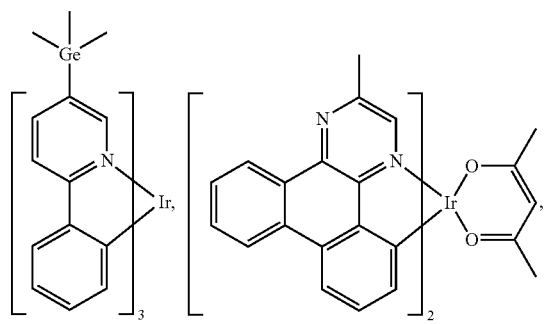
126
-continued
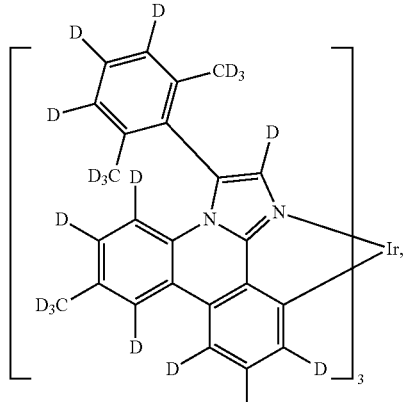
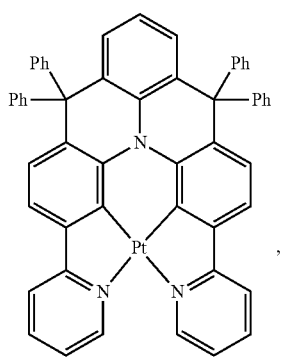
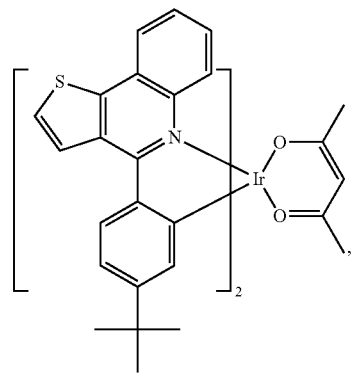
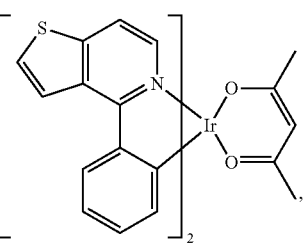

127
-continued
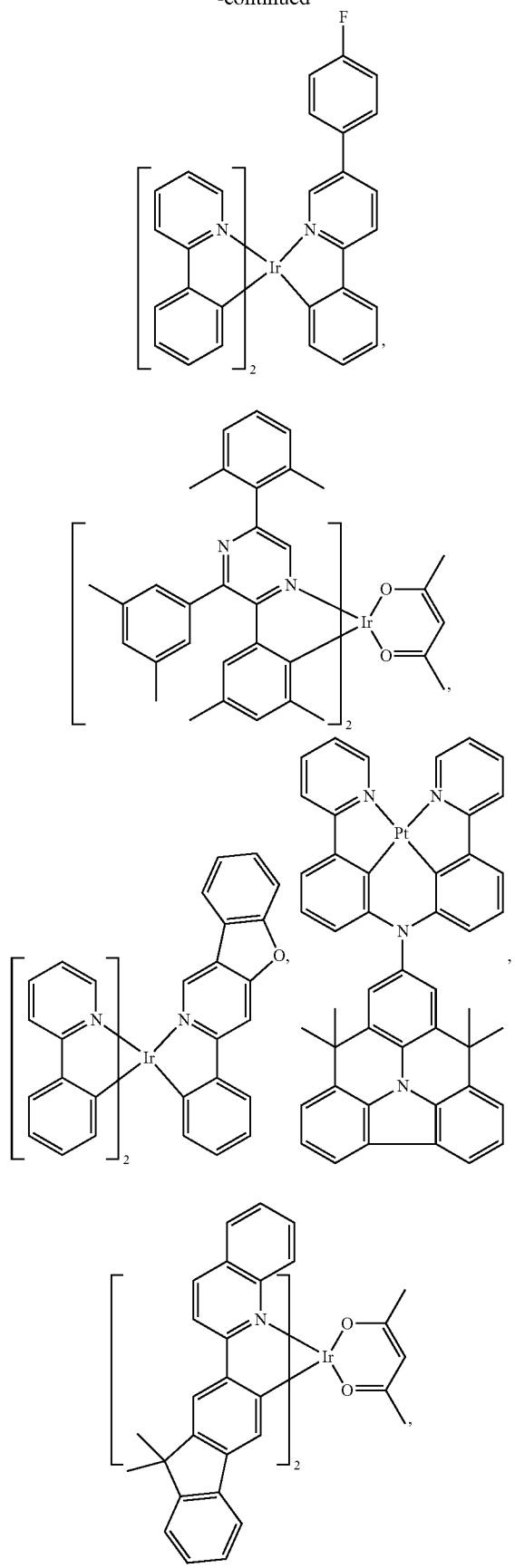
128
-continued
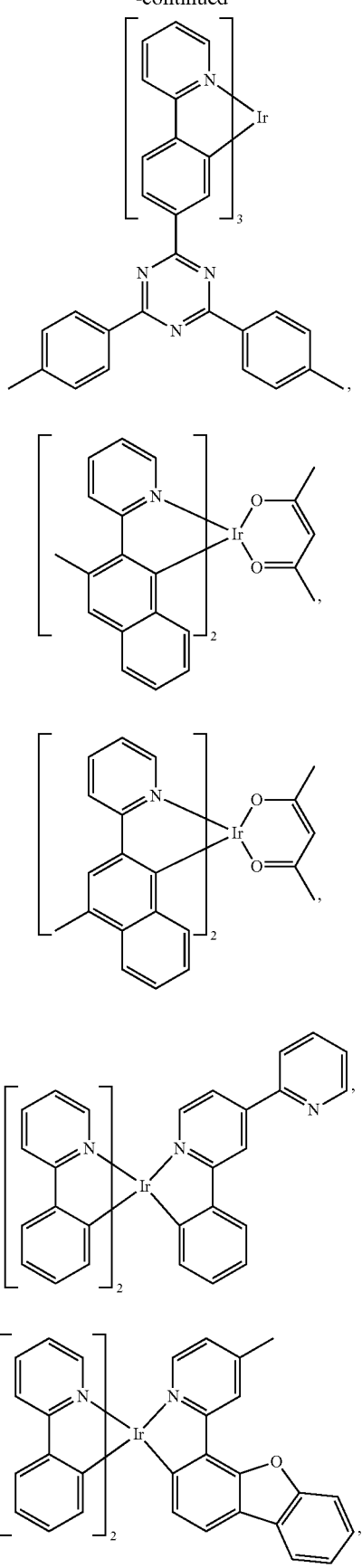

129
-continued
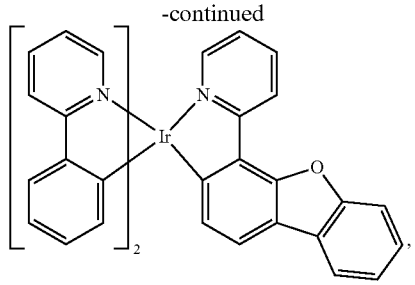
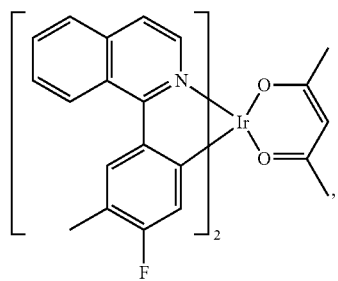
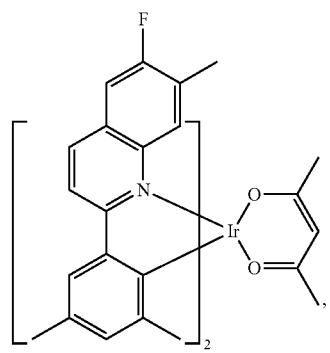
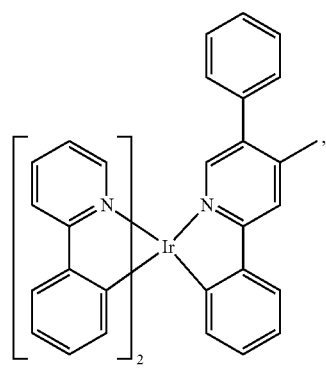
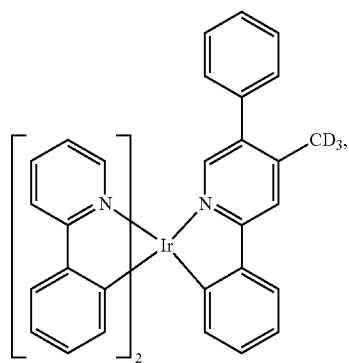
130
-continued
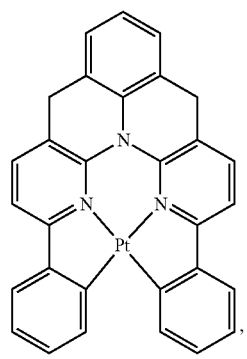
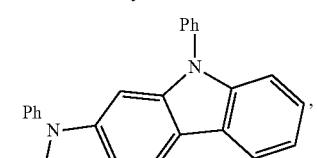
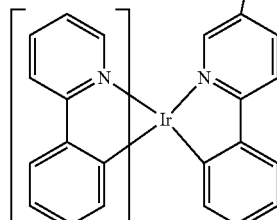
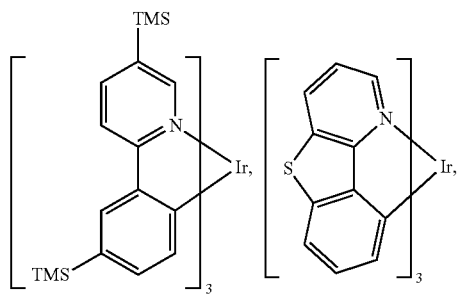
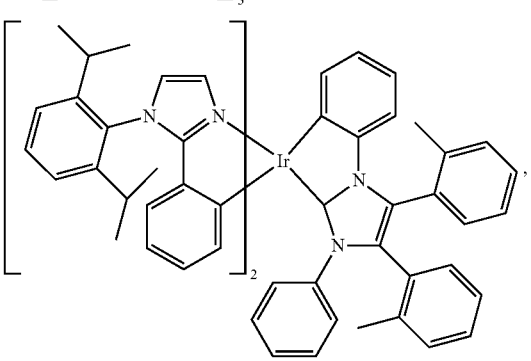
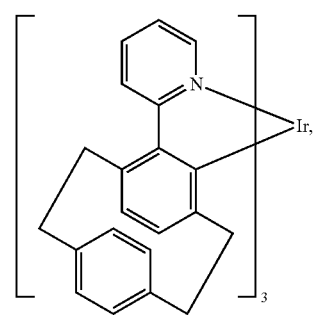

131
-continued
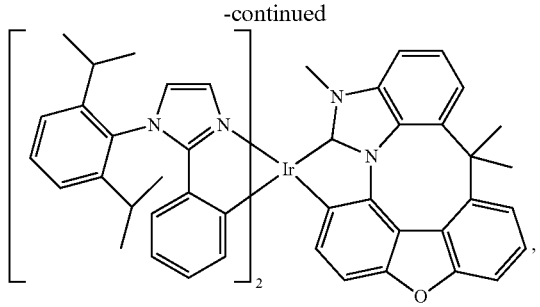
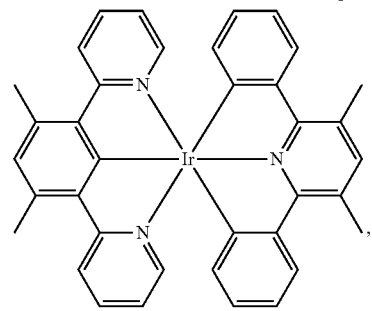
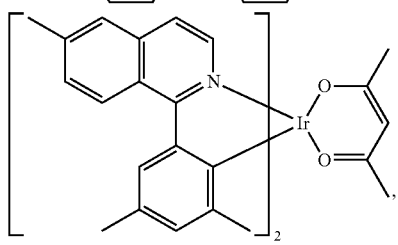
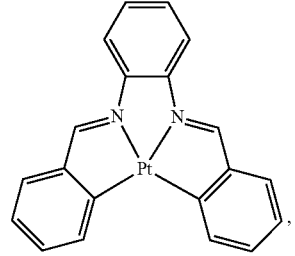
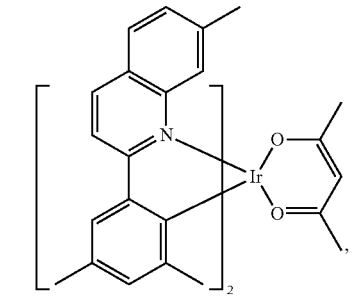
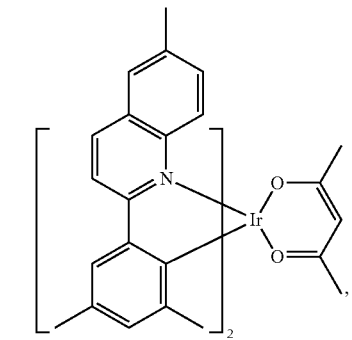
132
-continued
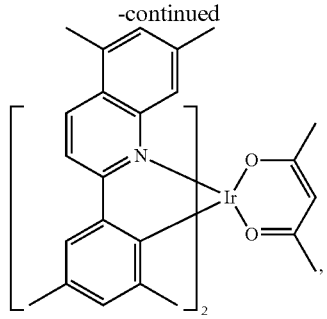
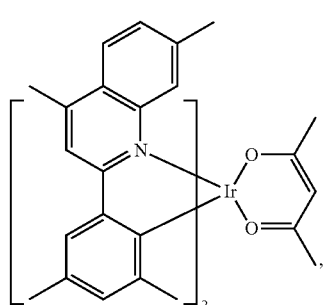
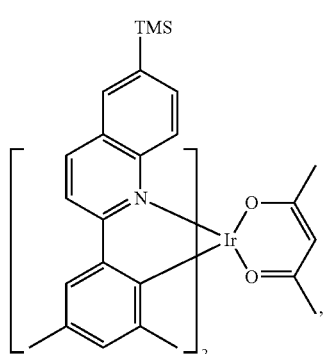
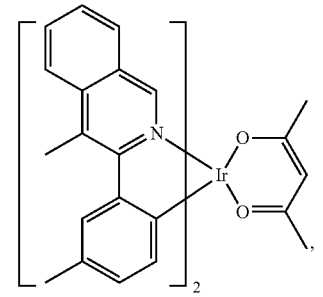
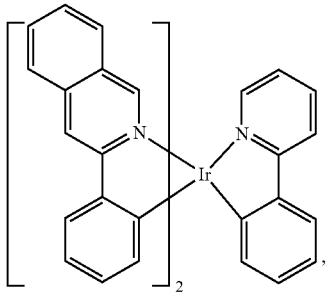

133
-continued
134
-continued
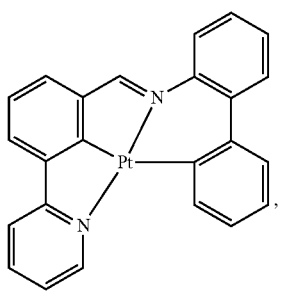
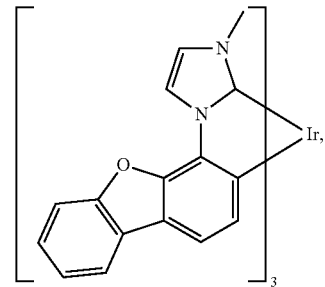
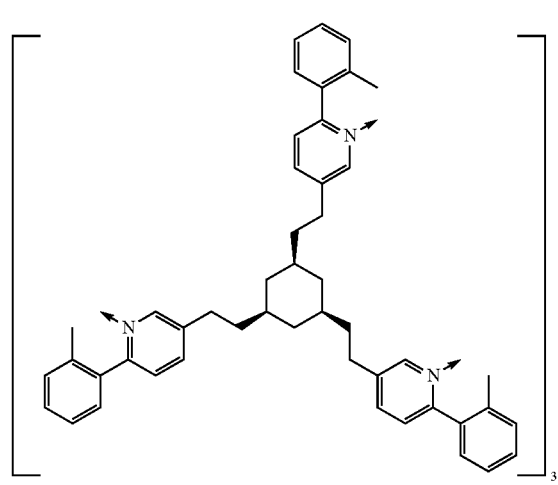
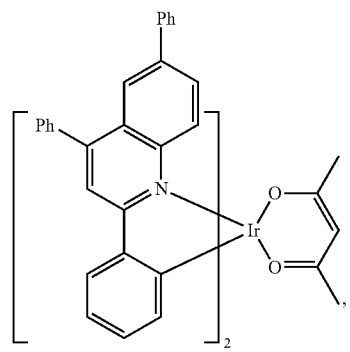
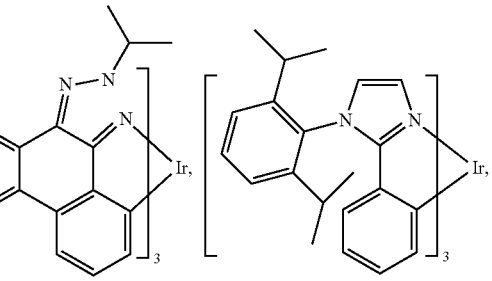
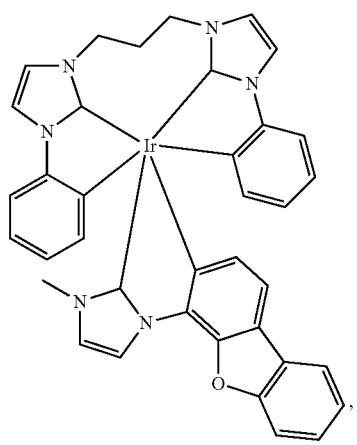
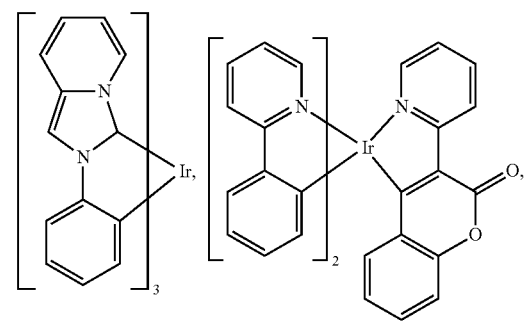
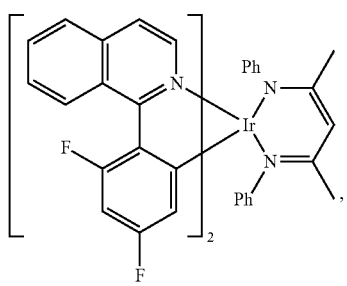
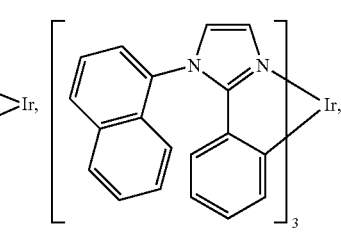

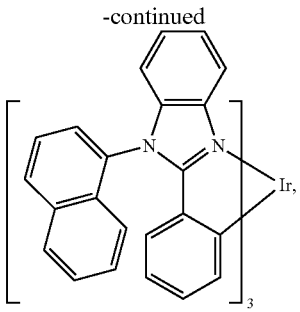

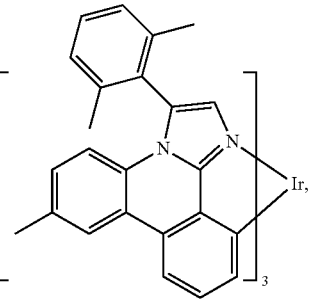

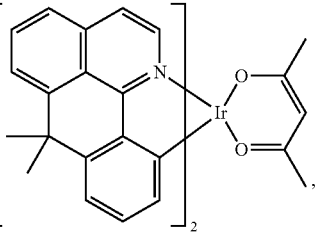

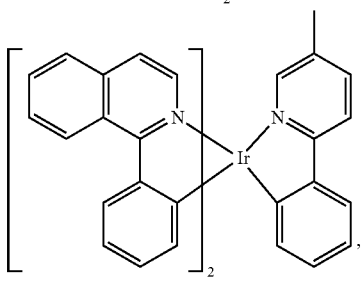

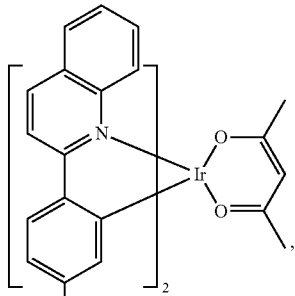

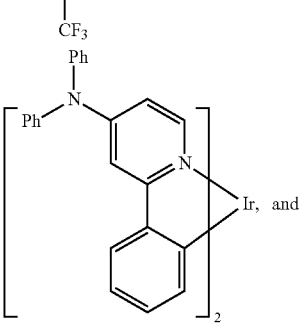

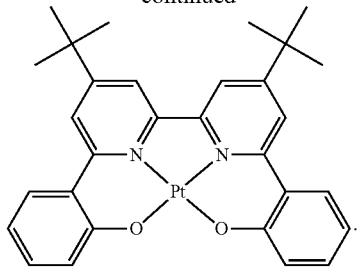

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and/or higher triplet energy than the emitter closest to the HBL interface. In some embodiments, the HBL material has a lower HOMO (further from the vacuum level) and/or higher triplet energy than one or more of the hosts closest to the HBL interface.

In one aspect, compound used in HBL contains the same molecule or the same functional groups used as host described above.

In another aspect, compound used in HBL contains at least one of the following groups in the molecule:

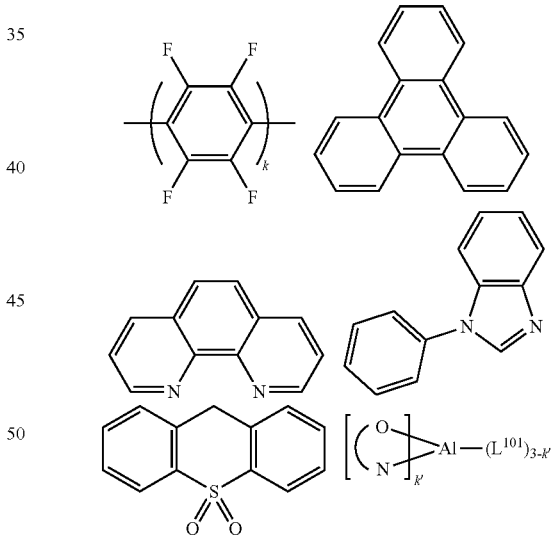

wherein k is an integer from 1 to 20; $L^{101}$ is an another ligand, k' is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

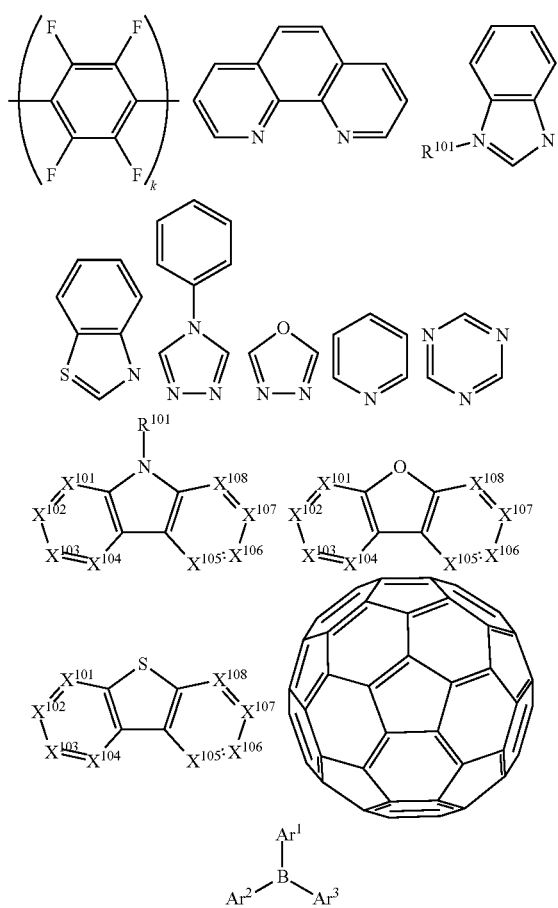

wherein $R^{101}$ is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, when it is aryl or heteroaryl, it has the similar definition as Ar's mentioned above. $Ar^1$ to $Ar^3$ has the similar definition as Ar's mentioned above. k is an integer from 1 to 20. $X^{101}$ to $X^{108}$ is selected from C (including CH) or N.

In another aspect, the metal complexes used in ETL contains, but not limit to the following general formula:

wherein (O—N) or (N—N) is a bidentate ligand, having metal coordinated to atoms O, N or N, N; $L^{101}$ is another ligand; k' is an integer value from 1 to the maximum number of ligands that may be attached to the metal.

Non-limiting examples of the ETL materials that may be used in an OLED in combination with materials disclosed herein are exemplified below together with references that disclose those materials: CN103508940, EP01602648, EP01734038, EP01956007, JP2004-022334, JP2005149918, JP2005-268199, KR0117693, KR20130108183, US20040036077, US20070104977, US2007018155, US20090101870, US20090115316, US20090140637, US20090179554, US2009218940, US2010108990, US2011156017, US2011210320, US2012193612, US2012214993, US2014014925, US2014014927, US20140284580, U.S. Pat. Nos. 6,656,612, 8,415,031, WO2003060956, WO2007111263, WO2009148269, WO2010067894, WO2010072300, WO2011074770, WO2011105373, WO2013079217, WO2013145667, WO2013180376, WO2014104499, WO2014104535,

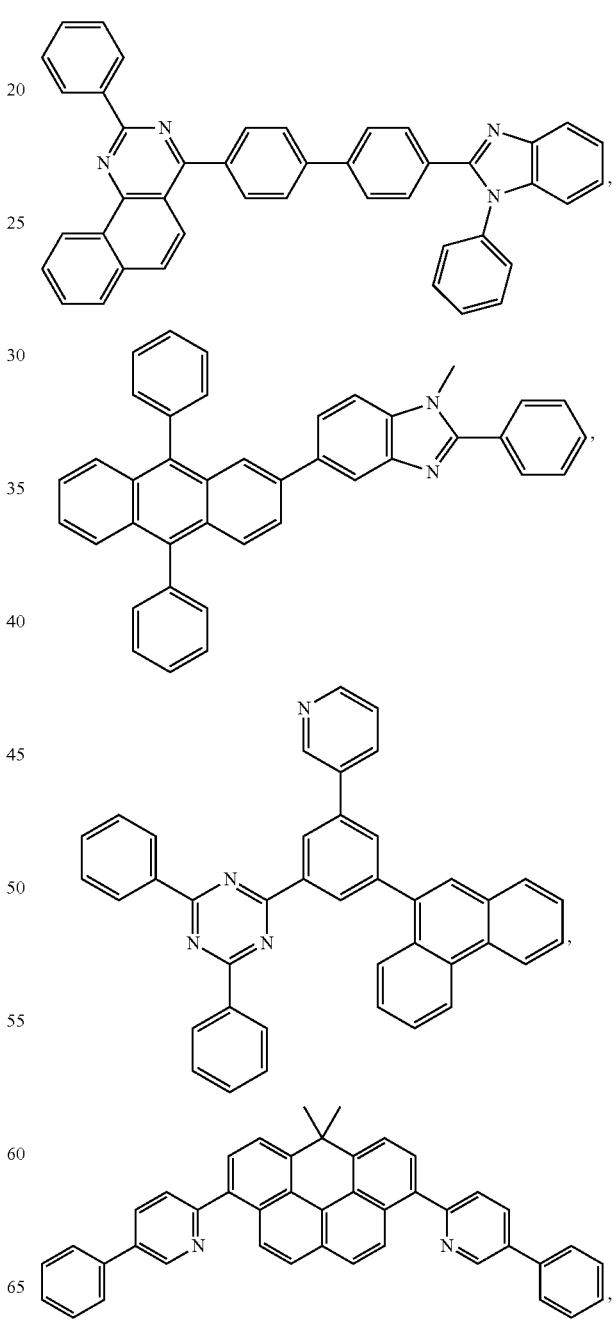

139
-continued
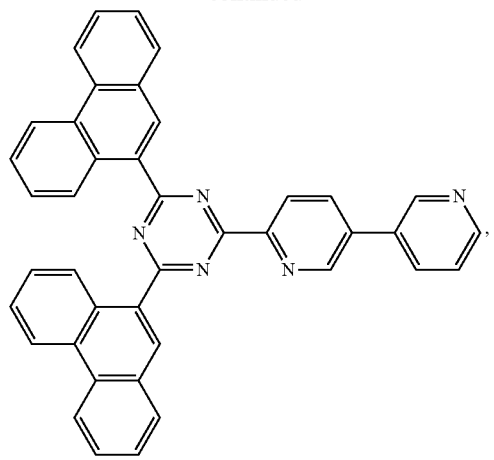
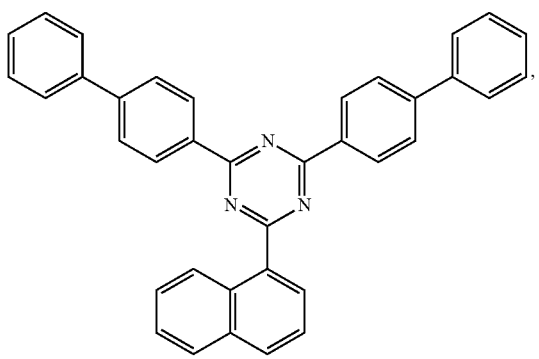
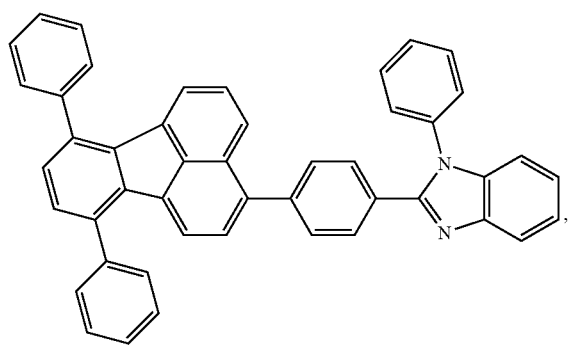
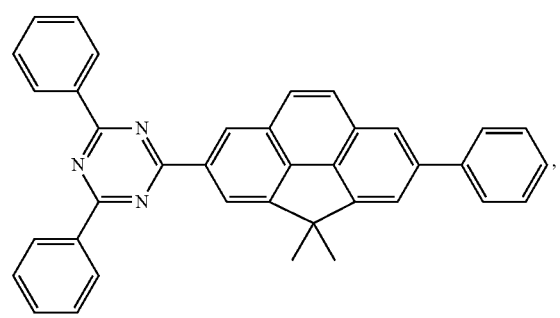
140
-continued
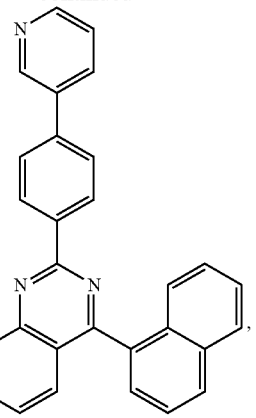
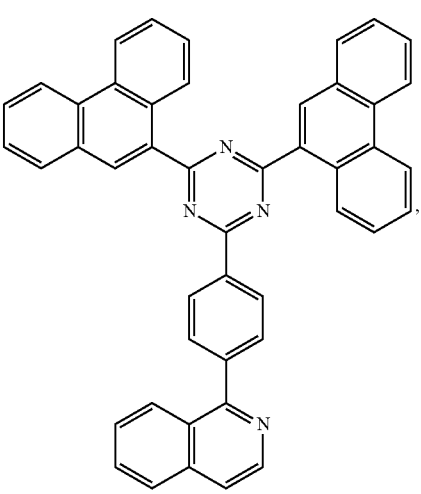
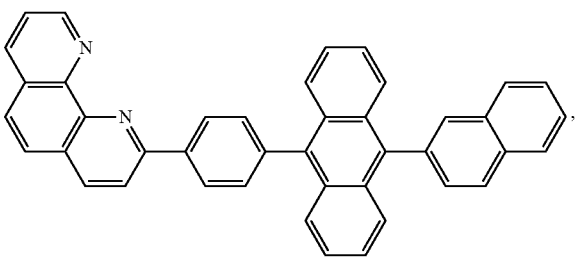
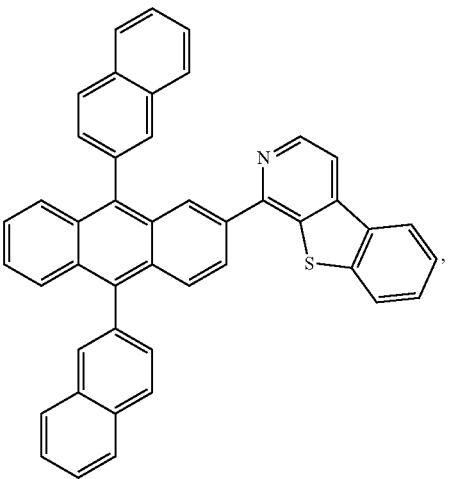

141
-continued
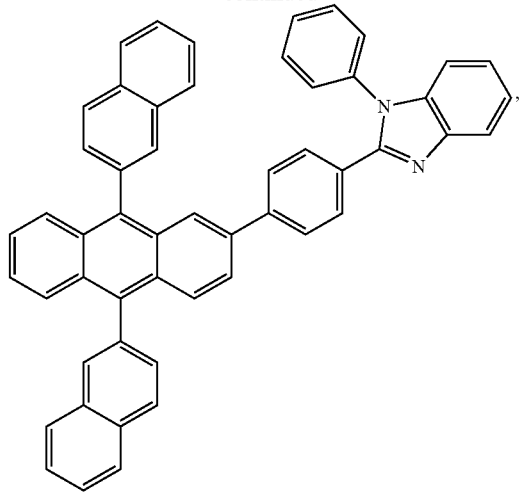
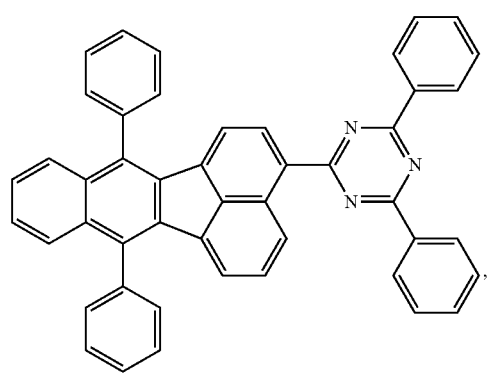
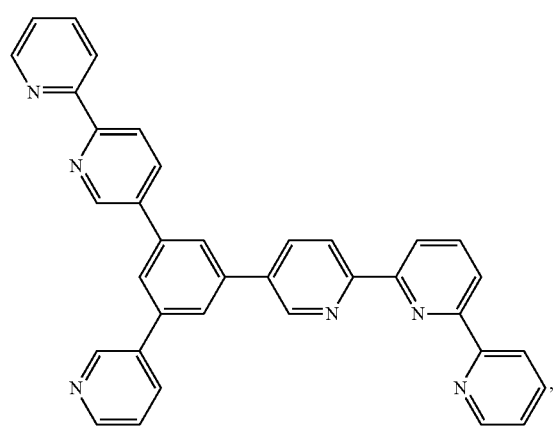
142
-continued
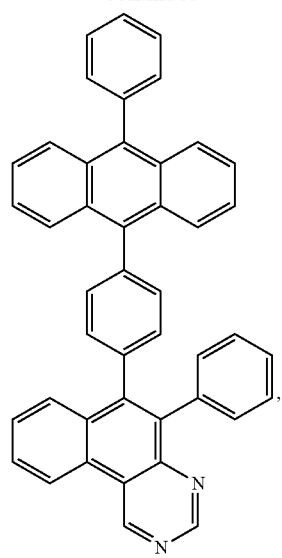
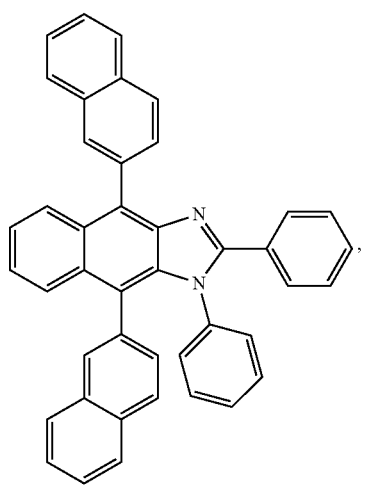
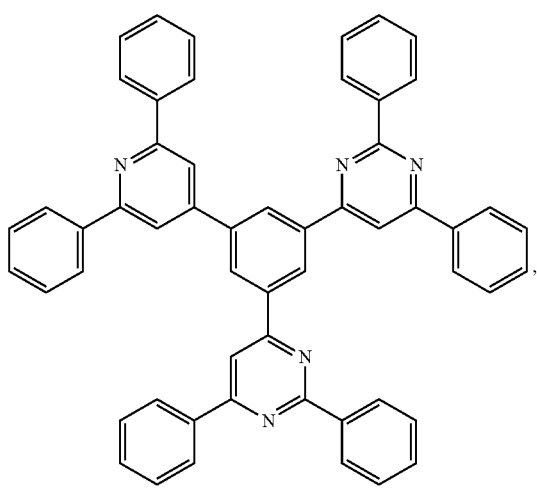

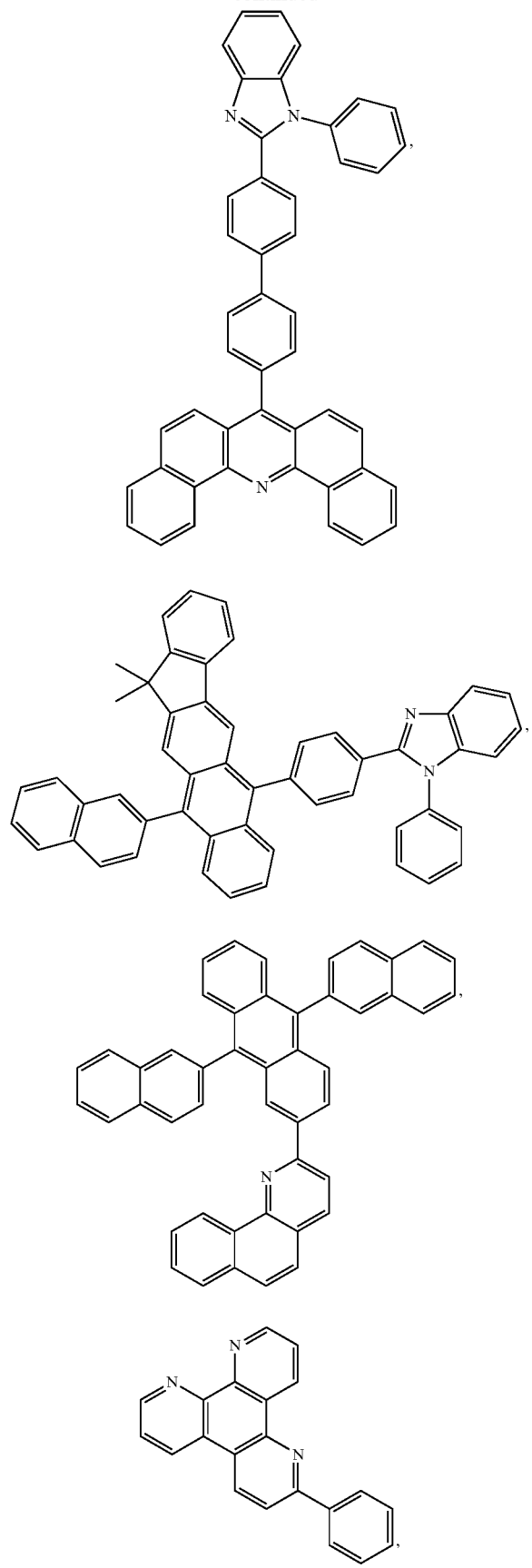

145
-continued

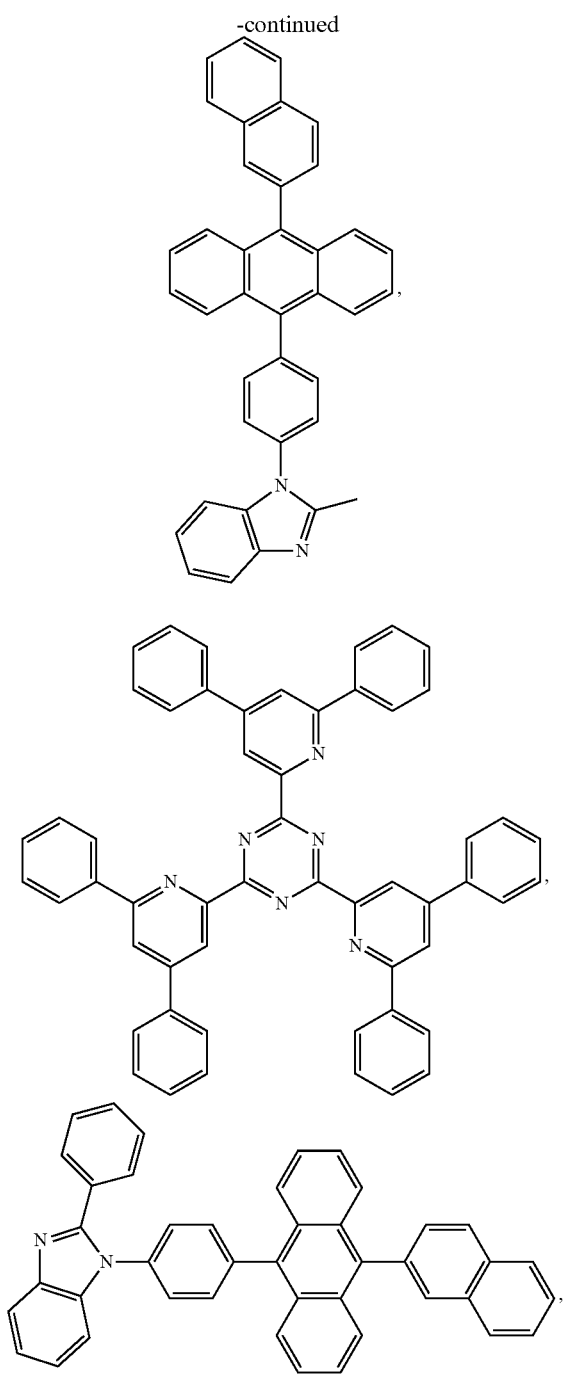

146
-continued

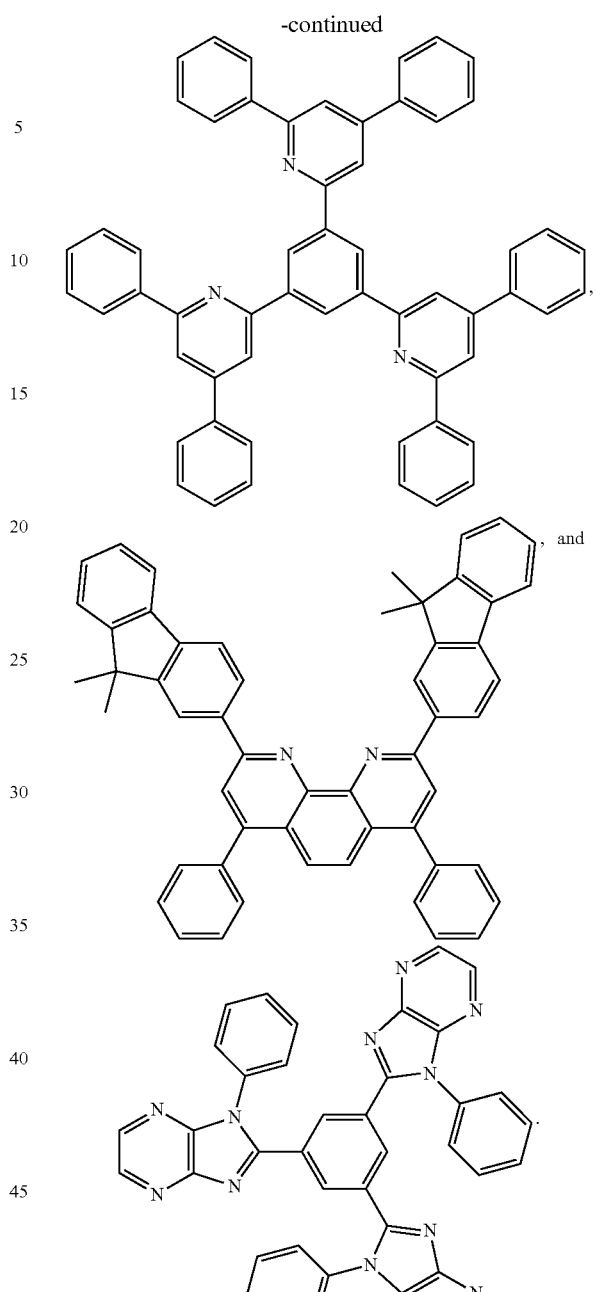

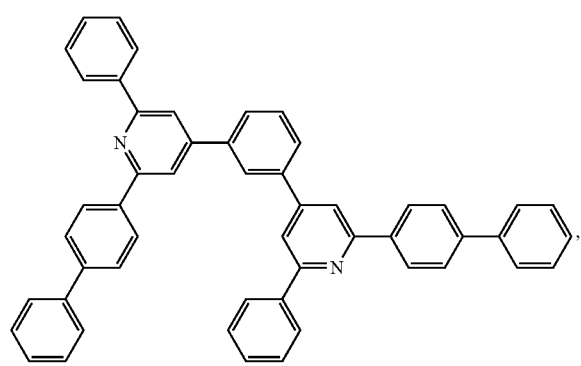

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

In any above-mentioned compounds used in each layer of the OLED device, the hydrogen atoms can be partially or fully deuterated. Thus, any specifically listed substituent, such as, without limitation, methyl, phenyl, pyridyl, etc. may be undeuterated, partially deuterated, and fully deuterated versions thereof. Similarly, classes of substituents such as, without limitation, alkyl, aryl, cycloalkyl, heteroaryl, etc. also may be undeuterated, partially deuterated, and fully deuterated versions thereof.

EXPERIMENTAL

Representative Ligand Syntheses:

In the following description of the synthesis steps, the intermediate compounds are labeled and referred to as (n).

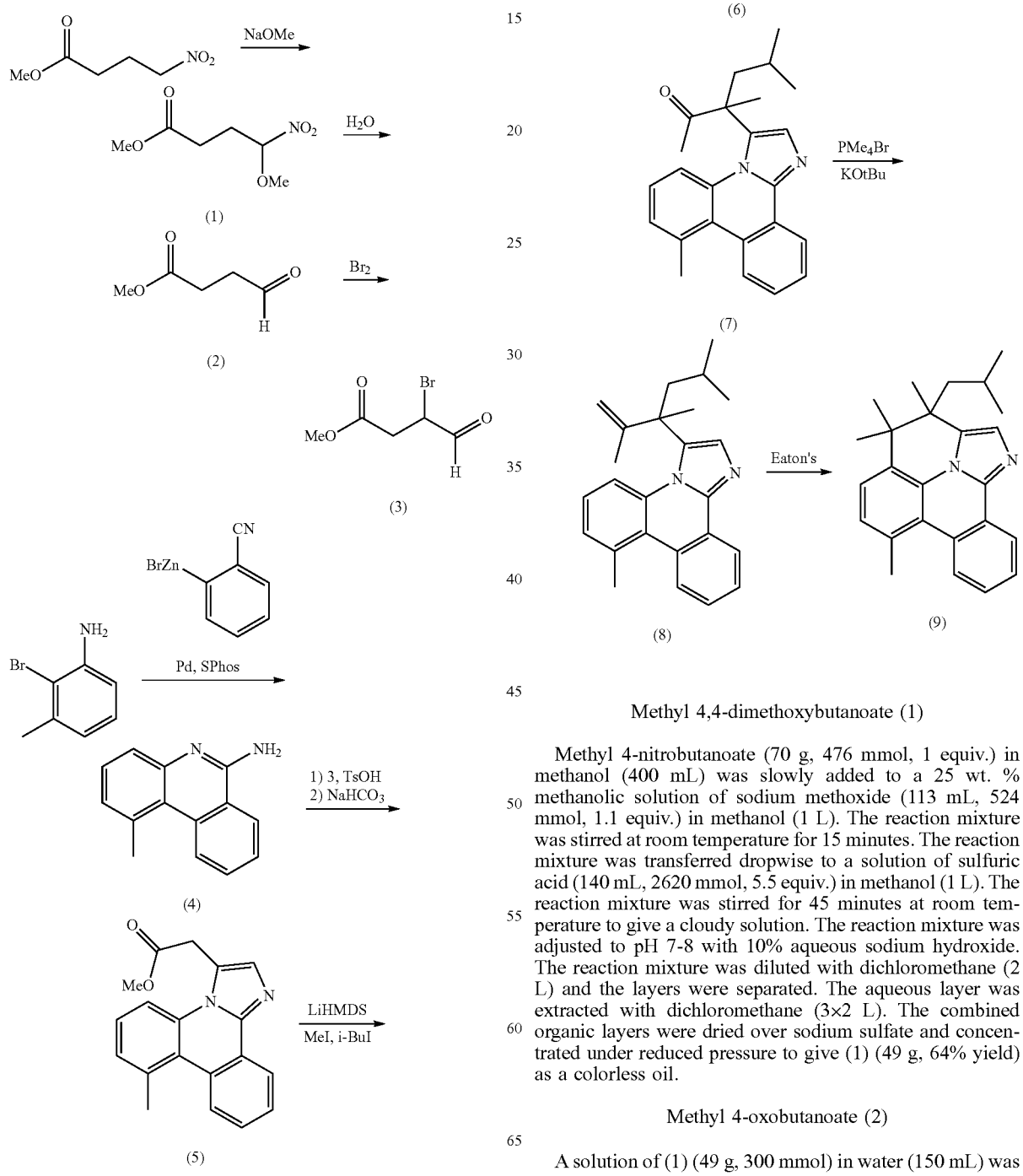

Methyl 4,4-dimethoxybutanoate (1)

Methyl 4-nitrobutanoate (70 g, 476 mmol, 1 equiv.) in methanol (400 mL) was slowly added to a 25 wt. % methanolic solution of sodium methoxide (113 mL, 524 mmol, 1.1 equiv.) in methanol (1 L). The reaction mixture was stirred at room temperature for 15 minutes. The reaction mixture was transferred dropwise to a solution of sulfuric acid (140 mL, 2620 mmol, 5.5 equiv.) in methanol (1 L). The reaction mixture was stirred for 45 minutes at room temperature to give a cloudy solution. The reaction mixture was adjusted to pH 7-8 with 10% aqueous sodium hydroxide. The reaction mixture was diluted with dichloromethane (2 L) and the layers were separated. The aqueous layer was extracted with dichloromethane (3×2 L). The combined organic layers were dried over sodium sulfate and concentrated under reduced pressure to give (1) (49 g, 64% yield) as a colorless oil.

Methyl 4-oxobutanoate (2)

A solution of (1) (49 g, 300 mmol) in water (150 mL) was refluxed for two hours. The reaction was cooled to room temperature and diluted with dichloromethane (300 mL). The layers were separated and the aqueous layer was extracted with dichloromethane (3×300 mL). The combined organic layers were dried over sodium sulfate and concentrated under reduced pressure to give (2) (24.2 g, 50% yield) as a colorless oil.

Methyl 3-bromo-4-oxobutanoate (3)

Bromine (10.2 mL, 199 mmol, 1 equiv) was added dropwise to a solution of (2) (23.1 g, 199 mmol, 1 equiv.) in dichloro-methane (1 L) at 0° C. The rate of addition was adjusted to maintain the temperature below 5° C. After stirring at room temperature for 30 minutes, the reaction mixture was concentrated under reduced pressure to give (3) (40 g, quantitative yield, 95% purity) as a light brown oil.

1-Methylphenanthridin-6-amine (4)

A mixture of 2-bromo-3-methylaniline (38.8 g, 208 mmol, 1 equiv.), (Chloro(2-dicyclohexylphosphino-2',6'-dimethoxy-1,1'-biphenyl)[2-(2'-amino-1,1'-biphenyl)]palladium(II) (2.99 g, 4.16 mmol, 0.02 equiv.), 2-dicyclohexylphosphino-2',6'-dimethoxybiphenyl (1.71 g, 4.16 mmol, 0.02 equiv.) in THF (832 mL) was sparged with nitrogen for 15 minutes. 0.5M 2-cyanophenyl zinc bromide solution in THF (500 mL, 250 mmol, 1.2 equiv.) was added to the mixture and the reaction mixture was refluxed overnight. After cooling to room temperature, the reaction mixture was diluted with saturated brine (10 mL) and concentrated under reduced pressure. The solids were dissolved in 10% methanol in dichloromethane (500 mL) and 24 wt. % aqueous solution of sodium hydroxide (500 mL). The layers were separated and the aqueous layer was extracted with dichloromethane (3×500 mL). The combined organic layers were dried over sodium sulfate, and concentrated under reduced pressure. The brown solid was sequentially triturated with 25% MTBE in heptanes (1.5 L) and dichloromethane (5×25 mL) to give (4) (10.7 g, 25% yield) as a pale yellow solid.

Methyl 2-(8-methylimidazo[1,2-f]phenanthridin-3-yl)acetate (5)

A mixture of (4) (16.5 g, 80 mmol, 1 equiv.), (3) (40 g, 200 mmol, 1.5 equiv.), and p-toluenesulfonic acid monohydrate (755 mg, 4 mmol, 0.05 equiv.) in 2-propanol (635 mL) was stirred at room temperature for 30 minutes. Sodium carbonate (13.3 g, 160 mmol, 2 equiv.) and water (32 mL) were added and the reaction mixture was refluxed overnight. The reaction mixture was cooled to room temperature and diluted with saturated aqueous sodium bicarbonate (300 mL) and dichloromethane (500 mL). The layers were separated and the aqueous layer was extracted with dichloromethane (3×500 mL). The combined organic layers were dried over sodium sulfate, filtered and concentrated under reduced pressure. The crude product was triturated with MTBE (2×100 mL) to give (5) (18 g, 75% yield) as a light brown solid.

Methyl 2,4-dimethyl-2-(8-methylimidazo[1,2-f] phenanthridin-3-yl)pentanoate (6)

1M LHMDS (10.8 mL, 10.8 mmol, 1.1 equiv) in THF was added drop-wise to a solution of (5) (3.0 g, 9.86 mmol, 1 equiv.) in anhydrous THF (270 mL) over 5 minutes. Iodomethane (0.62 mL, 9.86 mmol, 1 equiv.) was added and the reaction mixture was stirred for 1 hour. Additional 1M LHMDS (10.84 mL, 10.84 mmol, 1.1 equiv.) in THF and isobutyl iodide (1.7 mL, 14.79 mmol, 1.5 equiv.) were sequentially added at room temperature and the reaction mixture was stirred for 16 hours. The reaction mixture was quenched with 1M HCl (10 mL). The crude mixture was concentrated under reduced pressure. The residue was diluted with dichloromethane (200 mL) and water (150 mL). The layers were separated and the organic layer was dried over sodium sulfate and concentrated under reduced pressure. The crude product was pre-absorbed on silica gel (10 g) and purified by column chromatography to give (6) (1.95 g, 53% yield) as a yellow solid.

3,5-Dimethyl-3-(8-methylimidazo[1,2-f]phenanthridin-3-yl)hexan-2-one (7)

1.6M Methyllithium (12.8 mL, 20.51 mmol, 4 equiv.) in diethyl ether was added drop-wise to a solution of (6) (1.92 g, 5.13 mmol, 1 equiv.) in THF at −20° C. The reaction mixture was warmed to room temperature and stirred for 16 hours. The reaction was quenched with ice and the crude mixture was concentrated under reduced pressure. The residue was diluted with dichloromethane (200 mL) and water (100 mL). The layers were separated and the organic layer was dried over sodium sulfate and concentrated under reduced pressure. The crude product was purified by column chromatography to give (7) (1.35 g, 74% yield) as a white solid.

8-Methyl-3-(2,3,5-trimethylhex-1-en-3-yl)imidazo [1,2-f]phenanthridine (8)

Tetramethylphosphonium bromide (1.76 g, 10.29 mmol, 3 equiv.) and potassium tert-butoxide (1.16 g, 10.29 mmol, 3 equiv.) were added to a solution of 7 (1.23 g, 3.43 mmol, 1 equiv.) in THF (30 mL) at 55-60° C. The reaction mixture was refluxed overnight. After cooling to room temperature, the reaction mixture was concentrated under reduced pressure. The crude residue was diluted with dichloromethane (100 mL) and water (80 mL). The layers were separated and the organic layer was dried over sodium sulfate and concentrated under reduced pressure and purified by column chromatography to give (8) (0.70 g, 57% yield) as a yellow solid.

3-Isobutyl-3,4,4,7-tetramethyl-3,4-dihydrodibenzo [b,ij]imidazo[2,1,5-de]quinolizine (9)

A solution of (8) (0.70 g, 1.96 mmol, 1 equiv.) in Eaton's reagent (5 mL) was stirred at room temperature for 4 hours. The reaction mixture was quenched with ice cubes, diluted with water (100 mL), and extracted with dichloromethane (5×30 mL). The combined organic layers were washed sequentially with a 1M sodium hydroxide (50 mL), saturated aqueous sodium bicarbonate (50 mL), and saturated brine (50 mL). The organic layer was dried over sodium sulfate and concentrated under reduced pressure. The crude product was pre-absorbed on silica (3 g) and purified by column chromatography to give (9) (0.63 g, 90% yield) as a white solid.

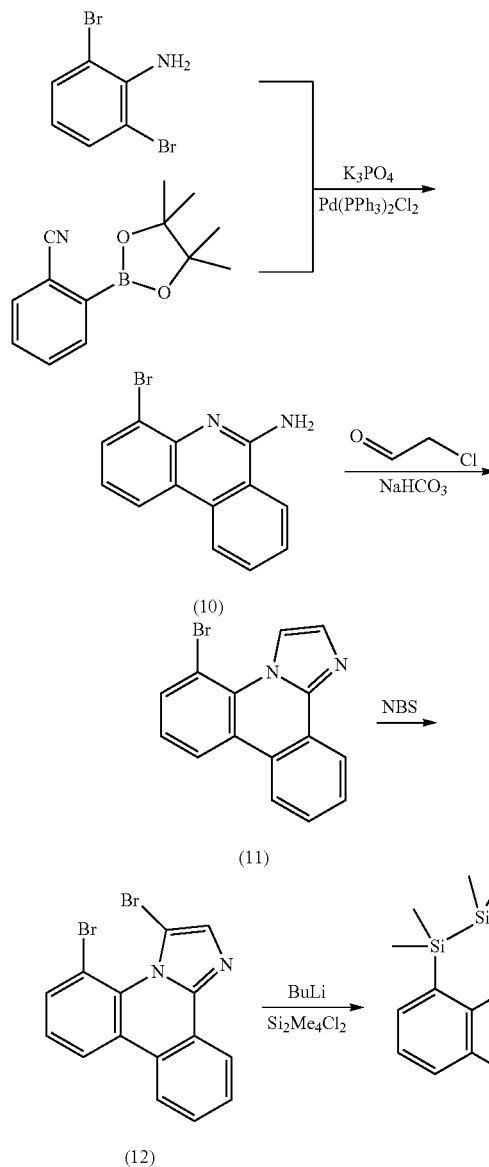

4-Bromophenanthridin-6-amine (10)

2-(4,4,5,5-Tetramethyl-1,3,2-dioxaborolan-2-yl)benzonitrile (17.4 g, 75.6 mmol, 1.0 equiv.) and 2,6-dibromo-aniline (19 g, 75.6 mmol, 1.0 equiv.) were dissolved in toluene (200 mL). Tribasic potassium phosphate hydrate (50 g, 227 mol, 3.0 equiv.) was dissolved in water (40 mL) and added to the reaction solution. The reaction mixture was sparged with nitrogen for 10 minutes. trans-Dichlorobis(triphenylphosphine) palladium(II) (2.6 g, 3.8 mmol, 0.05 equiv.) was added and the reaction mixture was heated at reflux for 4 hours. After cooling to room temperature, the layers were separated and the organic phase was washed with hot water (4×75 mL). The aqueous phase was extracted with ethyl acetate (50 mL). The organic phases were combined; ethyl acetate (100 mL) was added to dissolve some remaining solids. The organic solution was washed with brine (100 mL), filtered through Celite and concentrated to a brown semisolid (27 g). The material was triturated with dichloromethane (~50 mL) to give ~5.6 g of light yellow solid. The filtrates concentrated and the residue chromatographed on silica gel to give (10) (7.4 g, 36% yield) as an off-white solid.

5-Bromoimidazo[1,2-f]phenanthridine (11)

To a solution of (10) (7.35 g, 27 mmol, 1.0 equiv.) in 2-propanol (190 mL) was added 50% chloroacetaldehyde in water (8.5 g, 54 mmol, 2.0 equiv.). Sodium bicarbonate (5.7 g, 68 mmol, 2.5 equiv.) was added and the reaction was heated at reflux for 2 hours. After being cooled in an ice bath, the reaction mixture was diluted with dichloromethane (100 mL) and saturated sodium bicarbonate solution (200 mL). The layers were separated and the aqueous phase was extracted with dichloromethane (2×100 mL). The organic phases were combined, dried over sodium sulfate and concentrated. The crude product was chromatographed on silica gel (100 g) to give (11) (5.5 g, 70% yield) as an off-white solid.

3,5-Dibromoimidazo[1,2-f]phenanthridine (12)

(11) (5.5 g, 18.5 mmol, 1.0 equiv.) was dissolved in N,N-dimethylform-amide (275 mL) at 50° C. N-Bromosuccinimide (3.3 g, 18.5 mmol, 1.0 equiv.) was added in one portion and the solution was stirred at room temperature for 18 hours. A mixture of 10% dichloromethane in methyl tert-butyl ether (200 mL) and water (600 mL) were added, the layers separated and the aqueous phase was extracted with 10% dichloromethane in methyl tert-butyl ether (3×150 mL). The organic phases were combined, dried over sodium sulfate, and concentrated. The crude product was chromatographed on silica gel to give (12) (5.4 g, 73% yield) as an off-white solid.

3,3,4,4-tetramethyl-3,4-dihydro-1,2a1-diaza-3,4-disilabenzo[fg]aceanthrylene (13)

(12) (2.05 g, 5.45 mmol) was dissolved in THF (200 ml) and cooled in $^i$PrOH/CO$_2$ bath. Butyllithium solution in hexanes (7.15 ml, 11.45 mmol) was added slowly, becoming deep brown. After stirring 15 minutes cold, 1,2-dichloro-1,1,2,2-tetramethyldisilane (1.111 ml, 6.00 mmol) was added to the light beige suspension and the mixture was allowed to warm to room temperature. Quenching with water followed by EtOAc extraction, drying organics and column chromatography yielded (13) as a pale yellow, glassy residue, 1.11 g (61%).

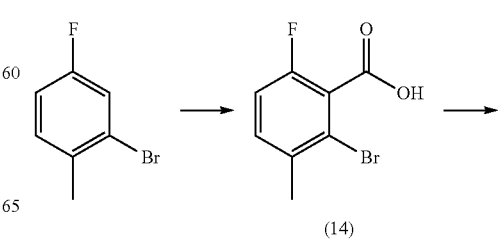

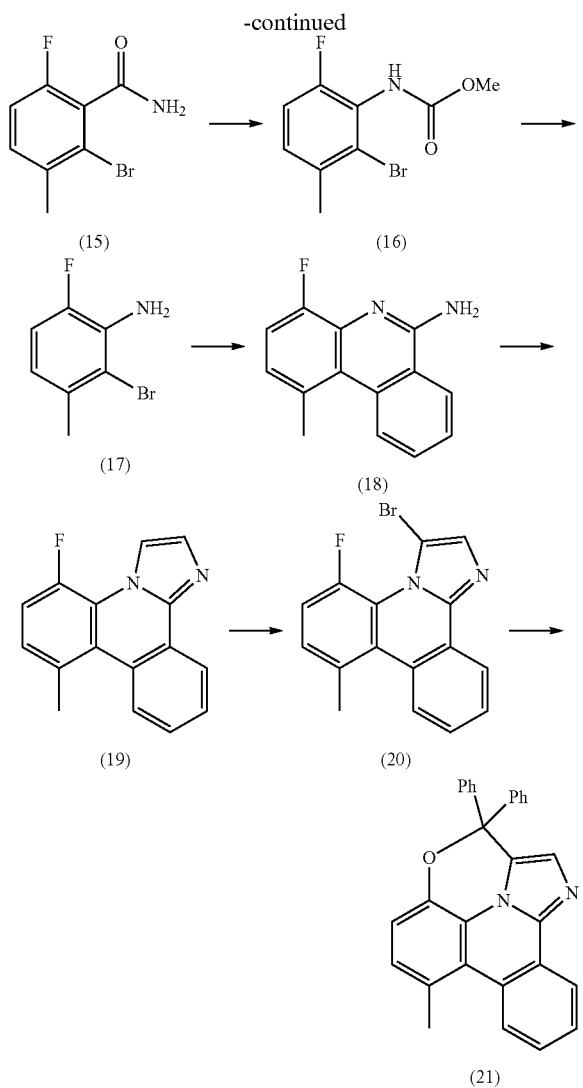

(15) (16) (17) (18) (19) (20) (21)

2-bromo-6-fluoro-3-methylbenzoic acid (14)

300 mL dry THF was charged to an oven dried 1000 mL three neck RBF fitted with two septa and a nitrogen inlet. A solution of diisopropylamine (20.0 ml, 142 mmol) in THF (300 mL) was in an ice/water bath. n-butyllithium (45 ml, 113 mmol) solution was added slowly and stirred at 0° C. for an additional 15 minutes before cooling in an $^i$PrOH/CO$_2$ bath. 2-bromo-4-fluoro-1-methylbenzene (12 ml, 97 mmol) was added slowly over 10 minutes and stirred cold for 1 hour before carbon dioxide was bubbled through the mixture. After 20 minutes bubbling while cold, the reaction was allowed to warm to room temperature while still bubbling, after which 100 mL of water was added. The organic layer was extracted with 3×100 mL 0.1M aq. NaOH. Combined water layers were washed with EtOAc and acidified to pH 1 with 6M HCl. Extraction with EtOAc, drying and condensation under reduced pressure afforded 19.24 g (85%) of the (14).

2-bromo-6-fluoro-3-methylbenzamide (15)

To a stirred mixture of (14) (17.06 g, 73.2 mmol) and two drops of DMF in 250 mL DCM was added a solution of oxalyl chloride (7.40 ml, 87 mmol) in 50 mL DCM slowly over 1 hour. Gas evolution stopped after 1.5 hours, and the solution was stirred an additional 30 minutes before cooling in an ice/water bat. Ammonium hydroxide (30% aq. soln, 40 ml, 342 mmol) was then added, slowly, over about 10 minutes and stirred an additional 30 minutes, forming a white precipitate. Water (100 mL) and DCM (100 mL) were added and the layers separated. Further extraction of the water layers with DCM followed by drying and condensation under reduced pressure yielded 15.86 g (93%) of (15).

methyl (2-bromo-6-fluoro-3-methylphenyl)carbamate (16)

Sodium metal (6.00 g, 261 mmol) was added portionwise in approximately 1 g portions to 400 mL of MeOH while cooling in an ice bath under nitrogen and stirred until no further gas evolution was visible. The solution was cooled in an $^i$PrOH/CO$_2$ bath and dibromine (4.0 ml, 78 mmol) was added neat via syringe, dropwise, over approximately 4 minutes. After stirring an additional 5 minutes, (15) (15.9 g, 68.5 mmol) was added and the pale yellow solution was stirred cold for 1 hour, then heated at reflux for 2 more hours. Volatiles were removed under reduced pressure and the residue was partitioned between DCM and water. Further extraction of the aqueous layer by DCM and drying of the combined organic layers followed by condensation under reduced pressure yielded 16.2 g (90%) of (16) as a white solid.

2-bromo-6-fluoro-3-methylaniline (17)

(16) (16.20 g, 61.8 mmol) was charged to a 500 mL RBF followed by reagent grade ethanol (120 mL). 60 mL 40% (w/v) soln. of potassium hydroxide (60 ml, 428 mmol) was then added and the reaction mixture was heated at reflux for 6 hours. Ethanol was removed under reduced pressure and the resultant aqueous mixture was extracted with DCM three times. Drying and condensation of the organic layer under reduced pressure yielded 9.53 g (76%) of a yellow oil that solidifies slowly at room temperature.

4-fluoro-1-methylphenanthridin-6-amine (18)

2-pinacolatoborano-benzonitrile (0.176 g, 0.770 mmol), potassium phosphate monohydrate (0.444 g, 1.926 mmol), and (17) (0.131 g, 0.642 mmol) were charged to a Schlenk flask followed by addition of 3 mL dioxane and 180 μL water. The reaction mixture was sparged with N$_2$ for 20 min, followed by the addition of XphosPd-G3 (6.1 mg, 7.21 μmol) then placed in an oil bath at 100° C. for 16 hours. After cooling to room temperature water (5 mL) and DCM (5 mL) were added. Further extraction with DCM and drying of the organic layer followed by purification by column chromatography yielded 101 mg (70%) of (18) as a light yellow solid.

5-fluoro-8-methylimidazo[1,2-f]phenanthridine (19)

(18) (65.0 mg, 287 μmol), 2 chloroacetaldehyde (0.080 ml of a 50% aq. soln., 630 μmol) and sodium bicarbonate (0.060 g, 718 μmol) in 2 mL iPrOH were heated to 80° C. for 14 hours. After cooling to room temperature, ice cold water was added. The tan precipitate was collected by vacuum filtration and washed with water to yield (19) as a tan solid (61 mg, 85%).

3-bromo-5-fluoro-8-methylimidazo[1,2-f]phenanthridine (20)

1-bromopyrrolidine-2,5-dione (1.509 g, 8.48 mmol) was added to a solution of (19) (2.122 g, 8.48 mmol) in 80 mL of DMF and the mixture was heated at 80° C. for 18 hours. The reaction mixture was cooled to room temperature and 150 mL of ice cold water was added. The yellow/tan solids were filtered and washed with water followed by drying to give 1.86 g of (20) as a yellow solid (67%).

7-methyl-3,3-diphenyl-3H-4-oxa-1,2a1-diazabenzo[fg]aceanthrylene (21)

Butyllithium solution (0.250 ml, 0.625 mmol) was added dropwise to a solution of (20) (0.205 g, 0.623 mmol) in 10 mL THF cooled in an iPrOH/CO$_2$ bath and the dark brown solution was stirred cold for 20 minutes. A pre-cooled solution of benzophenone (0.136 g, 0.747 mmol) in 5 mL THF was added via cannula and the mixture was stirred for 1 hour cold before being allowed to warm to room temperature. Quenching with sat. aq. NH$_4$Cl and extraction with DCM followed by drying of the organic layer and purification of condensed residues by column chromatography yielded 220 mg of (21) as a white solid (85%).

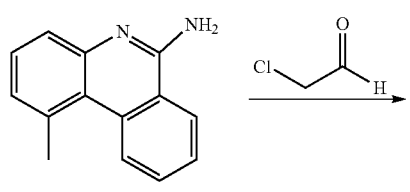

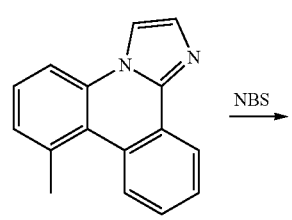

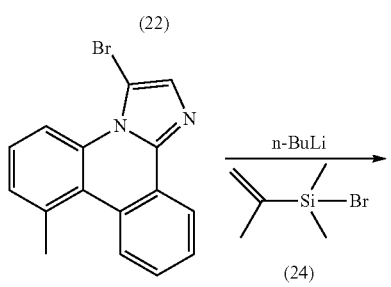

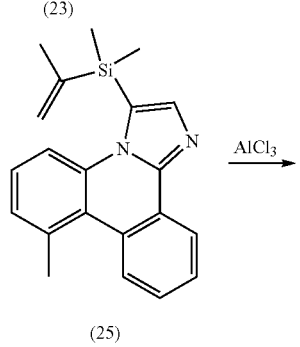

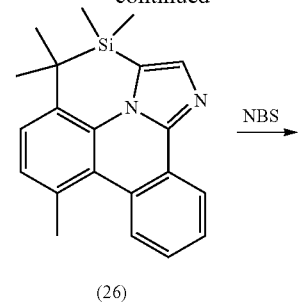

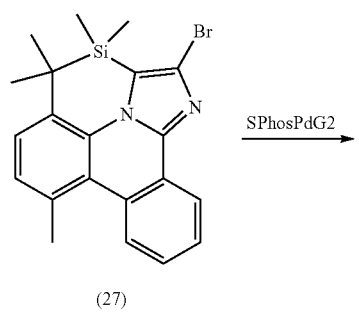

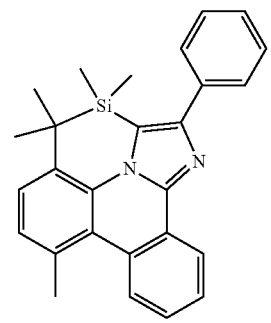

8-Methylimidazo[1,2-f]phenanthridine (22)

A 50% aqueous solution of chloroacetaldehyde (92 mL, 726 mmol, 3.6 equiv.) was added in one portion to a suspension of (4) (42 g, 202 mmol) and sodium bicarbonate (67.8 g, 807 mmol, 4 equiv.) in 2-propanol (2 L) at 50° C. The reaction mixture was refluxed for 17 hours, cooled to room temperature, and filtered through a plug of Celite. The filtrate was diluted with dichloromethane (2.5 L) and washed with water (4×1.5 L). The organic layer was dried over sodium sulfate (70 g) and concentrated under reduced pressure. The residue was dissolved in THF (500 mL) and filtered through a plug of silica (100 g), eluting with THF (500 mL). The filtrate was concentrated under reduced pressure and the residue was triturated with a 2 to 1 mixture of diethyl ether and hexanes (450 mL) to give 22 (46.0 g, 98% yield) as a light brown solid.

3-Bromo-8-methylimidazo[1,2-f]phenanthridine (23)

N-Bromosuccinimide (33.5 g, 188 mmol, 0.95 equiv.) was added in one portion to a solution of (22) (46.0 g, 198 mmol) in dichloromethane (0.8 L). After stirring at room temperature for 17 hours, the reaction mixture was quenched with saturated sodium thiosulfate (40 mL). The resulting mixture was stirred for 15 minutes, diluted with dichloromethane (2 L) and washed with 1M sodium hydroxide (1 L) and water (3×1.3 L). The organic layer was dried over sodium sulfate and concentrated under reduced pressure. The residue purified by column chromatography to give (23) (48.2 g, 82% yield) as a tan solid.

Bromodimethyl(prop-1-en-2-yl)silane (24)

0.5M Isopropenyl magnesium bromide in THF (814 mL, 407 mmol) was added dropwise over one hour, while maintaining the internal temperature around −20° C. during addition to a solution of chlorodimethylsilane (35.0 g, 370 mmol, 1.0 equiv.) in THF (150 mL). The reaction mixture was heated at 40° C. overnight. The reaction mixture was cooled to room temperature and allyl bromide (44.8 mL, 518 mmol, 1.4 equiv.) was added over ten minutes. After the addition was complete, palladium chloride (0.7 g, 3.7 mmol, 0.01 equiv.) was added and the reaction mixture was heated at 60° C. overnight. After cooling to room temperature, the reaction mixture was concentrated under reduced pressure (water bath kept at 20° C.). The resulting solid was suspended in pentane (500 mL) and filtered. The collected solid was washed with pentane (250 mL) and the filtrate was concentrated under reduced pressure to afford the crude product as a light brown oil. The crude product was dissolved in pentanes (400 mL) and filtered to remove solids. The solids were washed with pentanes (200 mL) and the filtrate was concentrated under reduced pressure to afford crude (24) (41.0 g, 62% yield) as a light brown oil.

3-(Dimethyl(prop-1-en-2-yl)silyl)-8-methylimidazo[1,2-f]phenanthridine (25)

2.5M n-Butyllithium in hexanes (7.6 mL, 18.9 mmol, 1.05 equiv.) was added dropwise to a solution of (23) (5.6 g, 18 mmol, 1 equiv.) in anhydrous THF (100 ml) at −78° C. The reaction mixture was stirred at −78° C. for 15 minutes and then (24) (18 mL, 99 mmol, 5.5 equiv.) was added via syringe. The reaction mixture was warmed to room temperature and stirred for 16 hours. The reaction mixture was quenched with ice and concentrated under reduced pressure. The residue was diluted with dichloromethane (200 mL) and water (100 mL). The layers were separated and the organic layer was dried over sodium sulfate and concentrated under reduced pressure. The crude product was purified by column chromatography to give 25 (4.5 g, 76% yield, >95% purity) as a white solid.

3,3,4,4,7-Pentamethyl-3,4-dihydro-1,2a$^1$-diaza-3-silabenzo[fg]aceanthrylene (26)

Anhydrous aluminum chloride (9.1 g, 68 mmol, 5 equiv.) was added to a solution of (25) (4.5 g, 13.6 mmol, 1 equiv.) in dichloromethane (500 mL) at −5° C. The reaction mixture was warmed to room temperature over 1.5 hours. Additional anhydrous aluminum chloride (1.81 g, 13.6 mmol, 1 equiv.) was added and the reaction was stirred for 40 minutes and the reaction mixture was monitored by TLC. The reaction mixture was poured into ice cooled saturated sodium bicarbonate (350 mL). The layers were separated and the aqueous layer was extracted with dichloromethane (3×100 mL). The combined organic layers were dried over sodium sulfate and concentrated under reduced pressure. The crude product was purified by column chromatography to give (26) (3.34 g, 74% yield, 95% purity) as a white solid.

2-Bromo-3,3,4,4,7-pentamethyl-3,4-dihydro-1,2a1-diaza-3-silabenzo[fg]ace-anthrylene (27)

Dry N-bromosuccinimide (1.24 g, 6.96 mmol, 1 equiv) was added to a solution of (26) (2.30 g, 6.96 mmol, 1 equiv.) in anhydrous dichloromethane (200 ml) and at room temperature. After stirring for 72 hours, additional N-bromosuccinimide (0.5 g, 2.81 mmol, 0.4 equiv.) and a catalytical amount of trifluoroacetic acid (1 μL, 0.013 μmol) were added. The reaction mixture was stirred at room temperature for 1 hour. A 20 wt % aqueous solution of sodium thiosulfate pentahydrate (50 mL) was added and the layers were separated. The organic layer was washed with saturated brine (100 mL), dried over sodium sulfate and concentrated under reduced pressure to give (27) (2.85 g, quantitative yield, 90% purity) as a yellow solid.

3,3,4,4,7-Pentamethyl-2-phenyl-3,4-dihydro-1,2a$^1$-diaza-3-silabenzo[fg]-ace-anthrylene (28)

A solution of (27) (4.0 g, 9.8 mmol, 1 equiv.) in a mixture (22:1) of 1,4-dioxane and water (230 mL) was sparged with nitrogen for 40 minutes. Phenylboronic acid (1.43 g, 11.7 mmol, 1.2 equiv.), potassium phosphate monohydrate (5.4 g, 23.5 mmol, 2.4 equiv.) and SPhosPdG2 (0.7 g, 0.98 mmol, 0.1 equiv.) were added, and the reaction mixture was sparged with nitrogen for 5 additional minutes. The reaction mixture was heated at 55-60° C. overnight. The reaction mixture was cooled to room temperature and concentrated under reduced pressure. The residue was diluted with dichloromethane (200 mL) and water (150 mL). The layers were separated and the organic layer was dried over sodium sulfate and concentrated under reduced pressure. The crude product was purified by column chromatography to give two batches of (28) (2.25 g, 69% yield) as a white solid.

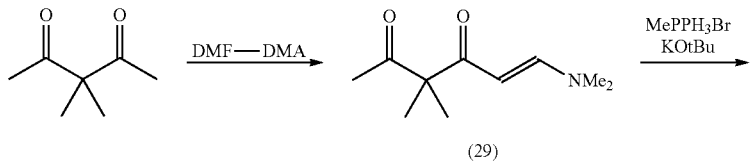

(29)

-continued
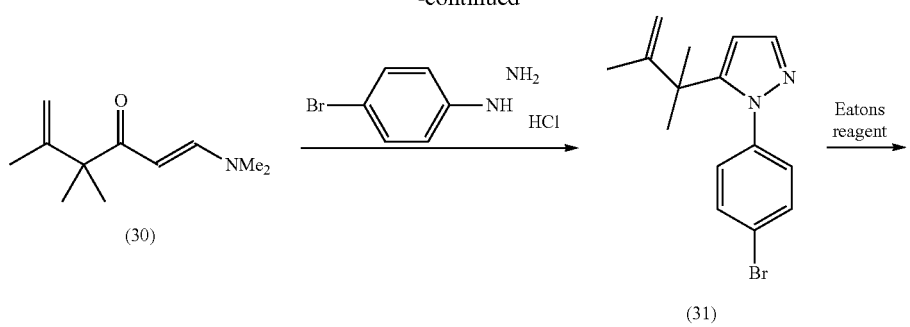
(30) → (31)
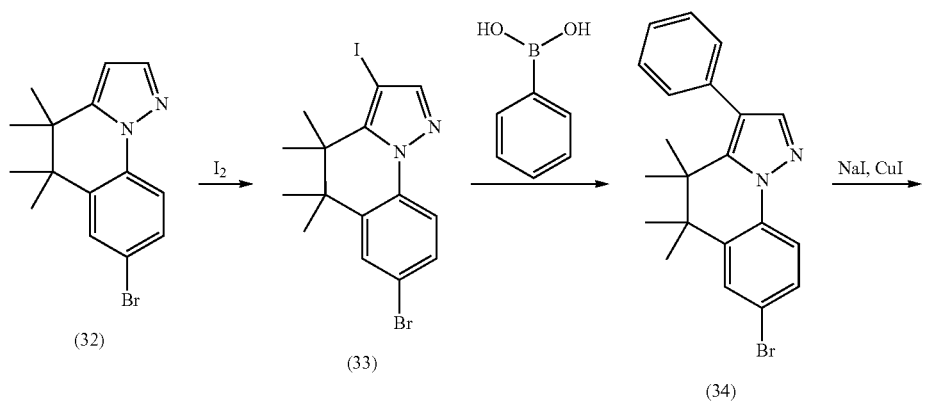
(32) → (33) → (34)
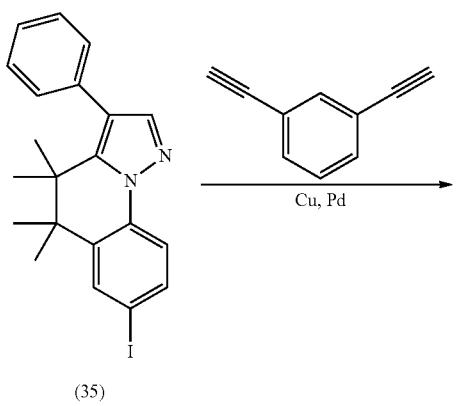
(35)
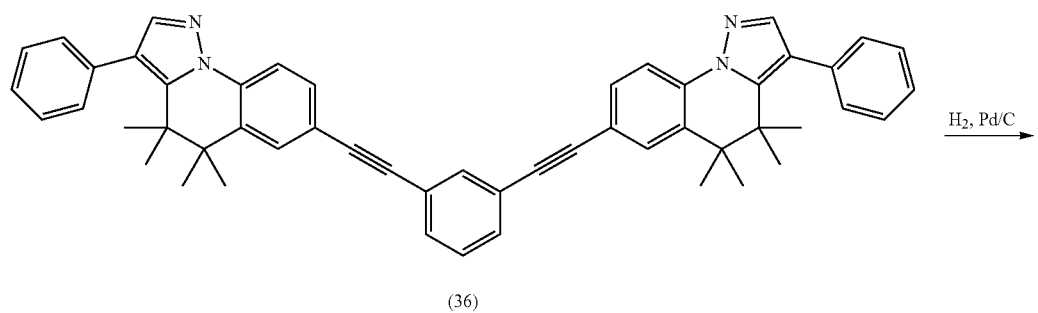
(36)

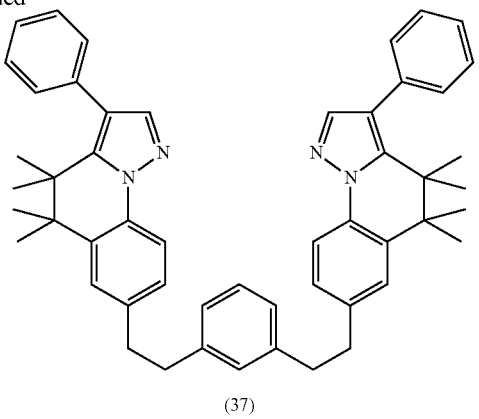

(37)

(E)-6-(Dimethylamino)-3,3-dimethylhex-5-ene-2,4-dione (29)

A solution of 3,3-dimethylpentane-2,4-dione (100 g, 780 mmol, 1 equiv.) and N,N-dimethylform-amide dimethyl acetal (102.3 g, 855 mmol, 1.1 equiv.) was refluxed overnight. After cooling to room temperature, water (0.3 L) and dichloromethane (300 mL) were added to the reaction mixture and the slurry was stirred for 10 minutes. The layers were separated and the aqueous layer was extracted with dichloromethane (300 mL). The combined organic layers were washed with saturated brine (300 mL), dried over sodium sulfate, filtered, and concentrated under reduced pressure to give (29) (94 g, crude) which was used subsequently.

(E)-1-(Dimethylamino)-4,4,5-trimethylhexa-1,5-dien-3-one (30)

A solution of methyl-triphenylphosphonium bromide (205 g, 575 mmol, 1.15 equiv) and potassium t-butoxide (67.3 g, 600 mmol, 1.2 equiv) in THF (1 L) was stirred at room temperature for 30 minutes. A solution of crude (29) (94 g, 500 mmol, 1 equiv) in THF (500 mL) was added to the reaction mixture at room temperature and the slurry was stirred overnight. Water (300 mL) was added to the reaction mixture and the slurry was stirred for 10 minutes. The layers were separated and the aqueous layer was extracted with dichloromethane (400 mL). The combined organic layers were washed with saturated brine (2×200 mL), dried over sodium sulfate, filtered and concentrated under reduced pressure to give (30) (231 g, 38% pure) as a dark solid which was used subsequently.

1-(4-Bromophenyl)-5-(2,3-dimethylbut-3-en-2-yl)-1H-pyrazole (31)

(4-Bromophenyl)hydrazine hydrochloride (44.3 g, 199 mmol, 1 equiv) was added to a solution of (30) (38% pure, 90.5 g, 199 mmol, 1 equiv) in ethanol (900 mL). After gentle refluxing overnight, the reaction mixture was cooled to room temperature and concentrated under reduced pressure. The residue was diluted with dichloromethane (2 L) and washed with saturated sodium bicarbonate (2×250 mL) and saturated brine (500 mL). The organic layer was dried over sodium sulfate and concentrated under reduced pressure. The crude material was purified by column chromatography to give (31) (36 g, 60% yield) as a dark red oil.

7-Bromo-4,4,5,5-tetramethyl-4,5-dihydropyrazolo[1,5-a]quinolone (32)

A solution of (31) (36 g, 118 mmol, 1 equiv) in Eaton's reagent (250 mL) was stirred at room temperature overnight. The reaction was carefully poured into ice water (300 mL) and diluted with ethyl acetate (200 mL). The reaction mixture was carefully basified with solid sodium bicarbonate and further diluted with water (300 mL). The layers were separated and the aqueous layer was extracted with ethyl acetate (400 mL) and dichloromethane (400 mL). The combined organic layers were washed with saturated brine (400 mL), dried over sodium sulfate, and concentrated under reduced pressure. The crude product was purified by column chromatography to give (32) (34 g, 76% yield) as a dark red oil.

7-Bromo-3-iodo-4,4,5,5-tetramethyl-4,5-dihydropyrazolo[1,5-a]quinolone (33)

Iodine (17 g, 67 mmol, 0.6 equiv.) and cerium ammonium nitrate (36.7 g, 67 mmol, 0.6 equiv.) were sequentially added to a solution of (32) (34 g, 111 mmol, 1 equiv.) in acetonitrile (800 mL). After stirring at room temperature overnight, the reaction mixture was concentrated under reduced pressure. Ethyl acetate (1.5 L) was added and the solution was washed with 5% sodium bisulfite (500 mL), saturated brine (2×500 mL), dried over sodium sulfate and concentrated under reduced pressure. The crude product was purified by column chromatography to give (33) (22 g, 67% yield) as yellow solid.

7-Bromo-4,4,5,5-tetramethyl-3-phenyl-4,5-dihydropyrazolo[1,5-a]quinolone (34)

A mixture of (33) (22 g, 51 mmol, 1 equiv.) phenylboronic acid (6.2 g, 51 mmol, 1 equiv.) and sodium carbonate (10.8 g, 102 mmol, 2 equiv.) in dimethoxyethane (300 mL) and water (150 mL) was sparged with a nitrogen for 20 minutes. Tetrakis(triphenylphosphine)palladium(0) (2.9 g, 2.6 mmol, 0.05 equiv.) was added and the reaction mixture was heated at a gentle reflux for 3 days. The reaction mixture was cooled to room temperature and diluted with ethyl acetate (400 mL) and saturated brine (200 mL). The layers were separated and the aqueous layer was extracted with ethyl acetate (2×150 mL). The combined organic layers were dried over sodium sulfate and concentrated under reduced pressure. The crude brown solid was purified by column chromatography to give (34) (9 g, 46% yield) as a white solid.

7-Iodo-4,4,5,5-tetramethyl-3-phenyl-4,5-dihydropyrazolo[1,5-a]quinolone (35)

A mixture of (34) (9 g, 24 mmol, 1 equiv.) and sodium iodide (7.1 g, 47 mmol, 2 equiv.) in dioxane (131 mL) was sparged with nitrogen for 20 minutes. Copper iodide (1.3 g, 7 mmol, 0.3 equiv.) and trans-dimethylcyclohexane-1,2-diamine (1.1 ml, 7.1 mmol, 0.3 equiv.) was added. The reaction was refluxed for seven days. After cooling to room temperature the mixture was filtered through a pad of celite, which was washed with ethyl acetate (600 mL). The filtrate was washed with saturated ammonium chloride (100 mL), water (200 mL) and saturated brine (200 mL). The organic layer was dried over sodium sulfate and concentrated under reduced pressure. The crude solid purified by column chromatography to give a 9 to 1 mixture of (35) (6.9 g, 68% yield) to (34) as a slight yellow solid.

1,3-Bis((4,4,5,5-tetramethyl-3-phenyl-4,5-dihydropyrazolo[1,5-a]quinolin-7-yl)ethynyl)benzene (36)

A mixture of (35) (8.4 g, 19.9 mmol, 1 equiv) and triethylamine (48 mL, 358 mmol, 18 equiv) in anhydrous THF (200 mL) sparged with nitrogen for 40 minutes. The reaction mixture was stirred at room temperature for 1.5 hours until most of the solid dissolved. Bis(triphenylphosphine)palladium(II) dichloride (554 mg, 0.8 mmol, 0.04 equiv), copper iodide (112 mg, 0.6 mmol, 0.03 equiv) and 1,3-diethynylbenzene (1.2 mL, 8.8 mmol, 0.45 equiv) were added. The reaction mixture was stirred at room temperature for 1 hour, then refluxed overnight. After cooling to room temperature, the reaction mixture was concentrated under reduced pressure and the crude solid was purified by column chromatography to yield 3.0 g of (36) as a white solid, 48%).

1,3-Bis(2-(4,4,5,5-tetramethyl-3-phenyl-4,5-dihydropyrazolo[1,5-a]quinolin-7-yl)ethyl)benzene (37)

A mixture of 10% dry palladium on carbon (436 mg, 0.28 mmol, 0.1 equiv.) and (36) (3.0 g, 4.1 mmol, 1 equiv.) in THF (60 mL) and ethyl acetate (30 mL) was hydrogenated @45 psi, repeated with two batches of fresh catalyst followed by filtration through celite. Purification by column chromatography yielded 1.57 g of (37) as a white solid.

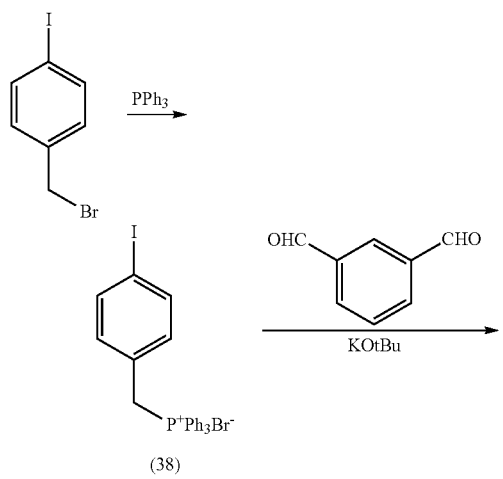

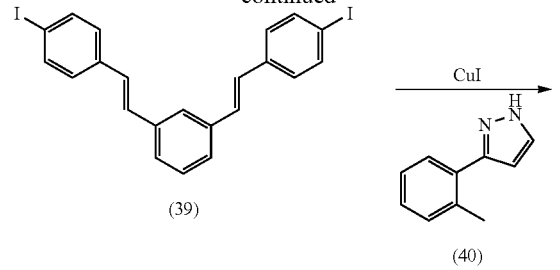

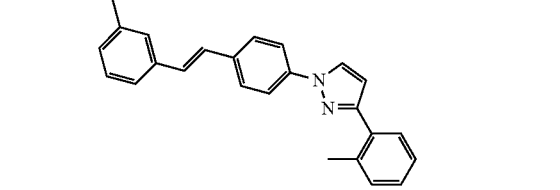

(4-Iodobenzyl)triphenylphosphonium bromide (38)

A solution of 4-iodobenzyl bromide (103 g, 0.347 mol, 1.0 equiv) and triphenylphosphine (91 g, 0.347 mol, 1.0 equiv.) in toluene (1.0 L) was heated at reflux overnight. The reaction mixture was cooled to room temperature and the resulting solid was filtered and dried under vacuum at 40° C. overnight to give (38) (190 g, 98% yield) as a white solid.

1,3-Bis(4-iodostyryl)benzene (39)

Potassium tert-butoxide (44.5 g, 0.397 mol) was added to a suspension of (38) (190 g, 0.340 mol, 2.4 equiv) in anhydrous THF (2.4 L) at room temperature, giving a bright orange mixture which was stirred at room temperature for 20 minutes. Isophthalaldehyde (19 g, 0.142 mol, 1.0 equiv) was added and the reaction mixture was stirred at room temperature overnight. The reaction mixture was poured into ice water (12 L) and extracted with ethyl acetate (3×1.2 L). The combined organic layers were washed with saturated brine (1.0 L), dried over sodium sulfate, filtered and concentrated under reduced pressure. The crude solid was triturated with MTBE followed by MeOH and dried under vacuum to yield (39) as an off-white solid, 33.4 g, 44%, as a mixture of trans and cis regioisomers.

3-(2-Methylphenyl)-1H-pyrazole (40)

A mixture of 2-methylacetophenone (5.0 g, 37.2 mmol, 1.0 equiv) and N,N-dimethylformamide dimethyl acetal (50 mL, 376 mmol, 10 equiv.) was heated reflux for 3 days. The reaction mixture was cooled to room temperature and concentrated under reduced pressure to give an orange oil which was taken on without further purification. This material was dissolved in ethanol (50 mL) and hydrazine hydrate (2.4 g, 75 mmol, 2 equiv) was added. The reaction mixture was stirred for 16 hours at room temperature and concentrated under reduced pressure to give (40) (6.1 g, 99% yield, 90% purity) as an orange oil.

1,3-Bis(4-(3-(2-methylphenyl)-1H-pyrozol-1-yl)styryl)benzene (41)

A mixture of (39) (2.0 g, 3.7 mmol, 1 equiv.), (40) (1.8 g, 11.1 mmol, 3 equiv.), copper (I) iodide (71 mg, 0.37 mmol, 0.1 equiv.), picolinic acid (92 mg, 0.75 mmol, 0.2 equiv.), and potassium phosphate tribasic (4.3 g, 18.5 mmol, 5 equiv.) in DMSO (50 mL) was sparged with a stream of nitrogen for 30 minutes and then heated at 130° C. for 48 hrs. The reaction mixture was poured into water and extracted with ethyl acetate (3×150 mL). The combined organic layer was washed with water (50 mL) and saturated aqueous brine (50 mL), dried over sodium sulfate, filtered, and concentrated under reduced pressure to give a green solid. The crude product was purified by column chromatography to give 1.5 g of (41) as an impure, tan solid.

1,3-Bis(4-(3-(2-methylphenyl)-1H-pyrozol-1-yl)phenethyl)benzene (42)

A mixture of (41) (1.5 g, 2.0 mmol), 10% Pd/C (500 mg), and ammonium formate (25 g, excess) in 2-propanol (500 mL) was heated at reflux over the weekend. The catalyst was filtered and the filtrate was concentrated under reduced pressure to give a semi-solid residue. This was dissolved in ethyl acetate (200 mL), washed with water (50 mL) and saturated aqueous brine (50 mL), dried over sodium sulfate, filtered, and concentrated under reduced pressure to give crude product that was purified by column chromatography to give (42) as a white crystalline solid, 450 mg.

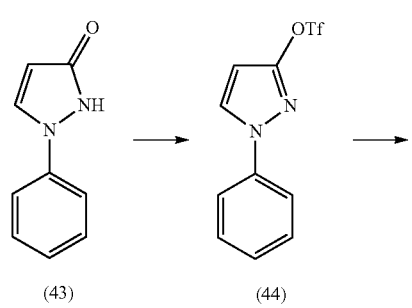

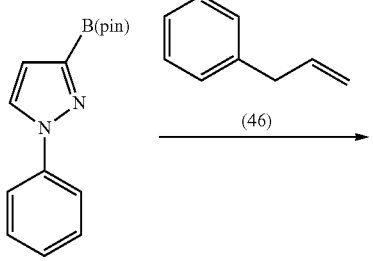

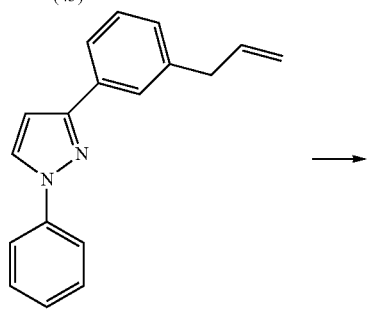

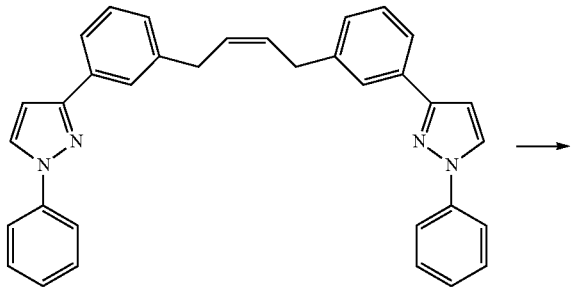

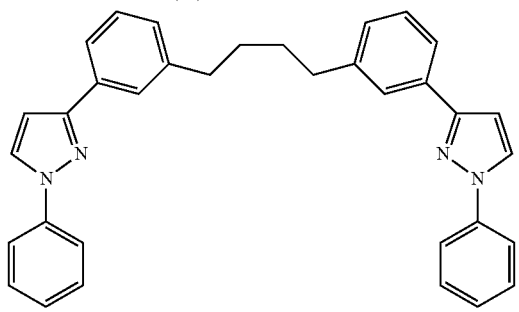

1-phenyl-1,2-dihydro-3H-pyrazol-3-one (43)

1-phenylpyrazolidin-3-one (40 g, 247 mmol) was dissolved in DMF (150 ml) and iron(III) chloride hexahydrate (3.33 g, 12.33 mmol) was added. Air was bubbled in as the temperature was raised to 80° C. with stirring until TLC indicated completion. The reaction mixture was poured into 1.5 L of water and cooled to room temperature in an ice bath followed by filtration and washing the precipitates with water and drying to yield (43) as a pale gray solid, 36 g (91%).

1-phenyl-1H-pyrazol-3-yl trifluoromethanesulfonate (44)

A solution of (43) (14.1 g, 88 mmol) and triethylamine (15 ml, 108 mmol) in DCM (400 ml) was cooled in an ice bath and trifluoromethanesulfonic anhydride (16.5 ml, 98 mmol) was added in portions. After warming to room temperature 300 mL of 50% brine was added and the organic layer was separated. Drying, and solvent evaporation yielded a residue that was purified by column chromatography to yield (44) as a yellow oil, 24.1 g (94%).

1-phenyl-3-(4,4,5,5-tetramethyl-1,3,2-dioxaborolan-2-yl)-1H-pyrazole (45)

(44) (10 g, 34.2 mmol), 4,4,4',4',5,5,5',5'-octamethyl-2,2'-bi(1,3,2-dioxaborolane) (9.56 g, 37.6 mmol), Pd(PPh$_3$)$_4$ (3.16 g, 2.74 mmol), potassium bromide (4.48 g, 37.6 mmol), and potassium acetate (10.08 g, 103 mmol) were combined in dioxane (171 ml) and heated at reflux for 16 hours. The mixture was partitioned between EtOAc and water and the organics were washed with brine, dried, vacuumed down, and purified by column chromatography, yielding (45) as a yellow oil, 7.84 g (85%).

1-allyl-3-bromobenzene (46)

A solution of 1,3-dibromobenzene (5 ml, 41.4 mmol) in THF (207 ml) was cooled in an $^i$PrOH/CO$_2$ bath, butyllithium solution in hexanes (16.55 ml, 41.4 mmol) was added slowly over 5 minutes and stirred cold for 30 minutes. A suspension of copper(I) iodide (3.94 g, 20.69 mmol) in 20 mL THF was added and the reaction mixture was allowed to warm to 0° C. in an ice bath while stirring. 3-bromoprop-1-ene (10.74 ml, 124 mmol) was added and the reaction mixture allowed to stir cold for 1 hour before quenching with sat. NH$_4$Cl and water. The reaction mixture was extracted with EtOAc, organics with dried and the solvent evaporated to yield a yellow oil which was purified by column chromatography to yield (46) as a colorless oil, 4.63 g (57%).

3-(3-allylphenyl)-1-phenyl-1H-pyrazole (47)

(45) (7.20 g, 26.7 mmol), potassium phosphate (9.44 g, 44.5 mmol), Pd$_2$(dba)$_3$ (0.407 g, 0.445 mmol), (46) (4.38 g, 22.23 mmol) and S-Phos (0.730 g, 1.778 mmol) were combined in dioxane (123 ml) and the reaction mixture was heated at reflux for 16 hours. Water was added and the mixture was extracted with EtOAc. The organics were washed with brine and solvent was evaporated. The resulting residue was purified by column chromatography to yield (47) as a pale yellow oil, 2.41 g (42%).

1,4-bis(3-(1-phenyl-1H-pyrazol-3-yl)phenyl)but-2-ene (48)

(47) (2.41 g, 9.26 mmol) and Grubbs Catalyst (0.190 g, 0.231 mmol) were dissolved in degassed DCM (50 ml) and heated at reflux for 16 hours. The reaction mixture was purified by column chromatography to yield (48) as a yellow oil that solidifies slowly at room temperature, 1.46 g (64%).

1,4-bis(3-(1-phenyl-1H-pyrazol-3-yl)phenyl)butane (49)

A solution of (48) (1.46 g, 2.96 mmol) in EtOAc (100 ml) was poured onto palladium on carbon, 10%, dry (0.141 g, 0.132 mmol) and hydrogenated at 50 psi. Filtration through Celite and solvent evaporation followed by column chromatography yielded a white, crystaline solid, 1.07 g (73%).

Representative Metalation Procedure:

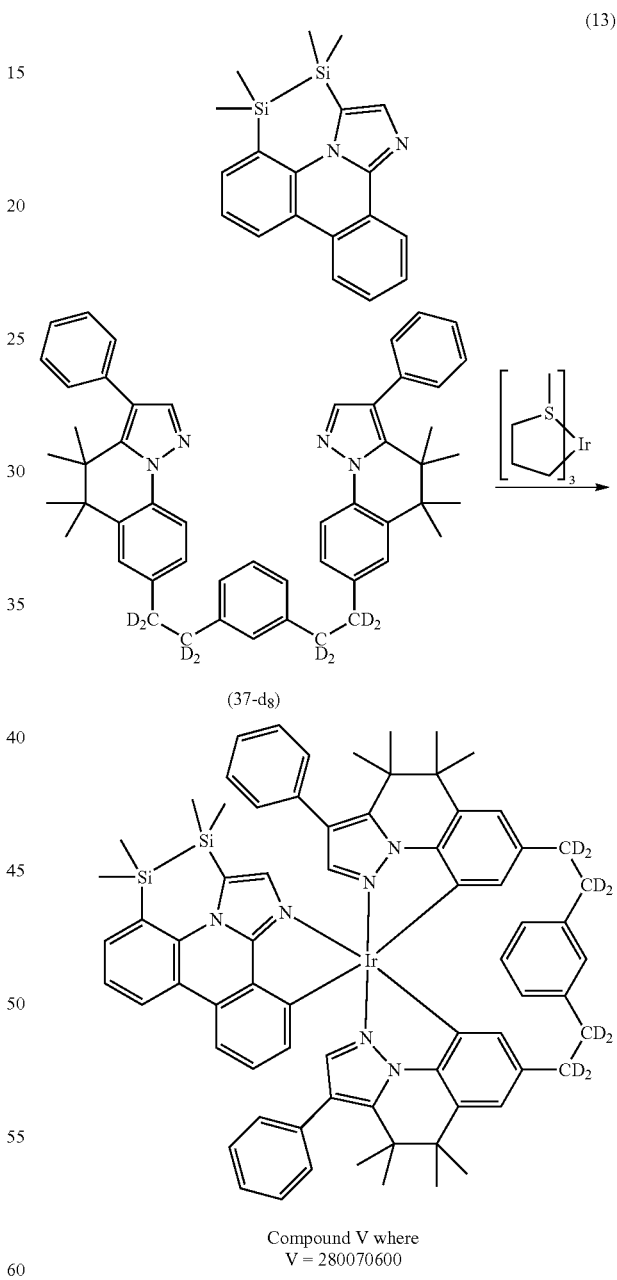

Compound V where
V = 280070600

(13) (0.054 g, 0.163 mmol) and (37-d$_8$) (0.081 g, 0.109 mmol), and tris-[(3-methylthio)propyl]iridium(III) (0.050 g, 0.109 mmol) were heated to reflux in 1,2-dichlorobenzene (1 ml) in the presence of HOTf for 16 hours. Purification of the crude reaction mixture yielded Complex Ir(L$_{103}$)(L$_{146}$-L$_{146}$-Link$_4$) (v=280070600) as a pale yellow solid, 37 mg (27%).

TABLE 1

Physical properties of compounds V and W:

| Compound Formula | Compound Number | $\lambda_{max}$ (nm, 77K)[a] | $\lambda_{max}$ (nm, RT)[a] | CIEx | CIEy | PLQY (%, PMMA) |
|---|---|---|---|---|---|---|
| $Ir(L_9)(L_{372}-L_{372}-Link_9)$ | V = 744070560 | 450 | 456 | 0.171 | 0.269 | 48 |
| $Ir(L_9)(L_{133}-L_{133}-Link_3)$ | V = 192992725 |  | 454 | 0.165 | 0.252 | 44 |
| $Ir(L_9)(L_{146}-L_{146}-Link_3)$ | V = 195302942 | 450 | 455 | 0.161 | 0.235 | 73 |
| $Ir(L_7)(L_{133}-L_{133}-Link_3)$ | V = 19299272 | 445 | 450 | 0.167 | 0.214 | 16 |
| $Ir(L_9)(L_{142}-L_{142}-Link_3)$ | V = 194592106 | 449 | 455 | 0.165 | 0.253 | 70 |
| $Ir(L_9)(L_{142}-L_{142}-Link_4)$ | V = 279359670 | 449 | 455 | 0.165 | 0.253 | 70 |
| $Ir(L_9)(L_{146}-L_{146}-Link_4)$ | V = 280070506 | 450 | 455 | 0.161 | 0.235 | 73 |
| $Ir(L_1-L_1-L_1-Link_{22})$ | W = 2293522393 | 456 | 460 | 0.165 | 0.222 | 56 |
| $Ir(L_{146})(L_{442}-L_{442}-Link_9)$ | V = 756510327 | 454 | 460 | 0.164 | 0.262 | 83 |
| $Ir(L_3-L_3-L_3-Link_{22})$ | W = 2293980319 | 459 | 464 | 0.177 | 0.274 | 44 |
| $Ir(L_9)(L_{150}-L_{150}-Link_3)$ | V = 196013778 | 450 | 458 | 0.180 | 0.307 | 56 |
| $Ir(L_{146})(L_3-L_3-Link_3)$ | V = 169890692 | 450 | 458 | 0.172 | 0.253 | 47 |
| $Ir(L_3)(L_{150}-L_{150}-Link_3)$ | V = 196013772 | 468 | 486 | 0.192 | 0.331 | 55 |
| $Ir(L_{128})(L_{146}-L_{146}-Link_4)$ | V = 280070625 | 447 | 454 | 0.163 | 0.234 | 59 |
| $Ir(L_{131})(L_{146}-L_{146}-Link_4)$ | V = 280070628 | 449 | 456 |  |  | 83 |
| $Ir(L_{30})(L_{139}-L_{139}-Link_3)$ | V = 194059000 | 449 | 457 | 0.175 | 0.264 | 62 |
| $Ir(L_{146})(L_{146}-L_3-Link_3)$ | V = 169943745 | 447 | 456 | 0.173 | 0.229 | 46 |
| $Ir(L_5)(L_{146}-L_3-Link_3)$ | V = 169943604 | 452 | 458 | 0.166 | 0.244 | 54 |
| $Ir(L_{103})(L_{146}-L_{146}-Link_4)$ | V = 280070600 | 451 | 462 | 0.192 | 0.257 | 67 |
| $Ir(L_{92})(L_{146}-L_8-Link_3)$ | V = 280070589 | 448 | 457 | 0.162 | 0.24 | 68 |
| $Ir(L_{30})(L_{146}-L_8-Link_3)$ | V = 170830319 | 454 | 460 | 0.164 | 0.281 | 80 |
| Comparative Compound 1 | n/a | 448 | 456 | 0.162 | 0.237 | 55 |

[a]$\lambda_{max}$ of emission spectra were measured in 2-Me—THF.

Experimental Device Data:

The OLEDs used in the experiments were grown on a glass substrate pre-coated with an indium-tin-oxide (ITO) layer having a sheet resistance of 15-Ω/sq. Prior to any organic layer deposition or coating, the substrate was degreased with solvents and then treated with an oxygen plasma for 1.5 minutes with 50 W at 100 mTorr and with UV ozone for 5 minutes.

The devices in Table 2 were fabricated in high vacuum (<10-6 Torr) by thermal evaporation. The anode electrode was 750 Å of indium tin oxide (ITO). The example devices had organic layers consisting of, sequentially, from the ITO surface, 100 Å thick Compound 1 (HIL), 250 Å layer of Compound 2 (HTL), 300 Å of Compound 3 doped with the inventive compounds at 15% (EML), 50 Å of Compound 4 (BL), 300 Å of Compound 5 (ETL), an EIL composed of either: 10 Å of Compound 7 or 5 Å of LiF followed by 1,000 Å of Al (Cath). All devices were encapsulated with a glass lid sealed with an epoxy resin in a nitrogen glove box (<1 ppm of H2O and O2,) immediately after fabrication with a moisture getter incorporated inside the package. Doping percentages are in volume percent.

The chemical structures for the compounds employed in the above device structures are provided below:

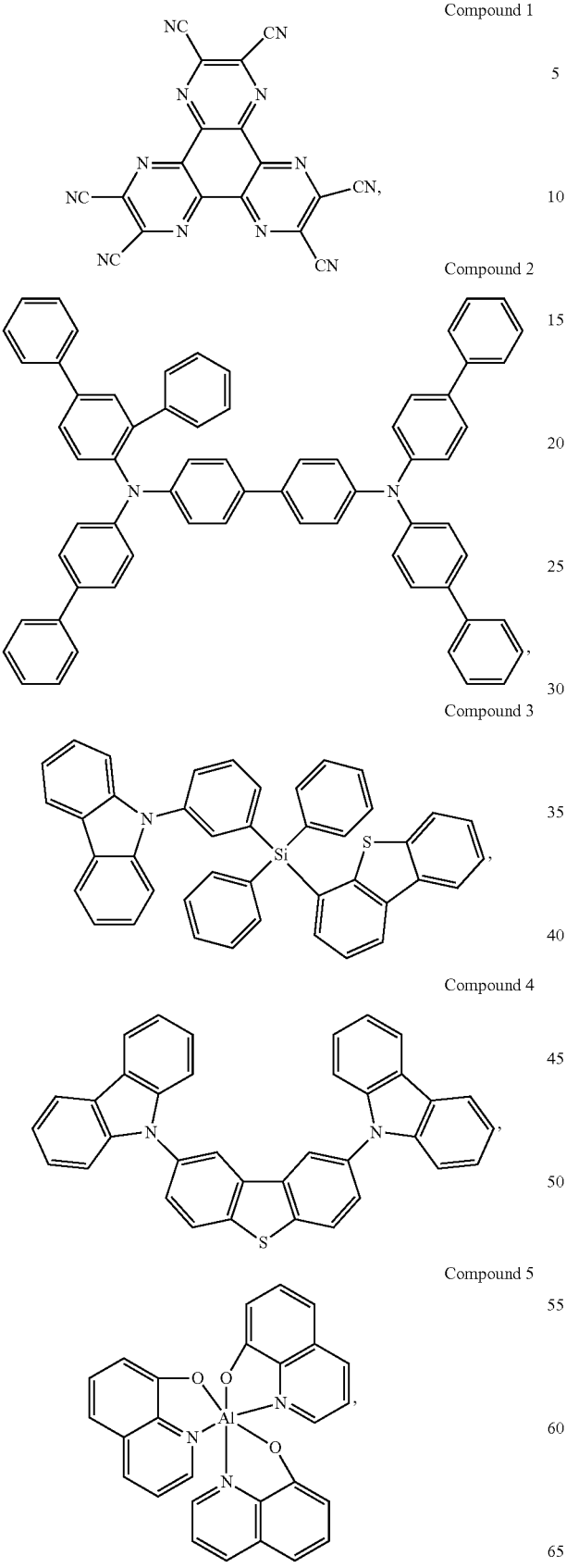
Compound 1
Compound 2
Compound 3
Compound 4
Compound 5
-continued
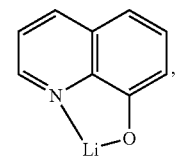
Compound 6
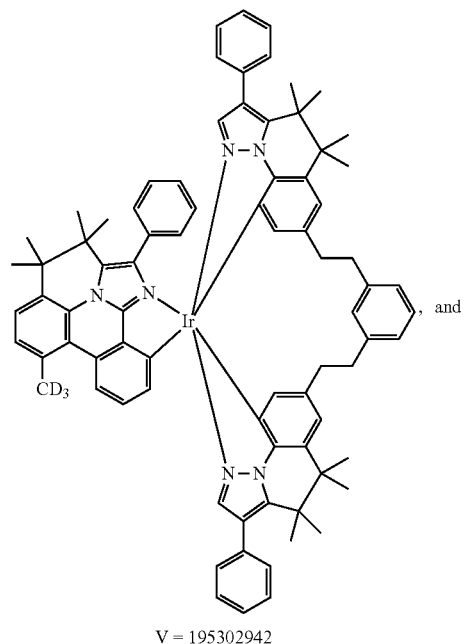
, and
V = 195302942
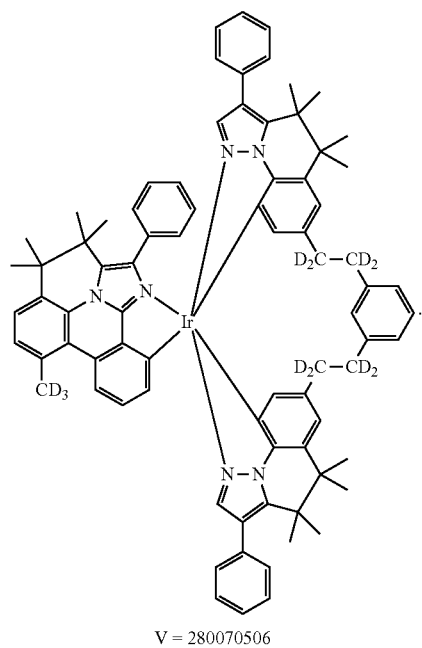
V = 280070506

TABLE 2

| Device | Device Structure | | | | | | | | | | | |
|---|---|---|---|---|---|---|---|---|---|---|---|---|
| | HIL | HTL | EML 300 Å | | | BL | ETL | | 1931 CIE | | λ max | FWHM |
| | 100 Å | 250 Å | Host | Emitter | [%] | 50 Å | 300 Å | EIL | x | y | [nm] | [nm] |
| Device 1 | Cmp 1 | Cmp 2 | Cmp 3 | Comparative Compound 1 | 15 | Cmp 4 | Cmp5 | LiF 5 Å | 0.148 | 0.212 | 458 | 54 |
| Device 2 | Cmp 1 | Cmp 2 | Cmp 3 | V = 195302942 | 15 | Cmp 4 | Cmp5 | Cmp 6-10 Å | 0.147 | 0.211 | 458 | 53 |
| Device 3 | Cmp 1 | Cmp 2 | Cmp 3 | V = 280070506 | 15 | Cmp 4 | Cmp5 | Cmp 6-10 Å | 0.147 | 0.220 | 458 | 55 |

TABLE 3

Device Results

| Device[a] | at 10 mA/cm$^2$ | | | | at 1K nits |
|---|---|---|---|---|---|
| — | Voltage[b] [V] | LE[b] [cd/A] | EQE[b] [%] | PE[b] [lm/W] | Calc*[b] 80% |
| Device 1 | 1.00 | 1.00 | 1.00 | 1.00 | 1.00 |
| Device 2 | 0.93 | 1.01 | 1.00 | 1.08 | 1.06 |
| Device 3 | 0.97 | 1.10 | 1.10 | 1.14 | 1.42 |

[a]Device structures for this table are listed in Table 2.
[b]All values are reported relative to those for Comparative Compound 1.

The chemical structure of Comparative Compound 1 is provided below:

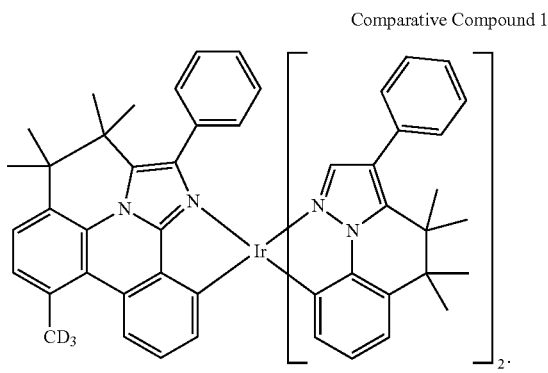

Comparative Compound 1

As the data in Table 1 indicates, a significant variation in both the emission wavelength ($\lambda_{max}$) and photoluminescent quantum yields (PLQY) can be realized through structural variation. Varying the internal strap (A) of the phenanthridineimidazole moiety itself can result in a 7 nm $\lambda_{max}$ shift in room temperature solution (V=280070506 vs. V=280070600). It is hypothesized that this stems from the size of the Si—Si strap compared to the C—C strap, in that the smaller C—C strap reduces the N—Ir interaction, resulting in greater ligand character to the triplet state and thus a higher energy emission, although it is accompanied by a reduction in PLQY.

The difference in PLQY values in Table 1 also speaks directly to the benefits of tethering bidentate moieties together. The most direct comparison can be made between Comparative Compound 1 (PLQY=55%) and V=280070506 (PLQY=73%), in which the introduction of the bottom tether results in a 20% increase without significantly affecting any of the other photophysical properties. Table 1 also demonstrates that in the presence of the same phosphorescent ligand (L$_9$), tethering the supporting ligands via either a top (V=744070560) or bottom (V=192992725) linking moiety can result in similar PLQY values (48% and 44%, respectively). Both of these observations supports the hypothesis that tethering two or more ligands in a tris-bidentate Ir(III) complex together can result in mitigation of thermally-accessible molecular vibration modes that act as non-radiative relaxation pathways in the triplet excited state. There may be many such vibrations in the molecules represented in this patent, but it is clear that tethering through multiple different strap chemistries can result in beneficial photophysical properties.

Yet another benefit of employing high-denticity ligands in the synthesis of the above complexes is the relative ease of purification. The purification of tris-dibendate Comparative Example 1 is very difficult due to the similar chemical properties of the desired material and the byproducts of the metalation reaction. This in turn requires lengthy and inefficient separation techniques that render scaling up of the materials impractical. Upon linking two or three of the bidentate moieties together, however, purification of the resultant reaction mixtures is greatly simplified, as neutral iridium complexes with undesired compositions are largely oligomeric or contain unbound heterocyclic groups, making their removal by standard silica gel chromatography trivial.

The device results in Table 3 also indicate an electroluminescent benefit of employing poly-bidentate ligands in the above structures, in that the complex V=195302942 exhibits a moderate (6%) increase in electroluminescent lifetime compared to the purely bidentate analog Comparative Compound 1. This suggests that—as expected—tethering of at least two of the bidentate moieties together has a measureable effect on the overall stability of the iridium complex as a whole. An increase in electroluminescent lifetime is also observed upon deuteration of the tether utilized in the tetradentate ligand itself (Link 4 vs. Link 3); hence resulting in a 42% increase in lifetime between compounds V=195302942 and V=280070506. This increase is believed to kinetically stabilize the benzylic sites which may be the site of chemical degradation during the repetitive process of electronic excitation. The lifetime increase indicates that the process of benzylic proton or deuteron removal represents a rate-limiting transformation for at least one mode of emitter degradation and can be mitigated through appropriate use of linkers between ligands.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A compound selected from the following structures $G_{nk}$=Ir(Ligand 1)(Ligand 2)(Ligand 3) in the following table, wherein k is an integer having a value of 5 or 7:

| $G_{nk}$ | Ligand 1 | Ligand 2 | Ligand 3 |
|---|---|---|---|
| $G_{n5}$ | $L_{Ai}$, wherein i = an integer from 1 to 6 | $L_{Bp}$, wherein p = an integer from 16 to 26 | $L_{Bp}$, wherein p = an integer from 16 to 26 |
| $G_{n7}$ | $L_{Ai}$, wherein i = an integer from 1 to 6 | $L_{Bp}$, wherein p = an integer from 27 to 41 | $L_{Bp}$, wherein p = an integer from 27 to 41 | wherein the ligands $L_{Ai}$ comprises the following structure:

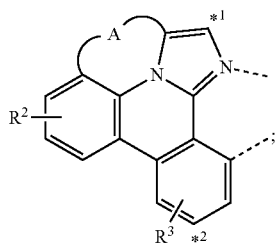

wherein the dashed lines represent bonds to the iridium atom;

wherein A is a linking group selected from the group consisting of:

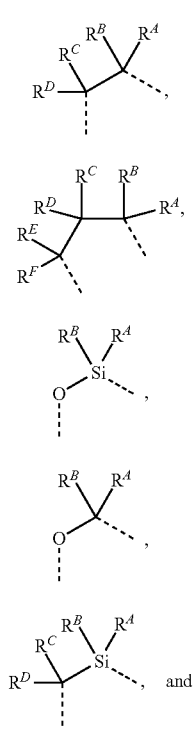

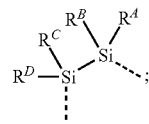

wherein the dashed lines in $A^1$ to $A^6$ indicate the connecting bonds;

wherein each $R^A$ to $R^F$ can be same or different, and are independently selected from the group consisting of hydrogen, deuterium, alkyl, cycloalkyl, aryl, hereroaryl, and combinations thereof; wherein any adjacent $R^A$ to $R^F$ are optionally joined or fused into 5-membered or 6-membered ring;

wherein $L_{Bp}$ is selected from the group consisting of:

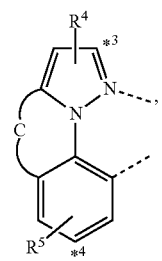

M1

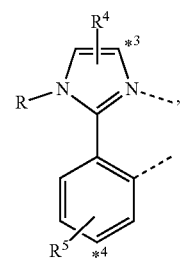

M2

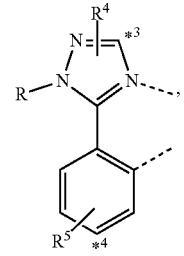

M3

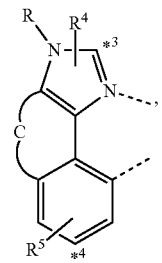

M4

-continued

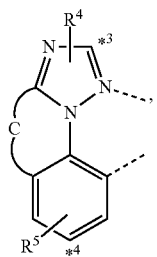
M5

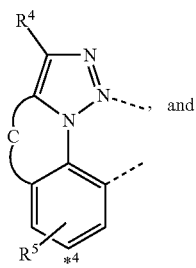
M6, and

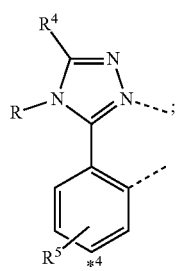
M7;

wherein C is an organic linker selected from the group consisting of:

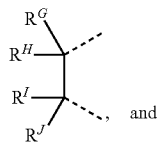
$C_1$ not present,
$C_2$
and
$C_3$

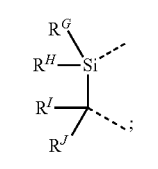

wherein the dashed lines indicate the connecting bonds;
wherein the carbon marked by *$^1$ connects to $R^1$;
wherein the carbon marked by *$^2$ connects to $R^3$;
wherein the carbon marked by *$^3$ connects to $L_1$ or $R^4$;
wherein the carbon marked by *$^4$ connects to $L_2$ or $R^5$;
wherein each of $R^1$, $R^2$, $R^3$, $R^4$, and $R^5$ independently represents mono to a maximum possible number of substitutions, or no substitution;
wherein each of $R^1$, $R^2$, and $R^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;

wherein each of $R^4$, $R^5$, $R^G$, $R^H$, $R^1$, and R is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;

wherein R is selected from the group consisting of methyl, deuterated methyl, isopropyl, substituted phenyl, and substituted dibenzofuran;

wherein the ligands $L_{Ai}$, wherein i is an integer from 1 to 6, are defined as follows:

| $L_{Ai}$ | A | *$^1$ | *$^2$ |
|---|---|---|---|
| $L_{A1}$ | $A^1$ | $R^1$ | $R^3$ |
| $L_{A2}$ | $A^2$ | $R^1$ | $R^3$ |
| $L_{A3}$ | $A^3$ | $R^1$ | $R^3$ |
| $L_{A4}$ | $A^4$ | $R^1$ | $R^3$ |
| $L_{A5}$ | $A^5$ | $R^1$ | $R^3$ |
| $L_{A6}$ | $A^6$ | $R^1$ | $R^3$ |
| $L_{A7}$ | $A^1$ | $L_1$ | $R^3$ |
| $L_{A8}$ | $A^2$ | $L_1$ | $R^3$ |
| $L_{A9}$ | $A^3$ | $L_1$ | $R^3$ |
| $L_{A10}$ | $A^4$ | $L_1$ | $R^3$ |
| $L_{A11}$ | $A^5$ | $L_1$ | $R^3$ |
| $L_{A12}$ | $A^6$ | $L_1$ | $R^3$ |
| $L_{A13}$ | $A^1$ | $R^1$ | $L_2$ |
| $L_{A14}$ | $A^2$ | $R^1$ | $L_2$ |
| $L_{A15}$ | $A^3$ | $R^1$ | $L_2$ |
| $L_{A16}$ | $A^4$ | $R^1$ | $L_2$ |
| $L_{A17}$ | $A^5$ | $R^1$ | $L_2$ |
| $L_{A18}$ | $A^6$ | $R^1$ | $L_2$; | wherein the ligands $L_{Bp}$, wherein p is an integer from 16 to 41, are defined as follows:

| $L_{Bp}$ | m | C | *$^3$ | *$^4$ |
|---|---|---|---|---|
| $L_{B1}$ | 1 | $C_1$ | $R^4$ | $R^5$ |
| $L_{B2}$ | 1 | $C_2$ | $R^4$ | $R^5$ |
| $L_{B3}$ | 1 | $C_3$ | $R^4$ | $R^5$ |
| $L_{B4}$ | 2 | — | $R^4$ | $R^5$ |
| $L_{B5}$ | 3 | — | $R^4$ | $R^5$ |
| $L_{B6}$ | 4 | $C_1$ | $R^4$ | $R^5$ |
| $L_{B7}$ | 4 | $C_2$ | $R^4$ | $R^5$ |
| $L_{B8}$ | 4 | $C_3$ | $R^4$ | $R^5$ |
| $L_{B9}$ | 5 | $C_1$ | $R^4$ | $R^5$ |
| $L_{B10}$ | 5 | $C_2$ | $R^4$ | $R^5$ |
| $L_{B11}$ | 5 | $C_3$ | $R^4$ | $R^5$ |
| $L_{B12}$ | 6 | $C_1$ | — | $R^5$ |
| $L_{B13}$ | 6 | $C_2$ | — | $R^5$ |
| $L_{B14}$ | 6 | $C_3$ | — | $R^5$ |
| $L_{B15}$ | 7 | — | — | $R^5$ |
| $L_{B16}$ | 1 | $C_1$ | $L_1$ | $R^5$ |
| $L_{B17}$ | 1 | $C_2$ | $L_1$ | $R^5$ |
| $L_{B18}$ | 1 | $C_3$ | $L_1$ | $R^5$ |
| $L_{B19}$ | 2 | — | $L_1$ | $R^5$ |
| $L_{B20}$ | 3 | — | $L_1$ | $R^5$ |
| $L_{B21}$ | 4 | $C_1$ | $L_1$ | $R^5$ |
| $L_{B22}$ | 4 | $C_2$ | $L_1$ | $R^5$ |
| $L_{B23}$ | 4 | $C_3$ | $L_1$ | $R^5$ |
| $L_{B24}$ | 5 | $C_1$ | $L_1$ | $R^5$ |
| $L_{B25}$ | 5 | $C_2$ | $L_1$ | $R^5$ |
| $L_{B26}$ | 5 | $C_3$ | $L_1$ | $R^5$ |
| $L_{B27}$ | 1 | $C_1$ | $R^4$ | $L_2$ |
| $L_{B28}$ | 1 | $C_2$ | $R^4$ | $L_2$ |
| $L_{B29}$ | 1 | $C_3$ | $R^4$ | $L_2$ |
| $L_{B30}$ | 2 | — | $R^4$ | $L_2$ |
| $L_{B31}$ | 3 | — | $R^4$ | $L_2$ |

-continued

| $L_{Bp}$ | m | C | *3 | *4 |
|---|---|---|---|---|
| $L_{B32}$ | 4 | $C_1$ | $R^4$ | $L_2$ |
| $L_{B33}$ | 4 | $C_2$ | $R^4$ | $L_2$ |
| $L_{B34}$ | 4 | $C_3$ | $R^4$ | $L_2$ |
| $L_{B35}$ | 5 | $C_1$ | $R^4$ | $L_2$ |
| $L_{B36}$ | 5 | $C_2$ | $R^4$ | $L_2$ |
| $L_{B37}$ | 5 | $C_3$ | $R^4$ | $L_2$ |
| $L_{B38}$ | 6 | $C_1$ | — | $L_2$ |
| $L_{B39}$ | 6 | $C_2$ | — | $L_2$ |
| $L_{B40}$ | 6 | $C_3$ | — | $L_2$ |
| $L_{B41}$ | 7 | — | — | $L_2$. | wherein $L_1$ or $L_2$ have a structure selected from the group consisting of

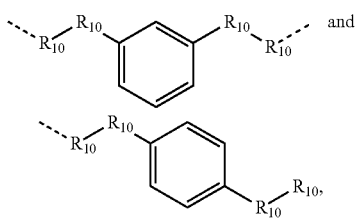

wherein $R_{10}$=$CH_2$ or $CD_2$; and wherein any two substituents may be joined or fused together to form a ring.

2. The compound of claim 1, wherein the compound is a compound V having the formula $Ir(L_x)(L_y\text{-}L_z\text{-Link}_q)$;

wherein in compound V, $L_x$ is a bidentate ligand;

wherein ($L_y$-$L_z$-Link$_q$) is a tetradentate ligand formed by linking bindentate ligand $L_y$ and bidentate ligand $L_z$ with Link$_q$;

wherein V is an integer defined by V=132((191((191 (q−1)+z)−1)+v)−1)+x wherein x is an integer from 1 to 132, y and z are each independently an integer from 133 to 189, 238 to 371, and q is an integer from 3 to 6; and each of $L_x$, $L_y$, and $L_z$ is one of the following structures L1 to L189, L238 to L371:

L1, L2, L3, L4, L5, L6, L7, L8, L9, L10, L11, L12, L13, L14, L15, L16, L17, L18, L19, L20, and L21 having the structure

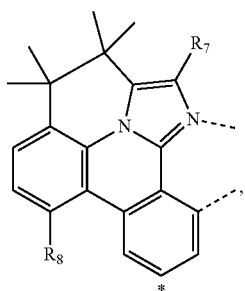

wherein in L1, $R^7$=H, and $R_8$=H, in L2, $R_7$=D, and $R_8$=H, in L3, $R_7$=H, and $R_8$=Me, in L4, $R_7$=D, and $R_8$=Me, in L5, $R_7$=H, and $R_8$=$CD_3$, in L6, $R_7$=D, and $R_8$=$CD_3$, in L7, $R_7$=Ph, and $R_8$=H, in L8, $R_7$=Ph, and $R_8$=Me, in L9, $R_7$=Ph, and $R_8$=$CD_3$, in L10, $R_7$=m-tol, and $R_8$=H, in L11, $R_7$=m-tol, and $R_8$=Me, in L12, $R_7$=m-tol, and $R_8$=$CD_3$, in L13, $R_7$=m-$CD_3C_6H_4$, and $R_6$=H, in L14, $R_7$=m-$CD_3C_6H_4$, and $R_6$=Me, in L15, $R_7$=m-$CD_3C_6H_4$, and $R_8$=$CD_3$, in L16, $R_7$=p-tol, and $R_8$=H, in L17, $R_7$=p-tol, and $R_8$=Me, in L18, $R_7$=p-tol, and $R_8$=$CD_3$, in L19, $R_7$=p-$CD_3C_6H_4$, and $R_8$=H, in L20, $R_7$=p-$CD_3C_6H_4$, and $R_8$=Me, and in L21, $R^7$=p-$CD_3C_6H_4$, and $R_8$=$CD_3$, L22, L23, L24, L25, L26, L27, L28, L29, L30, L31, L32, L33, L34, L35, L36, L37, L38, L39, L40, L41, and L42 having the structure

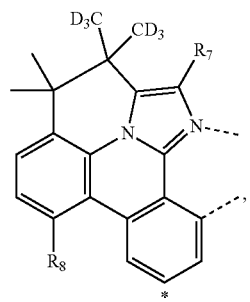

wherein in L22, $R_7$=H, and $R_8$=H, in L23, $R_7$=D, and $R_8$=H, in L24, $R_7$=H, and $R_8$=Me, in L25, $R_7$=D, and $R_8$=Me, in L26, $R_7$=H, and $R_8$=$CD_3$, in L27, $R_7$=D, and $R_8$=$CD_3$, in L28, $R_7$=Ph, and $R_8$=H, in L29, $R_7$=Ph, and $R_8$=Me, in L30, $R_7$=Ph, and $R_8$=$CD_3$, in L31, $R_7$=m-tol, and $R_8$=H, in L32, $R_7$=m-tol, and $R_8$=Me, in L33, $R_7$=m-tol, and $R_8$=$CD_3$, in L34, $R_7$=m-$CD_3C_6H_4$, and $R_8$=H, in L35, $R_7$=m-$CD_3C_6H_4$, and $R_8$=Me, in L36, $R_7$=m-$CD_3C_6H_4$, and $R_8$=$CD_3$, in L37, $R_7$=p-tol, and $R_8$=H, in L38, $R_7$=p-tol, and $R_8$=Me, in L39, $R_7$=p-tol, and $R_8$=$CD_3$, in L40, $R_7$=p-$CD_3C_6H_4$, and $R_8$=H, in L41, $R^7$=p-$CD_3C_6H_4$, and $R_8$=Me, and in L42, $R_7$=p-$CD_3C_6H_4$, and $R_8$=$CD_3$, L43, L44, L45, L46, L47, L48, L49, L50, L51, L52, L53, L54, L55, L56, L57, L58, L59, L60, L61, L62, and L63 having the structure

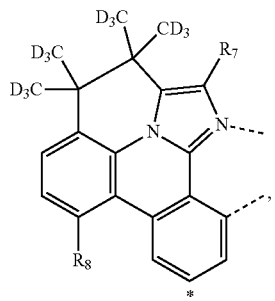

wherein in L43, $R_7$=H, and $R_8$=H, in L44, $R_7$=D, and $R_8$=H, in L45, $R_7$=H, and $R_8$=Me, in L46, $R_7$=D, and $R_8$=Me,
in L47, $R_7$=H, and $R_8$=CD$_3$, in L48, $R_7$=D, and $R_8$=CD$_3$,
in L49, $R_7$=Ph, and $R_8$=H, in L50, $R_7$=Ph, and $R_8$=Me,
in L51, $R_7$=Ph, and $R_8$=CD$_3$, in L52, $R_7$=m-tol, and $R_8$=H,
in L53, $R_7$=m-tol, and $R_8$=Me, in L54, $R_7$=m-tol, and $R_8$=CD$_3$,
in L55, $R_7$=m-CD$_3$C$_6$H$_4$, and $R_8$=H, in L56, $R_7$=m-CD$_3$C$_6$H$_4$, and $R_8$=Me,
in L57, $R_7$=m-CD$_3$C$_6$H$_4$, and $R_8$=CD$_3$, in L58, $R_7$=p-tol, and $R_8$=H,
in L59, $R_7$=p-tol, and $R_8$=Me, in L60, $R_7$=p-tol, and $R_8$=CD$_3$,
in L61, $R_7$=p-CD$_3$C$_6$H$_4$, and $R_8$=H, in L62, $R_7$=p-CD$_3$C$_6$H$_4$, and $R_8$=Me,
and in L63, $R_7$=p-CD$_3$C$_6$H$_4$, and $R_8$=CD$_3$, L64, L65, L66, L67, L68, L69, L70, L71, L72, L73, L74, L75, L76, L77, L78, L79, L80, L81, L82, L83, and L84 having the structure

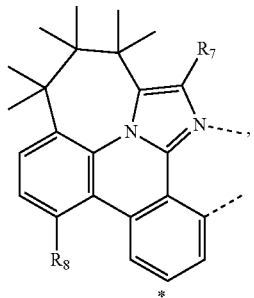

wherein in L64, $R_7$=H, and $R_8$=H, in L65, $R_7$=D, and $R_8$=H,
in L66, $R_7$=H, and $R_8$=Me, in L67, $R_7$=D, and $R_8$=Me,
in L68, $R_7$=H, and $R_8$=CD$_3$, in L69, $R_7$=D, and $R_8$=CD$_3$,
in L70, $R_7$=Ph, and $R_8$=H, in L71, $R_7$=Ph, and $R_8$=Me,
in L72, $R_7$=Ph, and $R_8$=CD$_3$, in L73, $R_7$=m-tol, and $R_8$=H,
in L74, $R_7$=m-tol, and $R_8$=Me, in L75, $R_7$=m-tol, and $R_8$=CD$_3$,
in L76, $R_7$=m-CD$_3$C$_6$H$_4$, and $R_8$=H, in L77, $R_7$=m-CD$_3$C$_6$H$_4$, and $R_8$=Me,
in L78, $R_7$=m-CD$_3$C$_6$H$_4$, and $R_8$=CD$_3$, in L79, $R_7$=p-tol, and $R_8$=H,
in L80, $R_7$=p-tol, and $R_8$=Me, in L81, $R^7$=p-tol, and $R_8$=CD$_3$,
in L82, $R_7$=p-CD$_3$C$_6$H$_4$, and $R_8$=H, in L83, $R_7$=p-CD$_3$C$_6$H$_4$, and $R_8$=Me,
and in L84, $R_7$=p-CD$_3$C$_6$H$_4$, and $R_8$=CD$_3$, L85, L86, L87, L88, L89, L90, L91, L92, L93, L94, L95, L96, L97, L98, L99, L100, L101, and L102 having the structure

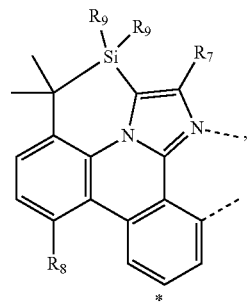

wherein in L85, $R_7$=H, $R_8$=H, and $R_9$=Me, in L86, $R_7$=H, $R_8$=Me, and $R_9$=Me,
in L87, $R_7$=H, $R_8$=CD$_3$, and $R_9$=Me, in L88, $R_7$=Ph, $R_8$=H, and $R_9$=Me,
in L89, $R_7$=Ph, $R_8$=Me, and $R_9$=Me, in L90, $R_7$=Ph, $R_8$=CD$_3$, and $R_9$=Me,
in L91, $R_7$=H, $R_8$=H, and $R_9$=$^i$Pr, in L92, $R_7$=H, $R_8$=Me, and $R_9$=$^i$Pr,
in L93, $R_7$=H, $R_8$=CD$_3$, and $R_9$=$^i$Pr, in L94, $R_7$=Ph, $R_8$=H, and $R_9$=$^i$Pr,
in L95, $R_7$=Ph, $R_8$=Me, and $R_9$=$^i$Pr, in L96, $R_7$=Ph, $R_8$=CD$_3$, and $R_9$=$^i$Pr,
in L97, $R_7$=H, $R_8$=H, and $R_9$=Ph, in L98, $R_7$=H, $R_8$=Me, and $R_9$=Ph,
in L99, $R_7$=H, $R_8$=CD$_3$, and $R_9$=Ph, in L100, $R_7$=Ph, $R_8$=H, and $R_9$=Ph,
in L101, $R_7$=Ph, $R_8$=Me, and $R_9$=Ph, and in L102, $R_7$=Ph, $R_8$=CD$_3$, and $R_9$=Ph, L103, L104, L105, L106, L107, and L108 having the structure

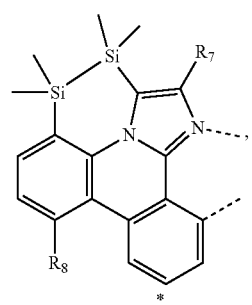

wherein in L103, $R_7$=H, and $R_8$=H, in L104, $R_7$=H, and $R_8$=Me,
in L105, $R_7$=H, and $R_8$=CD$_3$, in L106, $R_7$=Ph, and $R_8$=H,
in L107, $R_7$=Ph, and $R_8$=Me, and in L108, $R_7$=Ph, and $R_8$=CD$_3$, L109, L110, L111, L112, L113, L114, L115, L116, L117, L118, L119, L120, L121, L122, L123, L124, L125, and L126 having the structure

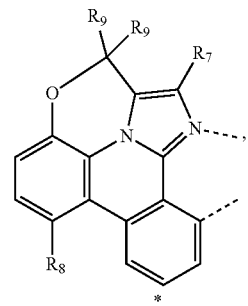

wherein in L109, $R_7$=H, $R_8$=H, and $R_9$=Me, in L110, $R_7$=H, $R_8$=Me, and $R_9$=Me,
in L111, $R_7$=H, $R_8$=CD$_3$, and $R_9$=Me, in L112, $R_7$=Ph, $R_8$=H, and $R_9$=Me,
in L113, $R_7$=Ph, $R_8$=Me, and $R_9$=Me, in L114, $R_7$=Ph, $R_8$=CD$_3$, and $R_9$=Me,
in L115, $R_7$=H, $R_8$=H, and $R_9$=CD$_3$, in L116, $R_7$=H, $R_8$=Me, and $R_9$=CD$_3$,
in L117, $R_7$=H, $R_8$=CD$_3$, and $R_9$=CD$_3$, in L118, $R_7$=Ph, $R_8$=H, and $R_9$=CD$_3$, in L119, $R_7$=Ph, $R_8$=Me, and $R_9$=CD$_3$, in L120, $R_7$=Ph, $R_8$=CD$_3$, and $R_9$=CD$_3$,
in L121, $R_7$=H, $R_8$=H, and $R_9$=Ph, in L122, $R_7$=H, $R_8$=Me, and $R_9$=Ph,
in L123, $R_7$=H, $R_8$=CD$_3$, and $R_9$=Ph, in L124, $R_7$=Ph, $R_8$=H, and $R_9$=Ph,
in L125, $R_7$=Ph, $R_8$=Me, and $R_9$=Ph, and in L126, $R_7$=Ph, $R_8$=CD$_3$, and $R_9$=Ph,
L127, L128, L129, L130, L131, and L132 having the structure

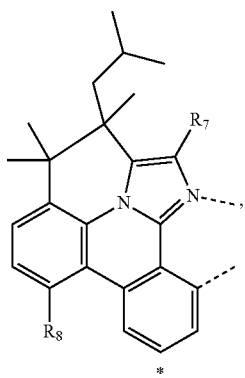

wherein in L127, $R_7$=H, and $R_8$=H, in L128, $R_7$=H, and $R_8$=Me,
in L129, $R_7$=H, and $R_8$=CD$_3$, in L130, $R_7$=Ph, and $R_8$=H,
in L131, $R_7$=Ph, and $R_8$=Me, and in L132, $R_7$=Ph, and $R_8$=CD$_3$,
L133, L134, L135, L136, L137, L138, L139, L140, L141, L142, L143, and L144 having the structure

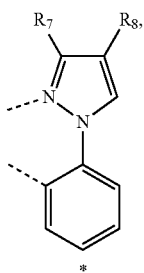

wherein in L133, $R_7$=H, and $R_8$=H, in L134, $R_7$=H, and $R_8$=Ph,
in L135, $R_7$=H, and $R_8$=2,6-Me$_2$-C$_6$H$_3$, in L136, $R_7$=H, and $R_8$=2,6-(CD$_3$)$_2$-C$_6$H$_3$,
in L137, $R_7$=H, and $R_8$=2,6-($^i$Bu)$_2$-C$_6$H$_3$, in L138, $R_7$=Ph, and $R_8$=H,
in L139, $R_7$=3,5-Me$_2$-C$_6$H$_3$, and $R_8$=H, and in L140, $R_7$=3,5-(CD$_3$)$_2$-C$_6$H$_3$, and $R_8$=H,
in L141, $R_7$=3,5-Me$_2$-C$_6$H$_3$, and $R_8$=Ph, and in L142, $R_7$=3,5-(CD$_3$)$_2$-C$_6$H$_3$, and $R_8$=Ph,
in L143, $R_y$=3,5-Me$_2$-C$_6$H$_3$, and $R_8$=2,6-Me$_2$-C$_6$H$_3$,
and in L144, $R_7$=3,5-(CD$_3$)$_2$-C$_6$H$_3$, and $R_8$=2,6-(CD$_3$)$_2$-C$_6$H$_3$, L145, L146, L147, L148, L149, L150, L151, L152, and L153 having the structure

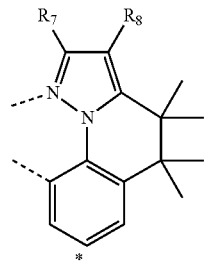

wherein in L145, $R_7$=H, and $R_8$=H, in L146, $R_7$=H, and $R_8$=Ph,
in L147, $R_7$=H, and $R_8$=2,6-Me$_2$-C$_6$H$_3$, in L148, $R_7$=H, and $R_8$=2,6-(CD$_3$)$_2$-C$_6$H$_3$,
in L149, $R_7$=Ph, and $R_8$=H, in L150, $R_7$=3,5-Me$_2$-C$_6$H$_3$, and $R_8$=H,
in L151, $R_7$=3,5-(CD$_3$)$_2$-C$_6$H$_3$, and $R_8$=H, and in L152, $R_7$=3,5-Me$_2$-C$_6$H$_3$, and $R_8$=Ph,
and in L153, $R_7$=3,5-(CD$_3$)$_2$-C$_6$H$_3$, and $R_8$=Ph,
L154, L155, L156, L157, L158, L159, L160, L161, and L162 having the structure

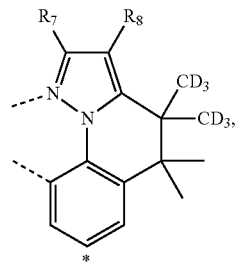

wherein in L154, $R_7$=H, and $R_8$=H, in L155, $R_7$=H, and $R_8$=Ph,
in L156, $R_7$=H, and $R_8$=2,6-Me$_2$-C$_6$H$_3$, in L157, $R_7$=H, and $R_8$=2,6-(CD$_3$)$_2$-C$_6$H$_3$,
in L158, $R_7$=Ph, and $R_8$=H, in L159, $R_7$=3,5-Me$_2$-C$_6$H$_3$, and $R_8$=H,
in L160, $R_7$=3,5-(CD$_3$)$_2$-C$_6$H$_3$, and $R_8$=H, and in L161, $R_7$=3,5-Me$_2$-C$_6$H$_3$, and $R_8$=Ph,
and in L162, $R_7$=3,5-(CD$_3$)$_2$-C$_6$H$_3$, and $R_8$=Ph,
L163, L164, L165, L166, L167, L168, L169, L170, and L171 having the structure

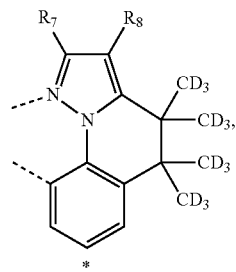

wherein in L163, $R_7$=H, and $R_8$=H, in L164, $R_7$=H, and $R_8$=Ph, in L165, R$_7$=H, and R$_8$=2,6-Me$_2$-C$_6$H$_3$, in L166, R$_7$=H, and R$_8$=2,6-(CD$_3$)$_2$-C$_6$H$_3$,
in L167, R$_7$=Ph, and R$_8$=H, in L168, R$_7$=3,5-Me$_2$-C$_6$H$_3$, and R$_8$=H,
in L169, R$_7$=3,5-(CD$_3$)$_2$-C$_6$H$_3$, and R$_8$=H, and in L170, R$_7$=3,5-Me$_2$-C$_6$H$_3$, and R$_8$=Ph,
and in L171, R$_7$=3,5-(CD$_3$)$_2$-C$_6$H$_3$, and R$_8$=Ph,
L172, L173, L174, L175, L176, L177, L178, L179, and L180 having the structure

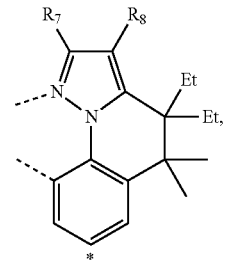

wherein in L172, R$_7$=H, and R$_8$=H, in L173, R$_7$=H, and R$_8$=Ph,
in L174, R$_7$=H, and R$_8$=2,6-Me$_2$-C$_6$H$_3$, in L175, R$_7$=H, and R$_s$=2,6-(CD$_3$)$_2$-C$_6$H$_3$,
in L176, R$_7$=Ph, and R$_8$=H, in L177, R$_7$=3,5-Me$_2$-C$_6$H$_3$, and R$_8$=H,
in L178, R$_7$=3,5-(CD$_3$)$_2$-C$_6$H$_3$, and R$_8$=H, and in L179, R$_7$=3,5-Me$_2$-C$_6$H$_3$, and R$_8$=Ph,
and in L180, R$_7$=3,5-(CD$_3$)$_2$-C$_6$H$_3$, and R$_8$=Ph,
L181, L182, L183, L184, L185, L186, L187, L188, and L189 having the structure

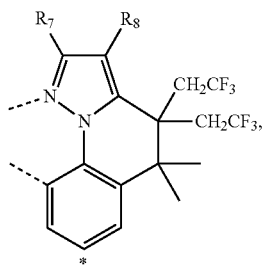

wherein in L181, R$_7$=H, and R$_8$=H, in L182, R$_7$=H, and R$_8$=Ph,
in L183, R$_7$=H, and R$_8$=2,6-Me$_2$-C$_6$H$_3$, in L184, R$_7$=H, and R$_8$=2,6-(CD$_3$)$_2$-C$_6$H$_3$,
in L185, R$_7$=Ph, and R$_8$=H, in L186, R$_7$=3,5-Me$_2$-C$_6$H$_3$, and R$_8$=H,
in L187, R$_7$=3,5-(CD$_3$)$_2$-C$_6$H$_3$, and R$_8$=H, and in L188, R$_7$=3,5-Me$_2$-C$_6$H$_3$, and R$_8$=Ph,
and in L189, R$_7$=3,5-(CD$_3$)$_2$-C$_6$H$_3$, and R$_8$=Ph,
L238, L239, L240, and L241 having the structure

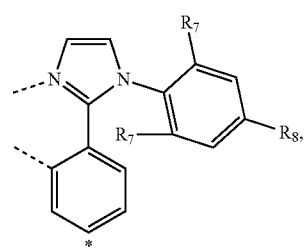

wherein in L238, R$_7$=Me, and R$_8$=H, in L239, R$_7$=$^i$Pr, and R$_8$=H,
in L240, R$_7$=Me, and R$_8$=Ph, and in L241, R$_7$=$^i$Pr, and R$_8$=Ph,
L242, and L243 having the structure

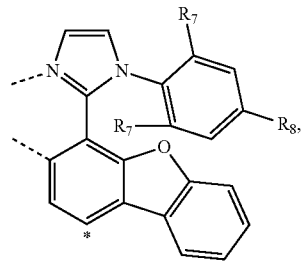

wherein in L242, R$_7$=Me, and R$_8$=H, and in L243, R$_7$=Me, and R$_8$=Ph,
L244, and L245 having the structure

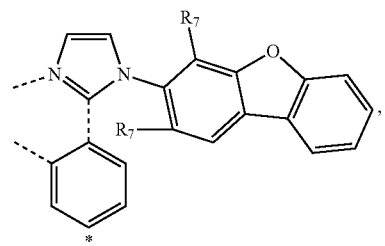

wherein in L244, R$_7$=Me, and in L245, R$_7$=$^i$Pr,
L246 having the structure

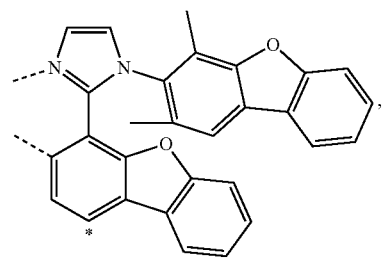

L247, L248, L249, and L250 having the structure

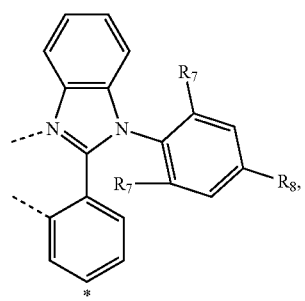

wherein in L247, R$_7$=Me, and R$_8$=H, in L248, R$_7$=$^i$Pr, and R$_8$=H,
in L249, R$_7$=Me, and R$_8$=Ph, and in L250, R$_7$=$^i$Pr, and R$_8$=Ph, L250, and L251 having the structure

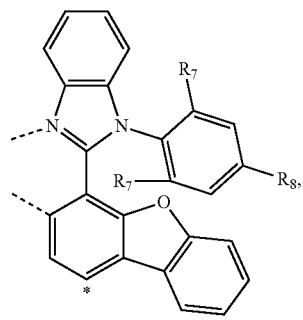

wherein in L250, R$_7$=Me, and R$_8$=H, and in L251, R$_7$=Me, and R$_8$=Ph,

L252, and L253 having the structure

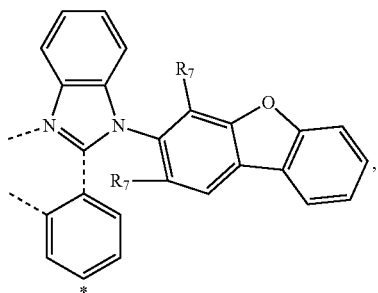

wherein in L252, R$_7$=Me, and in L253, R$_7$=Pr,

L255 having the structure

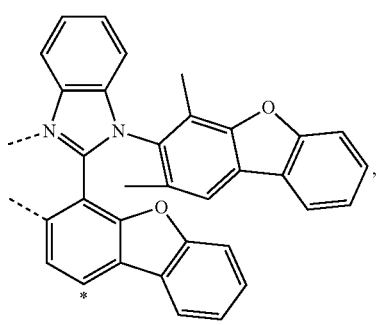

L256, L257, L258, L259, L260, L261, L262, L263, L264, L265, L266, L267, and L268 having the structure

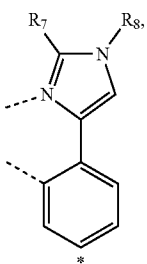

wherein in L256, R$_7$=H, and R$_8$=Me, in L257, R$_7$=H, and R$_8$=CD$_3$, in L258, R$_7$=H, and R$_8$=$^i$Pr, in L259, R$_7$=H, and R$_8$=2,6-Me$_2$-C$_6$H$_3$, in L260, R$_7$=H, and R$_8$=2,6-$^i$Pr$_2$-C$_6$H$_3$, in L261, R$_7$=Me, and R$_8$=2,6-Me$_2$-C$_6$H$_3$, in L262, R$_7$=Me, and R$_8$=2,6-$^i$Pr$_2$-C$_6$H$_3$, in L263, R$_7$=CD$_3$, and R$_8$=2,6-Me$_2$-C$_6$H$_3$, in L264, R$_7$=CD$_3$, and R$_8$=2,6-$^i$Pr$_2$-C$_6$H$_3$, in L265, R$_7$=Ph, and R$_8$=2,6-Me$_2$-C$_6$H$_3$, in L266, R$_7$=Ph, and R$_8$=2,6-$^i$Pr$_2$-C$_6$H$_3$, in L267, R$_7$=3,5-Me$_2$-C$_6$H$_3$, and R$_8$=2,6-Me$_2$-C$_6$H$_3$, and in L268, R$_7$=3,5-Me$_2$-C$_6$H$_3$, and R$_8$=2,6-$^i$Pr$_2$-C$_6$H$_3$, L269, L270, L271, L272, L273, L274, L275, L276, L277, L278, L279, L280, and L281 having the structure

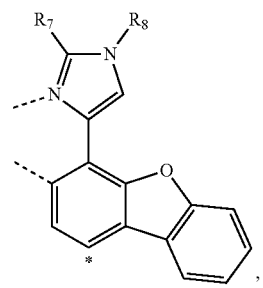

wherein in L269, R$_7$=H, and R$_8$=Me, in L270, R$_7$=H, and R$_8$=CD$_3$, in L271, R$_7$=H, and R$_8$=$^i$Pr, in L272, R$_7$=H, and R$_8$=2,6-Me$_2$-C$_6$H$_3$, in L273, R$_7$=H, and R$_8$=2,6-$^i$Pr$_2$-C$_6$H$_3$, in L274, R$_7$=Me, and R$_8$=2,6-Me$_2$-C$_6$H$_3$, in L275, R$_7$=Me, and R$_8$=2,6-$^i$Pr$_2$-C$_6$H$_3$, in L276, R$_7$=CD$_3$, and R$_8$=2,6-Me$_2$-C$_6$H$_3$, in L277, R$_7$=CD$_3$, and R$_8$=2,6-$^i$Pr$_2$-C$_6$H$_3$, in L278, R$_7$=Ph, and R$_8$=2,6-Me$_2$-C$_6$H$_3$, in L279, R$_7$=Ph, and R$_8$=2,6-$^i$Pr$_2$-C$_6$H$_3$, in L280, R$_7$=3,5-Me$_2$-C$_6$H$_3$, and R$_8$=2,6-Me$_2$-C$_6$H$_3$, and in L281, R$_7$=3,5-Me$_2$-C$_6$H$_3$, and R$_8$=2,6-$^i$Pr$_2$-C$_6$H$_3$, L282, L283, L284, and L285 having the structure

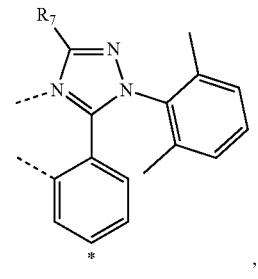

wherein in L282, R$_7$=H, in L283, R$_7$=Me, in L284, R$_7$=CD$_3$, and in L285, R$_7$=3,5-Me$_2$-C$_6$H$_3$, L286, L287, L288, and L289 having the structure

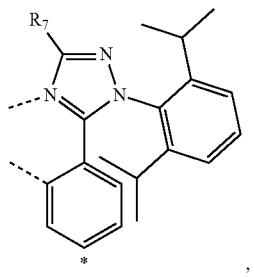

wherein in L286, R$_7$=H, in L287, R$_7$=Me,
in L288, R$_7$=CD$_3$, and in L289, R$_7$=3,5-Me$_2$-C$_6$H$_3$,
L290, L291, L292, and L293 having the structure

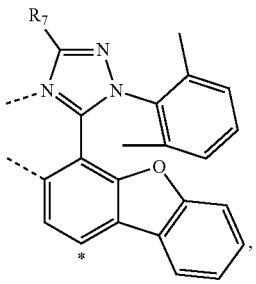

wherein in L290, R$_7$=H, in L291, R$_7$=Me,
in L292, R$_7$=CD$_3$, and in L293, R$_7$=3,5-Me$_2$-C$_6$H$_3$,
L294, L295, L296, and L297 having the structure

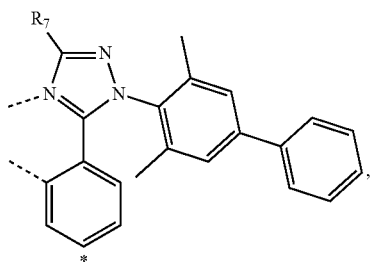

wherein in L294, R$_7$=H, in L295, R$_7$=Me,
in L296, R$_7$=CD$_3$, and in L297, R$_7$=3,5-Me$_2$-C$_6$H$_3$,
L298, L299, L300, and L301 having the structure

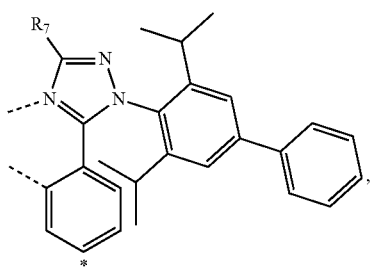

wherein in L298, R$_7$=H, in L299, R$_7$=Me,
in L300, R$_7$=CD$_3$, and in L301, R$_7$=3,5-Me$_2$-C$_6$H$_3$, L302, L303, L304, and L305 having the structure

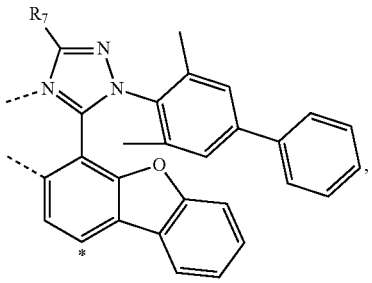

wherein in L302, R$_7$=H, in L303, R$_7$=Me,
in L304, R$_7$=CD$_3$, and in L305, R$_7$=3,5-Me$_2$-C$_6$H$_3$,
L306, L307, L308, and L309 having the structure

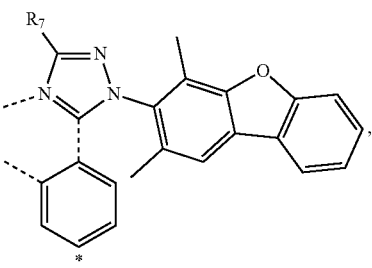

wherein in L306, R$_7$=H, in L307, R$_7$=Me,
in L308, R$_7$=CD$_3$, and in L309, R$_7$=3,5-Me$_2$-C$_6$H$_3$,
L310, L311, L312, and L313 having the structure

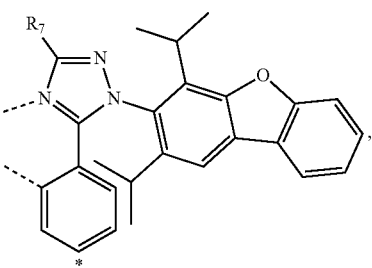

wherein in L310, R$_7$=H, in L311, R$_7$=Me,
in L312, R$_7$=CD$_3$, and in L313, R$_7$=3,5-Me$_2$-C$_6$H$_3$,
L314, L315, L316, and L317 having the structure

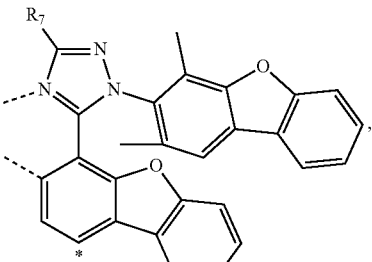

wherein in L314, R$_7$=H, in L315, R$_7$=Me,
in L316, R$_7$=CD$_3$, and in L317, R$_7$=3,5-Me$_2$-C$_6$H$_3$, L318, L319, L320, and L321 having the structure

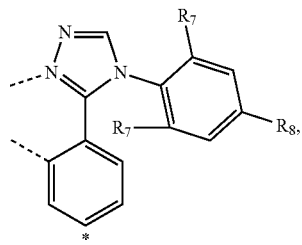

wherein in L318, R$_7$=Me, and R$_8$=H, in L319, R$_7$=$^i$Pr, and R$_8$=H,
in L320, R$_7$=Me, and R$_8$=Ph, and in L321, R$_7$=$^i$Pr, and R$_8$=Ph,
L322, and L323 having the structure

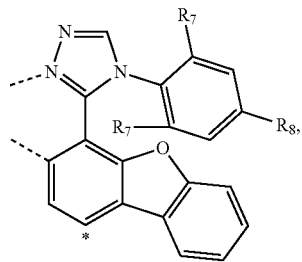

wherein in L322, R$_7$=Me, and R$_8$=H, and in L323, R$_7$=$^i$Pr, and R$_8$=H,
L324, and L325 having the structure

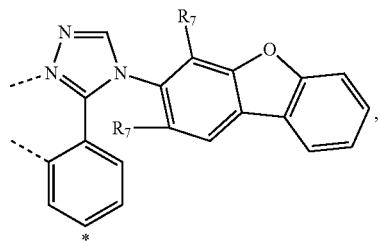

wherein in L324, R$_7$=Me, and in L325, R$_7$=$^i$Pr,
L326 having the structure

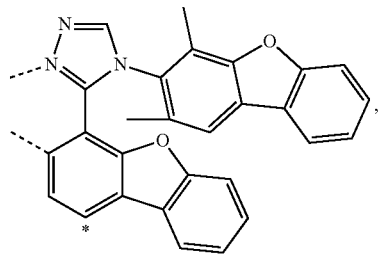

L327, L328, L329, and L330 having the structure

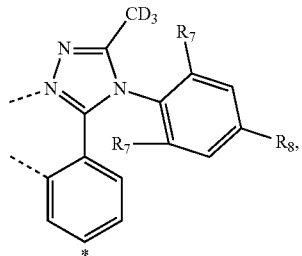

wherein in L327, R$_7$=Me, and R$_8$=H, in L328, R$_7$=$^i$Pr, and R$_8$=H,
in L329, R$_7$=Me, and R$_8$=Ph, and in L330, R$_7$=$^i$Pr, and R$_8$=Ph,
L331, and L332 having the structure

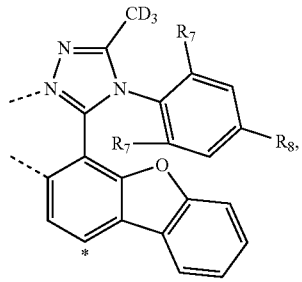

wherein in L331, R$_7$=Me, and R$_8$=H, and in L332, R$_7$=Me, and R$_8$=Ph,
L333, and L334 having the structure

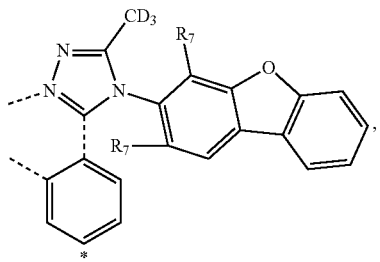

wherein in L333, R$_7$=Me, and in L334, R$_7$=$^i$Pr,
L335 having the structure

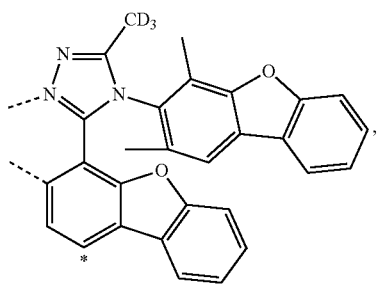

L336, L337, L338, L339, L340, and L341 having the structure

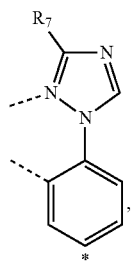

wherein in L336, R$_7$=H, in L337, R$_7$=Me,
in L338, R$_7$=CD$_3$, in L339, R$_7$=Ph,
in L340, R$_7$=3,5-Me$_2$-C$_6$H$_3$, and in L341, R$_7$=3,5-(CD$_3$)$_2$-C$_6$H$_3$ L342, L343, L344, L345, L346, and L347 having the structure

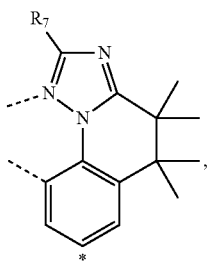

wherein in L342, R$_7$=H, in L343, R$_7$=Me,
in L344, R$_7$=CD$_3$, in L345, R$_7$=Ph,
in L346, R$_7$=3,5-Me$_2$-C$_6$H$_3$, and in L347, R$_7$=3,5-(CD$_3$)$_2$-C$_6$H$_3$ L348, L349, L350, L351, L352, and L353 having the structure

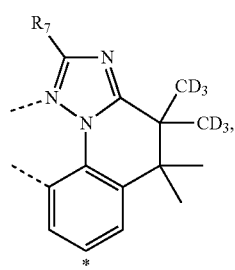

wherein in L348, R$_7$=H, in L349, R$_7$=Me,
in L350, R$_7$=CD$_3$, in L351, R$_7$=Ph,
in L352, R$_7$=3,5-Me$_2$-C$_6$H$_3$, and in L353, R$_7$=3,5-(CD$_3$)$_2$-C$_6$H$_3$ L354, L355, L356, L357, L358, and L359 having the structure

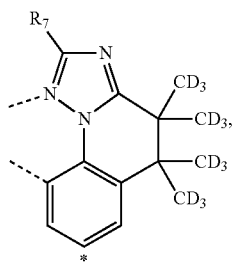

wherein in L354, R$_7$=H, in L355, R$_7$=Me,
in L356, R$_7$=CD$_3$, in L357, R$_7$=Ph,
in L358, R$_7$=3,5-Me$_2$-C$_6$H$_3$, and in L359, R$_7$=3,5-(CD$_3$)$_2$-C$_6$H$_3$ L360, L361, L362, L363, L364, and L365 having the structure

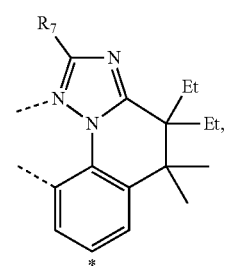

wherein in L360, R$_7$=H, in L361, R$_7$=Me,
in L362, R$_7$=CD$_3$, in L363, R$_7$=Ph,
in L364, R$_7$=3,5-Me$_2$-C$_6$H$_3$, and in L365, R$_7$=3,5-(CD$_3$)$_2$-C$_6$H$_3$ L366, L367, L368, L369, L370, and L371 having the structure

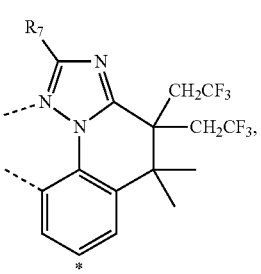

wherein in L366, R$_7$=H, in L367, R$_7$=Me,
in L368, R$_7$=CD$_3$, in L369, R$_7$=Ph,
in L370, R$_7$=3,5-Me$_2$-C$_6$H$_3$, and in L371, R$_7$=3,5-(CD$_3$)$_2$-C$_6$H$_3$,
  wherein the dashed lines indicate bonds to the iridium atom;
  wherein the carbon marked with * connects to an H atom for all L$_x$ structures or connects to Link$_q$ in L$_y$ and L$_z$ structures; and
  wherein in compound V, Link$_q$ is one of the structures Link3 through Link6 defined below:

Link3 and Link4 having the structure

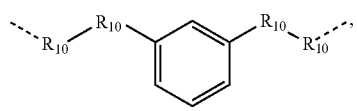

wherein in Link3, $R_{10}$=CH$_2$, and in Link4, $R_{10}$=CD$_2$, Link5 and Link6 having the structure

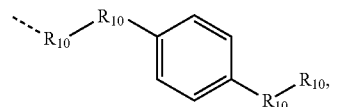

wherein in Link5, $R_{10}$=CH$_2$, and in Link6, $R_{10}$=CD$_2$, wherein the dashed line represents the bonds connecting to the carbon marked by *on $L_y$ and $L_z$.

3. The compound of claim 2, where the compound is selected from the group consisting of: Ir(L$_9$)(L$_{146}$-L$_{146}$-Link$_3$), Ir(L$_9$)(L$_{146}$-L$_{146}$-Link$_4$), Ir(L$_{51}$)(L$_{146}$-L$_{146}$-Link$_3$), Ir(L$_{51}$)(L$_{146}$-L$_{146}$-Link$_4$), Ir(L$_{47}$)(L$_{146}$-L$_{146}$-Link$_3$), Ir(L$_{47}$)(L$_{146}$-L$_{146}$-Link$_4$), Ir(L$_5$)(L$_{146}$-L$_{146}$-Link$_3$), Ir(L$_5$)(L$_{146}$-L$_{146}$-Link$_4$), Ir(L$_1$)(L$_{146}$-L$_{146}$-Link$_3$), Ir(L$_1$)(L$_{146}$-L$_{146}$-Link$_4$), Ir(L$_{43}$)(L$_{146}$-L$_{146}$-Link$_3$), Ir(L$_{43}$)(L$_{146}$-L$_{146}$-Link$_4$), Ir(L$_{117}$)(L$_{146}$-L$_{146}$-Link$_3$), Ir(L$_{117}$)(L$_{146}$-L$_{146}$-Link$_4$), Ir(L$_{120}$)(L$_{146}$-L$_{146}$-Link$_3$), Ir(L$_{120}$)(L$_{146}$-L$_{146}$-Link$_4$), Ir(L$_9$)(L$_9$-L$_{146}$-Link$_3$), Ir(L$_9$)(L$_9$-L$_{146}$-Link$_4$), Ir(L$_{51}$)(L$_{51}$-L$_{146}$-Link$_3$), Ir(L$_{51}$)(L$_{51}$-L$_{146}$-Link$_4$), Ir(L$_{47}$)(L$_{47}$-L$_{146}$-Link$_3$), Ir(L$_{47}$)(L$_{47}$-L$_{146}$-Link$_4$), Ir(L$_5$)(L$_5$-L$_{146}$-Link$_3$), Ir(L$_5$)(L$_5$-L$_{146}$-Link$_4$), Ir(L$_1$)(L$_1$-L$_{146}$-Link$_3$), Ir(L$_1$)(L$_1$-L$_{146}$-Link$_4$), Ir(L$_{43}$)(L$_{43}$-L$_{146}$-Link$_3$), Ir(L$_{43}$)(L$_{43}$-L$_{146}$-Link$_4$), Ir(L$_{117}$)(L$_{117}$-L$_{146}$-Link$_3$), Ir(L$_{117}$)(L$_{117}$-L$_{146}$-Link$_4$), Ir(L$_{120}$)(L$_{120}$-L$_{146}$-Link$_3$), and Ir(L$_{120}$)(L$_{120}$-L$_{146}$-Link$_4$).

4. A formulation comprising the compound of claim 1.

5. An organic light emitting device (OLED) comprising:
an anode;
a cathode; and
an organic layer, disposed between the anode and the cathode, comprising a compound selected from the following structures $G_{nk}$=Ir(Ligand 1)(Ligand 2)(Ligand 3) in the following table, wherein k is an integer having a value of 5 or 7:

| $G_{nk}$ | Ligand 1 | Ligand 2 | Ligand 3 |
|---|---|---|---|
| $G_{n5}$ | $L_{Ai}$, wherein i = an integer from 1 to 6 | $L_{Bp}$, wherein p = an integer from 16 to 26 | $L_{Bp}$, wherein p = an integer from 16 to 26 |
| $G_{n7}$ | $L_{Ai}$, wherein i = an integer from 1 to 6 | $L_{Bp}$, wherein p = an integer from 27 to 41 | $L_{Bp}$, wherein p = an integer from 27 to 41 | wherein the ligands $L_{Ai}$ comprises the following structure:

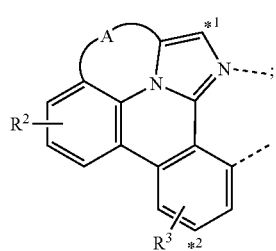

wherein the dashed lines represent bonds to the iridium atom;

wherein A is a linking group selected from the group consisting of:

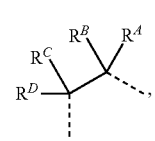

A$^1$

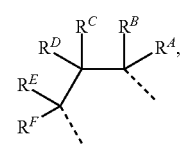

A$^2$

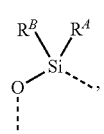

A$^3$

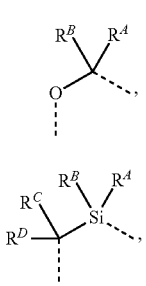

A$^4$

A$^5$ and

A$^6$ wherein the dashed lines in A$^1$ to A$^6$ indicate the connecting bonds;

wherein each R$^A$ to R$^F$ can be same or different, and are independently selected from the group consisting of hydrogen, deuterium, alkyl, cycloalkyl, aryl, heteroaryl, and combinations thereof; wherein any adjacent R$^A$ to R$^F$ are optionally joined or fused into a 5-membered or 6-membered ring;

wherein $L_{Bp}$ is selected from the group consisting of:

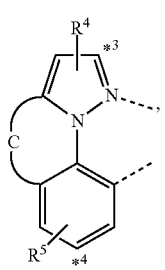

M1

-continued

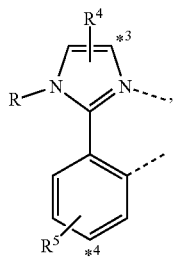
M2

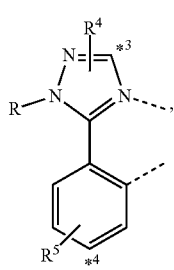
M3

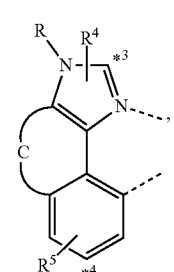
M4

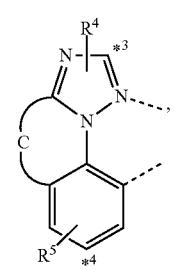
M5

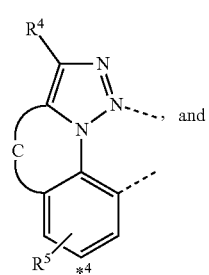
M6

-continued

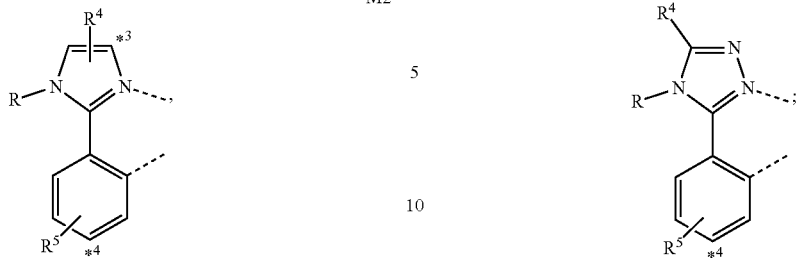
M7 wherein C is an organic linker selected from the group consisting of:

not present, $C_1$

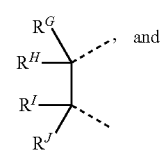 and $C_2$

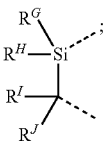 ; $C_3$ wherein the dashed lines indicate the connecting bonds:
wherein the carbon marked by *¹ connects to $R^1$;
wherein the carbon marked by *² connects to $R^3$;
wherein the carbon marked by *³ connects to L1 or $R^4$;
wherein the carbon marked by *⁴ connects to L2 or $R^5$;
wherein each of $R^1$, $R^2$, $R^3$, $R^4$, and $R^5$ independently represents mono to a maximum possible number of substitutions, or no substitution:
wherein each of $R^1$, $R^2$, and $R^3$ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;
wherein each of $R^4$, $R^5$, $R^G$, $R^H$, $R^I$, and $R^J$ is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;
wherein R is selected from the group consisting of methyl, deuterated methyl, isopropyl, substituted phenyl, and substituted dibenzofuran;
wherein the ligands $L_{Ai}$, wherein i is an integer from 1 to 6, are defined as follows:

| $L_{Ai}$ | A | *¹ | *² |
|---|---|---|---|
| $L_{A1}$ | $A^1$ | $R^1$ | $R^3$ |
| $L_{A2}$ | $A^2$ | $R^1$ | $R^3$ |

-continued

| $L_{Ai}$ | A | *1 | *2 |
|---|---|---|---|
| $L_{A43}$ | $A^3$ | $R^1$ | $R^3$ |
| $L_{A44}$ | $A^4$ | $R^1$ | $R^3$ |
| $L_{A45}$ | $A^5$ | $R^1$ | $R^3$ |
| $L_{A46}$ | $A^6$ | $R^1$ | $R^3$ | wherein the ligands $L_{Bp}$, wherein p is an integer from 16 to 41, are defined as follows:

| $L_{Bp}$ | having a structure | C | *3 | *4 |
|---|---|---|---|---|
| $L_{B16}$ | M1 | $C_1$ | $L_1$ | $R^5$ |
| $L_{B17}$ | M1 | $C_2$ | $L_1$ | $R^5$ |
| $L_{B18}$ | M1 | $C_3$ | $L_1$ | $R^5$ |
| $L_{B19}$ | M2 | — | $L_1$ | $R^5$ |
| $L_{B20}$ | M3 | — | $L_1$ | $R^5$ |
| $L_{B21}$ | M4 | $C_1$ | $L_1$ | $R^5$ |
| $L_{B22}$ | M4 | $C_2$ | $L_1$ | $R^5$ |
| $L_{B23}$ | M4 | $C_3$ | $L_1$ | $R^5$ |
| $L_{B24}$ | M5 | $C_1$ | $L_1$ | $R^5$ |
| $L_{B25}$ | M5 | $C_2$ | $L_1$ | $R^5$ |
| $L_{B26}$ | M5 | $C_3$ | $L_1$ | $R^5$ |
| $L_{B27}$ | M1 | $C_1$ | $R^4$ | $L_2$ |
| $L_{B28}$ | M1 | $C_2$ | $R^4$ | $L_2$ |
| $L_{B29}$ | M1 | $C_3$ | $R^4$ | $L_2$ |
| $L_{B30}$ | M2 | — | $R^4$ | $L_2$ |
| $L_{B31}$ | M3 | — | $R^4$ | $L_2$ |
| $L_{B32}$ | M4 | $C_1$ | $R^4$ | $L_2$ |
| $L_{B33}$ | M4 | $C_2$ | $R^4$ | $L_2$ |
| $L_{B34}$ | M4 | $C_3$ | $R^4$ | $L_2$ |
| $L_{B35}$ | M5 | $C_1$ | $R^4$ | $L_2$ |
| $L_{B36}$ | M5 | $C_2$ | $R^4$ | $L_2$ |
| $L_{B37}$ | M5 | $C_3$ | $R^4$ | $L_2$ |
| $L_{B38}$ | M6 | $C_1$ | — | $L_2$ |
| $L_{B39}$ | M6 | $C_2$ | — | $L_2$ |
| $L_{B40}$ | M6 | $C_3$ | — | $L_2$ |
| $L_{B41}$ | M7 | — | — | $L_2$ | wherein L1 or L2 have a structure selected from the group consisting of

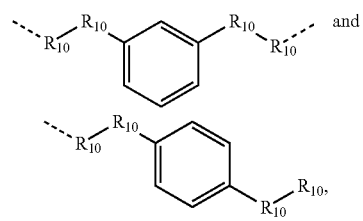

and wherein $R_{10}$=$CH_2$ or $CD_2$, and
wherein any two substituents may be joined or fused together to form a ring.

6. The OLED of claim 5, wherein the organic layer is an emissive layer and the compound is an emissive dopant or a non-emissive dopant.

7. The OLED of claim 5, wherein the organic layer further comprises a host, wherein the host comprises at least one chemical group selected from the group consisting of metal complex, triphenylene, carbazole, dibenzothiophene, dibenzofuran, dibenzoselenophene, azatriphenylene, azacarbazole, aza-dibenzothiophene, aza-dibenzofuran, and aza-dibenzoselenophene.

8. The OLED of claim 5, wherein the organic layer further comprises a host, wherein the host is selected from the group consisting of:

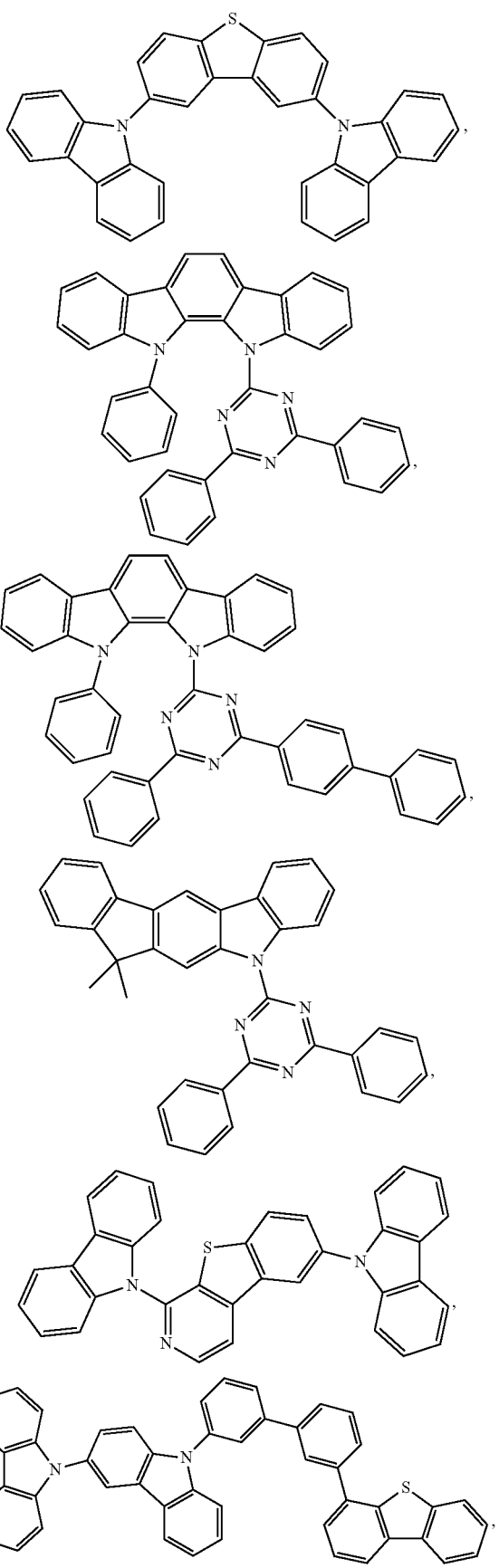

201
-continued
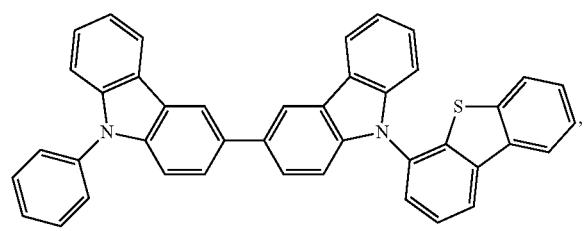
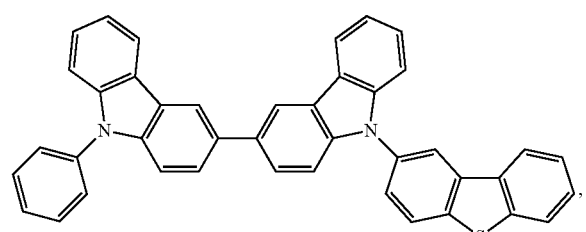
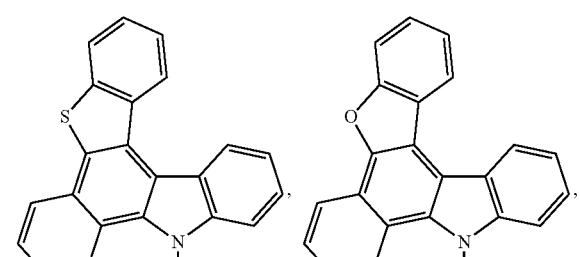
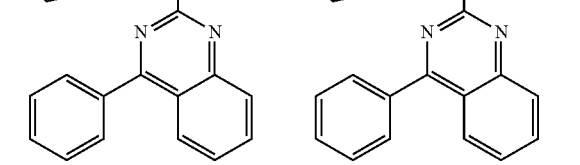
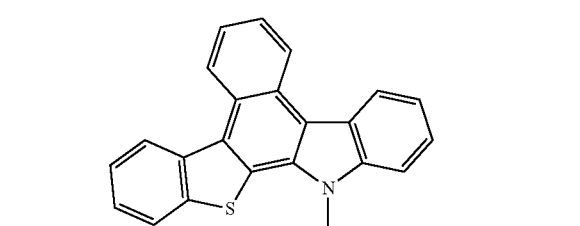
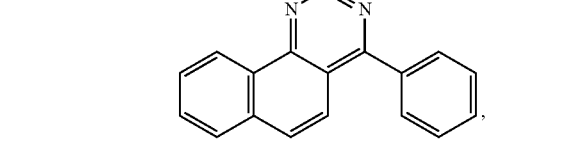
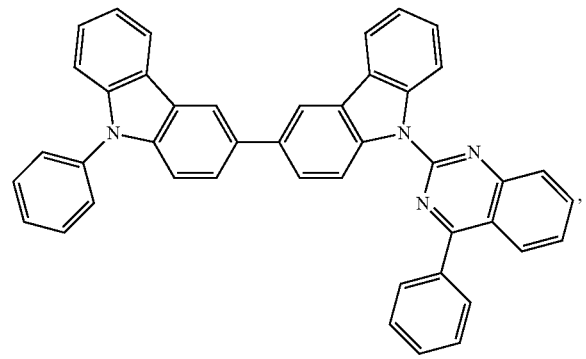
202
-continued
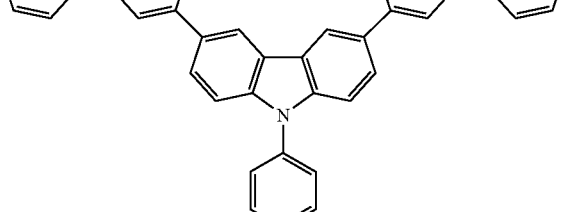
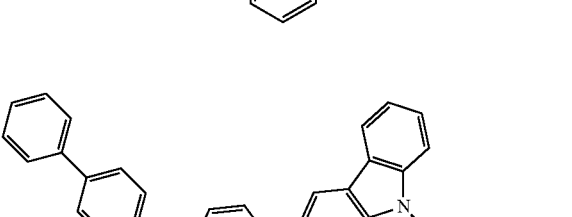
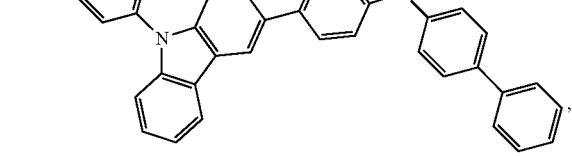
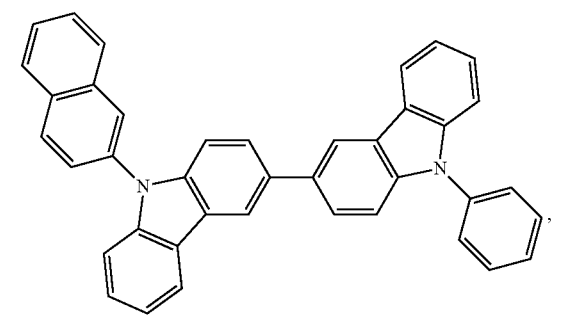
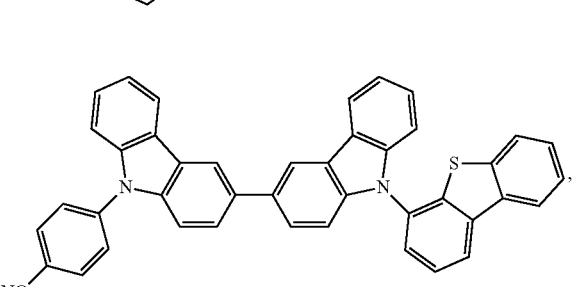
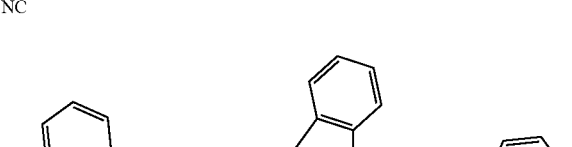
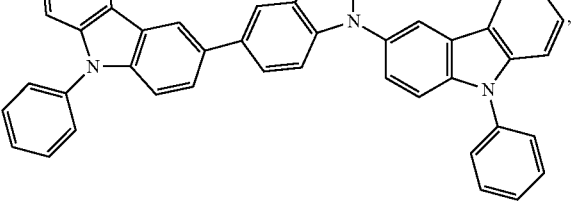

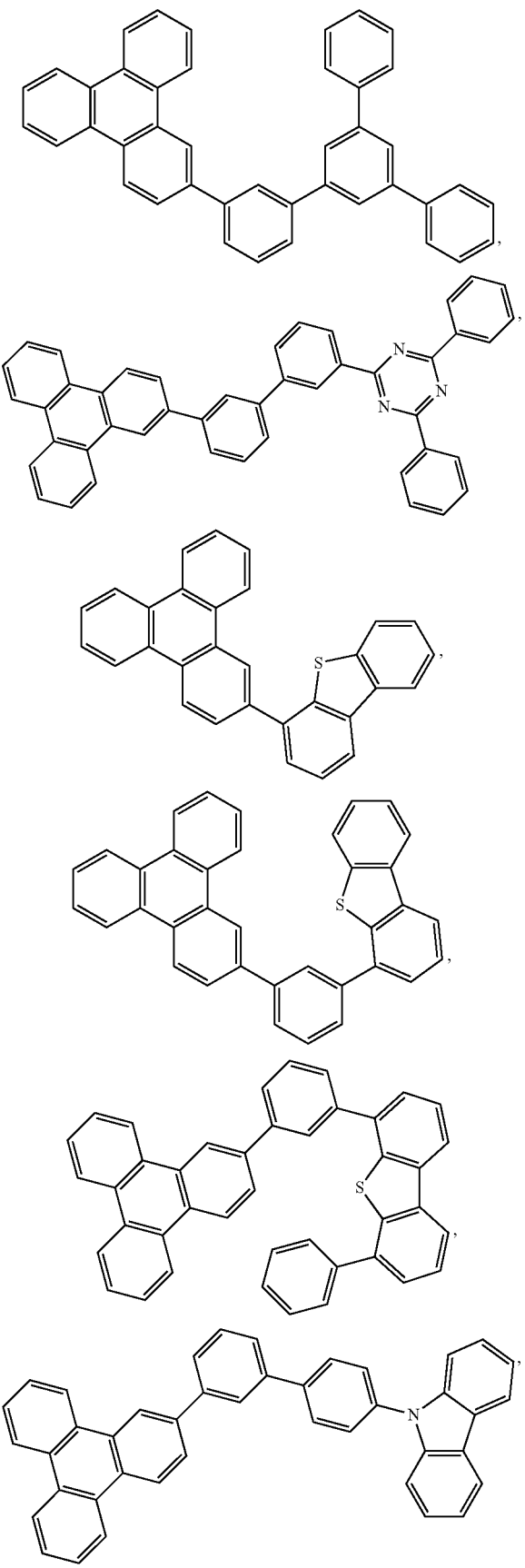

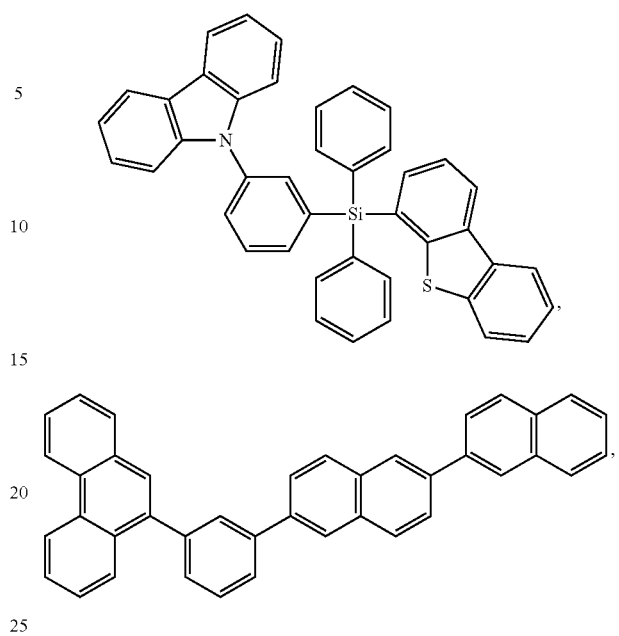

and combinations thereof.

9. A consumer product comprising an organic light-emitting device comprising:

an anode;

a cathode; and an organic layer, disposed between the anode and the cathode, comprising a compound selected from the following structures $G_{nk}$=Ir(Ligand 1)(Ligand 2)(Ligand 3) in the following table, wherein k is an integer having a value of 5 or 7:

| $G_{nk}$ | Ligand 1 | Ligand 2 | Ligand 3 |
|---|---|---|---|
| $G_{n5}$ | $L_{Ai}$, wherein i = an integer from 1 to 6 | $L_{Bp}$, wherein p = an integer from 16 to 26 | $L_{Bp}$, wherein p = an integer from 16 to 26 |
| $G_{n7}$ | $L_{Ai}$, wherein i = an integer from 1 to 6 | $L_{Bp}$, wherein p = an integer from 27 to 41 | $L_{Bp}$, wherein p = an integer from 27 to 41 | wherein the ligands $L_{Ai}$ comprises the following structure:

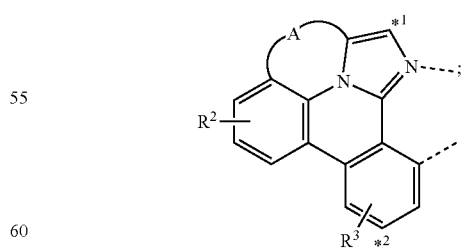

wherein the dashed lines represent bonds to the iridium atom;

wherein A is a linking group selected from the group consisting of:

A¹ 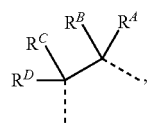

A² 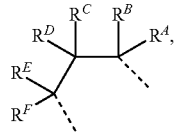

A³ 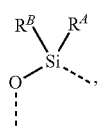

A⁴ 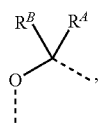

A⁵ 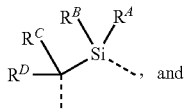, and

A⁶ 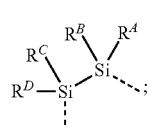;

wherein the dashed lines in A¹ to A⁶ indicate the connecting bonds:

wherein each $R^A$ to $R^F$ can be same or different, and are independently selected from the group consisting of hydrogen, deuterium, alkyl, cycloalkyl, aryl, heteroaryl, and combinations thereof; wherein any adjacent $R^A$ to $R^F$ are optionally joined or fused into a 5-membered or 6-membered ring;

wherein $L_{Bp}$ is selected from the group consisting of

M1 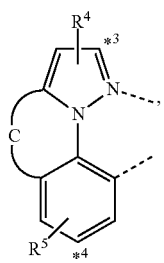

M2 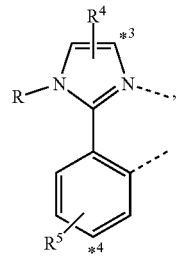

M3 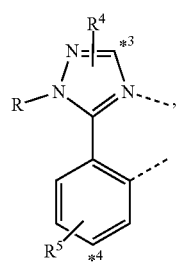

M4 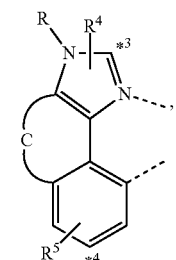

M5 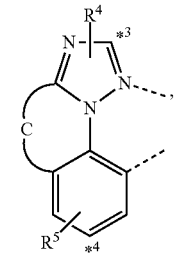

M6 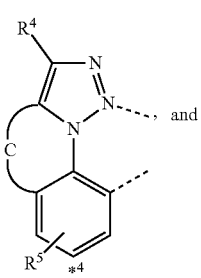, and

M7

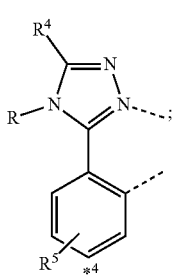

wherein C is an organic linker selected from the group consisting of:

C₁  not present,

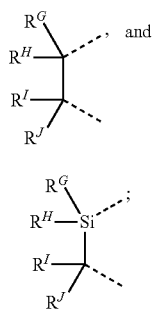 and C₂

C₃ wherein the dashed lines indicate the connecting bonds:
wherein the carbon marked by *¹ connects to R¹;
wherein the carbon marked by *² connects to R³;
wherein the carbon marked by *³ connects to L1 or R⁴;
wherein the carbon marked by *⁴ connects to L2 or R⁵;
wherein each of R¹, R², R³, R⁴, and R⁵ independently represents mono to a maximum possible number of substitutions, or no substitution;
wherein each of R¹, R², and R³ is independently selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, and combinations thereof;
wherein each of R⁴, R⁵, R^G, R^H, R^I, and R^J is independently selected from the group consisting of hydrogen, deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, and combinations thereof;
wherein R is selected from the group consisting of methyl, deuterated methyl, isopropyl, substituted phenyl, and substituted dibenzofuran;
wherein the ligands $L_{Ai}$, wherein i is an integer from 1 to 6, are defined as follows:

| $L_{Ai}$ | A | *¹ | *² |
|---|---|---|---|
| $L_{A1}$ | A¹ | R¹ | R³ |
| $L_{A2}$ | A² | R¹ | R³ |
| $L_{A3}$ | A³ | R¹ | R³ |
| $L_{A4}$ | A⁴ | R¹ | R³ |
| $L_{A5}$ | A⁵ | R¹ | R³ |
| $L_{A6}$ | A⁶ | R¹ | R³ | wherein the ligands $L_{Bp}$, wherein p is an integer from 16 to 41, are defined as follows:

| $L_{Bp}$ | having a structure | C | *³ | *⁴ |
|---|---|---|---|---|
| $L_{B16}$ | M1 | C₁ | L₁ | R⁵ |
| $L_{B17}$ | M1 | C₂ | L₁ | R⁵ |
| $L_{B18}$ | M1 | C₃ | L₁ | R⁵ |
| $L_{B19}$ | M2 | — | L₁ | R⁵ |
| $L_{B20}$ | M3 | — | L₁ | R⁵ |
| $L_{B21}$ | M4 | C₁ | L₁ | R⁵ |
| $L_{B22}$ | M4 | C₂ | L₁ | R⁵ |
| $L_{B23}$ | M4 | C₃ | L₁ | R⁵ |
| $L_{B24}$ | M5 | C₁ | L₁ | R⁵ |
| $L_{B25}$ | M5 | C₂ | L₁ | R⁵ |
| $L_{B26}$ | M5 | C₃ | L₁ | R⁵ |
| $L_{B27}$ | M1 | C₁ | R⁴ | L₂ |
| $L_{B28}$ | M1 | C₂ | R⁴ | L₂ |
| $L_{B29}$ | M1 | C₃ | R⁴ | L₂ |
| $L_{B30}$ | M2 | — | R⁴ | L₂ |
| $L_{B31}$ | M3 | — | R⁴ | L₂ |
| $L_{B32}$ | M4 | C₁ | R⁴ | L₂ |
| $L_{B33}$ | M4 | C₂ | R⁴ | L₂ |
| $L_{B34}$ | M4 | C₃ | R⁴ | L₂ |
| $L_{B35}$ | M5 | C₁ | R⁴ | L₂ |
| $L_{B36}$ | M5 | C₂ | R⁴ | L₂ |
| $L_{B37}$ | M5 | C₃ | R⁴ | L₂ |
| $L_{B38}$ | M6 | C₁ | — | L₂ |
| $L_{B39}$ | M6 | C₂ | — | L₂ |
| $L_{B40}$ | M6 | C₃ | — | L₂ |
| $L_{B41}$ | M7 | — | — | L₂ | wherein L1 or L2 have a structure selected from the group consisting of

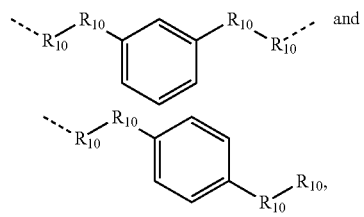

wherein $R_{10} = CH_2$ or $CD_2$, and
wherein any two substituents may be joined or fused together to form a ring.

10. The consumer product of claim 9, wherein the consumer product is one of a flat panel display, a curved display, a computer monitor, a medical monitor, a television, a billboard, a light for interior or exterior illumination and/or signaling, a heads-up display, a fully or partially transparent display, a flexible display, a rollable display, a foldable display, a stretchable display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, or a sign.

\* \* \* \* \*

UNITED STATES PATENT AND TRADEMARK OFFICE
CERTIFICATE OF CORRECTION

PATENT NO.      : 11,744,142 B2
APPLICATION NO. : 16/044620
DATED           : August 29, 2023
INVENTOR(S)     : Geza Szigethy et al.

It is certified that error appears in the above-identified patent and that said Letters Patent is hereby corrected as shown below:

In the Claims

In Claim 1, Column 178, Lines 26-35, please delete the following text in the table

| | | | |
|---|---|---|---|
| " $L_{A7}$  | $A^1$ | $L_1$ | $R^3$ " |
| " $L_{A8}$  | $A^2$ | $L_1$ | $R^3$ " |
| " $L_{A9}$  | $A^3$ | $L_1$ | $R^3$ " |
| " $L_{A10}$ | $A^4$ | $L_1$ | $R^3$ " |
| " $L_{A11}$ | $A^5$ | $L_1$ | $R^3$ " |
| " $L_{A12}$ | $A^6$ | $L_1$ | $R^3$ " |
| " $L_{A13}$ | $A^1$ | $R^1$ | $L_2$ " |
| " $L_{A14}$ | $A^2$ | $R^1$ | $L_2$ " |
| " $L_{A15}$ | $A^3$ | $R^1$ | $L_2$ " |
| " $L_{A16}$ | $A^4$ | $R^1$ | $L_2$ " |
| " $L_{A17}$ | $A^5$ | $R^1$ | $L_2$ " |
| " $L_{A18}$ | $A^6$ | $R^1$ | $L_2$ " |

Signed and Sealed this
Twenty-first Day of November, 2023

*Katherine Kelly Vidal*
Katherine Kelly Vidal
*Director of the United States Patent and Trademark Office*

CERTIFICATE OF CORRECTION (continued)
U.S. Pat. No. 11,744,142 B2

In Claim 1, Column 178, Lines 42-53, please delete the following text in the table

| | | | | |
|---|---|---|---|---|
| " $L_{B1}$ | 1 | $C_1$ | $R^4$ | $R^5$ " |
| " $L_{B2}$ | 1 | $C_2$ | $R^4$ | $R^5$ " |
| " $L_{B3}$ | 1 | $C_3$ | $R^4$ | $R^5$ " |
| " $L_{B4}$ | 2 | — | $R^4$ | $R^5$ " |
| " $L_{B5}$ | 3 | — | $R^4$ | $R^5$ " |
| " $L_{B6}$ | 4 | $C_1$ | $R^4$ | $R^5$ " |
| " $L_{B7}$ | 4 | $C_2$ | $R^4$ | $R^5$ " |
| " $L_{B8}$ | 4 | $C_3$ | $R^4$ | $R^5$ " |
| " $L_{B9}$ | 5 | $C_1$ | $R^4$ | $R^5$ " |
| " $L_{B10}$ | 5 | $C_2$ | $R^4$ | $R^5$ " |
| " $L_{B11}$ | 5 | $C_3$ | $R^4$ | $R^5$ " |
| " $L_{B12}$ | 6 | $C_1$ | — | $R^5$ " |
| " $L_{B13}$ | 6 | $C_2$ | — | $R^5$ " |
| " $L_{B14}$ | 6 | $C_3$ | — | $R^5$ " |
| " $L_{B15}$ | 7 | — | — | $R^5$ " |